US011239863B2

(12) United States Patent
Ikegaya et al.

(10) Patent No.: US 11,239,863 B2
(45) Date of Patent: Feb. 1, 2022

(54) DATA PROCESSING DEVICE AND DATA PROCESSING METHOD

(71) Applicant: Saturn Licensing LLC, New York, NY (US)

(72) Inventors: Ryoji Ikegaya, Kanagawa (JP); Makiko Yamamoto, Tokyo (JP); Yuji Shinohara, Kanagawa (JP)

(73) Assignee: Saturn Licensing LLC, New York, NY (US)

( * ) Notice: Subject to any disclaimer, the term of this patent is extended or adjusted under 35 U.S.C. 154(b) by 110 days.

(21) Appl. No.: 16/839,813

(22) Filed: Apr. 3, 2020

(65) Prior Publication Data

US 2020/0304152 A1 Sep. 24, 2020

Related U.S. Application Data

(63) Continuation of application No. 15/980,374, filed on May 15, 2018, now Pat. No. 10,659,080, which is a (Continued)

(30) Foreign Application Priority Data

Mar. 19, 2014 (JP) ................................ 2014-056461

(51) Int. Cl.
*H03M 13/27* (2006.01)
*H03M 13/00* (2006.01)

(Continued)

(52) U.S. Cl.
CPC ..... *H03M 13/2792* (2013.01); *H03M 13/036* (2013.01); *H03M 13/1137* (2013.01);

(Continued)

(58) Field of Classification Search
CPC ........................ H03M 13/2792; H03M 13/616
See application file for complete search history.

(56) References Cited

U.S. PATENT DOCUMENTS 10,193,571 B2 * 1/2019 Ikegaya ............ H04B 10/2507
10,659,080 B2 * 5/2020 Ikegaya ............ H03M 13/1165

(Continued)

FOREIGN PATENT DOCUMENTS

EP 1 513 258 A2 3/2005
JP 2007-6494 A 1/2007

(Continued)

OTHER PUBLICATIONS

International Search Report dated May 19, 2015 in PCT/JP2015/056597 filed Mar. 6, 2015.

(Continued)

*Primary Examiner* — Joseph D Torres
(74) *Attorney, Agent, or Firm* — Oblon, McClelland, Maier & Neustadt, L.L.P.

(57) ABSTRACT

The present technology relates to a data processing device and a data processing method capable of securing excellent communication quality in data transmission using an LDPC code. In group-wise interleave, an LDPC code having a code length N of 64800 bits and a coding rate r of 9/15, 11/15, or 13/15 is interleaved in units of bit groups of 360 bits. In group-wise deinterleave, a sequence of LDPC codes after the group-wise interleave is returned to an original sequence. The present technology, for example, can be applied to a case where data transmission using an LDPC code or the like is performed.

20 Claims, 174 Drawing Sheets

Related U.S. Application Data continuation of application No. 15/122,439, filed as application No. PCT/JP2015/056597 on Mar. 6, 2015, now abandoned.

(51) Int. Cl.

| | |
|---|---|
| ***H03M 13/03*** | (2006.01) |
| ***H03M 13/11*** | (2006.01) |
| ***H03M 13/29*** | (2006.01) |
| ***H03M 13/35*** | (2006.01) |
| ***H03M 13/25*** | (2006.01) |
| *H03M 13/15* | (2006.01) |

(52) U.S. Cl.

CPC ..... *H03M 13/1165* (2013.01); *H03M 13/255* (2013.01); *H03M 13/271* (2013.01); *H03M 13/2906* (2013.01); *H03M 13/356* (2013.01); *H03M 13/616* (2013.01); *H03M 13/618* (2013.01); *H03M 13/152* (2013.01)

(56) References Cited

U.S. PATENT DOCUMENTS

| | | | | |
|---|---|---|---|---|
| 2007/0011570 | A1 | 1/2007 | Jeong et al. | |
| 2007/0098110 | A1 | 5/2007 | Schmidt | |
| 2007/0118787 | A1 | 5/2007 | Schmidt | |
| 2009/0125781 | A1 | 5/2009 | Jeong | |
| 2010/0275100 | A1 | 10/2010 | Yokokawa et al. | |
| 2010/0306627 | A1 | 12/2010 | Sakai | |
| 2011/0090948 | A1 | 4/2011 | Zhou et al. | |
| 2014/0082452 | A1 | 3/2014 | Shinohara et al. | |
| 2015/0046765 | A1* | 2/2015 | Shinohara ......... | H03M 13/2906 714/752 |
| 2016/0211868 | A1 | 7/2016 | Shinohara | |
| 2017/0187392 | A1 | 6/2017 | Ikegaya | |
| 2018/0337693 | A1 | 11/2018 | Ikegaya | |
| 2019/0028122 | A1* | 1/2019 | Ikegaya ............. | H03M 13/1137 |
| 2019/0149172 | A1* | 5/2019 | Ikegaya ............. | H03M 13/1177 714/800 |

FOREIGN PATENT DOCUMENTS

| | | | |
|---|---|---|---|
| JP | 2011-523318 | A | 8/2011 |
| JP | 2013-5124 | A | 1/2013 |
| KR | 1020050025085 | A | 3/2005 |
| KR | 10-2008-0004628 | | 1/2008 |
| KR | 10-2010-0096102 | A1 | 9/2010 |
| KR | 10-2010-0136480 | | 12/2010 |
| KR | 10-1481854 | B1 | 1/2015 |
| KR | 10-0619206 | B1 | 9/2016 |
| WO | 2015/045901 | A1 | 4/2015 |

OTHER PUBLICATIONS

"Digital Video Broadcasting (DVB); Second generation framing structure, channel coding and modulation systems for Broadcasting, Interactive Services, News Gathering and other broadband satellite applications (DVB-S2)," ETSI EN 302 307, V1.2.1, Aug. 2009, 78 pages.

"ATSC 3.0 Physical Layer Proposal Rev. 01, Annex A, The Performance of Single Carrier Multi-Tone (SCMT) Modulation", Guarneri Communications, Nov. 17, 2013, 17 pages.

Office Action dated Mar. 22, 2017 in Korean Patent Application No. 10-2016-7024713.

Notice of Allowance dated Sep. 9, 2018 in corresponding Korean Patent Application No. 10-2017-7017141, 2 Pages.

Korean Notice of Allowance dated Feb. 20, 2020 in Korean Application No. 10-2019-7038715, citing documents AO-AP therein, 2 pgs.

* cited by examiner

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 13

NUMBER OF COLUMNS OF EACH COLUMN WEIGHT

| | N=64800 | | | | N=16200 | | | |
|---|---|---|---|---|---|---|---|---|
| Nominal CODING RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | --- | --- | --- | --- |

FIG. 15
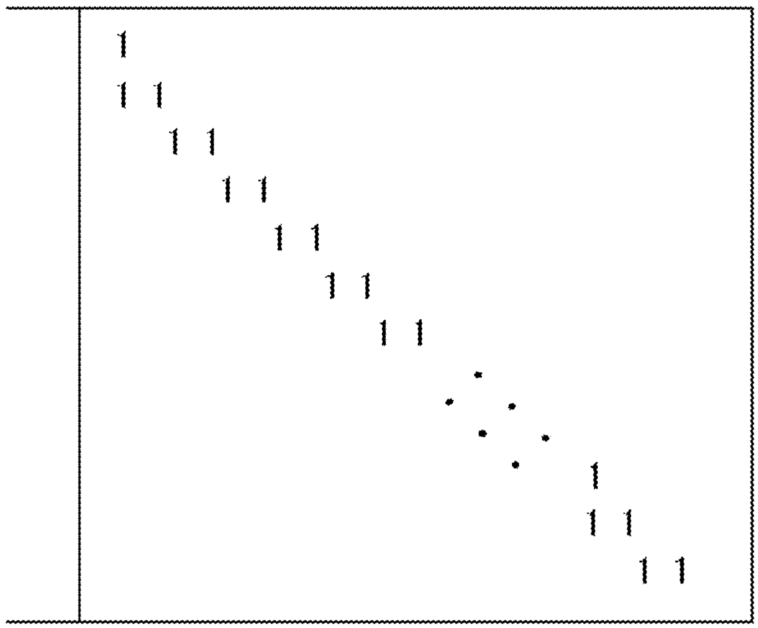
STAIRCASE STRUCTURE OF PARITY MATRIX
A
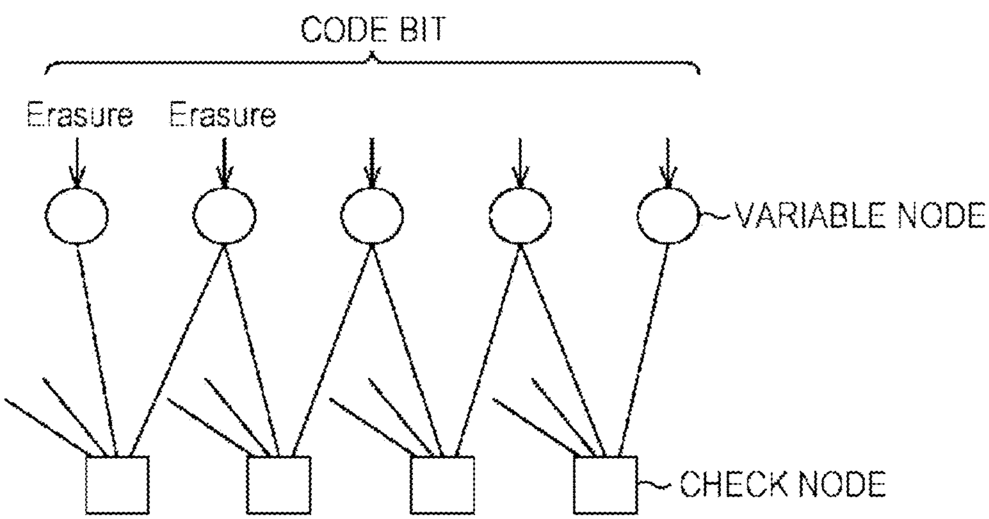
STAIRCASE STRUCTURE PORTION OF Tanner Graph
B r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

2 6 18
2 10 19
22
19
15

PROVIDED BY CRC/ETRI

FIG. 30

N=16200, rate=8/15

N=16200, rate=10/15

N=16200, rate=12/15

N=64800, rate=7/15

N=64800, rate=9/15

N=64800, rate=11/15

N=64800, rate=13/15

```
2114 7372 7926
1875 2388 4057
3232 4042 6663
9 401 583
13 4100 6684
2299 4190 4410
21 3670 4979
```

N=64800, rate=6/15

1606 3402 4961 6751 7132 11516 12300 12482 12592 13342 13764 14123 21576 23946
24533 25376 25667 26836 31799 34173 35462 36153 36740 37085 37152 37468 37658
4621 5007 6910 8732 9757 11508 13099 15513 16335 18052 19512 21319 23663 25628
27208 31333 32219 33003 33239 33447 36200 36473 36938 37201 37283 37495 38642
16 1094 2020 3080 4194 5098 5631 6877 7889 8237 9804 10067 11017 11366 13136 1
3354 15379 18934 20199 24522 26172 28666 30386 32714 36390 37015 37162
700 897 1708 6017 6490 7372 7825 9546 10398 16605 18561 18745 21625 22137 2369
3 24340 24966 25015 26995 28586 28895 29687 33938 34520 34858 37056 38297
159 2010 2573 3617 4452 4958 5556 5632 6481 8227 9924 10836 14954 15594 16623
18065 19249 22394 22677 23408 23731 24076 24776 27007 28222 30343 38371
3118 3545 4768 4992 5227 6732 8170 9397 10522 11508 15536 20218 21921 28599 29
445 29758 29968 31014 32027 33685 34378 35867 36323 36728 36870 38335 38623
1264 4254 6936 9165 9486 9950 10861 11653 13697 13961 15164 15665 18444 19470
20313 21189 24371 26431 26999 28086 28251 29261 31981 34015 35850 36129 37186
111 1307 1628 2041 2524 5358 7988 8191 10322 11905 12919 14127 15515 15711 170
61 19024 21195 22902 23727 24401 24608 25111 25228 27338 35398 37794 38196
961 3035 7174 7948 13355 13607 14971 18189 18339 18665 18875 19142 20615 21136
21309 21758 23366 24745 25849 25982 27583 30006 31118 32106 36469 36583 37920
2990 3549 4273 4808 5707 6021 6509 7456 8240 10044 12262 12660 13085 14750 156
80 16049 21587 23997 25803 28343 28693 34393 34860 35490 36021 37737 38296
955 4323 5145 6885 8123 9730 11840 12216 19194 20313 23056 24248 24830 25268 2
6617 26801 28557 29753 30745 31450 31973 32839 33025 33296 35710 37368 37509
264 605 4181 4483 5156 7238 8863 10939 11251 12964 16254 17511 20017 22395 228
16 23261 23422 24064 26329 27723 28186 30434 31956 33971 34372 36764 38123
520 2562 2794 3528 3860 4402 5676 6963 8655 9018 9783 11933 16336 17193 17320
19035 20606 23579 23769 24123 24966 27866 32457 34011 34499 36620 37526
10106 10637 10906 34242
1856 15100 19378 21848
943 11191 27806 29411
4575 6359 13629 19383
4476 4953 18782 24313
5441 6381 21840 35943
9638 9763 12546 30120
9587 10626 11047 25700
4088 15298 28768 35047
2332 6363 8782 28863
4625 4933 28298 30289
3541 4918 18257 31746
1221 25233 26757 34892
8150 16677 27934 30021
6500 25016 33043 38070
7374 10207 16189 35811
611 18480 20064 38261
25416 27352 36089 38469
1667 17614 25839 32776
4118 12481 21912 37945
5573 13222 23619 31271
18271 26251 27182 30587
14690 26430 26799 34355

PROVIDED BY Samsung

PROVIDED BY Samsung

FIG. 49

N=64800, rate=8/15

2768 3039 4059 5856 6245 7013 8157 9341 9802 10470 11521 12083 16610 18361 203
21 24601 27420 28206 29788
2739 8244 8891 9157 12624 12973 15534 16622 16919 18402 18780 19854 20220 2054
3 22306 25540 27478 27678 28053
1727 2268 6246 7815 9010 9556 10134 10472 11389 14599 15719 16204 17342 17666
18850 22058 25579 25860 29207
28 1346 3721 5565 7019 9240 12355 13109 14800 16040 16839 17369 17631 19357 19
473 19891 20381 23911 29683
869 2450 4386 5316 6160 7107 10362 11132 11271 13149 16397 16532 17113 19894 2
2043 22784 27383 28615 28804
508 4292 5831 8559 10044 10412 11283 14810 15888 17243 17538 19903 20528 22090
22652 27235 27384 28208 28485
389 2248 5840 6043 7000 9054 11075 11760 12217 12565 13587 15403 19422 19528 2
1493 25142 27777 28566 28702
1015 2002 5764 6777 9346 9629 11039 11153 12690 13068 13990 16841 17702 20021
24106 26300 29332 30081 30196
1480 3084 3467 4401 4798 5187 7851 11368 12323 14325 14546 16360 17158 18010 2
1333 25612 26556 26906 27005
6925 8876 12392 14529 15253 15437 19226 19950 20321 23021 23651 24393 24653 26
668 27205 28269 28529 29041 29292
2547 3404 3538 4686 5126 5468 7695 8799 14732 15072 15881 17410 18971 19609 19
717 22150 24941 27908 29018
888 1581 2311 5511 7218 9107 10454 12252 13662 15714 15894 17025 18671 24304 2
5316 25556 28489 28977 29212
1047 1494 1718 4645 5030 6811 7868 8146 10611 15767 17682 18391 22614 23021 23
763 25478 26491 29088 29757
59 1781 1900 3814 4121 8044 8906 9175 11156 14841 15789 16033 16755 17292 1855
0 19310 22605 29567 29850
1962 3057 4399 9476 10171 10769 11335 11569 15002 19501 20621 22642 23452 2436
0 25109 25290 25828 28505 29122
2895 3070 3437 4764 4905 6670 9244 11845 13352 13573 13975 14600 15871 17996 1
9672 20079 20579 25327 27958
612 1528 2004 4244 4599 4926 5843 7584 10122 10443 12267 14368 18413 19058 229
85 24257 26202 26596 27899
1361 2195 4146 6708 7158 7538 9138 9998 14862 15359 16076 18925 21401 21573 22
503 24146 24247 27778 29312
5229 6235 7134 7655 9139 13527 15408 16058 16705 18320 19909 20901 22238 22437
23654 25131 27550 28247 29903
697 2035 4887 5275 6909 9166 11805 15338 16381 18403 20425 20688 21547 24590 2
5171 26726 28848 29224 29412
5379 17329 22659 23062
11814 14759 22329 22936
2423 2811 10296 12727
8460 15260 16769 17290
14191 14608 29536 30187
7103 10069 20111 22850
4285 15413 26448 29069
548 2137 9189 10928
4581 7077 23382 23949

PROVIDED BY Samsung

PROVIDED BY Samsung

PROVIDED BY Samsung

FIG. 52

N=64800, rate=12/15

584 1472 1621 1867 3338 3568 3723 4185 5126 5889 7737 8632 8940 9725
221 445 590 3779 3835 6939 7743 8280 8448 8491 9367 10042 11242 12917
4662 4837 4900 5029 6449 6687 6751 8684 9936 11681 11811 11886 12089 12909
2418 3018 3647 4210 4473 7447 7502 9490 10067 11092 11139 11256 12201 12383
2591 2947 3349 3406 4417 4519 5176 6672 8498 8863 9201 11294 11376 12184
27 101 197 290 871 1727 3911 5411 6676 8701 9350 10310 10798 12439
1765 1897 2923 3584 3901 4048 6963 7054 7132 9165 10184 10824 11278 12669
2183 3740 4808 5217 5660 6375 6787 8219 8466 9037 10353 10583 11118 12762
73 1594 2146 2715 3501 3572 3639 3725 6959 7187 8406 10120 10507 10691
240 732 1215 2185 2788 2830 3499 3881 4197 4991 6425 7061 9756 10491
831 1568 1828 3424 4319 4516 4639 6018 9702 10203 10417 11240 11518 12458
2024 2970 3048 3638 3676 4152 5284 5779 5926 9426 9945 10873 11787 11837
1049 1218 1651 2328 3493 4363 5750 6483 7613 8782 9738 9803 11744 11937
1193 2060 2289 2964 3478 4592 4756 6709 7162 8231 8326 11140 11908 12243
978 2120 2439 3338 3850 4589 6567 8745 9656 9708 10161 10542 10711 12639
2403 2938 3117 3247 3711 5593 5844 5932 7801 10152 10226 11498 12162 12941
1781 2229 2276 2533 3582 3951 5279 5774 7930 9824 10920 11038 12340 12440
289 384 1980 2230 3464 3873 5958 8656 8942 9006 10175 11425 11745 12530
155 354 1090 1330 2002 2236 3559 3705 4922 5958 6576 8564 9972 12760
303 876 2059 2142 5244 5330 6644 7576 8614 9598 10410 10718 11033 12957
3449 3617 4408 4602 4727 6182 8835 8928 9372 9644 10237 10747 11655 12747
811 2565 2820 8677 8974 9632 11069 11548 11839 12107 12411 12695 12812 12890
972 4123 4943 6385 6449 7339 7477 8379 9177 9359 10074 11709 12552 12831
842 973 1541 2262 2905 5276 6758 7099 7894 8128 8325 8663 8875 10050
474 791 968 3902 4924 4965 5085 5908 6109 6329 7931 9038 9401 10568
1397 4461 4658 5911 6037 7127 7318 8678 8924 9000 9473 9602 10446 12692
1334 7571 12881
1393 1447 7972
633 1257 10597
4843 5102 11056
3294 8015 10513
1108 10374 10546
5353 7824 10111
3398 7674 8569
7719 9478 10503
2997 9418 9581
5777 6519 11229
1966 5214 9899
6 4088 5827
836 9248 9612
483 7229 7548
7865 8289 9804
2915 11098 11900
6180 7096 9481
1431 6786 8924
748 6757 8625
3312 4475 7204
1852 8958 11020
1915 2903 4006

PROVIDED BY Samsung

PROVIDED BY Samsung

PROVIDED BY Samsung

FIG. 55

N=16200, rate=6/15

```
  27 430 519 828 1897 1943 2513 2600 2640 3310 3415 4266 5044 5100 5328 5483 592
8 6204 6392 6416 6602 7019 7415 7623 8112 8485 8724 8994 9445 9667
  27 174 188 631 1172 1427 1779 2217 2270 2601 2813 3196 3582 3895 3908 3948 446
3 4955 5120 5809 5988 6478 6604 7096 7673 7735 7795 8925 9613 9670
  27 370 617 852 910 1030 1326 1521 1606 2118 2248 2909 3214 3413 3623 3742 3752
 4317 4694 5300 5687 6039 6100 6232 6491 6621 6860 7304 8542 8634
  990 1753 7635 8540
  933 1415 5666 8745
  27 6567 8707 9216
  2341 8692 9580 9615
  260 1092 5839 6080
  352 3750 4847 7726
  4610 6580 9506 9597
  2512 2974 4814 9348
  1461 4021 5060 7009
  1796 2883 5553 8306
  1249 5422 7057
  3965 6968 9422
  1498 2931 5092
  27 1090 6215
  26 4232 6354
```

PROVIDED BY LGE

FIG. 56

N=16200, rate=7/15

```
  553 742 901 1327 1544 2179 2519 3131 3280 3603 3789 3792 4253 5340 5934 5962 6
004 6698 7793 8001 8058 8126 8276 8559
  503 590 598 1185 1266 1336 1806 2473 3021 3356 3490 3680 3936 4501 4659 5891 6
132 6340 6602 7447 8007 8045 8059 8249
  795 831 947 1330 1502 2041 2328 2513 2814 2829 4048 4802 6044 6109 6461 6777 6
800 7099 7126 8095 8428 8519 8556 8610
  601 787 899 1757 2259 2518 2783 2816 2823 2949 3396 4330 4494 4684 4700 4837 4
881 4975 5130 5464 6554 6912 7094 8297
  4229 5628 7917 7992
  1506 3374 4174 5547
  4275 5650 8208 8533
  1504 1747 3433 6345
  3659 6955 7575 7852
  607 3002 4913 6453
  3533 6860 7895 8048
  4094 6366 8314
  2206 4513 5411
  32 3882 5149
  389 3121 4626
  1308 4419 6520
  2092 2373 6849
  1815 3679 7152
  3582 3979 6948
  1049 2135 3754
  2276 4442 6591
```

PROVIDED BY LGE

FIG. 57

N=16200, rate=9/15

212 255 540 967 1033 1517 1538 3124 3408 3800 4373 4864 4905 5163 5177 6186
275 660 1351 2211 2876 3063 3433 4088 4273 4544 4618 4632 5548 6101 6111 6136
279 335 494 865 1662 1681 3414 3775 4252 4595 5272 5471 5796 5907 5986 6008
345 352 3094 3188 4297 4338 4490 4865 5303 6477
222 681 1218 3169 3850 4878 4954 5666 6001 6237
172 512 1536 1559 2179 2227 3334 4049 6464
716 934 1694 2890 3276 3608 4332 4468 5945
1133 1593 1825 2571 3017 4251 5221 5639 5845
1076 1222 6465
159 5064 6078
374 4073 5357
2833 5526 5845
1594 3639 5419
1028 1392 4239
115 622 2175
300 1748 6245
2724 3276 5349
1433 6117 6448
485 663 4955
711 1132 4315
177 3266 4339
1171 4841 4982
33 1584 3692
2820 3485 4249
1716 2428 3125
250 2275 6338
108 1719 4961

PROVIDED BY LGE

FIG. 58

N=16200, rate=11/15

49 719 784 794 968 2382 2685 2873 2974 2995 3540 4179
272 281 374 1279 2034 2067 2112 3429 3613 3815 3838 4216
206 714 820 1800 1925 2147 2168 2769 2806 3253 3415 4311
62 159 166 605 1496 1711 2652 3016 3347 3517 3654 4113
363 733 1118 2062 2613 2736 3143 3427 3664 4100 4157 4314
57 142 436 983 1364 2105 2113 3074 3639 3835 4164 4242
870 921 950 1212 1861 2128 2707 2993 3730 3968 3983 4227
185 2684 3263
2035 2123 2913
883 2221 3521
1344 1773 4132
438 3178 3650
543 756 1639
1057 2337 2898
171 3298 3929
1626 2960 3503
484 3050 3323
2283 2336 4189
2732 4132 4318
225 2335 3497
600 2246 2658
1240 2790 3020
301 1097 3539
1222 1267 2594
1364 2004 3603
1142 1185 2147
564 1505 2086
697 991 2908
1467 2073 3462
2574 2818 3637
748 2577 2772
1151 1419 4129
164 1238 3401

PROVIDED BY LGE

FIG. 59

N=16200, rate=13/15

71 334 645 779 786 1124 1131 1267 1379 1554 1766 1798 1939
6 183 364 506 512 922 972 981 1039 1121 1537 1840 2111
6 71 153 204 253 268 781 799 873 1118 1194 1661 2036
6 247 353 581 921 940 1108 1146 1208 1268 1511 1527 1671
6 37 466 548 747 1142 1203 1271 1512 1516 1837 1904 2125
6 171 863 953 1025 1244 1378 1396 1723 1783 1816 1914 2121
1268 1360 1647 1769
6 458 1231 1414
183 535 1244 1277
107 360 498 1456
6 2007 2059 2120
1480 1523 1670 1927
139 573 711 1790
6 1541 1889 2023
6 374 957 1174
287 423 872 1285
6 1809 1918
65 818 1396
590 766 2107
192 814 1843
775 1163 1256
42 735 1415
334 1008 2055
109 596 1785
406 534 1852
684 719 1543
401 465 1040
112 392 621
82 897 1950
887 1962 2125
793 1088 2159
723 919 1139
610 839 1302
218 1080 1816
627 1646 1749
496 1165 1741
916 1055 1662
182 722 945
5 595 1674

PROVIDED BY LGE

FIG. 60

N=64800, rate=10/15

316 1271 3692 9495 12147 12849 14928 16671 16938 17864 19108 20502 21097 21115
2341 2559 2643 2816 2865 5137 5331 7000 7523 8023 10439 10797 13208 15041
5556 6858 7677 10162 10207 11349 12321 12398 14787 15743 15859 15952 19313 208
79
349 573 910 2702 3654 6214 9246 9353 10638 11772 14447 14953 16620 19888
204 1390 2887 3835 6230 6533 7443 7876 9299 10291 10896 13960 18287 20086
541 2429 2838 7144 8523 8637 10490 10585 11074 12074 15762 16812 17900 18548
733 1659 3838 5323 5805 7882 9429 10682 13697 16909 18846 19587 19592 20904
1134 2136 4631 4653 4718 5197 10410 11666 14996 15305 16048 17417 18960 20303
734 1001 1283 4959 10016 10176 10973 11578 12051 15550 15915 19022 19430 20121
745 4057 5855 9885 10594 10989 13156 13219 13351 13631 13685 14577 17713 20386
968 1446 2130 2502 3092 3787 5323 8104 8418 9998 11681 13972 17747 17929
3020 3857 5275 5786 6319 8608 11943 14062 17144 17752 18001 18453 19311 21414
709 747 1038 2181 5320 8292 10584 10859 13964 15009 15277 16953 20675 21509
1663 3247 5003 5760 7186 7360 10346 14211 14717 14792 15155 16128 17355 17970
516 578 1914 6147 9419 11148 11434 13289 13325 13332 19106 19257 20962 21556
5009 5632 6531 9430 9886 10621 11765 13969 16178 16413 18110 18249 20616 20759
457 2686 3318 4608 5620 5858 6480 7430 9602 12691 14664 18777 20152 20848
33 2877 5234 6851 7907 8654 10688 15401 16123 17942 17969 18747 18931 20224
87 897 7636 8663 11425 12288 12672 14199 16435 17615 17950 18953 19667 20281
1042 1832 2545 2719 2947 3672 3700 6249 6398 6833 11114 14283 17694 20477
326 488 2662 2880 3009 5357 6587 8882 11604 14374 18781 19051 19057 20508
854 1294 2436 2852 4903 6466 7761 9072 9564 10321 13638 15658 16946 19119
194 899 1711 2408 2786 5391 7108 8079 8716 11453 17303 19484 20989 21389
1631 3121 3994 5005 7810 8850 10315 10589 13407 17162 18624 18758 19311 20301
736 2424 4792 5600 6370 10061 16053 16775 18600
1254 8163 8876 9157 12141 14587 16545 17175 18191
388 6641 8974 10607 10716 14477 16825 17191 18400
5578 6082 6824 7360 7745 8655 11402 11665 12428
3603 8729 13463 14698 15210 19112 19550 20727 21052
48 1732 3805 5158 15442 16909 19854 21071 21579
11707 14014 21531
1542 4133 4925
10083 13505 21198
14300 15765 16752
778 1237 11215
1325 3199 14534
2007 14510 20599
1996 5881 16429
5111 15018 15980
4989 10681 12810
3763 10715 16515
2259 10080 15642
9032 11319 21305
3915 15213 20884
11150 15022 20201
1147 6749 19625
12139 12939 18870
3840 4634 10244

PROVIDED BY LGE

PROVIDED BY LGE

PROVIDED BY LGE

FIG. 63

N=64800, rate=9/15

218 592 1116 2229 2989 3217 3922 4338 5063 7196 8516 9168 10774 12013 12355 12485 13238 13315 13365 15102 16325 16379 17222 17866 19091 21096 21677 22183 22884 23023 23059 23295 23694 24888 25755

142 556 754 1359 1813 2861 3733 4015 4103 4137 4590 5431 7423 8429 9924 10043 11764 12672 13476 14250 15182 15575 15835 16093 16893 17014 17993 18328 19778 20782 22151 22347 23841 25434 25647

8 1287 1813 2927 4094 4691 5599 7087 7503 8777 9100 11299 11310 12283 12638 12774 12983 13161 13750 13899 14093 14581 15066 18310 19537 21141 21530 21920 22726 23080 23250 23588 23749 25129 25493

170 2231 2273 4646 5468 5912 7624 7804 8019 8715 9157 10173 10978 13144 14209 14508 15118 15510 16699 17285 18189 18842 19164 19242 19568 20657 20745 22599 22754 24105 24136 24644 25091 25259 25476

611 3593 5689 5980 6779 7830 8200 8420 8701 10161 10601 10863 11251 11540 12306 12364 12396 13247 13256 13454 13683 13810 13912 14254 14665 15530 16749 18022 21173 21359 21564 21860 23562 23936 25873

225 490 1197 1357 2322 3436 3759 5720 5886 10068 10994 12476 13186 13403 13774 14376 14505 14946 15555 16515 17068 17581 18317 19533 19993 20376 20597 21656 23103 23230 23860 24883 25100 25576 25835

910 1479 3144 3600 4255 5851 6277 6587 7337 8562 9592 11428 11534 12127 12452 13565 14336 15311 15470 16915 17520 18194 18324 18385 18575 19627 20126 20219 21108 21294 22218 22466 22541 23614 24218

120 6693 11582 11756 14656 16088 24473 24811
990 3571 8517 10259 14187 15732 17864 23697
2366 5536 8236 14281 16176 19247 25431 25641
9056 10221 16011 17287 22095 22694 23634 24541
1138 3241 4444 11816 14651 17585 20317 24036
3166 5421 7828 11855 13148 16492 22830 25181
3644 5858 7555 12551 14018 15716 20181 20877
3405 7546 10508 12355 12455 16386 22014 22846
5305 12876 13734 15949 16747 17458 18068 23552
2717 4365 5192 9626 11487 17811 24163 25201
4705 5787 12649 14298 15570 19876 23193 24688
3394 4960 9629 11445 19031 23128 23563 25774
1648 4768 8372 11388 11448 13373 14773 15814
4043 10049 13225 14765 18206 19663 20316 25534
8820 15709 17949 18383 18624 19746 23307 25346
221 10075 12281 13163 16430 18834 20637 21646
264 296 2837 4856 9223 10324 16330 18557
4532 7935 12782 16508 17549 21310 23929 24846
5143 5666 6753 8248 12394 13840 14926 15611
4289 9811 10826 11025 11425 15567 20767 25246
1826 4386 6372 6698 7467 20479 23360 24751
740 1873 3727 8628 11803 21326 24482 25134
315 664 2026 10700 12624 21194 24678 24802
8431 9604 11559 12120 19557 21047 21161 21584
6275 8787 9830 10580 12795 15287 20794 21063
3780 7735 9717 10410 14334 19217 24239 24857
4214 9796 10451 17817 18072 18697 19265 24591
2497 5485 6337 10065 13070 14240 20115 23668

PROVIDED BY NERC

PROVIDED BY NERC

PROVIDED BY NERC

FIG. 66

N=16200, rate=5/15

69 244 706 5145 5994 6066 6763 6815 8509
257 541 618 3933 6188 7048 7484 8424 9104
69 500 536 1494 1669 7075 7553 8202 10305
11 189 340 2103 3199 6775 7471 7918 10530
333 400 434 1806 3264 5693 8534 9274 10344
111 129 260 3562 3676 3680 3809 5169 7308 8280
100 303 342 3133 3952 4226 4713 5053 5717 9931
83 87 374 828 2460 4943 6311 8657 9272 9571
114 166 325 2680 4698 7703 7886 8791 9978 10684
281 542 549 1671 3178 3955 7153 7432 9052 10219
202 271 608 3860 4173 4203 5169 6871 8113 9757
16 359 419 3333 4198 4737 6170 7987 9573 10095
235 244 584 4640 5007 5563 6029 6816 7678 9968
123 449 646 2460 3845 4161 6610 7245 7686 8651
136 231 468 835 2622 3292 5158 5294 6584 9926
3085 4683 8191 9027 9922 9928 10550
2462 3185 3976 4091 8089 8772 9342

PROVIDED BY CRC/ETRI

FIG. 67

N=64800, rate=5/15

221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32084 42675
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 397 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24868 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649

PROVIDED BY CRC/ETRI

PROVIDED BY CRC/ETRI

FIG. 69

N=64800, rate=6/15

71 276 856 6867 12964 17373 18159 26420 28460 28477
257 322 672 2533 5316 6578 9037 10231 13845 36497
233 765 904 1366 3875 13145 15409 18620 23910 30825
100 224 405 12776 13868 14787 16781 23886 29099 31419
23 496 891 2512 12589 14074 19392 20339 27658 28684
473 712 759 1283 4374 9898 12551 13814 24242 32728
511 567 815 11823 17106 17900 19338 22315 24396 26448
45 733 836 1923 3727 17468 25746 33806 35995 36657
17 487 675 2670 3922 5145 18009 23993 31073 36624
72 751 773 1937 17324 28512 30666 30934 31016 31849
257 343 594 14041 19141 24914 26864 28809 32055 34753
99 241 491 2650 9670 17433 17785 18988 22235 30742
198 299 655 6737 8304 10917 16092 19387 20755 37690
351 916 926 18151 21708 23216 30321 33578 34052 37949
54 332 373 2010 3332 5623 16301 34337 36451 37861
139 257 1068 11090 20289 29694 29732 32640 35133 36404
457 885 968 2115 4956 5422 5949 17570 26673 32387
137 570 619 5006 6099 7979 14429 16650 25443 32789
46 282 287 10258 18383 20258 27186 27494 28429 38266
445 486 1058 1868 9976 11294 20364 23695 30826 35330
134 900 931 12518 14544 17715 19623 21111 33868 34570
62 66 586 8020 20270 23831 31041 31965 32224 35189
174 290 784 6740 14673 17642 26286 27382 33447 34879
332 675 1033 1838 12004 15439 20765 31721 34225 38863
527 558 832 3867 6318 8317 10883 13466 18427 25377
431 780 1021 1112 2873 7675 13059 17793 20570 20771
339 536 1015 5725 6916 10846 14487 21156 28123 32614
456 830 1078 7511 11801 12362 12705 17401 28867 34032
222 538 989 5593 6022 8302 14008 23445 25127 29022
37 393 788 3025 7768 11367 22276 22761 28232 30394
234 257 1045 1307 2908 6337 26530 28142 34129 35997
35 46 978 9912 9978 12567 17843 24194 34887 35206
39 959 967 5027 10847 14657 18859 28075 28214 36325
275 477 823 11376 18073 28997 30521 31661 31941 32116
185 580 966 11733 12013 12760 13358 19372 32534 35504
760 891 1046 11150 20358 21638 29930 31014 33050 34840
360 389 1057 5316 5938 14186 16404 32445 34021 35722
306 344 679 5224 6674 10305 18753 25583 30585 36943
103 171 1016 8780 11741 12144 19470 20955 22495 27377
818 832 894 3883 14279 14497 22505 28129 28719 31246
215 411 760 5886 25612 28556 32213 32704 35901 36130
229 489 1067 2385 8587 20565 23431 28102 30147 32859
288 664 980 8138 8531 21676 23787 26708 28798 34490
89 552 847 6656 9889 23949 26226 27080 31236 35823
66 142 443 3339 3813 7977 14944 15464 19186 25983
605 876 931 16682 17669 25800 28220 33432 35738 37382
346 423 806 5669 7668 8789 9928 19724 24039 27893
48 460 1055 3512 7389 7549 20216 22180 28221 35437
187 636 824 1678 4508 13588 19683 21750 30311 33480

PROVIDED BY CRC/ETRI

PROVIDED BY CRC/ETRI

FIG. 71

N=64800, rate=7/15

460 792 1007 4580 11452 13130 26882 27020 32439
35 472 1056 7154 12700 13326 13414 16828 19102
45 440 772 4854 7863 26945 27684 28651 31875
744 812 892 1509 9018 12925 14140 21357 25106
271 474 761 4268 6706 9609 19701 19707 24870
223 477 662 1987 9247 18376 22148 24948 27694
44 379 786 8823 12322 14666 16377 28688 29924
104 219 562 5832 19665 20615 21043 22759 32180
41 43 870 7963 13718 14136 17216 30470 33428
592 744 887 4513 6192 18116 19482 25032 34095
456 821 1078 7162 7443 8774 15567 17243 33085
151 666 977 6946 10358 11172 18129 19777 32234
236 793 870 2001 6805 9047 13877 30131 34252
297 698 772 3449 4204 11608 22950 26071 27512
202 428 474 3205 3726 6223 7708 20214 25283
139 719 915 1447 2938 11864 15932 21748 28598
135 853 902 3239 18590 20579 30578 33374 34045
9 13 971 11834 13642 17628 21669 24741 30965
344 531 730 1880 16895 17587 21901 28620 31957
7 192 380 3168 3729 5518 6827 20372 34168
28 521 681 4313 7465 14209 21501 23364 25980
269 393 898 3561 11066 11985 17311 26127 30309
42 82 707 4880 4890 9818 23340 25959 31695
189 262 707 6573 14082 22259 24230 24390 24664
383 568 573 5498 13449 13990 16904 22629 34203
585 596 820 2440 2488 21956 28261 28703 29591
755 763 795 5636 16433 21714 23452 31150 34545
23 343 669 1159 3507 13096 17978 24241 34321
316 384 944 4872 8491 18913 21085 23198 24798
64 314 765 3706 7136 8634 14227 17127 23437
220 693 899 8791 12417 13487 18335 22126 27428
285 794 1045 8624 8801 9547 19167 21894 32657
386 621 1045 1634 1882 3172 13686 16027 22448
95 622 693 2827 7098 11462 14112 18831 31308
446 813 928 7976 8935 13146 27117 27766 33111
89 138 241 3218 9283 20458 31484 31538 34216
277 420 704 9281 12576 12788 14496 15357 20585
141 643 758 4894 10264 15144 16357 22478 26461
17 108 160 13183 15424 17939 19276 23714 26655
109 285 608 1682 20223 21791 24615 29622 31983
123 515 622 7037 13946 15292 15606 16262 23742
264 565 923 6460 13622 13934 23181 25475 26134
202 548 789 8003 10993 12478 16051 25114 27579
121 450 575 5972 10062 18693 21852 23874 28031
507 560 889 12064 13316 19629 21547 25461 28732
664 786 1043 9137 9294 10163 23389 31436 34297
45 830 907 10730 16541 21232 30354 30605 31847
203 507 1060 6971 12216 13321 17861 22671 29825
369 881 952 3035 12279 12775 17682 17805 34281

PROVIDED BY CRC/ETRI

PROVIDED BY CRC/ETRI

CODE LENGTH : N=16200
CODING RATE : {8, 10, 12}/15

| Rate | PERFORMANCE THRESHOLD (Es/NO) | MINIMUM CYCLE LENGTH |
|---|---|---|
| 8/15 | 0. 805765 | 6 |
| 10/15 | 2. 471011 | 6 |
| 12/15 | 4. 269922 | 6 |

| Rate | X1 | KX1 | X2 | KX2 | Y1 | KY1 | Y2 | KY2 | M |
|---|---|---|---|---|---|---|---|---|---|
| 8/15 | 32 | 720 | 14 | 1080 | 4 | 1440 | 3 | 5400 | 7560 |
| 10/15 | 25 | 720 | 14 | 1440 | 4 | 360 | 3 | 8280 | 5400 |
| 12/15 | 14 | 2160 | — | 0 | 4 | 720 | 3 | 10080 | 3240 |

CODE LENGTH : N=64800

CODING RATE : {7, 9, 11, 13}/15

| Rate | PERFORMANCE THRESHOLD (Es/NO) | MINIMUM CYCLE LENGTH |
|---|---|---|
| 7/15 | -0.093751 | 6 |
| 9/15 | 1.658523 | 8 |
| 11/15 | 3.351930 | 6 |
| 13/15 | 5.301749 | 6 |

| Rate | X1 | KX1 | X2 | KX2 | Y1 | KY1 | Y2 | KY2 | M |
|---|---|---|---|---|---|---|---|---|---|
| 7/15 | 33 | 2160 | 15 | 5040 | 4 | 0 | 3 | 23040 | 34560 |
| 9/15 | 19 | 6840 | — | 0 | 4 | 6840 | 3 | 25200 | 25920 |
| 11/15 | 15 | 8280 | — | 0 | 4 | 2520 | 3 | 36720 | 17280 |
| 13/15 | 13 | 9360 | — | 0 | 4 | 360 | 3 | 46440 | 8640 |

CODE LENGTH : N=64800
CODING RATE : [6, 8, 12] /15

| Rate | X1 | KX1 | X2 | KX2 | Y1 | KY1 | Y2 | KY2 | M |
|---|---|---|---|---|---|---|---|---|---|
| 6/15 | 27 | 4680 | — | 0 | 4 | 13680 | 3 | 7560 | 38880 |
| 8/15 | 19 | 7200 | — | 0 | 4 | 5760 | 3 | 21600 | 30240 |
| 12/15 | 14 | 9360 | — | 0 | 4 | 0 | 3 | 42480 | 12960 |

PROVIDED BY Samsung

CODE LENGTH : N=16200
CODING RATE : {6, 7, 9, 11, 13} /15

| Rate | X1 | KX1 | X2 | KX2 | Y1 | KY1 | Y2 | KY2 | M |
|---|---|---|---|---|---|---|---|---|---|
| 6/15 | 30 | 1080 | – | – | 4 | 3600 | 3 | 1800 | 9720 |
| 7/15 | 24 | 1440 | – | – | 4 | 2520 | 3 | 3600 | 8640 |
| 9/15 | 16 | 1080 | 10 | 720 | 9 | 1080 | 3 | 6840 | 6480 |
| 11/15 | 12 | 2520 | – | – | – | – | 3 | 9360 | 4320 |
| 13/15 | 13 | 2160 | – | – | 4 | 3600 | 3 | 8280 | 2160 |

PROVIDED BY LGE

CODE LENGTH : N=64800
CODING RATE : 10/15

| Rate | X1 | KX1 | X2 | KX2 | Y1 | KY1 | Y2 | KY2 | M |
|---|---|---|---|---|---|---|---|---|---|
| 10/15 | 14 | 8640 | 9 | 2160 | 4 | 0 | 3 | 32400 | 21600 |

PROVIDED BY LGE

CODE LENGTH : N=64800
CODING RATE : 9/15

| Rate | X1 | KX1 | X2 | KX2 | Y1 | KY1 | Y2 | KY2 | M |
|---|---|---|---|---|---|---|---|---|---|
| 9/15 | 35 | 2520 | 8 | 11520 | 4 | 1080 | 3 | 23760 | 25920 |

PROVIDED BY NERC

CODE LENGTH : N=16200
CODING RATE : 5/15

| Rate | N | K | N-K | g | Q1 | Q2 |
|---|---|---|---|---|---|---|
| 5/15 | 16200 | 5400 | 10800 | 720 | 2 | 28 |

*Q1=g/360, Q2=(N-K-g)/360

PROVIDED BY CRC/ETRI

CODE LENGTH : N=64800
CODING RATE : {5, 6, 7}/15

| Rate | N | K | N-K | M1 | M2 | Q1 | Q2 |
|---|---|---|---|---|---|---|---|
| 5/15 | 64800 | 21600 | 43200 | 1440 | 41760 | 4 | 116 |
| 6/15 | 64800 | 25920 | 38880 | 1080 | 37800 | 3 | 105 |
| 7/15 | 64800 | 30240 | 34560 | 1080 | 33480 | 3 | 93 |

*M1=g, M2=N-K-g, Q1=M1/360, Q2=M2/360

PROVIDED BY CRC/ETRI

FIG. 84
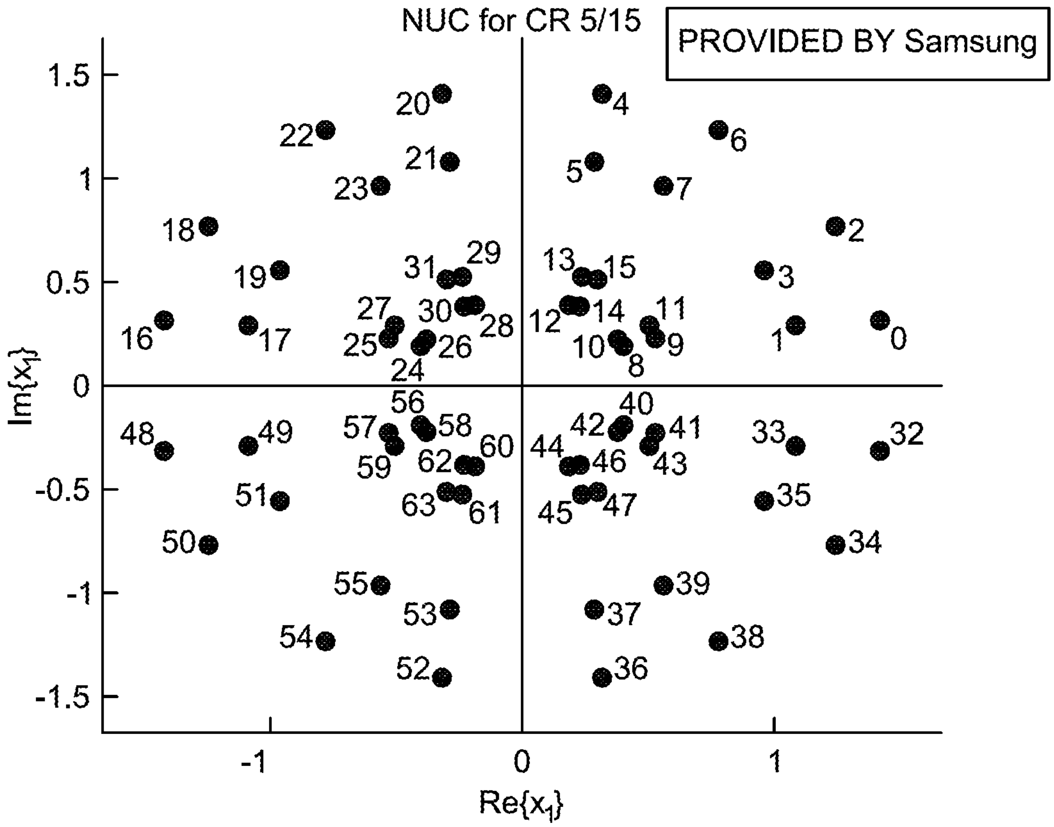
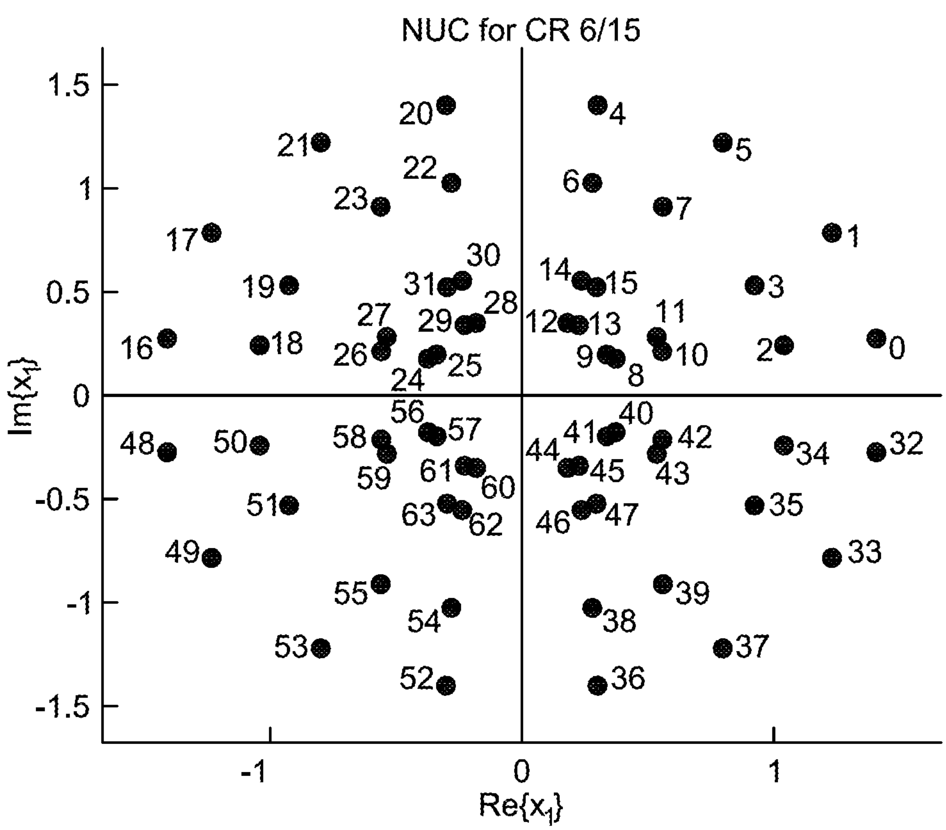

FIG. 84 (Cont'd)
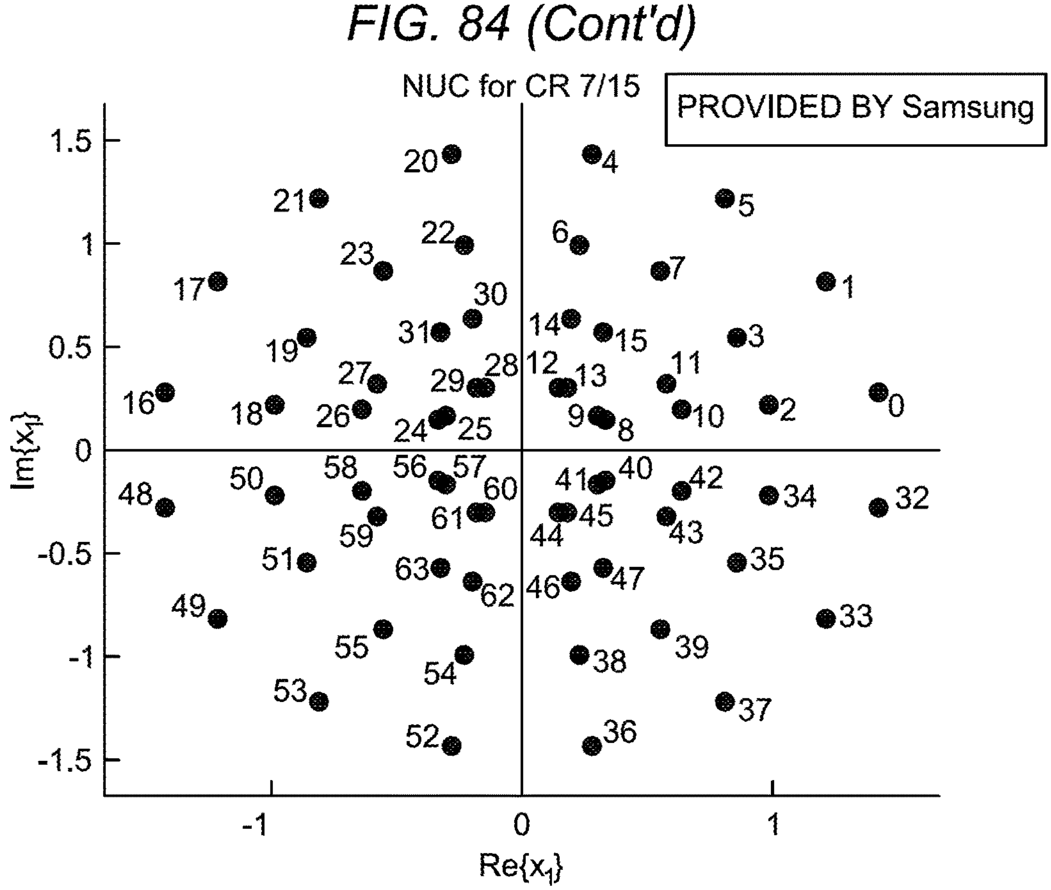
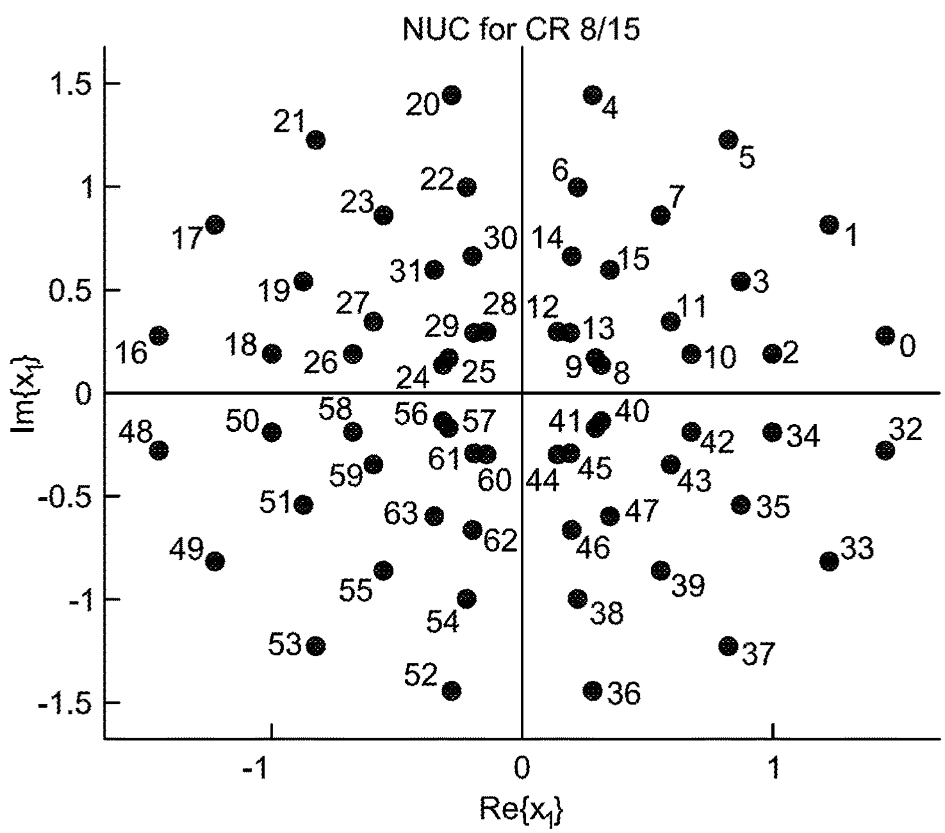

*FIG. 84 (Cont'd)*
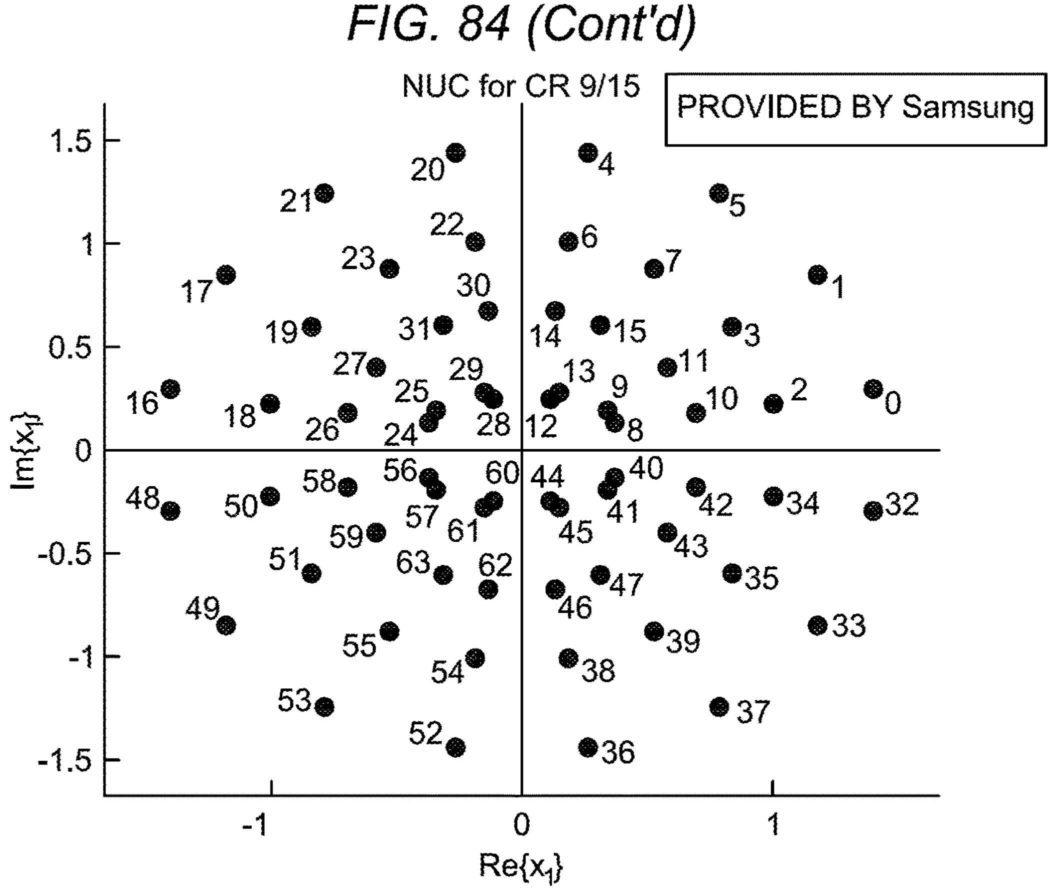
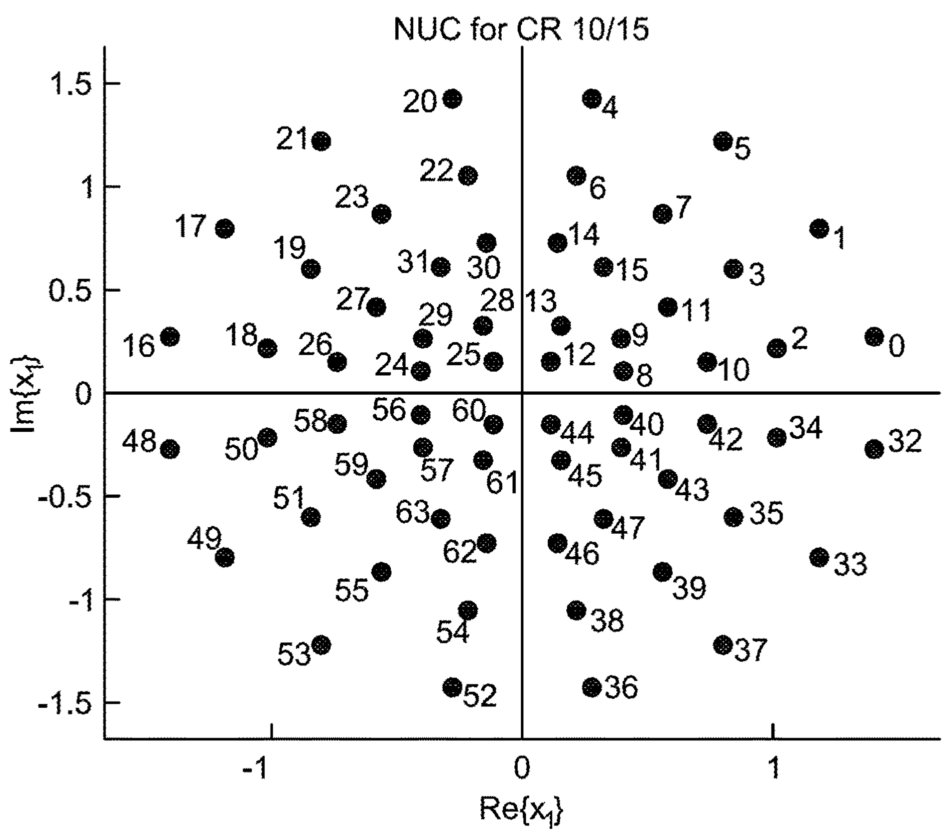

FIG. 84 (Cont'd)
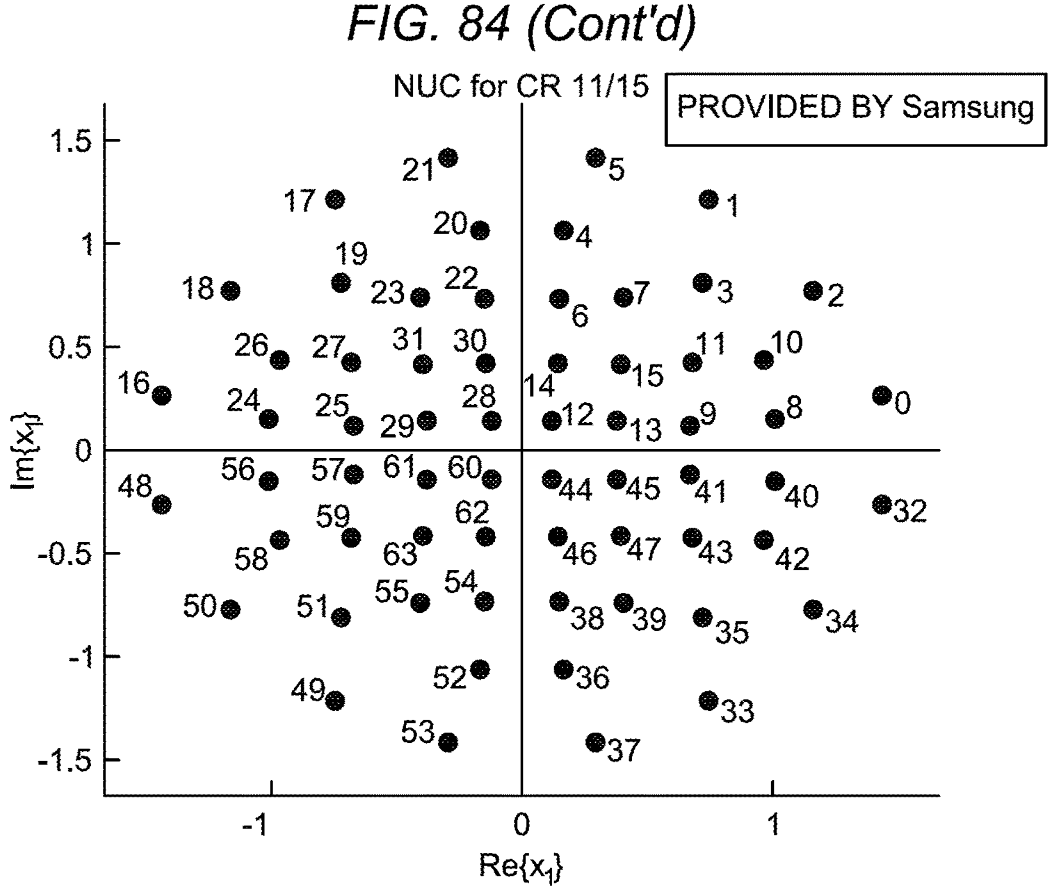
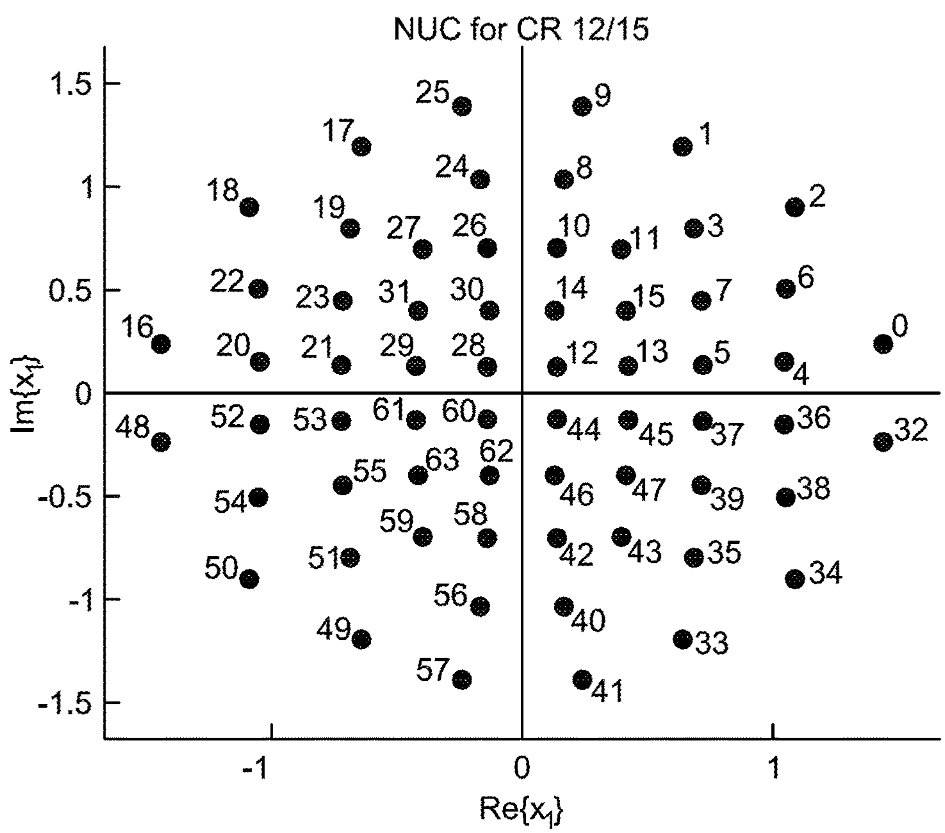

FIG. 86 (Cont'd)
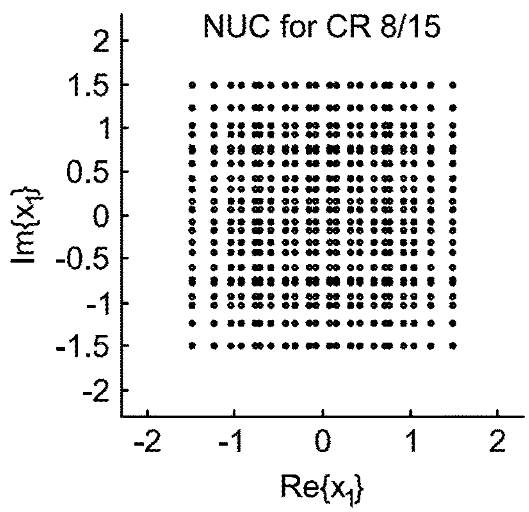
PROVIDED BY Samsung
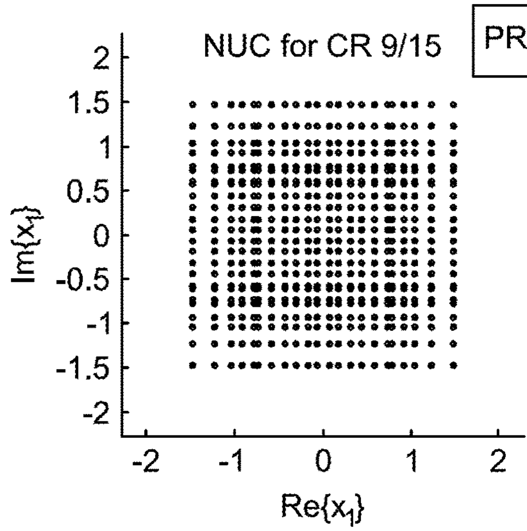
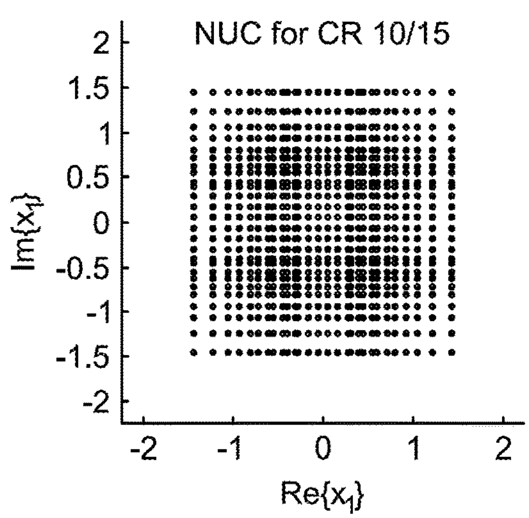

FIG. 86 (Cont'd)
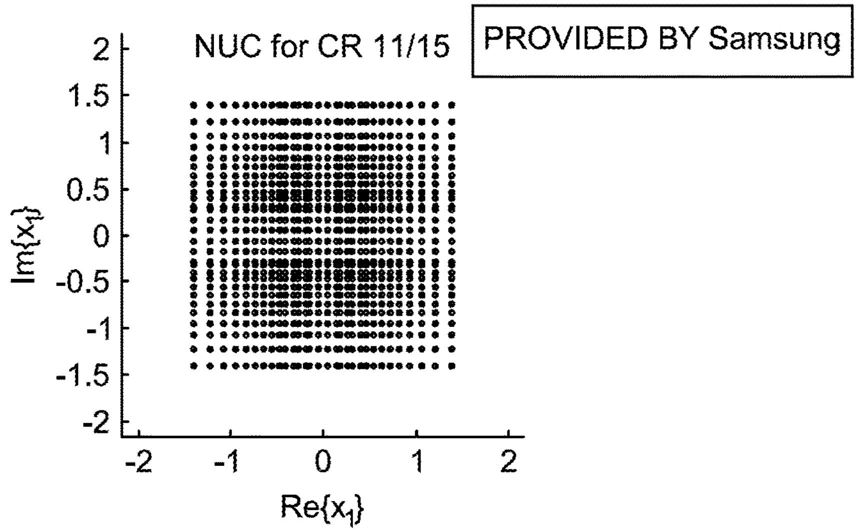
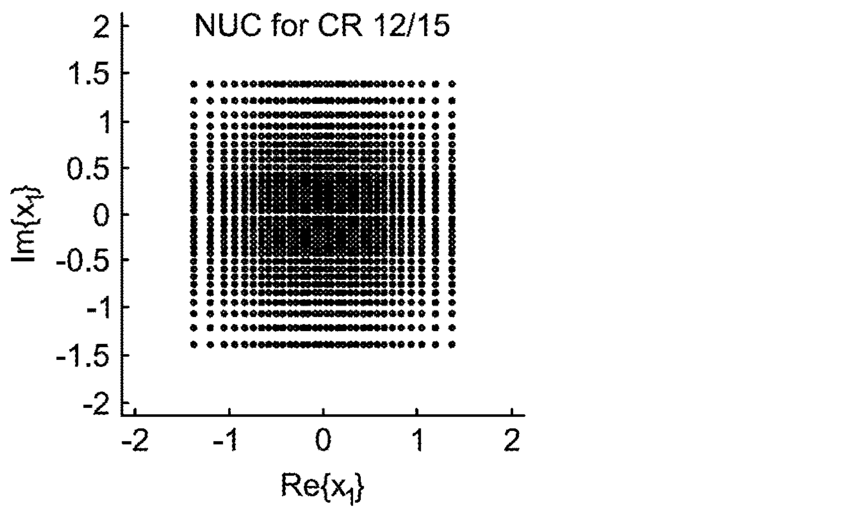
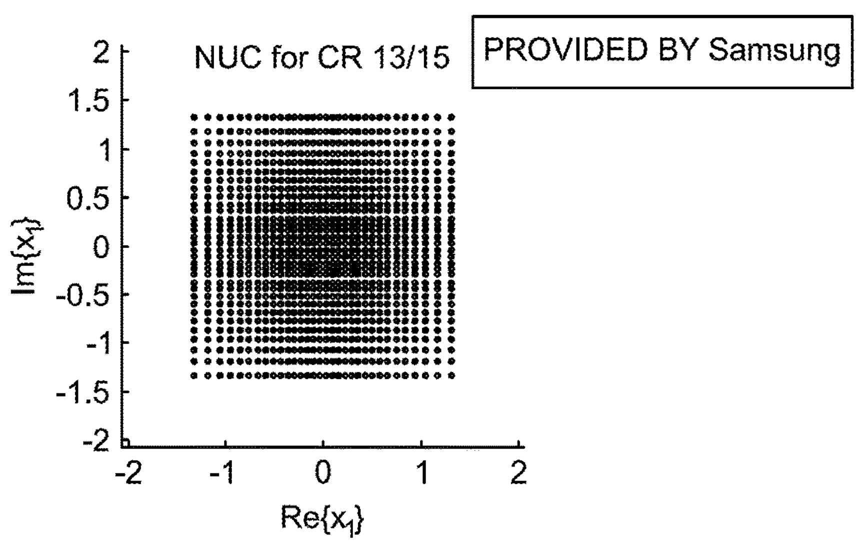

FIG. 87

| Input cell word y | Constellation point zq |
|---|---|
| (00) | $(1+1i)/\sqrt{2}$ |
| (01) | $(1-1i)/\sqrt{2}$ |
| (10) | $(-1+1i)/\sqrt{2}$ |
| (11) | $(-1-1i)/\sqrt{2}$ |

FIG. 88

| w/Shape | NUC_16_5/15 | NUC_16_6/15 | NUC_16_7/15 | NUC_16_8/15 |
|---|---|---|---|---|
| w0 | 0.5309 + 1.1928i | 0.5115 + 1.2092i | 0.5029 + 1.1949i | 0.4951 + 1.2068i |
| w1 | 1.1928 + 0.5309i | 1.2092 + 0.5115i | 1.1962 + 0.5050i | 1.2068 + 0.4951i |
| w2 | 0.2842 + 0.4633i | 0.2663 + 0.4530i | 0.2632 + 0.4959i | 0.2575 + 0.4819i |
| w3 | 0.4633 + 0.2842i | 0.4530 + 0.2663i | 0.4993 + 0.2625i | 0.4819 + 0.2575i |

| w/Shape | NUC_16_9/15 | NUC_16_10/15 | NUC_16_11/15 | NUC_16_12/15 | NUC_16_13/15 |
|---|---|---|---|---|---|
| w0 | 0.4967 + 1.1932i | 0.4487 + 1.1657i | 0.9342 + 0.9847i | 0.9555 + 0.9555i | 0.9517 + 0.9511i |
| w1 | 1.1896 + 0.4896i | 1.2080 + 0.5377i | 0.9866 + 0.2903i | 0.9555 + 0.2949i | 0.9524 + 0.3061i |
| w2 | 0.2452 + 0.5326i | 0.2213 + 0.4416i | 0.2716 + 0.9325i | 0.2949 + 0.9555i | 0.3067 + 0.9524i |
| w3 | 0.5210 + 0.2440i | 0.6186 + 0.2544i | 0.2901 + 0.2695i | 0.2949 + 0.2949i | 0.3061 + 0.3067i |

FIG. 89

| w/Shape | NUC_64_5/15 | NUC_64_6/15 | NUC_64_7/15 | NUC_64_8/15 |
|---|---|---|---|---|
| w0 | 1.4327+0.3305i | 1.4521+0.3005i | 1.4865+0.2932i | 1.4827+0.2920i |
| w1 | 1.0909+0.2971i | 1.2657+0.8178i | 1.2618+0.8446i | 1.2563+0.8411i |
| w2 | 1.2484+0.7803i | 1.0666+0.2744i | 1.0271+0.2345i | 1.0211+0.2174i |
| w3 | 0.9762+0.5715i | 0.9500+0.5641i | 0.8976+0.5624i | 0.8798+0.5702i |
| w4 | 0.3309+1.4326i | 0.3011+1.4529i | 0.2943+1.4811i | 0.2920+1.4827i |
| w5 | 0.2979+1.0923i | 0.8202+1.2651i | 0.8402+1.2602i | 0.8410+1.2563i |
| w6 | 0.7829+1.2477i | 0.2750+1.0676i | 0.2356+1.0261i | 0.2174+1.0211i |
| w7 | 0.5739+0.9763i | 0.5656+0.9499i | 0.5632+0.8957i | 0.5702+0.8798i |
| w8 | 0.3901+0.2112i | 0.3553+0.1948i | 0.3147+0.1567i | 0.3040+0.1475i |
| w9 | 0.5317+0.2475i | 0.3569+0.2094i | 0.3116+0.1730i | 0.3028+0.1691i |
| w10 | 0.3945+0.2289i | 0.5696+0.2431i | 0.6512+0.2053i | 0.6855+0.1871i |
| w11 | 0.5236+0.2894i | 0.5410+0.3002i | 0.5965+0.3353i | 0.6126+0.3563i |
| w12 | 0.2108+0.3911i | 0.1946+0.3566i | 0.1567+0.3125i | 0.1475+0.3040i |
| w13 | 0.2475+0.5327i | 0.2094+0.3579i | 0.1733+0.3091i | 0.1691+0.3028i |
| w14 | 0.2287+0.3955i | 0.2430+0.5697i | 0.2056+0.6506i | 0.1871+0.6855i |
| w15 | 0.2898+0.5246i | 0.3004+0.5417i | 0.3364+0.5943i | 0.3563+0.6126i |

| w/Shape | NUC_64_9/15 | NUC_64_10/15 | NUC_64_11/15 | NUC_64_12/15 | NUC_64_13/15 |
|---|---|---|---|---|---|
| w0 | 1.4678+0.3029i | 1.4388+0.2878i | 1.4443+0.2683i | 1.4480+0.2403i | 1.4303+0.2329i |
| w1 | 1.2296+0.8500i | 1.2150+0.8133i | 0.7471+1.2243i | 0.6406+1.1995i | 0.6297+1.1818i |
| w2 | 1.0496+0.2245i | 1.0386+0.2219i | 1.1749+0.7734i | 1.0952+0.9115i | 1.0803+0.9154i |
| w3 | 0.8739+0.6079i | 0.8494+0.6145i | 0.7138+0.8201i | 0.6868+0.8108i | 0.6870+0.8095i |
| w4 | 0.2834+1.4645i | 0.2931+1.4656i | 0.1638+1.0769i | 1.0500+0.1642i | 1.0444+0.1681i |
| w5 | 0.8084+1.2532i | 0.8230+1.2278i | 0.2927+1.4217i | 0.7170+0.1473i | 0.7240+0.1548i |
| w6 | 0.2038+1.0260i | 0.2069+1.0649i | 0.1462+0.7457i | 1.0519+0.5188i | 1.0553+0.5250i |
| w7 | 0.5574+0.8905i | 0.5677+0.8971i | 0.4134+0.7408i | 0.7146+0.4532i | 0.7142+0.4710i |
| w8 | 0.3884+0.1313i | 0.4119+0.1177i | 1.0203+0.1517i | 0.1677+1.0405i | 0.2114+1.4305i |
| w9 | 0.3771+0.1914i | 0.3998+0.2516i | 0.6653+0.1357i | 0.2402+1.4087i | 0.2020+1.0575i |
| w10 | 0.7243+0.1762i | 0.7442+0.1559i | 0.9639+0.4465i | 0.1369+0.7073i | 0.1221+0.6613i |
| w11 | 0.6116+0.4008i | 0.5954+0.4328i | 0.6746+0.4339i | 0.4044+0.7057i | 0.3735+0.7557i |
| w12 | 0.1358+0.2445i | 0.1166+0.1678i | 0.1271+0.1428i | 0.1374+0.1295i | 0.1455+0.1275i |
| w13 | 0.1677+0.2860i | 0.1582+0.3325i | 0.3782+0.1406i | 0.4185+0.1357i | 0.4322+0.1389i |
| w14 | 0.1555+0.6756i | 0.1355+0.7408i | 0.1311+0.4288i | 0.1325+0.3998i | 0.1432+0.3852i |
| w15 | 0.3472+0.6007i | 0.3227+0.6200i | 0.3919+0.4276i | 0.4122+0.4120i | 0.4220+0.4278i |

*FIG. 90*

| w/Shape | NUC_256_5/15 | NUC_256_6/15 | NUC_256_7/15 | NUC_256_8/15 |
|---|---|---|---|---|
| w0 | 0.3454+1.7407 i | 0.6800+1.6926 i | 0.1256+0.2068 i | 1.0804+1.3788 i |
| w1 | 0.2848+1.4216 i | 0.3911+1.3645 i | 0.1255+0.2077 i | 1.0487+0.9862 i |
| w2 | 0.2900+1.4190 i | 0.2191+1.7524 i | 0.1265+0.2240 i | 1.6464+0.7428 i |
| w3 | 0.2737+1.3492 i | 0.2274+1.4208 i | 0.1264+0.2247 i | 1.3245+0.9414 i |
| w4 | 0.9875+1.4751 i | 0.8678+1.2487 i | 0.1557+0.2325 i | 0.7198+1.2427 i |
| w5 | 0.8056+1.2096 i | 0.7275+1.1667 i | 0.1555+0.2328 i | 0.8106+1.0040 i |
| w6 | 0.8024+1.2105 i | 0.8747+1.0470 i | 0.1594+0.2446 i | 0.5595+1.0317 i |
| w7 | 0.7633+1.1501 i | 0.7930+1.0406 i | 0.1590+0.2447 i | 0.6118+0.9722 i |
| w8 | 0.2418+1.0058 i | 0.2098+0.9768 i | 0.1383+0.6402 i | 1.6768+0.2002 i |
| w9 | 0.2421+1.0268 i | 0.2241+1.0454 i | 0.1417+0.6402 i | 0.9997+0.6844 i |
| w10 | 0.2430+1.0263 i | 0.1858+1.9878 i | 0.1344+0.6027 i | 1.4212+0.4769 i |
| w11 | 0.2435+1.0473 i | 0.1901+1.0659 i | 0.1366+0.6023 i | 1.1479+0.6312 i |
| w12 | 0.5466+0.8834 i | 0.5547+0.8312 i | 0.3330+0.5769 i | 0.6079+0.6566 i |
| w13 | 0.5600+0.8986 i | 0.5479+0.8651 i | 0.3228+0.5787 i | 0.7284+0.6957 i |
| w14 | 0.5596+0.8990 i | 0.6073+0.8182 i | 0.3099+0.5483 i | 0.5724+0.7031 i |
| w15 | 0.5732+0.9141 i | 0.5955+0.8420 i | 0.3017+0.5493 i | 0.6302+0.7259 i |
| w16 | 1.7419+0.3438 i | 1.4070+0.1790 i | 0.4168+0.1173 i | 0.1457+1.4010 i |
| w17 | 1.4213+0.2870 i | 1.7227+0.2900 i | 0.4168+0.1185 i | 0.1866+1.7346 i |
| w18 | 1.4197+0.2879 i | 1.3246+0.2562 i | 0.4205+0.1200 i | 0.1174+1.1035 i |
| w19 | 1.3494+0.2745 i | 1.3636+0.3854 i | 0.4202+0.1215 i | 0.1095+1.0132 i |
| w20 | 1.4793+0.9855 i | 1.3708+1.2834 i | 0.3852+0.1797 i | 0.4357+1.3636 i |
| w21 | 1.2123+0.8007 i | 1.6701+0.8403 i | 0.3860+0.1803 i | 0.5853+1.6820 i |
| w22 | 1.2118+0.7988 i | 1.1614+0.7909 i | 0.3867+0.1760 i | 0.3439+1.0689 i |
| w23 | 1.1521+0.7597 i | 1.2241+0.7367 i | 0.3879+0.1765 i | 0.3234+0.9962 i |
| w24 | 1.0044+0.2394 i | 0.9769+0.1863 i | 0.7366+0.1528 i | 0.1092+0.6174 i |
| w25 | 1.0250+0.2403 i | 0.9452+0.2057 i | 0.7255+0.1884 i | 0.1074+0.6307 i |
| w26 | 1.0252+0.2408 i | 1.0100+0.2182 i | 0.7219+0.1535 i | 0.1109+0.6996 i |
| w27 | 1.0460+0.2418 i | 0.9795+0.2417 i | 0.7117+0.1857 i | 0.1076+0.7345 i |
| w28 | 0.8845+0.5424 i | 0.8241+0.4856 i | 0.5825+0.4149 i | 0.3291+0.6264 i |
| w29 | 0.8997+0.5562 i | 0.8232+0.4837 i | 0.6012+0.4001 i | 0.3126+0.6373 i |
| w30 | 0.9000+0.5558 i | 0.8799+0.5391 i | 0.5715+0.3988 i | 0.3392+0.6999 i |
| w31 | 0.9148+0.5690 i | 0.8796+0.5356 i | 0.5889+0.3864 i | 0.3202+0.7282 i |

FIG. 90 (Cont'd)

| | | | | |
|---|---|---|---|---|
| w32 | 0.1617+0.3255 i | 0.1376+0.3342 i | 0.1671+1.7095 i | 0.9652+0.1066 i |
| w33 | 0.1624+0.3255 i | 0.1383+0.3292 i | 0.4420+1.6137 i | 0.9075+0.1666 i |
| w34 | 0.1624+0.3255 i | 0.1363+0.3322 i | 0.1477+1.3374 i | 0.9724+0.1171 i |
| w35 | 0.1621+0.3256 i | 0.1370+0.3273 i | 0.3135+1.3073 i | 0.9186+0.1752 i |
| w36 | 0.1790+0.3237 i | 0.1655+0.3265 i | 1.0214+1.3784 i | 0.6342+0.1372 i |
| w37 | 0.1789+0.3238 i | 0.1656+0.3227 i | 0.7434+1.5169 i | 0.6550+0.1495 i |
| w38 | 0.1791+0.3239 i | 0.1634+0.3246 i | 0.7869+1.1040 i | 0.6290+0.1393 i |
| w39 | 0.1791+0.3240 i | 0.1636+0.3208 i | 0.6252+1.2041 i | 0.6494+0.1504 i |
| w40 | 0.2113+0.6188 i | 0.1779+0.6841 i | 0.1526+1.9140 i | 1.3127+0.1240 i |
| w41 | 0.2119+0.6257 i | 0.1828+0.6845 i | 0.1914+0.9087 i | 0.9572+0.4344 i |
| w42 | 0.2122+0.6254 i | 0.1745+0.6828 i | 0.1539+1.0179 i | 1.2403+0.2631 i |
| w43 | 0.2127+0.6319 i | 0.1793+0.6829 i | 0.2095+1.0084 i | 1.0254+0.4130 i |
| w44 | 0.3178+0.5735 i | 0.3547+0.6009 i | 0.5021+0.7976 i | 0.6096+0.4214 i |
| w45 | 0.3218+0.5787 i | 0.3593+0.6011 i | 0.4537+0.8238 i | 0.6773+0.4284 i |
| w46 | 0.3215+0.5788 i | 0.3576+0.5990 i | 0.5663+0.8802 i | 0.5995+0.4102 i |
| w47 | 0.3257+0.5842 i | 0.3624+0.5994 i | 0.5021+0.9146 i | 0.6531+0.4101 i |
| w48 | 0.3188+0.1624 i | 0.2697+0.1443 i | 1.7030+0.1913 i | 0.1250+0.1153 i |
| w49 | 0.3195+0.1623 i | 0.2704+0.1433 i | 1.6116+0.5458 i | 0.1252+0.1158 i |
| w50 | 0.3195+0.1624 i | 0.2644+0.1442 i | 1.3788+0.1641 i | 0.1245+0.1152 i |
| w51 | 0.3201+0.1623 i | 0.2650+0.1432 i | 1.3121+0.4320 i | 0.1247+0.1156 i |
| w52 | 0.3184+0.1783 i | 0.2763+0.1638 i | 1.2722+1.1406 i | 0.3768+0.1244 i |
| w53 | 0.3196+0.1785 i | 0.2768+0.1626 i | 1.4536+0.8623 i | 0.3707+0.1237 i |
| w54 | 0.3189+0.1791 i | 0.2715+0.1630 i | 1.0204+0.9076 i | 0.3779+0.1260 i |
| w55 | 0.3200+0.1794 i | 0.2719+0.1618 i | 1.1634+0.7212 i | 0.3717+0.1252 i |
| w56 | 0.6175+0.2099 i | 0.6488+0.1696 i | 0.9979+0.1554 i | 0.1161+0.3693 i |
| w57 | 0.6234+0.2098 i | 0.6462+0.1706 i | 0.9681+0.2706 i | 0.1157+0.3645 i |
| w58 | 0.6230+0.2110 i | 0.6456+0.1745 i | 1.0796+0.1672 i | 0.1176+0.3469 i |
| w59 | 0.6291+0.2117 i | 0.6431+0.1753 i | 1.0514+0.3095 i | 0.1171+0.3424 i |
| w60 | 0.5729+0.3146 i | 0.5854+0.3186 i | 0.7488+0.6179 i | 0.3530+0.3899 i |
| w61 | 0.5781+0.3186 i | 0.5862+0.3167 i | 0.8017+0.5596 i | 0.3422+0.3808 i |
| w62 | 0.5779+0.3188 i | 0.5864+0.3275 i | 0.8168+0.6803 i | 0.3614+0.3755 i |
| w63 | 0.5831+0.3226 i | 0.5873+0.3254 i | 0.8882+0.5928 i | 0.3509+0.3656 i |

*FIG. 91*

| w/Shape | NUC_256_9/15 | NUC_256_10/15 | NUC_256_11/15 | NUC_256_12/15 | NUC_256_13/15 |
|---|---|---|---|---|---|
| w0 | 0.0899+0.1337 i | 1.6097+0.1548 i | 0.0591+0.3040 i | 1.1980+1.1541 i | 1.5315+0.2812 i |
| w1 | 0.0910+0.1377 i | 1.5549+0.4605 i | 0.1067+0.3390 i | 0.9192+1.2082 i | 0.9982+1.2680 i |
| w2 | 0.0873+0.3862 i | 1.3226+0.1290 i | 0.0687+0.4930 i | 1.2778+0.8523 i | 1.2623+0.9828 i |
| w3 | 0.0883+0.3873 i | 1.2772+0.3829 i | 0.1491+0.4650 i | 1.0390+0.9253 i | 1.0130+1.0317 i |
| w4 | 0.1115+0.1442 i | 1.2753+1.0242 i | 0.0887+0.2236 i | 0.6057+1.2200 i | 0.5551+1.2232 i |
| w5 | 0.1135+0.1472 i | 1.4434+0.7540 i | 0.1828+0.2696 i | 0.7371+1.4217 i | 0.7500+1.3030i |
| w6 | 0.2067+0.3591 i | 1.0491+0.8476 i | 0.3356+0.3853 i | 0.6678+1.0021 i | 0.6087+1.0227 i |
| w7 | 0.1975+0.3621 i | 1.1861+0.6253 i | 0.2702+0.3881 i | 0.8412+0.9448 i | 0.7948+1.0535 i |
| w8 | 0.1048+0.7533 i | 0.9326+0.0970 i | 0.0835+0.7880 i | 1.2128+0.5373 i | 1.4036+0.5215 i |
| w9 | 0.1770+0.7412 i | 0.8962+0.2804 i | 0.2394+0.7591 i | 1.0048+0.5165 i | 0.9890+0.6534 i |
| w10 | 0.1022+0.5904 i | 1.1044+0.1102 i | 0.0760+0.6412 i | 1.4321+0.6343 i | 1.2520+0.7351 i |
| w11 | 0.1191+0.5890 i | 1.0648+0.3267 i | 0.1987+0.6157 i | 1.0245+0.7152 i | 1.0227+0.8252 i |
| w12 | 0.4264+0.6230 i | 0.7325+0.6071 i | 0.5245+0.6123 i | 0.6384+0.6073 i | 0.6403+0.6582 i |
| w13 | 0.3650+0.6689 i | 0.8260+0.4559 i | 0.3927+0.6985 i | 0.8175+0.5684 i | 0.8060+0.6652 i |
| w14 | 0.3254+0.5153 i | 0.8744+0.7153 i | 0.4287+0.4942 i | 0.6568+0.7801 i | 0.6373+0.8319 i |
| w15 | 0.2959+0.5302 i | 0.9882+0.5300 i | 0.3318+0.5634 i | 0.8311+0.7459 i | 0.8148+0.8469 i |
| w16 | 0.3256+0.0768 i | 0.1646+1.6407 i | 0.0989+0.0607 i | 0.1349+1.4742 i | 0.0862+1.1910 i |
| w17 | 0.3266+0.0870 i | 0.4867+1.5743 i | 0.2630+0.0643 i | 0.1105+1.2309 i | 0.1233+1.4227 i |
| w18 | 0.4721+0.0994 i | 0.1363+1.3579 i | 0.4932+0.0751 i | 0.0634+0.9796 i | 0.0755+0.9944 i |
| w19 | 0.4721+0.1206 i | 0.4023+1.3026 i | 0.4161+0.0867 i | 0.1891+1.0198 i | 0.2181+0.9629 i |

FIG. 91 (Cont'd)

| | | | | | |
|---|---|---|---|---|---|
| w20 | 0.2927+0.1267 i | 1.0542+1.2584 i | 0.0968+0.0986 i | 0.4142+1.4461 i | 0.4487+1.4550 i |
| w21 | 0.2947+0.1296 i | 0.7875+1.4450 i | 0.2399+0.1452 i | 0.3323+1.2279 i | 0.3074+1.2765 i |
| w22 | 0.3823+0.2592 i | 0.8687+1.0407 i | 0.4202+0.2731 i | 0.4998+0.9827 i | 0.4457+0.9767 i |
| w23 | 0.3944+0.2521 i | 0.6502+1.1951 i | 0.3814+0.2140 i | 0.3467+1.0202 i | 0.3244+1.0818 i |
| w24 | 0.7755+0.1118 i | 0.0982+0.9745 i | 0.8082+0.0772 i | 0.0680+0.6501 i | 0.0654+0.6354 i |
| w25 | 0.7513+0.2154 i | 0.2842+0.9344 i | 0.7885+0.2238 i | 0.2016+0.6464 i | 0.1971+0.6324 i |
| w26 | 0.6591+0.1033 i | 0.1142+1.1448 i | 0.6399+0.0777 i | 0.0719+0.8075 i | 0.0669+0.8037 i |
| w27 | 0.6446+0.1737 i | 0.3385+1.0973 i | 0.6420+0.1790 i | 0.2088+0.8146 i | 0.2018+0.7966 i |
| w28 | 0.5906+0.4930 i | 0.6062+0.7465 i | 0.6417+0.5007 i | 0.4809+0.6296 i | 0.4855+0.6442 i |
| w29 | 0.6538+0.4155 i | 0.4607+0.8538 i | 0.7299+0.3774 i | 0.3374+0.6412 i | 0.3382+0.6322 i |
| w30 | 0.4981+0.3921 i | 0.7263+0.8764 i | 0.5309+0.3792 i | 0.4955+0.8008 i | 0.4757+0.8090 i |
| w31 | 0.5373+0.3586 i | 0.5450+1.0067 i | 0.5944+0.3031 i | 0.3431+0.8141 i | 0.3361+0.7848 i |
| w32 | 0.1630+1.6621 i | 0.2655+0.0746 i | 0.1546+1.5857 i | 1.2731+0.1108 i | 1.1297+0.0851 i |
| w33 | 0.4720+1.5898 i | 0.2664+0.0759 i | 0.4570+1.5271 i | 1.0794+0.0977 i | 0.9487+0.0716 i |
| w34 | 0.1268+1.3488 i | 0.4571+0.0852 i | 0.1299+1.3237 i | 1.5126+0.1256 i | 1.3237+0.1117 i |
| w35 | 0.3752+1.2961 i | 0.4516+0.1062 i | 0.3843+1.2747 i | 0.9029+0.0853 i | 0.9393+0.2065 i |
| w36 | 1.0398+1.2991 i | 0.2559+0.1790 i | 1.0096+1.2448 i | 0.5429+0.0694 i | 0.6190+0.0700 i |
| w37 | 0.7733+1.4772 i | 0.2586+0.1772 i | 0.7469+1.4138 i | 0.6795+0.0559 i | 0.7738+0.0686 i |
| w38 | 0.8380+1.0552 i | 0.3592+0.2811 i | 0.8493+1.0396 i | 0.5628+0.1945 i | 0.6220+0.2081 i |
| w39 | 0.6242+1.2081 i | 0.3728+0.2654 i | 0.6271+1.1808 i | 0.7326+0.1410 i | 0.7757+0.2088 i |
| w40 | 0.1103+0.9397 i | 0.7706+0.0922 i | 0.0962+0.9482 i | 1.2283+0.3217 i | 1.1814+0.4884 i |
| w41 | 0.2415+0.9155 i | 0.7407+0.2260 i | 0.2825+0.9136 i | 1.0269+0.3261 i | 0.9824+0.4891 i |

FIG. 91 (Cont'd)

| | | | | | |
|---|---|---|---|---|---|
| w42 | 0.1118+1.1163 i | 0.6180+0.0927 i | 0.1111+1.1188 i | 1.4663+0.3716 i | 1.1993+0.3009 i |
| w43 | 0.3079+1.0866 i | 0.6019+0.1658 i | 0.3278+1.0767 i | 0.9085+0.2470 i | 0.9901+0.3353 i |
| w44 | 0.5647+0.7638 i | 0.6007+0.4980 i | 0.6212+0.7418 i | 0.6160+0.4549 i | 0.6359+0.4984 i |
| w45 | 0.4385+0.8433 i | 0.6673+0.3928 i | 0.4618+0.8431 i | 0.7818+0.4247 i | 0.8014+0.4986 i |
| w46 | 0.6846+0.8841 i | 0.4786+0.3935 i | 0.7246+0.8784 i | 0.5938+0.3170 i | 0.6291+0.3515 i |
| w47 | 0.5165+1.0034 i | 0.5176+0.3391 i | 0.5361+0.9967 i | 0.7600+0.2850 i | 0.7895+0.3529 i |
| w48 | 0.6489+0.1630 i | 0.0757+0.1003 i | 1.6072+0.1609 i | 0.0595+0.0707 i | 0.0671+0.0678 i |
| w49 | 1.5848+0.4983 i | 0.0753+0.1004 i | 1.5432+0.4731 i | 0.1722+0.0706 i | 0.1990+0.0681 i |
| w50 | 1.3437+0.1389 i | 0.0777+0.4788 i | 1.3489+0.1333 i | 0.0599+0.2119 i | 0.0672+0.2013 i |
| w51 | 1.2850+0.4025 i | 0.0867+0.4754 i | 1.2954+0.3928 i | 0.1748+0.2114 i | 0.2001+0.2020 i |
| w52 | 1.2728+1.0661 i | 0.1023+0.2243 i | 1.2390+1.0268 i | 0.4134+0.0701 i | 0.4732+0.0691 i |
| w53 | 1.4509+0.7925 i | 0.1010+0.2242 i | 1.4186+0.7656 i | 0.2935+0.0705 i | 0.3357+0.0687 i |
| w54 | 1.0249+0.8794 i | 0.1950+0.3919 i | 1.0410+0.8559 i | 0.4231+0.2066 i | 0.4760+0.2065 i |
| w55 | 1.1758+0.6545 i | 0.1881+0.3961 i | 1.1906+0.6386 i | 0.2979+0.2100 i | 0.3369+0.2036 i |
| w56 | 0.9629+0.1113 i | 0.0930+0.8122 i | 0.9742+0.0932 i | 0.0638+0.5002 i | 0.0662+0.4806 i |
| w57 | 0.9226+0.2849 i | 0.2215+0.7840 i | 0.9407+0.2747 i | 0.1905+0.4966 i | 0.1986+0.4811 i |
| w58 | 1.1062+0.1118 i | 0.0937+0.6514 i | 1.1464+0.1111 i | 0.0612+0.3552 i | 0.0673+0.3384 i |
| w59 | 1.0674+0.3393 i | 0.1540+0.6366 i | 1.1015+0.3295 i | 0.1810+0.3533 i | 0.1996+0.3401 i |
| w60 | 0.7234+0.6223 i | 0.4810+0.6306 i | 0.7601+0.6105 i | 0.4630+0.4764 i | 0.4830+0.4908 i |
| w61 | 0.8211+0.4860 i | 0.3856+0.7037 i | 0.8677+0.4536 i | 0.3231+0.4895 i | 0.3383+0.4845 i |
| w62 | 0.8457+0.7260 i | 0.3527+0.5230 i | 0.8874+0.7222 i | 0.4416+0.3397 i | 0.4783+0.3476 i |
| w63 | 0.9640+0.5518 i | 0.3100+0.5559 i | 1.0145+0.5366 i | 0.3083+0.3490 i | 0.3375+0.3430 i |

FIG. 92

| u/Shape | NUC 1k 5/15 | NUC 1k 6/15 | NUC_1k 7/15 | NUC 1k 8/15 | NUC_1k 9/15 | NUC 1k 10/15 | NUC 1k 11/15 | NUC 1k 12/15 | NUC 1k 13/15 |
|---|---|---|---|---|---|---|---|---|---|
| u1 | 0.9997 | 1.0003 | 0.9963 | 1.0005 | 1.0011 | 1.0772 | 1.2776 | 2.5983 | 2.9754 |
| u2 | 0.9916 | 1.0149 | 1.1928 | 2.0897 | 2.7364 | 2.8011 | 3.2278 | 4.5193 | 4.9978 |
| u3 | 0.9911 | 1.0158 | 1.1963 | 2.0888 | 2.7353 | 2.9634 | 3.6845 | 6.1649 | 7.0187 |
| u4 | 2.4349 | 2.6848 | 3.0187 | 3.9945 | 4.7973 | 4.8127 | 5.5155 | 8.2107 | 9.1029 |
| u5 | 2.4346 | 2.6903 | 3.0304 | 3.9931 | 4.7912 | 5.1864 | 6.3531 | 9.9594 | 11.2221 |
| u6 | 2.486 | 2.882 | 3.6381 | 5.3843 | 6.7638 | 6.7838 | 8.0757 | 12.0321 | 13.4239 |
| u7 | 2.4864 | 2.8747 | 3.6161 | 5.3894 | 6.7793 | 7.5029 | 9.3579 | 13.9574 | 15.6992 |
| u8 | 4.4576 | 4.7815 | 5.5244 | 7.5206 | 9.0009 | 9.2380 | 11.0655 | 16.2598 | 18.0937 |
| u9 | 4.4646 | 4.7619 | 5.4955 | 7.6013 | 9.1536 | 10.3200 | 12.7075 | 18.4269 | 20.6137 |
| u10 | 4.9706 | 5.5779 | 6.7182 | 9.3371 | 11.3648 | 12.0115 | 14.5719 | 20.9273 | 23.2898 |
| u11 | 4.9552 | 5.6434 | 6.9391 | 9.8429 | 12.0321 | 13.5356 | 16.5813 | 23.4863 | 26.1557 |
| u12 | 6.7222 | 7.3854 | 8.7621 | 11.9255 | 14.393 | 15.6099 | 18.8402 | 26.4823 | 29.2399 |
| u13 | 7.0327 | 7.8797 | 9.6592 | 13.3962 | 16.1857 | 17.7524 | 21.3824 | 29.7085 | 32.5936 |
| u14 | 8.5382 | 9.635 | 11.7195 | 15.8981 | 19.1014 | 20.5256 | 24.2862 | 33.6247 | 36.309 |
| u15 | 10.4411 | 11.7874 | 14.3731 | 19.1591 | 22.8664 | 24.1254 | 27.7376 | 38.5854 | 40.584 |

| | | | | | | | | | | | | | | | | |
|---|---|---|---|---|---|---|---|---|---|---|---|---|---|---|---|---|
| y0, q | 1 | 1 | 1 | 1 | 1 | 1 | 1 | 1 | 1 | 1 | 1 | 1 | 1 | 1 | 1 | 1 |
| y2, q | 0 | 0 | 0 | 0 | 0 | 0 | 0 | 0 | 1 | 1 | 1 | 1 | 1 | 1 | 1 | 1 |
| y4, q | 0 | 0 | 0 | 0 | 1 | 1 | 1 | 1 | 1 | 1 | 1 | 1 | 0 | 0 | 0 | 0 |
| y6, q | 0 | 0 | 1 | 1 | 1 | 1 | 0 | 0 | 0 | 0 | 1 | 1 | 1 | 1 | 0 | 0 |
| y8, q | 0 | 1 | 1 | 0 | 0 | 1 | 1 | 0 | 0 | 1 | 1 | 0 | 0 | 1 | 1 | 0 |
| Re ($z_q$) | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | -1 |
| Y0, q | 0 | 0 | 0 | 0 | 0 | 0 | 0 | 0 | 0 | 0 | 0 | 0 | 0 | 0 | 0 | 0 |
| y2, q | 1 | 1 | 1 | 1 | 1 | 1 | 1 | 1 | 0 | 0 | 0 | 0 | 0 | 0 | 0 | 0 |
| y4, q | 0 | 0 | 0 | 0 | 1 | 1 | 1 | 1 | 1 | 1 | 1 | 1 | 0 | 0 | 0 | 0 |
| y6, q | 0 | 0 | 1 | 1 | 1 | 1 | 0 | 0 | 0 | 0 | 1 | 1 | 1 | 1 | 0 | 0 |
| y8, q | 0 | 1 | 1 | 0 | 0 | 1 | 1 | 0 | 0 | 1 | 1 | 0 | 0 | 1 | 1 | 0 |
| Re ($z_q$) | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

B

| | | | | | | | | | | | | | | | | |
|---|---|---|---|---|---|---|---|---|---|---|---|---|---|---|---|---|
| y1, q | 1 | 1 | 1 | 1 | 1 | 1 | 1 | 1 | 1 | 1 | 1 | 1 | 1 | 1 | 1 | 1 |
| y3, q | 0 | 0 | 0 | 0 | 0 | 0 | 0 | 0 | 1 | 1 | 1 | 1 | 1 | 1 | 1 | 1 |
| y5, q | 0 | 0 | 0 | 0 | 1 | 1 | 1 | 1 | 1 | 1 | 1 | 1 | 0 | 0 | 0 | 0 |
| y7, q | 0 | 0 | 1 | 1 | 1 | 1 | 0 | 0 | 0 | 0 | 1 | 1 | 1 | 1 | 0 | 0 |
| y9, q | 0 | 1 | 1 | 0 | 0 | 1 | 1 | 0 | 0 | 1 | 1 | 0 | 0 | 1 | 1 | 0 |
| Im ($z_q$) | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | -1 |
| y1, q | 0 | 0 | 0 | 0 | 0 | 0 | 0 | 0 | 0 | 0 | 0 | 0 | 0 | 0 | 0 | 0 |
| y3, q | 1 | 1 | 1 | 1 | 1 | 1 | 1 | 1 | 0 | 0 | 0 | 0 | 0 | 0 | 0 | 0 |
| y5, q | 0 | 0 | 0 | 0 | 1 | 1 | 1 | 1 | 1 | 1 | 1 | 1 | 0 | 0 | 0 | 0 |
| y7, q | 0 | 0 | 1 | 1 | 1 | 1 | 0 | 0 | 0 | 0 | 1 | 1 | 1 | 1 | 0 | 0 |
| y9, q | 0 | 1 | 1 | 0 | 0 | 1 | 1 | 0 | 0 | 1 | 1 | 0 | 0 | 1 | 1 | 0 |
| Im ($z_q$) | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 95

| | N=64800 | | | | |
|---|---|---|---|---|---|
| | QPSK | 16QAM | 64QAM | 256QAM | 1024QAM |
| C | 2 | 4 | 6 | 8 | 10 |
| R1 | 32400 | 16200 | 10800 | 7920 | 6480 |
| R2 | 0 | 0 | 0 | 180 | 0 |

| | N=16200 | | | | |
|---|---|---|---|---|---|
| | QPSK | 16QAM | 64QAM | 256QAM | 1024QAM |
| C | 2 | 4 | 6 | 8 | 10 |
| R1 | 7920 | 3960 | 2520 | 1800 | 1440 |
| R2 | 180 | 90 | 180 | 225 | 180 |

C: NUMBER OF columns (SYMBOL BIT NUMBER)
R1: NUMBER OF ROWS OF Part1
R2: NUMBER OF ROWS OF Part2

FIG. 98

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 39 | 47 | 96 | 176 | 33 | 75 | 165 | 38 | 27 | 58 | 90 | 76 | 17 | 46 | 10 | 91 | 133 | 69 | 171 | 32 | 117 | 78 |
| 13 | 146 | 101 | 36 | 0 | 138 | 25 | 77 | 122 | 49 | 14 | 125 | 140 | 93 | 130 | 2 | 104 | 102 | 128 | 4 | 111 | 151 |
| 84 | 167 | 35 | 127 | 156 | 55 | 82 | 85 | 66 | 114 | 8 | 147 | 115 | 113 | 5 | 31 | 100 | 106 | 48 | 52 | 67 | 107 |
| 18 | 126 | 112 | 50 | 9 | 143 | 28 | 160 | 71 | 79 | 43 | 98 | 86 | 94 | 64 | 3 | 166 | 105 | 103 | 118 | 63 | 51 |
| 139 | 172 | 141 | 175 | 56 | 74 | 95 | 29 | 45 | 129 | 120 | 168 | 92 | 150 | 7 | 162 | 153 | 137 | 108 | 159 | 157 | 173 |
| 23 | 89 | 132 | 57 | 37 | 70 | 134 | 40 | 21 | 149 | 80 | 1 | 121 | 59 | 110 | 142 | 152 | 15 | 154 | 145 | 12 | 170 |
| 54 | 155 | 99 | 22 | 123 | 72 | 177 | 131 | 116 | 44 | 158 | 73 | 11 | 65 | 164 | 119 | 174 | 34 | 83 | 53 | 24 | 42 |
| 60 | 26 | 161 | 69 | 179 | 41 | 148 | 109 | 87 | 144 | 135 | 20 | 62 | 81 | 169 | 124 | 6 | 19 | 30 | 163 | 61 | 178 |
| 136 | 97 | 16 | 88 | | | | | | | | | | | | | | | | | | |

FIG. 99

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 6 | 14 | 1 | 127 | 161 | 177 | 75 | 123 | 62 | 103 | 17 | 18 | 167 | 88 | 27 | 34 | 8 | 110 | 7 | 78 | 94 | 44 |
| 45 | 166 | 149 | 61 | 163 | 145 | 155 | 157 | 82 | 130 | 70 | 92 | 151 | 139 | 160 | 133 | 26 | 2 | 79 | 15 | 95 | 122 |
| 126 | 178 | 101 | 24 | 138 | 146 | 179 | 30 | 86 | 58 | 11 | 121 | 159 | 49 | 84 | 132 | 117 | 119 | 50 | 52 | 4 | 51 |
| 48 | 74 | 114 | 59 | 40 | 131 | 33 | 89 | 66 | 136 | 72 | 16 | 134 | 37 | 164 | 77 | 99 | 173 | 20 | 158 | 156 | 90 |
| 41 | 176 | 81 | 42 | 60 | 109 | 22 | 150 | 105 | 120 | 12 | 64 | 56 | 96 | 111 | 21 | 148 | 53 | 169 | 97 | 108 | 35 |
| 140 | 91 | 115 | 152 | 36 | 106 | 154 | 0 | 25 | 54 | 63 | 172 | 80 | 168 | 142 | 118 | 162 | 135 | 73 | 83 | 153 | 141 |
| 9 | 28 | 55 | 31 | 112 | 107 | 85 | 100 | 175 | 23 | 57 | 47 | 38 | 170 | 137 | 76 | 147 | 93 | 19 | 98 | 124 | 39 |
| 87 | 174 | 144 | 46 | 10 | 129 | 69 | 71 | 125 | 99 | 116 | 171 | 128 | 65 | 102 | 5 | 43 | 143 | 104 | 13 | 67 | 29 |
| 3 | 113 | 32 | 165 | | | | | | | | | | | | | | | | | | |

FIG. 109

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 12 | 15 | 2 | 16 | 27 | 50 | 35 | 74 | 38 | 70 | 108 | 32 | 112 | 54 | 30 | 122 | 72 | 116 | 36 | 90 | 49 | 85 |
| 132 | 138 | 144 | 150 | 156 | 162 | 168 | 174 | 0 | 14 | 9 | 5 | 23 | 66 | 68 | 52 | 96 | 117 | 84 | 128 | 100 | 63 |
| 60 | 127 | 81 | 99 | 53 | 55 | 103 | 95 | 133 | 139 | 145 | 151 | 157 | 163 | 169 | 175 | 10 | 22 | 13 | 11 | 28 | 104 |
| 37 | 57 | 115 | 45 | 65 | 129 | 107 | 75 | 119 | 110 | 31 | 43 | 97 | 78 | 125 | 58 | 134 | 140 | 146 | 152 | 158 | 164 |
| 170 | 176 | 4 | 19 | 6 | 8 | 24 | 44 | 101 | 94 | 118 | 130 | 69 | 71 | 83 | 34 | 86 | 124 | 48 | 106 | 88 | 40 |
| 102 | 91 | 135 | 141 | 147 | 153 | 159 | 165 | 171 | 177 | 3 | 20 | 7 | 17 | 25 | 87 | 41 | 120 | 47 | 80 | 59 | 62 |
| 89 | 45 | 56 | 131 | 61 | 126 | 113 | 92 | 51 | 98 | 136 | 142 | 148 | 154 | 160 | 166 | 172 | 178 | 21 | 18 | 1 | 26 |
| 29 | 39 | 73 | 121 | 105 | 77 | 42 | 114 | 93 | 82 | 111 | 109 | 67 | 79 | 123 | 64 | 76 | 33 | 137 | 143 | 149 | 155 |
| 161 | 167 | 173 | 179 | | | | | | | | | | | | | | | | | | |

FIG. 114

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 32 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 104 | 120 | 47 | 136 | 116 | 109 | 22 | 20 | 117 | 61 | 52 | 108 | 86 | 99 | 76 | 30 | 37 | 58 | 36 | 138 | 95 | 130 |
| 177 | 93 | 56 | 33 | 24 | 62 | 0 | 67 | 83 | 46 | 79 | 70 | 154 | 18 | 75 | 43 | 49 | 63 | 162 | 16 | 167 | 60 |
| 125 | 1 | 123 | 107 | 9 | 45 | 53 | 15 | 38 | 23 | 57 | 141 | 4 | 178 | 165 | 113 | 21 | 105 | 11 | 124 | 126 | 77 |
| 146 | 29 | 131 | 27 | 176 | 40 | 74 | 91 | 140 | 64 | 73 | 44 | 129 | 157 | 172 | 51 | 10 | 128 | 119 | 163 | 103 | 28 |
| 85 | 156 | 78 | 6 | 8 | 173 | 160 | 106 | 31 | 54 | 122 | 25 | 139 | 68 | 150 | 164 | 87 | 135 | 97 | 166 | 42 | 169 |
| 161 | 137 | 26 | 39 | 133 | 5 | 94 | 69 | 2 | 30 | 171 | 149 | 115 | 96 | 145 | 101 | 92 | 143 | 12 | 88 | 81 | 71 |
| 19 | 147 | 50 | 152 | 159 | 155 | 151 | 174 | 60 | 32 | 3 | 142 | 72 | 14 | 170 | 112 | 65 | 89 | 175 | 158 | 17 | 114 |
| 62 | 144 | 13 | 98 | 66 | 59 | 7 | 118 | 48 | 153 | 100 | 134 | 84 | 111 | 132 | 127 | 41 | 168 | 110 | 102 | 34 | 121 |
| 179 | 148 | 55 | 35 | | | | | | | | | | | | | | | | | | |

FIG. 117

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 40 | 159 | 100 | 14 | 88 | 75 | 53 | 24 | 157 | 84 | 23 | 77 | 140 | 145 | 32 | 28 | 112 | 39 | 76 | 50 | 93 | 27 |
| 107 | 25 | 152 | 101 | 127 | 5 | 129 | 71 | 9 | 21 | 96 | 73 | 35 | 106 | 158 | 49 | 136 | 30 | 137 | 115 | 139 | 48 |
| 167 | 85 | 74 | 72 | 7 | 110 | 161 | 41 | 170 | 147 | 82 | 128 | 149 | 33 | 8 | 120 | 47 | 68 | 58 | 67 | 87 | 155 |
| 11 | 18 | 103 | 151 | 29 | 36 | 83 | 135 | 79 | 150 | 97 | 54 | 70 | 138 | 156 | 31 | 121 | 34 | 20 | 130 | 61 | 57 |
| 2 | 166 | 117 | 15 | 6 | 165 | 118 | 98 | 116 | 131 | 109 | 62 | 126 | 175 | 22 | 111 | 164 | 16 | 133 | 102 | 55 | 105 |
| 64 | 177 | 78 | 37 | 162 | 124 | 119 | 19 | 4 | 69 | 132 | 65 | 123 | 160 | 17 | 52 | 38 | 1 | 80 | 90 | 42 | 81 |
| 104 | 13 | 144 | 51 | 114 | 3 | 43 | 146 | 163 | 59 | 45 | 89 | 122 | 169 | 44 | 94 | 86 | 99 | 66 | 171 | 173 | 0 |
| 141 | 148 | 176 | 26 | 143 | 178 | 60 | 153 | 142 | 91 | 179 | 12 | 168 | 113 | 95 | 174 | 56 | 134 | 92 | 46 | 108 | 125 |
| 10 | 172 | 154 | 63 | | | | | | | | | | | | | | | | | | |

FIG. 120

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 62 | 17 | 10 | 25 | 174 | 13 | 159 | 14 | 106 | 9 | 42 | 57 | 78 | 67 | 41 | 132 | 110 | 87 | 77 | 27 | 88 | 56 |
| 8 | 161 | 7 | 164 | 171 | 44 | 75 | 176 | 145 | 165 | 157 | 34 | 142 | 96 | 103 | 52 | 11 | 82 | 141 | 116 | 15 | 158 |
| 139 | 120 | 36 | 61 | 20 | 112 | 144 | 53 | 128 | 24 | 96 | 122 | 114 | 104 | 150 | 50 | 51 | 80 | 109 | 33 | 5 | 95 |
| 59 | 16 | 134 | 105 | 111 | 21 | 40 | 146 | 18 | 133 | 60 | 23 | 160 | 106 | 32 | 79 | 55 | 6 | 1 | 154 | 117 | 19 |
| 152 | 167 | 166 | 30 | 35 | 100 | 74 | 131 | 99 | 156 | 39 | 76 | 86 | 43 | 178 | 155 | 179 | 177 | 136 | 175 | 81 | 64 |
| 124 | 153 | 84 | 163 | 135 | 115 | 125 | 47 | 45 | 143 | 72 | 48 | 172 | 97 | 85 | 107 | 126 | 91 | 129 | 137 | 83 | 118 |
| 54 | 2 | 9 | 58 | 169 | 73 | 123 | 4 | 92 | 168 | 162 | 94 | 138 | 119 | 22 | 31 | 63 | 89 | 90 | 69 | 49 | 173 |
| 28 | 127 | 26 | 29 | 101 | 170 | 93 | 140 | 147 | 149 | 148 | 66 | 65 | 121 | 12 | 71 | 37 | 70 | 102 | 46 | 38 | 68 |
| 130 | 3 | 113 | 151 | | | | | | | | | | | | | | | | | | |

FIG. 121

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 168 | 18 | 46 | 131 | 88 | 90 | 11 | 89 | 111 | 174 | 172 | 38 | 78 | 153 | 9 | 80 | 53 | 27 | 44 | 79 | 35 | 83 |
| 171 | 51 | 37 | 99 | 95 | 119 | 117 | 127 | 112 | 166 | 28 | 123 | 33 | 160 | 29 | 6 | 135 | 10 | 66 | 69 | 74 | 92 |
| 15 | 109 | 106 | 178 | 65 | 141 | 0 | 3 | 154 | 156 | 164 | 7 | 45 | 115 | 122 | 148 | 110 | 24 | 121 | 126 | 23 | 175 |
| 21 | 113 | 58 | 43 | 26 | 143 | 56 | 142 | 39 | 147 | 30 | 25 | 101 | 145 | 136 | 19 | 4 | 48 | 158 | 118 | 133 | 49 |
| 20 | 102 | 14 | 151 | 5 | 2 | 72 | 103 | 75 | 60 | 84 | 34 | 157 | 169 | 31 | 161 | 81 | 70 | 85 | 159 | 132 | 41 |
| 152 | 179 | 98 | 144 | 36 | 16 | 87 | 40 | 91 | 1 | 130 | 108 | 139 | 94 | 97 | 8 | 104 | 13 | 150 | 137 | 47 | 73 |
| 62 | 12 | 50 | 61 | 105 | 100 | 86 | 146 | 165 | 22 | 17 | 57 | 167 | 59 | 96 | 120 | 155 | 77 | 162 | 55 | 68 | 140 |
| 134 | 82 | 76 | 125 | 32 | 176 | 138 | 173 | 177 | 163 | 107 | 170 | 71 | 129 | 63 | 93 | 42 | 52 | 116 | 149 | 54 | 128 |
| 124 | 114 | 67 | 64 | | | | | | | | | | | | | | | | | | |

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | | |
|---|---|---|---|---|---|---|---|---|---|---|---|---|---|---|---|---|---|---|---|---|---|
| 18 | 8 | 166 | 117 | 4 | 111 | 142 | 148 | 176 | 91 | 120 | 144 | 99 | 124 | 20 | 25 | 31 | 78 | 36 | 72 | 2 | 98 |
| 93 | 74 | 174 | 52 | 152 | 62 | 88 | 75 | 23 | 97 | 147 | 15 | 71 | 1 | 127 | 138 | 81 | 83 | 68 | 94 | 112 | 119 |
| 121 | 89 | 163 | 85 | 86 | 28 | 17 | 64 | 14 | 44 | 158 | 159 | 150 | 32 | 128 | 70 | 90 | 29 | 30 | 63 | 100 | 65 |
| 129 | 140 | 177 | 46 | 84 | 92 | 10 | 33 | 58 | 7 | 96 | 151 | 171 | 40 | 76 | 6 | 3 | 37 | 104 | 57 | 135 | 103 |
| 141 | 107 | 116 | 160 | 41 | 153 | 175 | 55 | 130 | 118 | 131 | 42 | 27 | 133 | 95 | 179 | 34 | 21 | 87 | 106 | 105 | 108 |
| 79 | 134 | 113 | 26 | 164 | 114 | 73 | 102 | 77 | 22 | 110 | 161 | 43 | 122 | 123 | 82 | 5 | 48 | 139 | 60 | 49 | 154 |
| 115 | 146 | 67 | 69 | 137 | 109 | 143 | 24 | 101 | 45 | 16 | 12 | 19 | 178 | 80 | 51 | 47 | 149 | 50 | 172 | 170 | 169 |
| 61 | 9 | 39 | 136 | 59 | 38 | 54 | 156 | 126 | 125 | 145 | 0 | 13 | 155 | 132 | 162 | 11 | 157 | 66 | 165 | 173 | 56 |
| 168 | 167 | 53 | 35 | | | | | | | | | | | | | | | | | | |

FIG. 124

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 77 | 50 | 109 | 128 | 153 | 12 | 48 | 17 | 147 | 55 | 173 | 172 | 135 | 121 | 99 | 162 | 52 | 40 | 129 | 168 | 103 | 87 |
| 134 | 105 | 179 | 10 | 131 | 151 | 3 | 26 | 100 | 15 | 123 | 88 | 18 | 91 | 54 | 160 | 49 | 1 | 76 | 80 | 74 | 31 |
| 47 | 58 | 161 | 9 | 16 | 34 | 41 | 21 | 177 | 11 | 63 | 6 | 39 | 165 | 169 | 125 | 114 | 57 | 37 | 67 | 93 | 96 |
| 73 | 106 | 83 | 166 | 24 | 51 | 142 | 65 | 43 | 64 | 53 | 72 | 156 | 81 | 4 | 155 | 33 | 163 | 56 | 150 | 70 | 167 |
| 107 | 112 | 144 | 149 | 36 | 32 | 35 | 59 | 101 | 29 | 127 | 138 | 176 | 90 | 141 | 92 | 170 | 102 | 119 | 25 | 75 | 14 |
| 0 | 68 | 20 | 97 | 110 | 28 | 89 | 118 | 154 | 126 | 2 | 22 | 124 | 85 | 175 | 78 | 46 | 152 | 23 | 86 | 27 | 79 |
| 130 | 66 | 45 | 113 | 111 | 62 | 61 | 7 | 30 | 133 | 108 | 171 | 143 | 60 | 178 | 5 | 122 | 44 | 38 | 148 | 157 | 84 |
| 42 | 139 | 145 | 8 | 104 | 115 | 71 | 137 | 132 | 146 | 164 | 98 | 13 | 117 | 174 | 158 | 95 | 116 | 140 | 94 | 136 | 120 |
| 82 | 69 | 159 | 19 | | | | | | | | | | | | | | | | | | |

FIG. 128
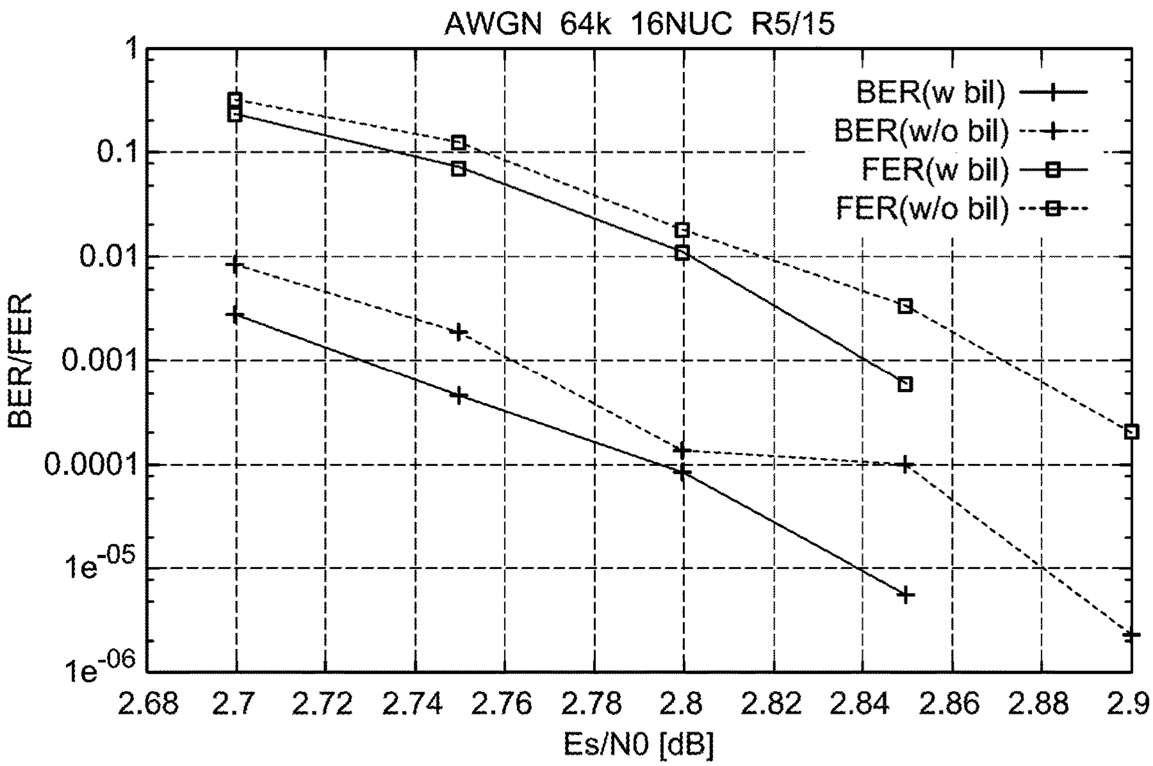
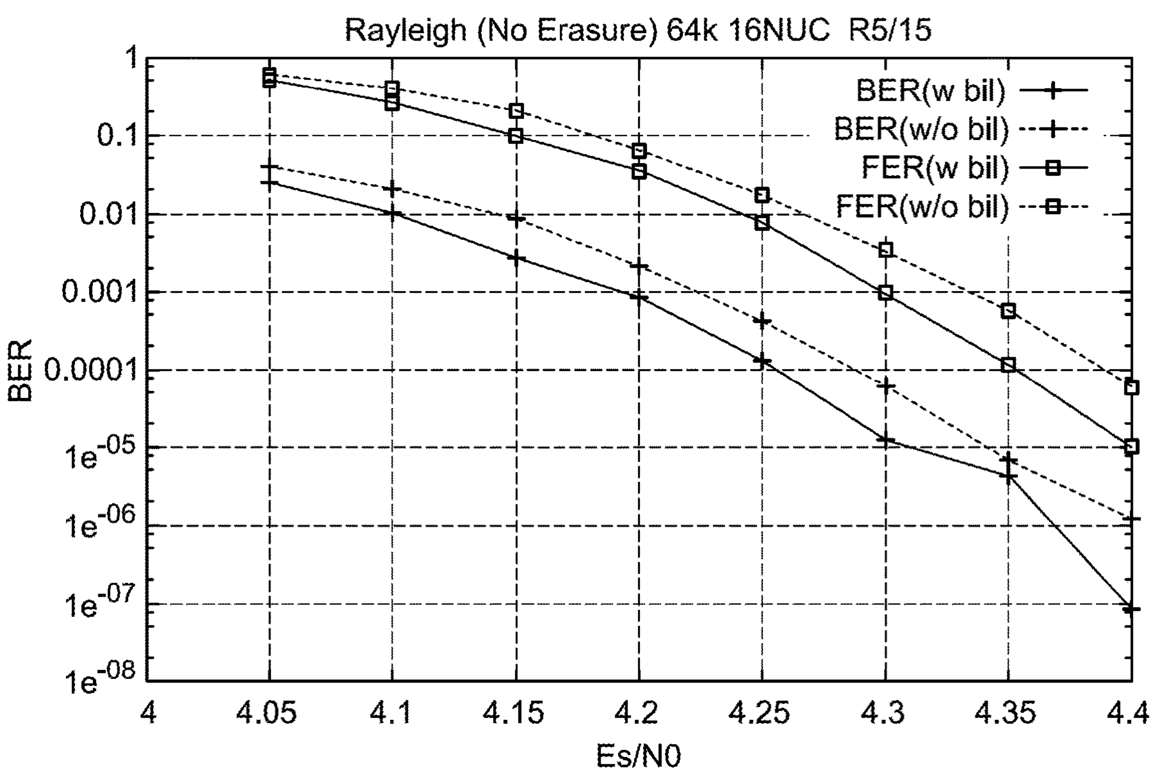

FIG. 147
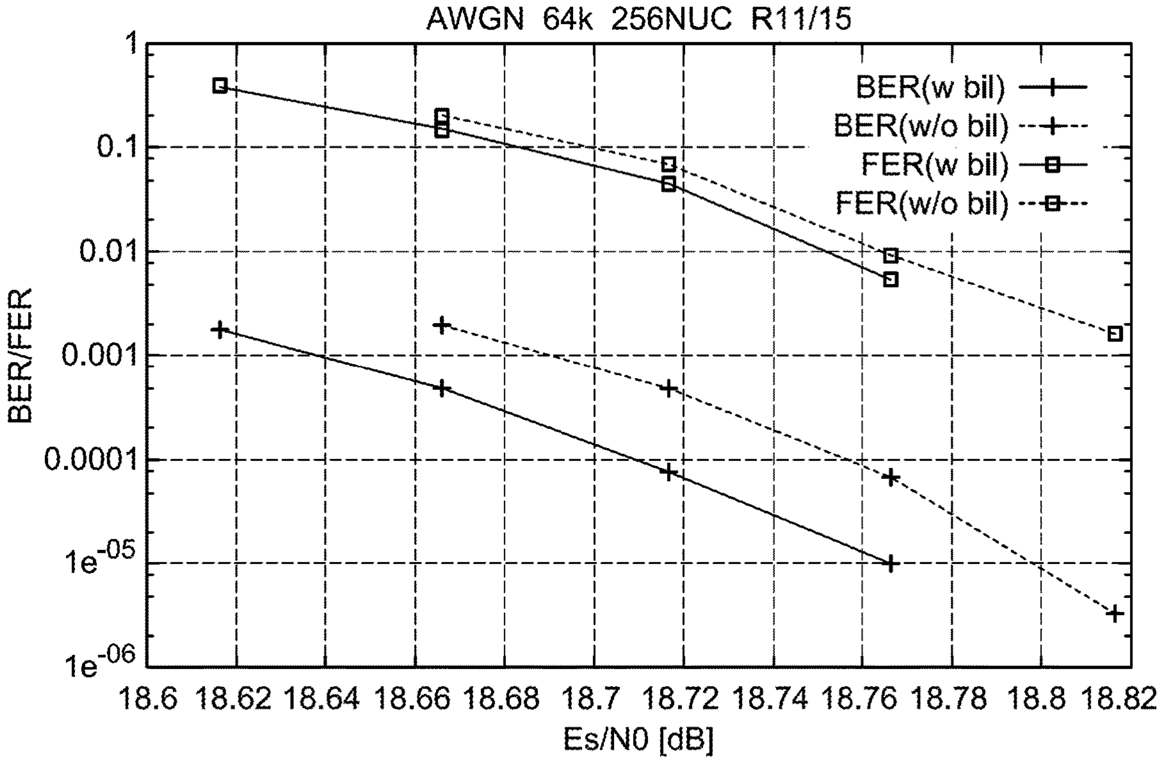
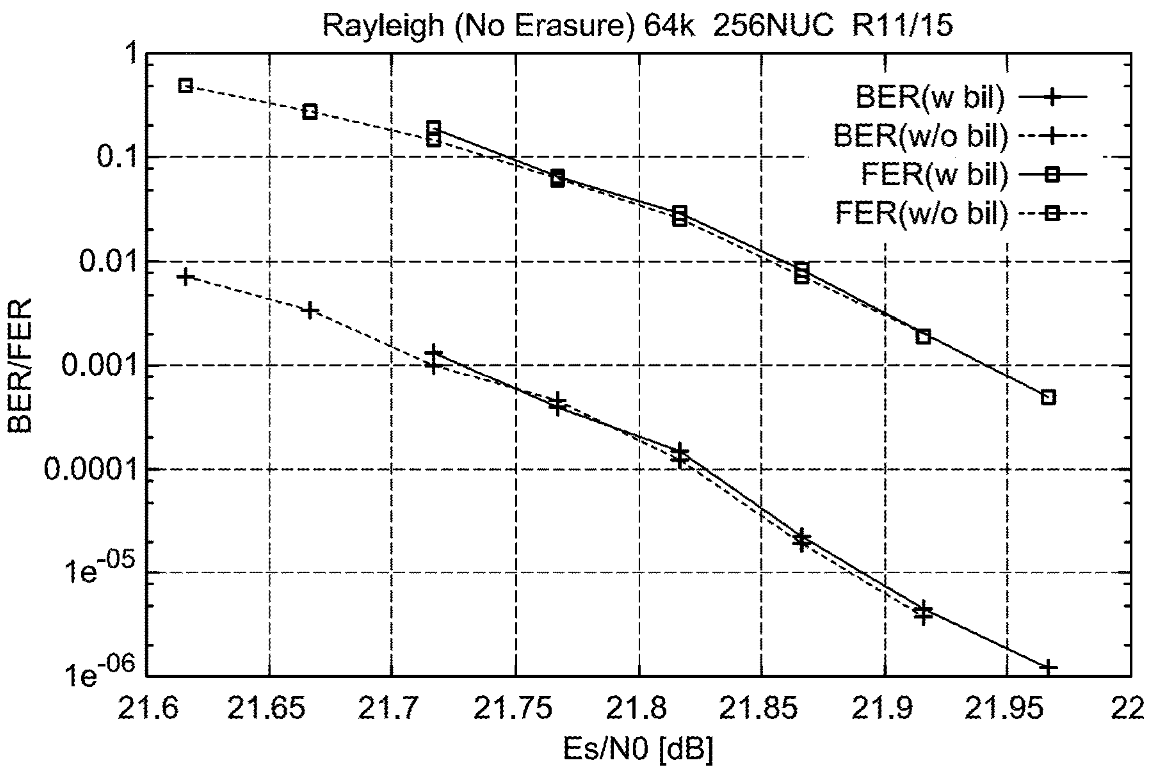

FIG. 154
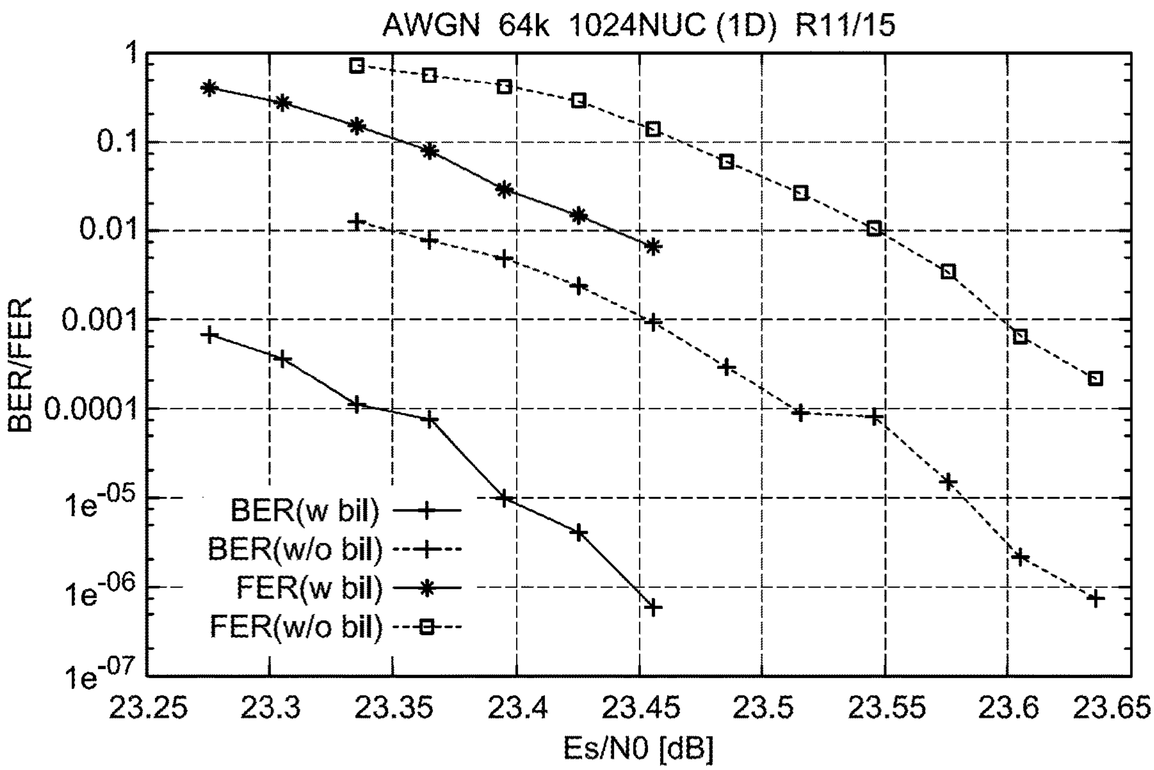
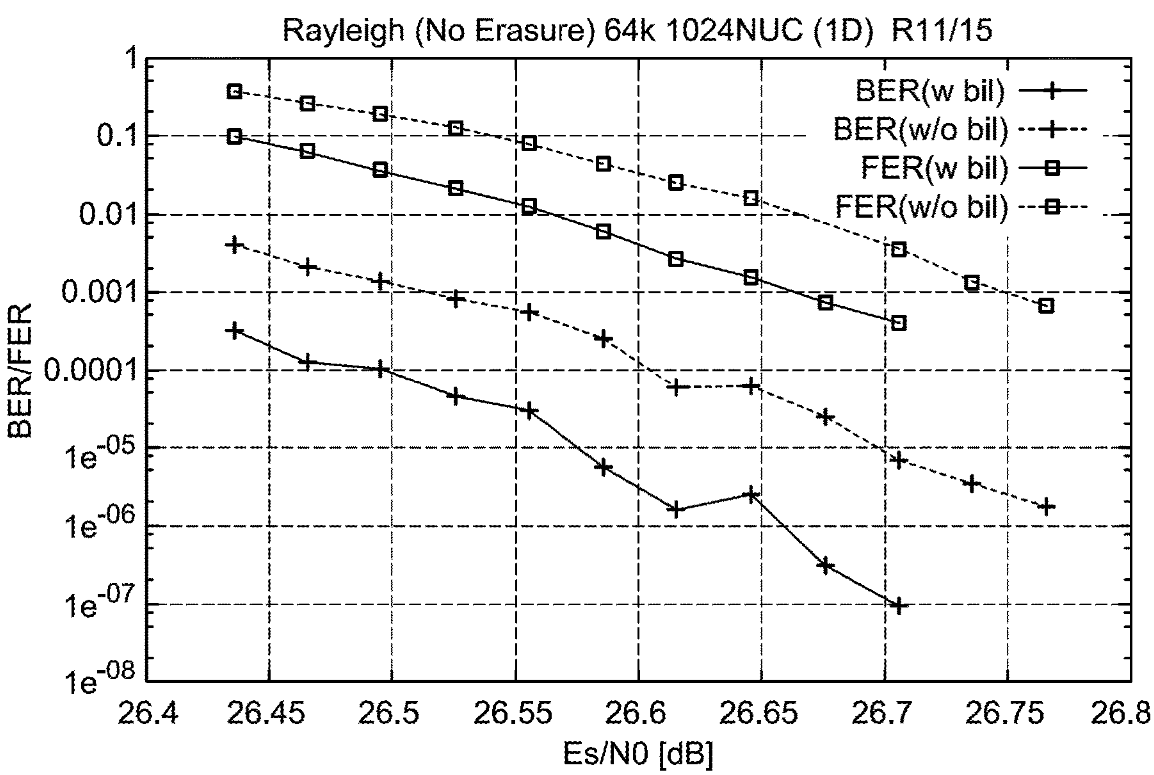

DATA PROCESSING DEVICE AND DATA PROCESSING METHOD

CROSS REFERENCE TO RELATED APPLICATIONS

This application is a continuation of U.S. application Ser. No. 15/980,374, filed on May 15, 2018, which is a continuation of U.S. application Ser. No. 15/122,439, filed Aug. 30, 2016, which is a National Stage of PCT/JP2015/056597, filed Mar. 6, 2015 and claims the benefit of priority under 35 U.S.C. § 119 of Japanese Patent Application No. 2014-056461, filed Mar. 19, 2014. The entire contents of each of the above-noted applications are incorporated herein by reference.

TECHNICAL FIELD

The present technology relates to a data processing device and a data processing method, and more particularly, to a data processing device and a data processing method capable of securing excellent communication quality, for example, in data transmission using an LDPC code.

BACKGROUND ART

Some of information presented in the present specification and drawings was provided by Samsung Electronics Co., Ltd. (hereinafter, represented as Samsung), LGE Inc., NERC, and CRC/ETRI (indicated in the drawings).

A low density parity check (LDPC) code has a high error correction capability, and in recent years, the LDPC code has widely been employed in transmission schemes of digital broadcasting such as Digital Video Broadcasting (DVB)-S.2, DVB-T.2, and DVB-C.2 of Europe and the like, or Advanced Television Systems Committee (ATSC) 3.0 of the USA and the like (for example, see Non-Patent Document 1).

From a recent study, it is known that performance near a Shannon limit is acquired from the LDPC code when a code length increases, similarly to a turbo code or the like. Since the LDPC code has a property that a shortest distance is proportional to the code length, the LDPC code has advantages of a block error probability characteristic being superior and a so-called error floor phenomenon observed in a decoding characteristic of the turbo code or the like rarely occurring as characteristics thereof.

CITATION LIST

Non-Patent Document

Non-Patent Document 1: DVB-S.2: ETSI EN 302307 V1.2.1 (2009 October)

SUMMARY OF THE INVENTION

Problems to be Solved by the Invention

In data transmission using the LDPC code, for example, the LDPC code is converted into a symbol of a quadrature modulation (digital modulation) such as Quadrature Phase Shift Keying (QPSK), and the symbol is mapped to a signal point of the quadrature modulation and is transmitted.

The data transmission using the LDPC code as above has spread worldwide, and there is a demand to secure excellent communication (transmission) quality.

The present technology is in consideration of such a situation and enables the securement of excellent communication quality in data transmission using an LDPC code.

Solutions to Problems

According to the present technology, there is provided a first data processing device/method including: a coding unit/step that performs LDPC coding on the basis of a parity check matrix of an LDPC code having a code length N of 64800 bits and a coding rate r of 9/15; a group-wise interleaving unit/step that performs group-wise interleave interleaving the LDPC code in units of bit groups of 360 bits; and a mapping unit/step that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 18, 8, 166, 117, 4, 111, 142, 148, 176, 91, 120, 144, 99, 124, 20, 25, 31, 78, 36, 72, 2, 98, 93, 74, 174, 52, 152, 62, 88, 75, 23, 97, 147, 15, 71, 1, 127, 138, 81, 83, 68, 94, 112, 119, 121, 89, 163, 85, 86, 28, 17, 64, 14, 44, 158, 159, 150, 32, 128, 70, 90, 29, 30, 63, 100, 65, 129, 140, 177, 46, 84, 92, 10, 33, 58, 7, 96, 151, 171, 40, 76, 6, 3, 37, 104, 57, 135, 103, 141, 107, 116, 160, 41, 153, 175, 55, 130, 118, 131, 42, 27, 133, 95, 179, 34, 21, 87, 106, 105, 108, 79, 134, 113, 26, 164, 114, 73, 102, 77, 22, 110, 161, 43, 122, 123, 82, 5, 48, 139, 60, 49, 154, 115, 146, 67, 69, 137, 109, 143, 24, 101, 45, 16, 12, 19, 178, 80, 51, 47, 149, 50, 172, 170, 169, 61, 9, 39, 136, 59, 38, 54, 156, 126, 125, 145, 0, 13, 155, 132, 162, 11, 157, 66, 165, 173, 56, 168, 167, 53, and 35, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 113155733165680624110407134041394714040143 53
1552215698160791736319374195432053022833243 39
27113616236700673077333127681544115568179 23
18341203212150222023239382535125590258762 5910
7360587240086279765310346107991248212935136 04
15909165261978220506228042362924859256 00
14451690430448518919917692521378316076166 75
17274188061888220819219582245123869239992 4177
1290233756616371899610102109411136012242149 18
168082057123374240462504525060256622578325 913
2842192634213503855894531016815820174731957 1
196852279023336233672389024061256572568 0
017094041493259687123843095641059611026147 61
19484207622085823803240162479525853258 63
29162565006609168311851718568187381938720 159
205442160321941241372426924416248032515425 395
556687137001142613221150011636717601183802 2796
2348823938254762563525678258072585725872
119595885488860114891684518450184691949620 190
231732526225566256682567925858258882591 5
752076908855918314654166951712117854180831 8428
196332047020736217202233523273250832529325 403
4858410129937861066818523189632086422106223 08
230332310723128239902428624409245952580 2

1251389465398276108851164412777134271403915954
1707819053205372286324521250872546325838
35098748958111509158841623017583192642090021001
2131022547227562295924768248142559425626258880
2129691448238646016626666710242131411385214137
1864019951224492345424431255122581 4
18537890993410063167281904019809208252152221800
2358224556250312554725562257332578925906
409645825766589465171002712182132471520717041
1895820133205032222824332246132568925855258 83
0258195539707675367695953213668150511768319665
2025321996241362489025758257842580 7
3440444215607674277965877711017155931954222202
22973233972342324418248732510725644
159562162285025439
156215172195172236 2
750812879243242449 6
629815819167571872 1
1117315175199662119 5
59135051694123793
226748301202320587
882792781307216664
1441917463233982534 8
611216534204232269 8
49389142110324799
689612761132062587 3
213801232221701
1160021306257532579 0
842113076142711540 1
963014112190172095 5
212139322178125824
596191101665419636
585434993612770
65751143319798
2731733820926
142531846325404
217912480525869
21164615850
6075858623819
184352209324852
2103236811704
109251740218232
90622506125674
184972085323404
186061936419551
7102225543
67441548125868
90811730525164
82370125883
96801995522848
56456419121
55951508625892
31741712723183
193971981720275
125612457125825
7111988925865
191042018921851
549968625548
65862032525906
32242071021637
6411521525754
134842372925818
2043749324246
168602523025768
220472420024902
93911804019499
78552433625069
238342557025852
1977880025756
66712177225859
3279671024444
240992511725820
55531230625915
481110723907
108321197425773
22231790525484
167821713520446
47528613457
162182244924362
117162220025897
83151500922633
132048025852
123521865825687
36811479423703
302453125846
41032207724107
238372562225812
36271338725839
908536719388
0689425795
203222354625181
81782526025437
24491324422565
311892822741
1312513414838
60851393724220
661463325670
472251225472
88672470425279
67422162322745
147994824178
85222426124307
192022240624609.

In the first data processing device/method as described above, LDPC coding is performed on the basis of a parity check matrix of an LDPC code having a code length N of 64800 bits and a coding rater of 9/15, group-wise interleave interleaving the LDPC code in units of bit groups of 360 bits is performed, and the LDPC code is mapped into one of 1024 signal points determined according to a modulation scheme in units of 10 bits. In the group-wise interleave, by using an (i+1)-th bit group from a head of the LDPC code as a bit group i, a sequence of bit groups 0 to 179 of the LDPC code of 64800 bits is interleaved into a sequence of bit groups 18, 8, 166, 117, 4, 111, 142, 148, 176, 91, 120, 144, 99, 124, 20, 25, 31, 78, 36, 72, 2, 98, 93, 74, 174, 52, 152, 62, 88, 75, 23, 97, 147, 15, 71, 1, 127, 138, 81, 83, 68, 94, 112, 119, 121, 89, 163, 85, 86, 28, 17, 64, 14, 44, 158, 159, 150, 32, 128, 70, 90, 29, 30, 63, 100, 65, 129, 140, 177, 46, 84, 92, 10, 33, 58, 7, 96, 151, 171, 40, 76, 6, 3, 37, 104, 57, 135, 103, 141, 107, 116, 160, 41, 153, 175, 55, 130, 118, 131, 42, 27, 133, 95, 179, 34, 21, 87, 106, 105, 108, 79, 134, 113, 26, 164, 114, 73, 102, 77, 22, 110, 161, 43, 122, 123, 82, 5, 48, 139, 60, 49, 154, 115, 146, 67, 69, 137, 109, 143, 24, 101, 45, 16, 12, 19, 178, 80, 51, 47, 149, 50, 172, 170, 169, 61, 9, 39, 136, 59, 38, 54, 156, 126, 125, 145, 0, 13, 155, 132, 162, 11, 157, 66, 165, 173, 56, 168, 167, 53, and 35.

The LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181

8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609.

According to the present technology, there is provided a second data processing device/method including a group-wise deinterleaving unit/step that returns a sequence of the LDPC code after the group-wise interleave that is acquired from data transmitted from a transmitting device to an original state. The transmitting device includes: a coding unit that performs LDPC coding on the basis of a parity check matrix of an LDPC code having a code length N of 64800 bits and a coding rate r of 9/15; a group-wise interleaving unit that performs group-wise interleave interleaving the LDPC code in units of bit groups of 360 bits; and a mapping unit that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 18, 8, 166, 117, 4, 111, 142, 148, 176, 91, 120, 144, 99, 124, 20, 25, 31, 78, 36, 72, 2, 98, 93, 74, 174, 52, 152, 62, 88, 75, 23, 97, 147, 15, 71, 1, 127, 138, 81, 83, 68, 94, 112, 119, 121, 89, 163, 85, 86, 28, 17, 64, 14, 44, 158, 159, 150, 32, 128, 70, 90, 29, 30, 63, 100, 65, 129, 140, 177, 46, 84, 92, 10, 33, 58, 7, 96, 151, 171, 40, 76, 6, 3, 37, 104, 57, 135, 103, 141, 107, 116, 160, 41, 153, 175, 55, 130, 118, 131, 42, 27, 133, 95, 179, 34, 21, 87, 106, 105, 108, 79, 134, 113, 26, 164, 114, 73, 102, 77, 22, 110, 161, 43, 122, 123, 82, 5, 48, 139, 60, 49, 154, 115, 146, 67, 69, 137, 109, 143, 24, 101, 45, 16, 12, 19, 178, 80, 51, 47, 149, 50, 172, 170, 169, 61, 9, 39, 136, 59, 38, 54, 156, 126, 125, 145, 0, 13, 155, 132, 162, 11, 157, 66, 165, 173, 56, 168, 167, 53, and 35, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680

0 1709 4041 4932 5968 7123 8430 9564 10596 11026 14761 19484 20762 20858 23803 24016 24795 25853 25863

29 1625 6500 6609 16831 18517 18568 18738 19387 20159 20544 21603 21941 24137 24269 24416 24803 25154 25395

55 66 871 3700 11426 13221 15001 16367 17601 18380 22796 23488 23938 25476 25635 25678 25807 25857 25872

1 19 5958 8548 8860 11489 16845 18450 18469 19496 20190 23173 25262 25566 25668 25679 25858 25888 25915

7520 7690 8855 9183 14654 16695 17121 17854 18083 18428 19633 20470 20736 21720 22335 23273 25083 25293 25403

48 58 410 1299 3786 10668 18523 18963 20864 22106 22308 23033 23107 23128 23990 24286 24409 24595 25802

12 51 3894 6539 8276 10885 11644 12777 13427 14039 15954 17078 19053 20537 22863 24521 25087 25463 25838

3509 8748 9581 11509 15884 16230 17583 19264 20900 21001 21310 22547 22756 22959 24768 24814 25594 25626 25880

21 29 69 1448 2386 4601 6626 6667 10242 13141 13852 14137 18640 19951 22449 23454 24431 25512 25814

18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883

0 25 819 5539 7076 7536 7695 9532 13668 15051 17683 19665 20253 21996 24136 24890 25758 25784 25807

34 40 44 4215 6076 7427 7965 8777 11017 15593 19542 22202 22973 23397 23423 24418 24873 25107 25644

1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232

9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609.

In the second data processing device/method as above, a sequence of the LDPC code after the group-wise interleave that is acquired from data transmitted from a transmitting device is returned to an original state, wherein the transmitting device includes: a coding unit that performs LDPC coding on the basis of a parity check matrix of an LDPC code having a code length N of 64800 bits and a coding rate r of 9/15; a group-wise interleaving unit that performs group-wise interleave interleaving the LDPC code in units of bit groups of 360 bits; and a mapping unit that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 18, 8, 166, 117, 4, 111, 142, 148, 176, 91, 120, 144, 99, 124, 20, 25, 31, 78, 36, 72, 2, 98, 93, 74, 174, 52, 152, 62, 88, 75, 23, 97, 147, 15, 71, 1, 127, 138, 81, 83, 68, 94, 112, 119, 121, 89, 163, 85, 86, 28, 17, 64, 14, 44, 158, 159, 150, 32, 128, 70, 90, 29, 30, 63, 100, 65, 129, 140, 177, 46, 84, 92, 10, 33, 58, 7, 96, 151, 171, 40, 76, 6, 3, 37, 104, 57, 135, 103, 141, 107, 116, 160, 41, 153, 175, 55, 130, 118, 131, 42, 27, 133, 95, 179, 34, 21, 87, 106, 105, 108, 79, 134, 113, 26, 164, 114, 73, 102, 77, 22, 110, 161, 43, 122, 123, 82, 5, 48, 139, 60, 49, 154, 115, 146, 67, 69, 137, 109, 143, 24, 101, 45, 16, 12, 19, 178, 80, 51, 47, 149, 50, 172, 170, 169, 61, 9, 39, 136, 59, 38, 54, 156, 126, 125, 145, 0, 13, 155, 132, 162, 11, 157, 66, 165, 173, 56, 168, 167, 53, and 35, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680

0 1709 4041 4932 5968 7123 8430 9564 10596 11026 14761 19484 20762 20858 23803 24016 24795 25853 25863

29 1625 6500 6609 16831 18517 18568 18738 19387 20159 20544 21603 21941 24137 24269 24416 24803 25154 25395

55 66 871 3700 11426 13221 15001 16367 17601 18380 22796 23488 23938 25476 25635 25678 25807 25857 25872

1 19 5958 8548 8860 11489 16845 18450 18469 19496 20190 23173 25262 25566 25668 25679 25858 25888 25915

7520 7690 8855 9183 14654 16695 17121 17854 18083 18428 19633 20470 20736 21720 22335 23273 25083 25293 25403

48 58 410 1299 3786 10668 18523 18963 20864 22106 22308 23033 23107 23128 23990 24286 24409 24595 25802

12 51 3894 6539 8276 10885 11644 12777 13427 14039 15954 17078 19053 20537 22863 24521 25087 25463 25838

3509 8748 9581 11509 15884 16230 17583 19264 20900 21001 21310 22547 22756 22959 24768 24814 25594 25626 25880

21 29 69 1448 2386 4601 6626 6667 10242 13141 13852 14137 18640 19951 22449 23454 24431 25512 25814

18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883

0 25 819 5539 7076 7536 7695 9532 13668 15051 17683 19665 20253 21996 24136 24890 25758 25784 25807

34 40 44 4215 6076 7427 7965 8777 11017 15593 19542 22202 22973 23397 23423 24418 24873 25107 25644

1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637

641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609.

According to the present technology, there is provided a third data processing device/method including: a coding unit/step that performs LDPC coding on the basis of a parity check matrix of an LDPC code having a code length N of 64800 bits and a coding rate r of 11/15; a group-wise interleaving unit/step that performs group-wise interleave interleaving the LDPC code in units of bit groups of 360 bits; and a mapping unit/step that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 51, 47, 53, 43, 55, 59, 49, 33, 35, 31, 24, 37, 0, 2, 45, 41, 39, 57, 42, 44, 52, 40, 23, 30, 32, 34, 54, 56, 46, 50, 122, 48, 1, 36, 38, 58, 77, 3, 65, 81, 67, 147, 83, 69, 26, 75, 85, 73, 79, 145, 71, 63, 5, 61, 70, 78, 68, 62, 66, 6, 64, 149, 60, 82, 80, 4, 76, 84, 72, 154, 86, 74, 89, 128, 137, 91, 141, 93, 101, 7, 87, 9, 103, 99, 95, 11, 13, 143, 97, 133, 136, 12, 100, 94, 14, 88, 142, 96, 92, 8, 152, 10, 139, 102, 104, 132, 90, 98, 114, 112, 146, 123, 110, 15, 125, 150, 120, 153, 29, 106, 134, 27, 127, 108, 130, 116, 28, 107, 126, 25, 131, 124, 129, 151, 121, 105, 111, 115, 135, 148, 109, 117, 158, 113, 170, 119, 162, 178, 155, 176, 18, 20, 164, 157, 160, 22, 140, 16, 168, 166, 172, 174, 175, 179, 118, 138, 156, 19, 169, 167, 163, 173, 161, 177, 165, 144, 171, 17, 21, and 159, the LDPC code includes information bits and parity bits, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 696 989 1238 3091 3116 3738 4269 6406 7033 8048 9157 10254 12033 16456 16912

444 1488 6541 8626 10735 12447 13111 13706 14135 15195 15947 16453 16916 17137 17268

401 460 992 1145 1576 1678 2238 2320 4280 6770 10027 12486 15363 16714 17157

1161 3108 3727 4508 5092 5348 5582 7727 11793 12515 12917 13362 14247 16717 17205

542 1190 6883 7911 8349 8835 10489 11631 14195 15009 15454 15482 16632 17040 17063

17 487 776 880 5077 6172 9771 11446 12798 16016 16109 16171 17087 17132 17226

1337 3275 3462 4229 9246 10180 10845 10866 12250 13633 14482 16024 16812 17186 17241

15 980 2305 3674 5971 8224 11499 11752 11770 12897 14082 14836 15311 16391 17209

0 3926 5869 8696 9351 9391 11371 14052 14172 14636 14974 16619 16961 17033 17237

3033 5317 6501 8579 10698 12168 12966 14019 15392 15806 15991 16493 16690 17062 17090

981 1205 4400 6410 11003 13319 13405 14695 15846 16297 16492 16563 16616 16862 16953

1725 4276 8869 9588 14062 14486 15474 15548 16300 16432 17042 17050 17060 17175 17273

1807 5921 9960 10011 14305 14490 14872 15852 16054 16061 16306 16799 16833 17136 17262

2826 4752 6017 6540 7016 8201 14245 14419 14716 15983 16569 16652 17171 17179 17247

1662 2516 3345 5229 8086 9686 11456 12210 14595 15808 16011 16421 16825 17112 17195

2890 4821 5987 7226 8823 9869 12468 14694 15352 15805 16075 16462 17102 17251 17263

3751 3890 4382 5720 10281 10411 11350 12721 13121 14127 14980 15202 15335 16735 17123

26 30 2805 5457 6630 7188 7477 7556 11065 16608 16859 16909 16943 17030 17103

40 4524 5043 5566 9645 10204 10282 11696 13080 14837 15607 16274 17034 17225 17266

904 3157 6284 7151 7984 11712 12887 13767 15547 16099 16753 16829 17044 17250 17259

7 311 4876 8334 9249 11267 14072 14559 15003 15235 15686 16331 17177 17238 17253

4410 8066 8596 9631 10369 11249 12610 15769 16791 16960 17018 17037 17062 17165 17204

24 8261 9691 10138 11607 12782 12786 13424 13933 15262 15795 16476 17084 17193 17220

88 11622 14705 15890

304 2026 2638 6018

1163 4268 11620 17232

9701 11785 14463 17260

4118 10952 12224 17006

3647 10823 11521 12060

1717 3753 9199 11642

2187 14280 17220

14787 16903 17061

381 3534 4294

3149 6947 8323

12562 16724 16881

7289 9997 15306

5615 13152 17260

5666 16926 17027

4190 7798 16831

4778 10629 17180

10001 13884 15453

6 2237 8203

7831 15144 15160

9186 17204 17243

9435 17168 17237

42 5701 17159

7812 14259 15715

39 4513 6658

38 9368 11273

1119 4785 17182

5620 16521 16729

16 6685 17242

210 3452 12383

466 14462 16250

10548 12633 13962

1452 6005 16453

22 4120 13684

5195 11563 16522

5518 16705 17201

12233 14552 15471

6067 13440 17248

8660 8967 17061

8673 12176 15051

5959 15767 16541

3244 12109 12414

31 15913 16323

3270 15686 16653

24 7346 14675

12 1531 8740

6228 7565 16667

16936 17122 17162

4868 8451 13183

3714 4451 16919

11313 13801 17132

17070 17191 17242

1911 11201 17186

14 17190 17254

11760 16008 16832

14543 17033 17278

16129 16765 17155

6891 15561 17007

12741 14744 17116

8992 16661 17277

1861 11130 16742

4822 13331 16192

13281 14027 14989

38 14887 17141

10698 13452 15674

4 2539 16877

857 17170 17249

11449 11906 12867

285 14118 16831

15191 17214 17242

39 728 16915

2469 12969 15579

16644 17151 17164

2592 8280 10448

9236 12431 17173

9064 16892 17233

4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

In the third data processing device/method as described above, LDPC coding is performed on the basis of a parity check matrix of an LDPC code having a code length N of 64800 bits and a coding rate r of 11/15, group-wise interleave interleaving the LDPC code in units of bit groups of 360 bits is performed, and the LDPC code is mapped into one of 1024 signal points determined according to a modulation scheme in units of 10 bits. In the group-wise interleave, by using an (i+1)-th bit group from a head of the LDPC code as a bit group i, a sequence of bit groups 0 to 179 of the LDPC code of 64800 bits is interleaved into a sequence of bit groups 51, 47, 53, 43, 55, 59, 49, 33, 35, 31, 24, 37, 0, 2, 45, 41, 39, 57, 42, 44, 52, 40, 23, 30, 32, 34, 54, 56, 46, 50, 122, 48, 1, 36, 38, 58, 77, 3, 65, 81, 67, 147, 83, 69, 26, 75, 85, 73, 79, 145, 71, 63, 5, 61, 70, 78, 68, 62, 66, 6, 64, 149, 60, 82, 80, 4, 76, 84, 72, 154, 86, 74, 89, 128, 137, 91, 141, 93, 101, 7, 87, 9, 103, 99, 95, 11, 13, 143, 97, 133, 136, 12, 100, 94, 14, 88, 142, 96, 92, 8, 152, 10, 139, 102, 104, 132, 90, 98, 114, 112, 146, 123, 110, 15, 125, 150, 120, 153, 29, 106, 134, 27, 127, 108, 130, 116, 28, 107, 126, 25, 131, 124, 129, 151, 121, 105, 111, 115, 135, 148, 109, 117, 158, 113, 170, 119, 162, 178, 155, 176, 18, 20, 164, 157, 160, 22, 140, 16, 168, 166, 172, 174, 175, 179, 118, 138, 156, 19, 169, 167, 163, 173, 161, 177, 165, 144, 171, 17, 21, and 159.

The LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 696 989 1238 3091 3116 3738 4269 6406 7033 8048 9157 10254 12033 16456 16912
444 1488 6541 8626 10735 12447 13111 13706 14135 15195 15947 16453 16916 17137 17268
401 460 992 1145 1576 1678 2238 2320 4280 6770 10027 12486 15363 16714 17157
1161 3108 3727 4508 5092 5348 5582 7727 11793 12515 12917 13362 14247 16717 17205
542 1190 6883 7911 8349 8835 10489 11631 14195 15009 15454 15482 16632 17040 17063
17 487 776 880 5077 6172 9771 11446 12798 16016 16109 16171 17087 17132 17226
1337 3275 3462 4229 9246 10180 10845 10866 12250 13633 14482 16024 16812 17186 17241
15 980 2305 3674 5971 8224 11499 11752 11770 12897 14082 14836 15311 16391 17209
0 3926 5869 8696 9351 9391 11371 14052 14172 14636 14974 16619 16961 17033 17237
3033 5317 6501 8579 10698 12168 12966 14019 15392 15806 15991 16493 16690 17062 17090
981 1205 4400 6410 11003 13319 13405 14695 15846 16297 16492 16563 16616 16862 16953
1725 4276 8869 9588 14062 14486 15474 15548 16300 16432 17042 17050 17060 17175 17273
1807 5921 9960 10011 14305 14490 14872 15852 16054 16061 16306 16799 16833 17136 17262
2826 4752 6017 6540 7016 8201 14245 14419 14716 15983 16569 16652 17171 17179 17247
1662 2516 3345 5229 8086 9686 11456 12210 14595 15808 16011 16421 16825 17112 17195
2890 4821 5987 7226 8823 9869 12468 14694 15352 15805 16075 16462 17102 17251 17263
3751 3890 4382 5720 10281 10411 11350 12721 13121 14127 14980 15202 15335 16735 17123
26 30 2805 5457 6630 7188 7477 7556 11065 16608 16859 16909 16943 17030 17103
40 4524 5043 5566 9645 10204 10282 11696 13080 14837 15607 16274 17034 17225 17266
904 3157 6284 7151 7984 11712 12887 13767 15547 16099 16753 16829 17044 17250 17259
7 311 4876 8334 9249 11267 14072 14559 15003 15235 15686 16331 17177 17238 17253
4410 8066 8596 9631 10369 11249 12610 15769 16791 16960 17018 17037 17062 17165 17204
24 8261 9691 10138 11607 12782 12786 13424 13933 15262 15795 16476 17084 17193 17220
88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243

9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579
16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

According to the present technology, there is provided a fourth data processing device/method including a group-wise deinterleaving unit/step that returns a sequence of the LDPC code after the group-wise interleave that is acquired from data transmitted from a transmitting device to an original state. The transmitting device includes: a coding unit that performs LDPC coding on the basis of a parity check matrix of an LDPC code having a code length N of 64800 bits and a coding rate r of 11/15; a group-wise interleaving unit that performs group-wise interleave interleaving the LDPC code in units of bit groups of 360 bits; and a mapping unit that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 51, 47, 53, 43, 55, 59, 49, 33, 35, 31, 24, 37, 0, 2, 45, 41, 39, 57, 42, 44, 52, 40, 23, 30, 32, 34, 54, 56, 46, 50, 122, 48, 1, 36, 38, 58, 77, 3, 65, 81, 67, 147, 83, 69, 26, 75, 85, 73, 79, 145, 71, 63, 5, 61, 70, 78, 68, 62, 66, 6, 64, 149, 60, 82, 80, 4, 76, 84, 72, 154, 86, 74, 89, 128, 137, 91, 141, 93, 101, 7, 87, 9, 103, 99, 95, 11, 13, 143, 97, 133, 136, 12, 100, 94, 14, 88, 142, 96, 92, 8, 152, 10, 139, 102, 104, 132, 90, 98, 114, 112, 146, 123, 110, 15, 125, 150, 120, 153, 29, 106, 134, 27, 127, 108, 130, 116, 28, 107, 126, 25, 131, 124, 129, 151, 121, 105, 111, 115, 135, 148, 109, 117, 158, 113, 170, 119, 162, 178, 155, 176, 18, 20, 164, 157, 160, 22, 140, 16, 168, 166, 172, 174, 175, 179, 118, 138, 156, 19, 169, 167, 163, 173, 161, 177, 165, 144, 171, 17, 21, and 159, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 696 989 1238 3091 3116 3738 4269 6406 7033 8048 9157 10254 12033 16456 16912

444 1488 6541 8626 10735 12447 13111 13706 14135 15195 15947 16453 16916 17137 17268

401 460 992 1145 1576 1678 2238 2320 4280 6770 10027 12486 15363 16714 17157

1161 3108 3727 4508 5092 5348 5582 7727 11793 12515 12917 13362 14247 16717 17205

542 1190 6883 7911 8349 8835 10489 11631 14195 15009 15454 15482 16632 17040 17063

17 487 776 880 5077 6172 9771 11446 12798 16016 16109 16171 17087 17132 17226

1337 3275 3462 4229 9246 10180 10845 10866 12250 13633 14482 16024 16812 17186 17241

15 980 2305 3674 5971 8224 11499 11752 11770 12897 14082 14836 15311 16391 17209

0 3926 5869 8696 9351 9391 11371 14052 14172 14636 14974 16619 16961 17033 17237

3033 5317 6501 8579 10698 12168 12966 14019 15392 15806 15991 16493 16690 17062 17090

981 1205 4400 6410 11003 13319 13405 14695 15846 16297 16492 16563 16616 16862 16953

1725 4276 8869 9588 14062 14486 15474 15548 16300 16432 17042 17050 17060 17175 17273

1807 5921 9960 10011 14305 14490 14872 15852 16054 16061 16306 16799 16833 17136 17262

2826 4752 6017 6540 7016 8201 14245 14419 14716 15983 16569 16652 17171 17179 17247

1662 2516 3345 5229 8086 9686 11456 12210 14595 15808 16011 16421 16825 17112 17195

2890 4821 5987 7226 8823 9869 12468 14694 15352 15805 16075 16462 17102 17251 17263

3751 3890 4382 5720 10281 10411 11350 12721 13121 14127 14980 15202 15335 16735 17123

26 30 2805 5457 6630 7188 7477 7556 11065 16608 16859 16909 16943 17030 17103

40 4524 5043 5566 9645 10204 10282 11696 13080 14837 15607 16274 17034 17225 17266

904 3157 6284 7151 7984 11712 12887 13767 15547 16099 16753 16829 17044 17250 17259

7 311 4876 8334 9249 11267 14072 14559 15003 15235 15686 16331 17177 17238 17253

4410 8066 8596 9631 10369 11249 12610 15769 16791 16960 17018 17037 17062 17165 17204

24 8261 9691 10138 11607 12782 12786 13424 13933 15262 15795 16476 17084 17193 17220

88 11622 14705 15890

304 2026 2638 6018

1163 4268 11620 17232

9701 11785 14463 17260

4118 10952 12224 17006

3647 10823 11521 12060

1717 3753 9199 11642

2187 14280 17220

14787 16903 17061

381 3534 4294

3149 6947 8323

12562 16724 16881

7289 9997 15306

5615 13152 17260

5666 16926 17027

4190 7798 16831

4778 10629 17180

10001 13884 15453

6 2237 8203

7831 15144 15160

9186 17204 17243

9435 17168 17237

42 5701 17159

7812 14259 15715

39 4513 6658

38 9368 11273

1119 4785 17182

5620 16521 16729

16 6685 17242

210 3452 12383

466 14462 16250

10548 12633 13962

1452 6005 16453

22 4120 13684

5195 11563 16522

5518 16705 17201

12233 14552 15471

6067 13440 17248

8660 8967 17061

8673 12176 15051

5959 15767 16541

3244 12109 12414

31 15913 16323

3270 15686 16653

24 7346 14675

12 1531 8740

6228 7565 16667

16936 17122 17162

4868 8451 13183

3714 4451 16919

11313 13801 17132

17070 17191 17242

1911 11201 17186

14 17190 17254

11760 16008 16832

14543 17033 17278

16129 16765 17155

6891 15561 17007

12741 14744 17116

8992 16661 17277

1861 11130 16742

4822 13331 16192

13281 14027 14989

38 14887 17141

10698 13452 15674

4 2539 16877

857 17170 17249

11449 11906 12867

285 14118 16831

15191 17214 17242

39 728 16915

2469 12969 15579

16644 17151 17164

2592 8280 10448

9236 12431 17173

9064 16892 17233

4526 16146 17038

31 2116 16083

15837 16951 17031

5362 8382 16618

6137 13199 17221

2841 15068 17068

24 3620 17003

9880 15718 16764

1784 10240 17209

2731 10293 10846

3121 8723 16598

8563 15662 17088

13 1167 14676

29 13850 15963

3654 7553 8114

23 4362 14865

4434 14741 16688

8362 13901 17244

13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

In the fourth data processing device/method as above, a sequence of the LDPC code after the group-wise interleave that is acquired from data transmitted from a transmitting device is returned to an original state, wherein the transmitting device includes: a coding unit that performs LDPC coding on the basis of a parity check matrix of an LDPC code having a code length N of 64800 bits and a coding rate r of 11/15; a group-wise interleaving unit that performs group-wise interleave interleaving the LDPC code in units of bit groups of 360 bits; and a mapping unit that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 51, 47, 53, 43, 55, 59, 49, 33, 35, 31, 24, 37, 0, 2, 45, 41, 39, 57, 42, 44, 52, 40, 23, 30, 32, 34, 54, 56, 46, 50, 122, 48, 1, 36, 38, 58, 77, 3, 65, 81, 67, 147, 83, 69, 26, 75, 85, 73, 79, 145, 71, 63, 5, 61, 70, 78, 68, 62, 66, 6, 64, 149, 60, 82, 80, 4, 76, 84, 72, 154, 86, 74, 89, 128, 137, 91, 141, 93, 101, 7, 87, 9, 103, 99, 95, 11, 13, 143, 97, 133, 136, 12, 100, 94, 14, 88, 142, 96, 92, 8, 152, 10, 139, 102, 104, 132, 90, 98, 114, 112, 146, 123, 110, 15, 125, 150, 120, 153, 29, 106, 134, 27, 127, 108, 130, 116, 28, 107, 126, 25, 131, 124, 129, 151, 121, 105, 111, 115, 135, 148, 109, 117, 158, 113, 170, 119, 162, 178, 155, 176, 18, 20, 164, 157, 160, 22, 140, 16, 168, 166, 172, 174, 175, 179, 118, 138, 156, 19, 169, 167, 163, 173, 161, 177, 165, 144, 171, 17, 21, and 159, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element “1” in the information matrix portion for every 360 columns and is 696 989 1238 3091 3116 3738 4269 6406 7033 8048 9157 10254 12033 16456 16912

444 1488 6541 8626 10735 12447 13111 13706 14135 15195 15947 16453 16916 17137 17268

401 460 992 1145 1576 1678 2238 2320 4280 6770 10027 12486 15363 16714 17157

1161 3108 3727 4508 5092 5348 5582 7727 11793 12515 12917 13362 14247 16717 17205

542 1190 6883 7911 8349 8835 10489 11631 14195 15009 15454 15482 16632 17040 17063

17 487 776 880 5077 6172 9771 11446 12798 16016 16109 16171 17087 17132 17226

1337 3275 3462 4229 9246 10180 10845 10866 12250 13633 14482 16024 16812 17186 17241

15 980 2305 3674 5971 8224 11499 11752 11770 12897 14082 14836 15311 16391 17209

0 3926 5869 8696 9351 9391 11371 14052 14172 14636 14974 16619 16961 17033 17237

3033 5317 6501 8579 10698 12168 12966 14019 15392 15806 15991 16493 16690 17062 17090

981 1205 4400 6410 11003 13319 13405 14695 15846 16297 16492 16563 16616 16862 16953

1725 4276 8869 9588 14062 14486 15474 15548 16300 16432 17042 17050 17060 17175 17273

1807 5921 9960 10011 14305 14490 14872 15852 16054 16061 16306 16799 16833 17136 17262

2826 4752 6017 6540 7016 8201 14245 14419 14716 15983 16569 16652 17171 17179 17247

1662 2516 3345 5229 8086 9686 11456 12210 14595 15808 16011 16421 16825 17112 17195

2890 4821 5987 7226 8823 9869 12468 14694 15352 15805 16075 16462 17102 17251 17263

3751 3890 4382 5720 10281 10411 11350 12721 13121 14127 14980 15202 15335 16735 17123

26 30 2805 5457 6630 7188 7477 7556 11065 16608 16859 16909 16943 17030 17103

40 4524 5043 5566 9645 10204 10282 11696 13080 14837 15607 16274 17034 17225 17266

904 3157 6284 7151 7984 11712 12887 13767 15547 16099 16753 16829 17044 17250 17259

7 311 4876 8334 9249 11267 14072 14559 15003 15235 15686 16331 17177 17238 17253

4410 8066 8596 9631 10369 11249 12610 15769 16791 16960 17018 17037 17062 17165 17204

24 8261 9691 10138 11607 12782 12786 13424 13933 15262 15795 16476 17084 17193 17220

88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522

5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579
16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

According to the present technology, there is provided a fifth data processing device/method including: a coding unit/step that performs LDPC coding on the basis of a parity check matrix of an LDPC code having a code length N of 64800 bits and a coding rate r of 13/15; a group-wise interleaving unit/step that performs group-wise interleave interleaving the LDPC code in units of bit groups of 360 bits; and a mapping unit/step that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 142 2307 2598 2650 4028 4434 5781 5881 6016 6323 6681 6698 8125

2932 4928 5248 5256 5983 6773 6828 7789 8426 8494 8534 8539 8583

899 3295 3833 5399 6820 7400 7753 7890 8109 8451 8529 8564 8602

21 3060 4720 5429 5636 5927 6966 8110 8170 8247 8355 8365 8616

20 1745 2838 3799 4380 4418 4646 5059 7343 8161 8302 8456 8631

9 6274 6725 6792 7195 7333 8027 8186 8209 8273 8442 8548 8632

494 1365 2405 3799 5188 5291 7644 7926 8139 8458 8504 8594 8625

192 574 1179 4387 4695 5089 5831 7673 7789 8298 8301 8612 8632

11 20 1406 6111 6176 6256 6708 6834 7828 8232 8457 8495 8602

6 2654 3554 4483 4966 5866 6795 8069 8249 8301 8497 8509 8623

21 1144 2355 3124 6773 6805 6887 7742 7994 8358 8374 8580 8611

335 4473 4883 5528 6096 7543 7586 7921 8197 8319 8394 8489 8636

2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609

1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

In the fifth data processing device/method as described above, LDPC coding is performed on the basis of a parity check matrix of an LDPC code having a code length N of 64800 bits and a coding rate r of 13/15, group-wise interleave interleaving the LDPC code in units of bit groups of 360 bits is performed, and the LDPC code is mapped into one of 1024 signal points determined according to a modulation scheme in units of 10 bits. In the group-wise interleave, by using an (i+1)-th bit group from a head of the LDPC code as a bit group i, a sequence of bit groups 0 to 179 of the LDPC code of 64800 bits is interleaved into a sequence of bit groups 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175.

The LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921

200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

According to the present technology, there is provided a sixth data processing device/method including a group-wise deinterleaving unit/step that returns a sequence of the LDPC code after the group-wise interleave that is acquired from data transmitted from a transmitting device to an original state. The transmitting device includes: a coding unit that performs LDPC coding on the basis of a parity check matrix of an LDPC code having a code length N of 64800 bits and a coding rate r of 13/15; a group-wise interleaving unit that performs group-wise interleave interleaving the LDPC code in units of bit groups of 360 bits; and a mapping unit that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 142 2307 2598 2650 4028 4434 5781 5881 6016 6323 6681 6698 8125

2932 4928 5248 5256 5983 6773 6828 7789 8426 8494 8534 8539 8583

899 3295 3833 5399 6820 7400 7753 7890 8109 8451 8529 8564 8602

21 3060 4720 5429 5636 5927 6966 8110 8170 8247 8355 8365 8616

20 1745 2838 3799 4380 4418 4646 5059 7343 8161 8302 8456 8631

9 6274 6725 6792 7195 7333 8027 8186 8209 8273 8442 8548 8632

494 1365 2405 3799 5188 5291 7644 7926 8139 8458 8504 8594 8625

192 574 1179 4387 4695 5089 5831 7673 7789 8298 8301 8612 8632

11 20 1406 6111 6176 6256 6708 6834 7828 8232 8457 8495 8602

6 2654 3554 4483 4966 5866 6795 8069 8249 8301 8497 8509 8623

21 1144 2355 3124 6773 6805 6887 7742 7994 8358 8374 8580 8611

335 4473 4883 5528 6096 7543 7586 7921 8197 8319 8394 8489 8636

2919 4331 4419 4735 6366 6393 6844 7193 8165 8205 8544 8586 8617

12 19 742 930 3009 4330 6213 6224 7292 7430 7792 7922 8137

710 1439 1588 2434 3516 5239 6248 6827 8230 8448 8515 8581 8619

200 1075 1868 5581 7349 7642 7698 8037 8201 8210 8320 8391 8526

3 2501 4252 5256 5292 5567 6136 6321 6430 6486 7571 8521 8636

3062 4599 5885 6529 6616 7314 7319 7567 8024 8153 8302 8372 8598

105 381 1574 4351 5452 5603 5943 7467 7788 7933 8362 8513 8587

787 1857 3386 3659 6550 7131 7965 8015 8040 8312 8484 8525 8537

15 1118 4226 5197 5575 5761 6762 7038 8260 8338 8444 8512 8568

36 5216 5368 5616 6029 6591 8038 8067 8299 8351 8565 8578 8585

1 23 4300 4530 5426 5532 5817 6967 7124 7979 8022 8270 8467

629 2133 4828 5475 5875 5890 7194 8042 8345 8385 8518 8598 8612

11 1065 3782 4237 4993 7104 7863 7904 8104 8228 8321 8383 8565

2131 2274 3168 3215 3220 5597 6347 7812 8238 8354 8527 8557 8614

5600 6591 7491 7696

1766 8281 8626

1725 2280 5120

1650 3445 7652

4312 6911 8626

15 1013 5892

2263 2546 2979

1545 5873 7406

67 726 3697

2860 6443 8542

17 911 2820

1561 4580 6052

79 5269 7134

22 2410 2424

3501 5642 8627

808 6950 8571

4099 6389 7482

4023 5000 7833

5476 5765 7917

1008 3194 7207

20 495 5411

1703 8388 8635

6 4395 4921

200 2053 8206

1089 5126 5562

10 4193 7720

1967 2151 4608

22 738 3513

3385 5066 8152

440 1118 8537

3429 6058 7716

5213 7519 8382

5564 8365 8620

43 3219 8603

4 5409 5815

5 6376 7654

4091 5724 5953

5348 6754 8613

1634 6398 6632

72 2058 8605

3497 5811 7579

3846 6743 8559

15 5933 8629

2133 5859 7068

4151 4617 8566

2960 8270 8410

2059 3617 8210

544 1441 6895

4043 7482 8592

294 2180 8524

3058 8227 8373

364 5756 8617

5383 8555 8619

1704 2480 4181

7338 7929 7990

2615 3905 7981

4298 4548 8296

8262 8319 8630

892 1893 8028

5694 7237 8595

1487 5012 5810

4335 8593 8624

3509 4531 5273

10 22 830

4161 5208 6280

275 7063 8634

4 2725 3113

2279 7403 8174

1637 3328 3930

2810 4939 5624

3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

In the sixth data processing device/method as above, a sequence of the LDPC code after the group-wise interleave that is acquired from data transmitted from a transmitting device is returned to an original state, wherein the transmitting device includes: a coding unit that performs LDPC coding on the basis of a parity check matrix of an LDPC code having a code length N of 64800 bits and a coding rate r of 13/15; a group-wise interleaving unit that performs group-wise interleave interleaving the LDPC code in units of bit groups of 360 bits; and a mapping unit that maps the LDPC code into one of 1024 signal points determined according to a modulation scheme in units of 10 bits, wherein, in the group-wise interleave, by using an (i+1)-th bit group from a head of the LDPC code as a bit group i, a sequence of bit groups 0 to 179 of the LDPC code of 64800 bits is interleaved into a sequence of bit groups 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175, the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table representing a position of an element "1" in the information matrix portion for every 360 columns and is 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598

105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054

1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

Here, the data processing device may be an independent device or an internal block configuring one device.

Effects of the Invention

According to the present technology, in data transmission using the LDPC code, excellent communication quality can be secured.

Note that the effects described here are not necessarily limited, but anyone effect described in the present disclosure may be acquired.

BRIEF DESCRIPTION OF DRAWINGS

FIG. 3 is a diagram that illustrates an example of a parity check matrix of an LDPC code.

FIG. 13 is a diagram that illustrates the parity check matrix of the LDPC code that is defined in the standard of the DVB-T.2.

FIG. 15 is a diagram that illustrates an example of a parity matrix $H_T$ having a staircase structure and a Tanner graph corresponding to the parity matrix $H_T$.

FIG. 30 is a diagram that illustrates an example of the parity check matrix initial value table.

FIG. 31 is a diagram that illustrates an example of the parity check matrix initial value table.

FIG. 32 is a diagram that illustrates an example of the parity check matrix initial value table.

FIG. 33 is a diagram that illustrates an example of the parity check matrix initial value table.

FIG. 34 is a diagram that illustrates an example of the parity check matrix initial value table.

FIG. 35 is a diagram that illustrates an example of the parity check matrix initial value table.

FIG. 36 is a diagram that illustrates an example of the parity check matrix initial value table.

FIG. 37 is a diagram that illustrates an example of the parity check matrix initial value table.

FIG. 38 is a diagram that illustrates an example of the parity check matrix initial value table.

FIG. 39 is a diagram that illustrates an example of the parity check matrix initial value table.

FIG. 40 is a diagram that illustrates an example of the parity check matrix initial value table.

FIG. 41 is a diagram that illustrates an example of the parity check matrix initial value table.

FIG. 42 is a diagram that illustrates an example of the parity check matrix initial value table.

FIG. 43 is a diagram that illustrates an example of the parity check matrix initial value table.

FIG. 44 is a diagram that illustrates an example of the parity check matrix initial value table.

FIG. 45 is a diagram that illustrates an example of the parity check matrix initial value table.

FIG. 46 is a diagram that illustrates an example of the parity check matrix initial value table.

FIG. 47 is a diagram that illustrates an example of the parity check matrix initial value table.

FIG. 48 is a diagram that illustrates an example of the parity check matrix initial value table.

FIG. 49 is a diagram that illustrates an example of the parity check matrix initial value table.

FIG. 50 is a diagram that illustrates an example of the parity check matrix initial value table.

FIG. 51 is a diagram that illustrates an example of the parity check matrix initial value table.

FIG. 52 is a diagram that illustrates an example of the parity check matrix initial value table.

FIG. 53 is a diagram that illustrates an example of the parity check matrix initial value table.

FIG. 54 is a diagram that illustrates an example of the parity check matrix initial value table.

FIG. 55 is a diagram that illustrates an example of the parity check matrix initial value table.

FIG. 56 is a diagram that illustrates an example of the parity check matrix initial value table.

FIG. 57 is a diagram that illustrates an example of the parity check matrix initial value table.

FIG. 58 is a diagram that illustrates an example of the parity check matrix initial value table.

FIG. 59 is a diagram that illustrates an example of the parity check matrix initial value table.

FIG. 60 is a diagram that illustrates an example of the parity check matrix initial value table.

FIG. 61 is a diagram that illustrates an example of the parity check matrix initial value table.

FIG. 62 is a diagram that illustrates an example of the parity check matrix initial value table.

FIG. 63 is a diagram that illustrates an example of the parity check matrix initial value table.

FIG. 64 is a diagram that illustrates an example of the parity check matrix initial value table.

FIG. 65 is a diagram that illustrates an example of the parity check matrix initial value table.

FIG. 66 is a diagram that illustrates an example of the parity check matrix initial value table.

FIG. 67 is a diagram that illustrates an example of the parity check matrix initial value table.

FIG. 68 is a diagram that illustrates an example of the parity check matrix initial value table.

FIG. 69 is a diagram that illustrates an example of the parity check matrix initial value table.

FIG. 70 is a diagram that illustrates an example of the parity check matrix initial value table.

FIG. 71 is a diagram that illustrates an example of the parity check matrix initial value table.

FIG. 72 is a diagram that illustrates an example of the parity check matrix initial value table.

FIG. 87 is a diagram that illustrates an example of coordinates of a signal point of a UC in a case where a modulation scheme is QPSK.

FIG. 88 is a diagram that illustrates an example of coordinates of a signal point of a 2D NUC in a case where a modulation scheme is 16 QAM.

FIG. 89 is a diagram that illustrates an example of coordinates of a signal point of a 2D NUC in a case where a modulation scheme is 64 QAM.

FIG. 90 is a diagram that illustrates an example of coordinates of a signal point of a 2D NUC in a case where a modulation scheme is 256 QAM.

FIG. 91 is a diagram that illustrates an example of coordinates of a signal point of a 2D NUC in a case where a modulation scheme is 256 QAM.

FIG. 92 is a diagram that illustrates an example of coordinates of a signal point of a 1D NUC in a case where a modulation scheme is 1024QAM.

FIG. 93 is a diagram that illustrates relations between a symbol y and a real part Re $(z_q)$ and an imaginary part Im $(z_q)$ of a complex number as coordinates of a signal point $z_q$ of a 1D NUC corresponding to the symbol y.

FIG. 95 is a diagram that illustrates an example of the number C of columns of parts 1 and 2 and part column lengths R1 and R2 for each combination of a code length N and a modulation scheme.

FIG. 98 is a diagram that illustrates a first example of a GW pattern for an LDPC code having a code length N of 64 k bits.

FIG. 99 is a diagram that illustrates a second example of a GW pattern for an LDPC code having a code length N of 64 k bits.

FIG. 109 is a diagram that illustrates a 12th example of a GW pattern for an LDPC code having a code length N of 64 k bits.

FIG. 114 is a diagram that illustrates a 17th example of a GW pattern for an LDPC code having a code length N of 64 k bits.

FIG. 117 is a diagram that illustrates a 20th example of a GW pattern for an LDPC code having a code length N of 64 k bits.

FIG. 120 is a diagram that illustrates a 23rd example of a GW pattern for an LDPC code having a code length N of 64 k bits.

FIG. 121 is a diagram that illustrates a 24th example of a GW pattern for an LDPC code having a code length N of 64 k bits.

FIG. 122 is a diagram that illustrates a 25th example of a GW pattern for an LDPC code having a code length N of 64 k bits.

FIG. 123 is a diagram that illustrates a 26th example of a GW pattern for an LDPC code having a code length N of 64 k bits.

FIG. 124 is a diagram that illustrates a 27th example of a GW pattern for an LDPC code having a code length N of 64 k bits.

FIG. 125 is a diagram that illustrates a 28th example of a GW pattern for an LDPC code having a code length N of 64 k bits.

FIG. 126 is a diagram that illustrates a 29th example of a GW pattern for an LDPC code having a code length N of 64 k bits.

FIG. 127 is a diagram that illustrates a simulation result of a simulation of measuring an error rate.

FIG. 128 is a diagram that illustrates a simulation result of a simulation of measuring an error rate.

FIG. 129 is a diagram that illustrates a simulation result of a simulation of measuring an error rate.

FIG. 130 is a diagram that illustrates a simulation result of a simulation of measuring an error rate.

FIG. 131 is a diagram that illustrates a simulation result of a simulation of measuring an error rate.

Figure 132:
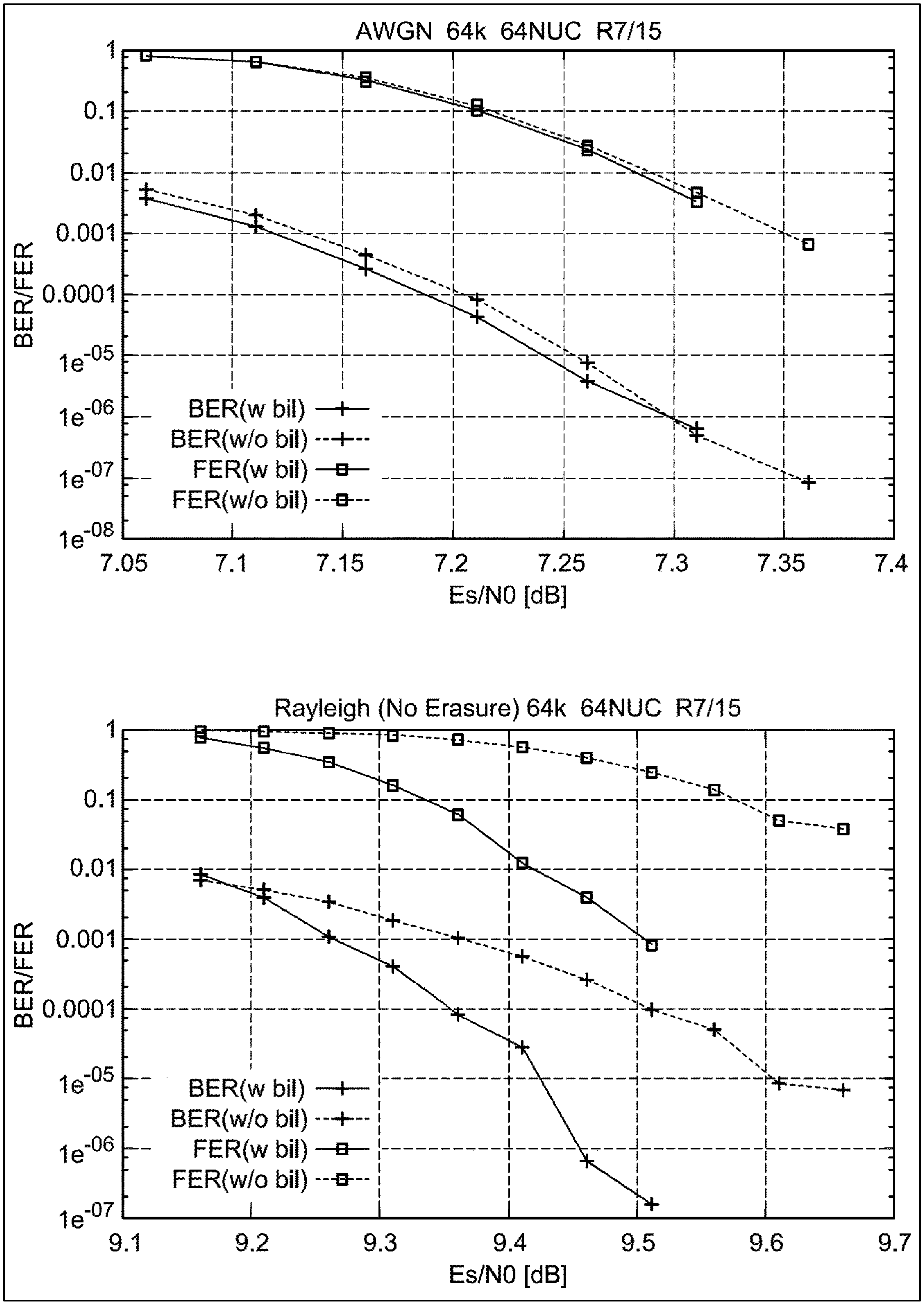

FIG. 132 is a diagram that illustrates a simulation result of a simulation of measuring an error rate.

Figure 133:
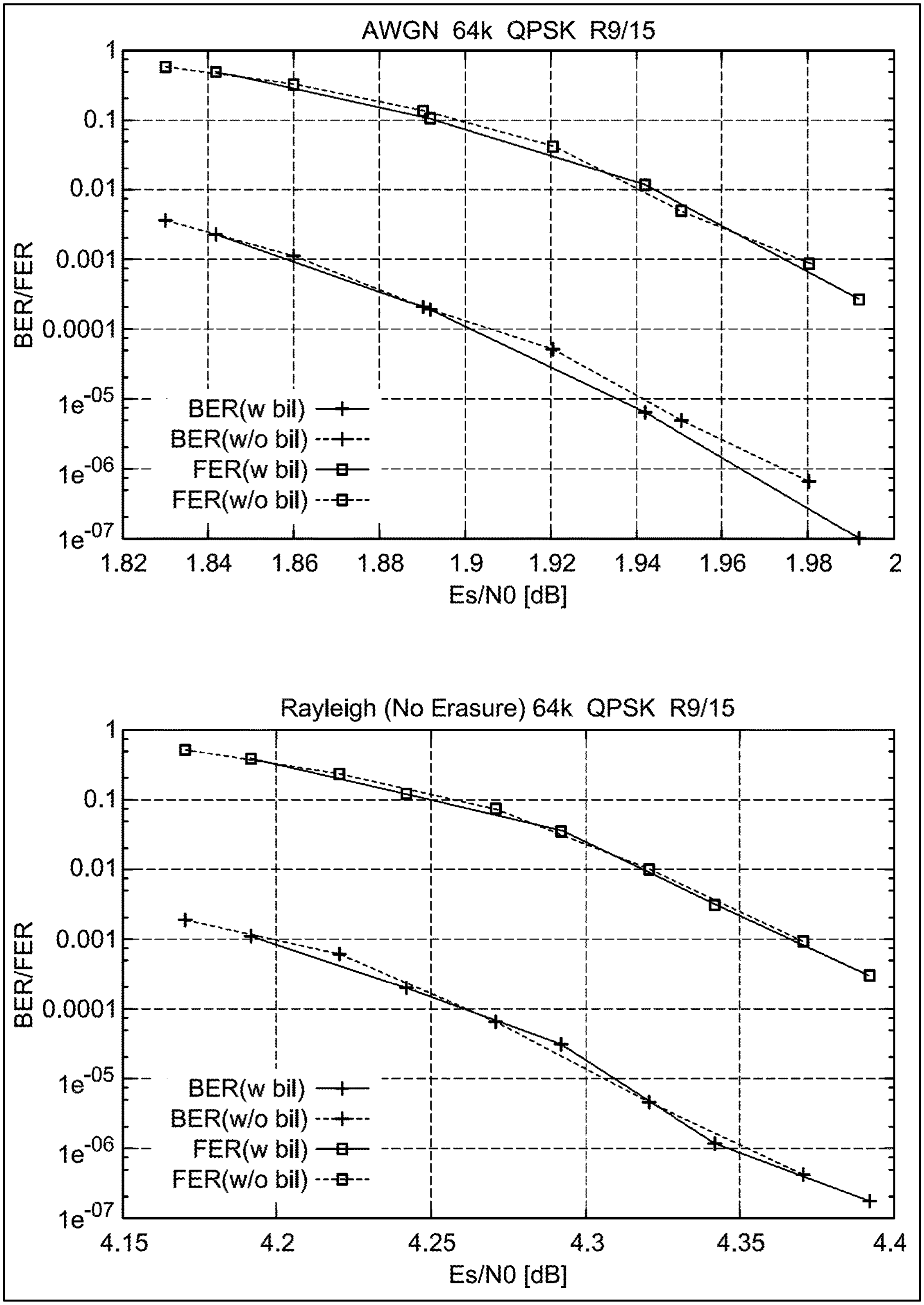

FIG. 133 is a diagram that illustrates a simulation result of a simulation of measuring an error rate.

Figure 134:
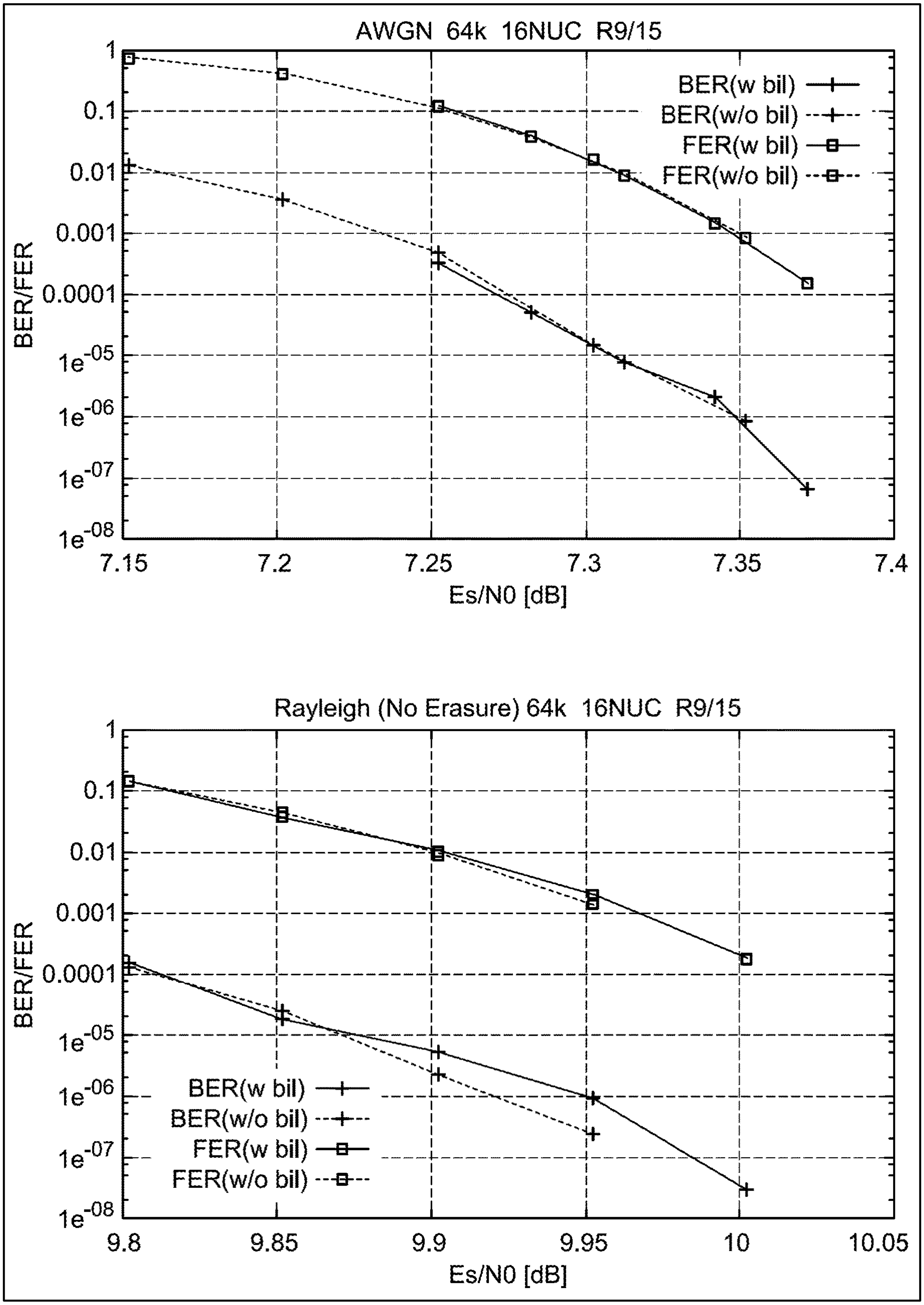

FIG. 134 is a diagram that illustrates a simulation result of a simulation of measuring an error rate.

Figure 135:
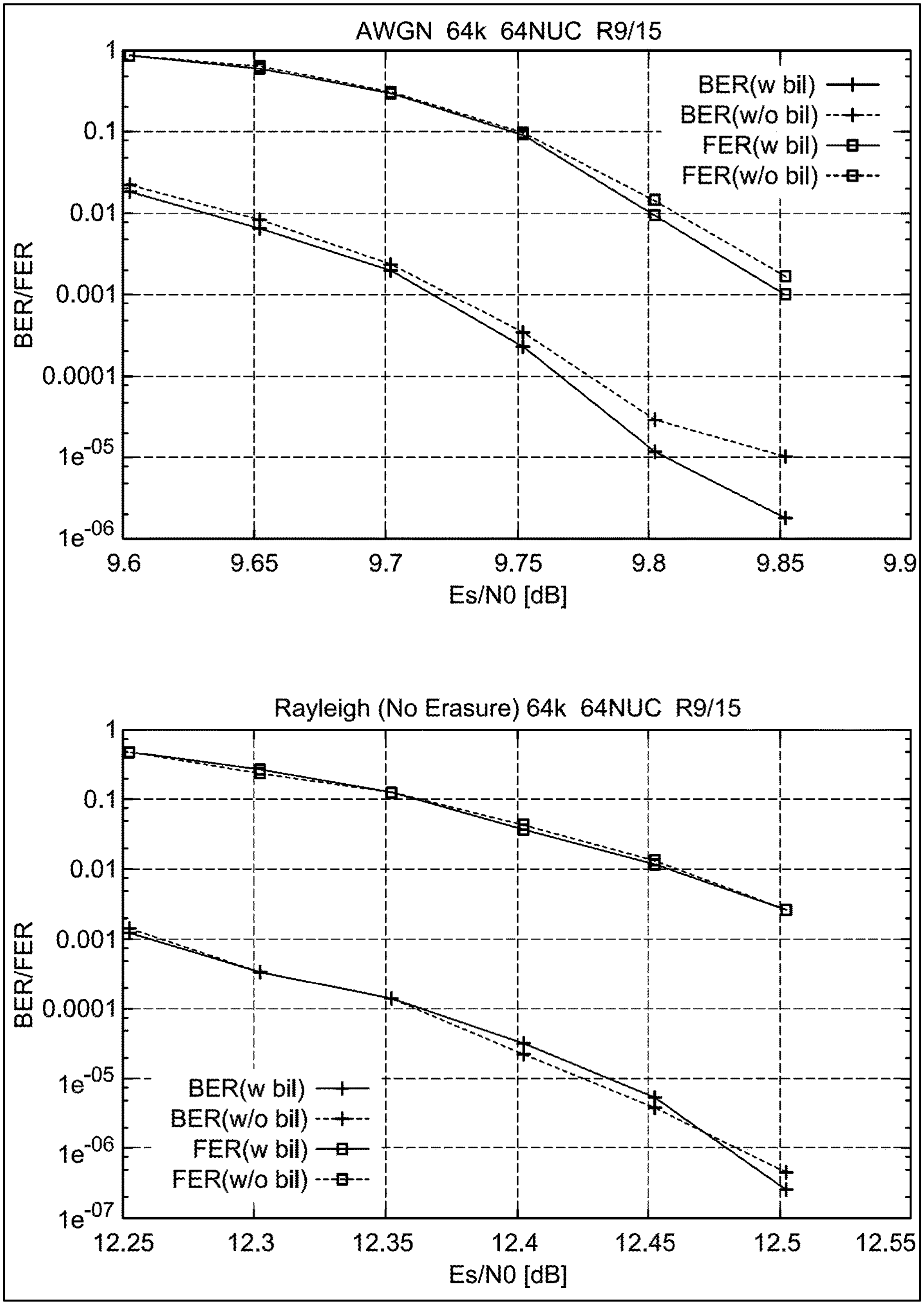

FIG. 135 is a diagram that illustrates a simulation result of a simulation of measuring an error rate.

Figure 136:
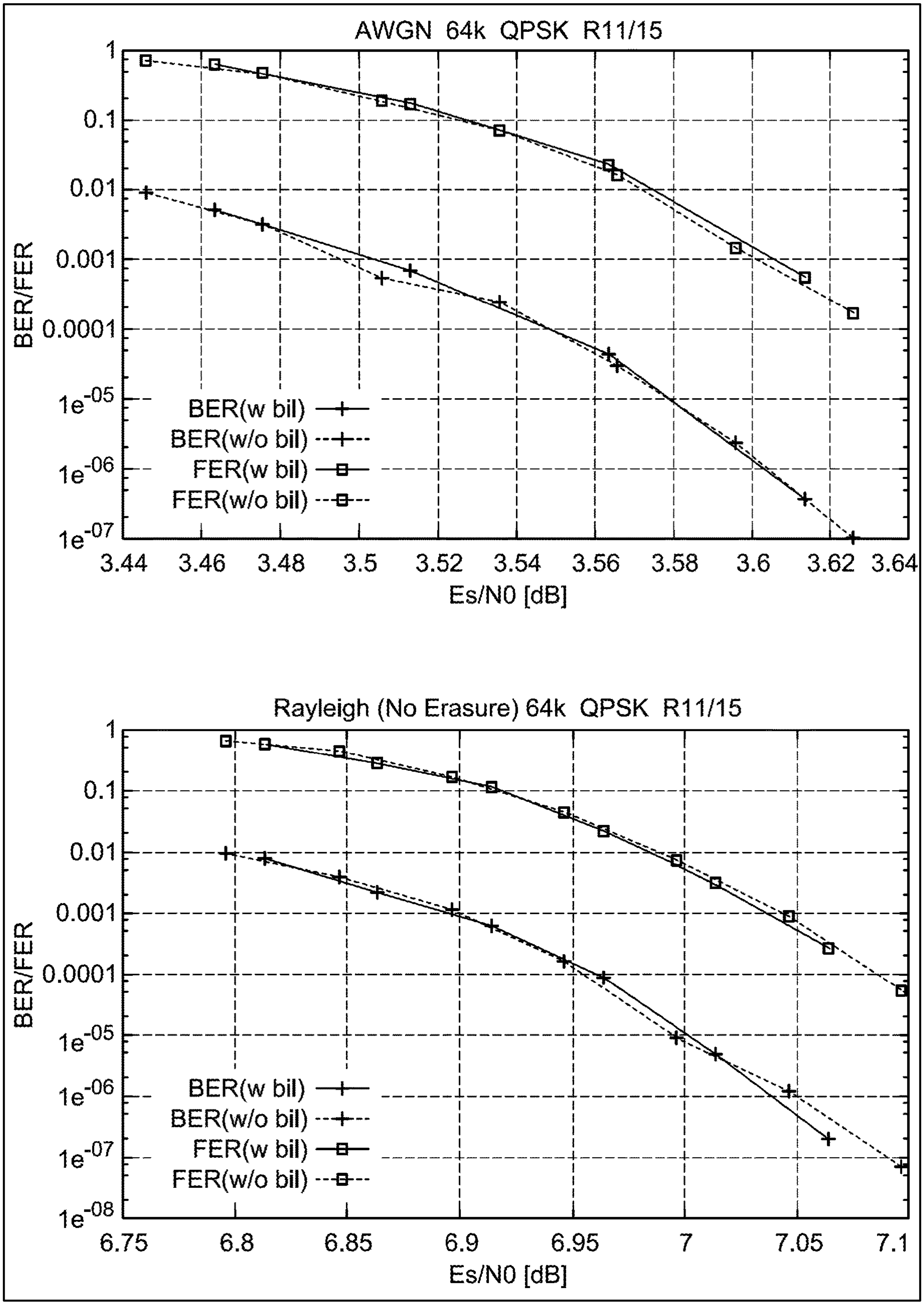

FIG. 136 is a diagram that illustrates a simulation result of a simulation of measuring an error rate.

Figure 137:
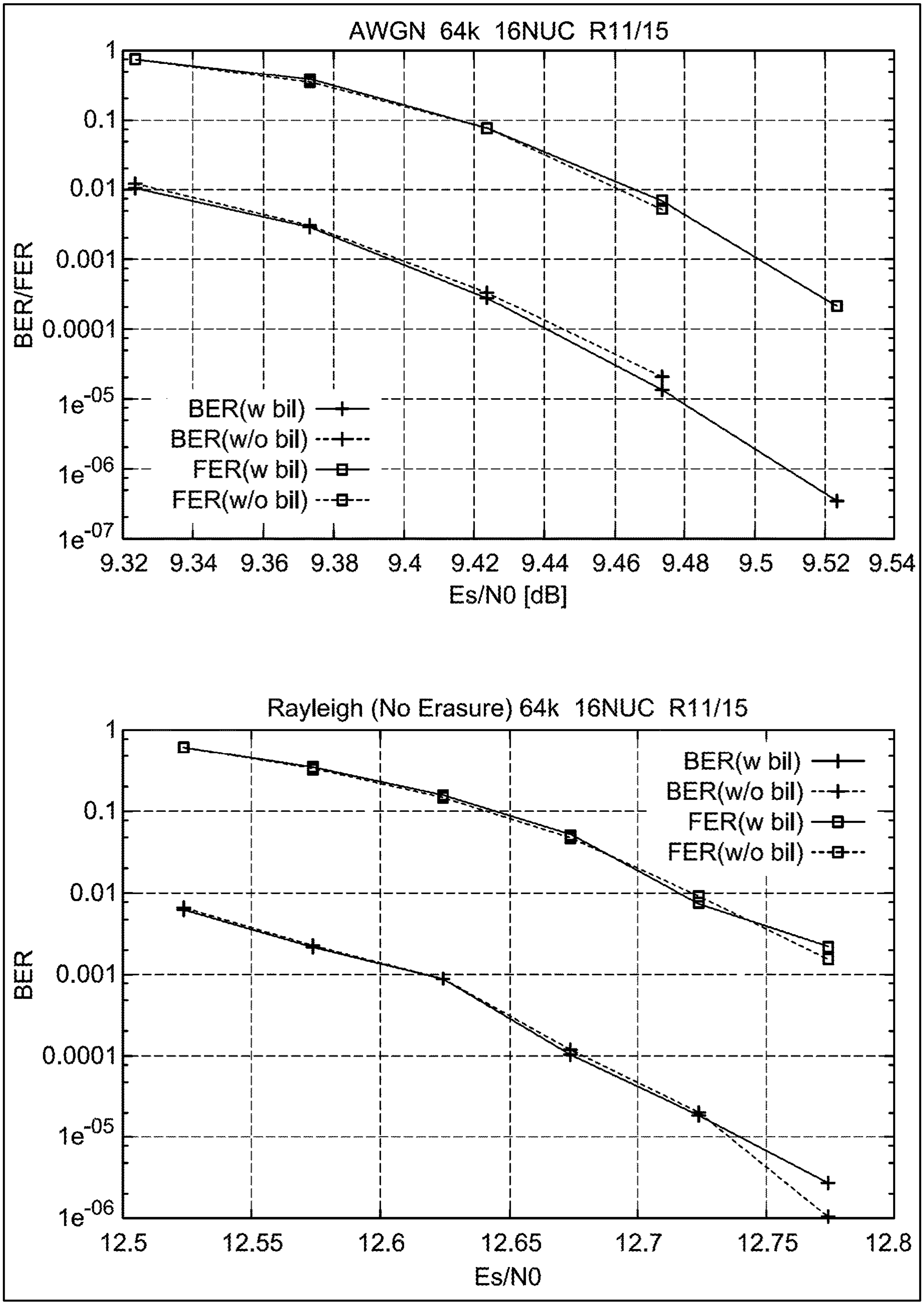

FIG. 137 is a diagram that illustrates a simulation result of a simulation of measuring an error rate.

Figure 138:
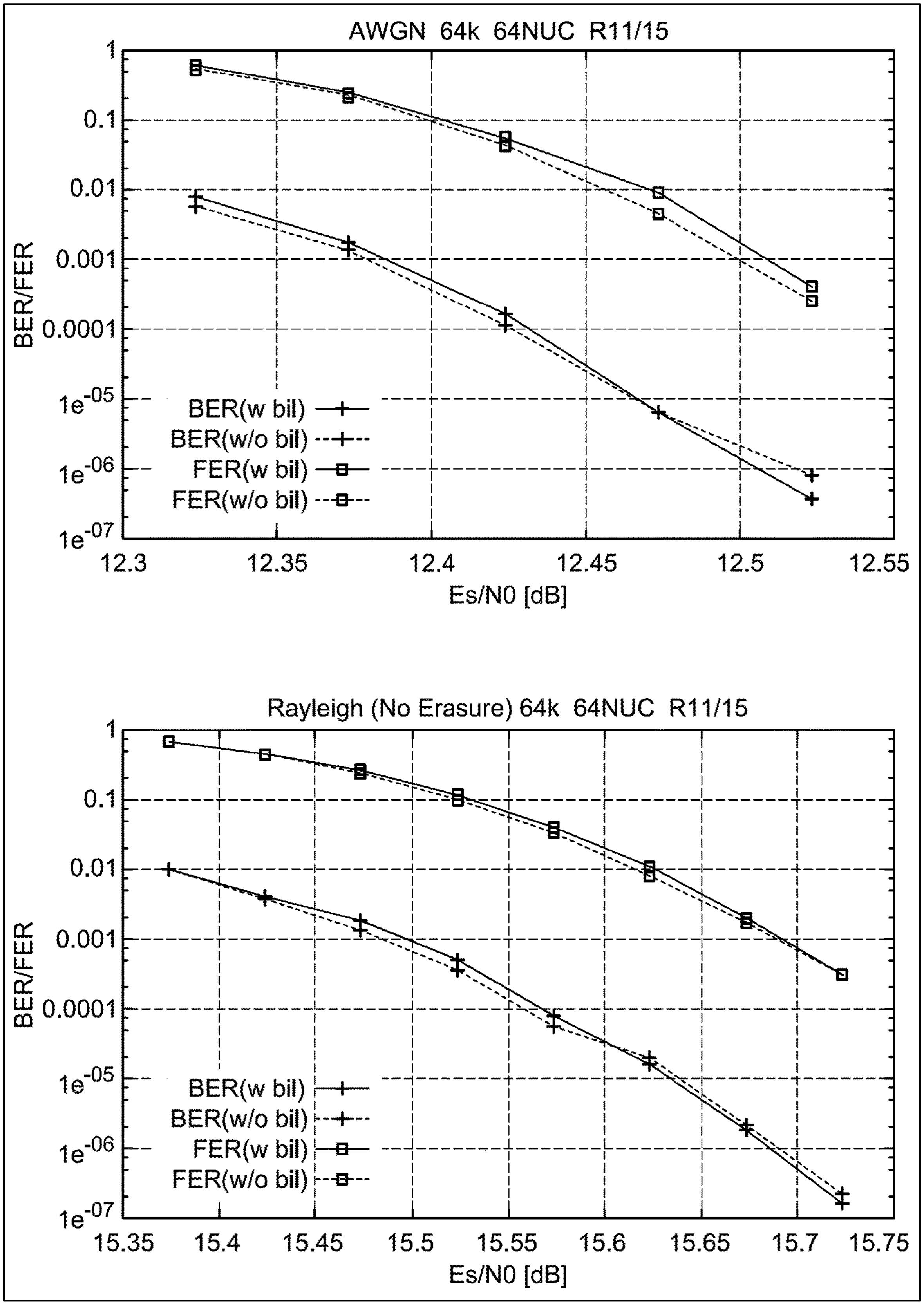

FIG. 138 is a diagram that illustrates a simulation result of a simulation of measuring an error rate.

Figure 139:
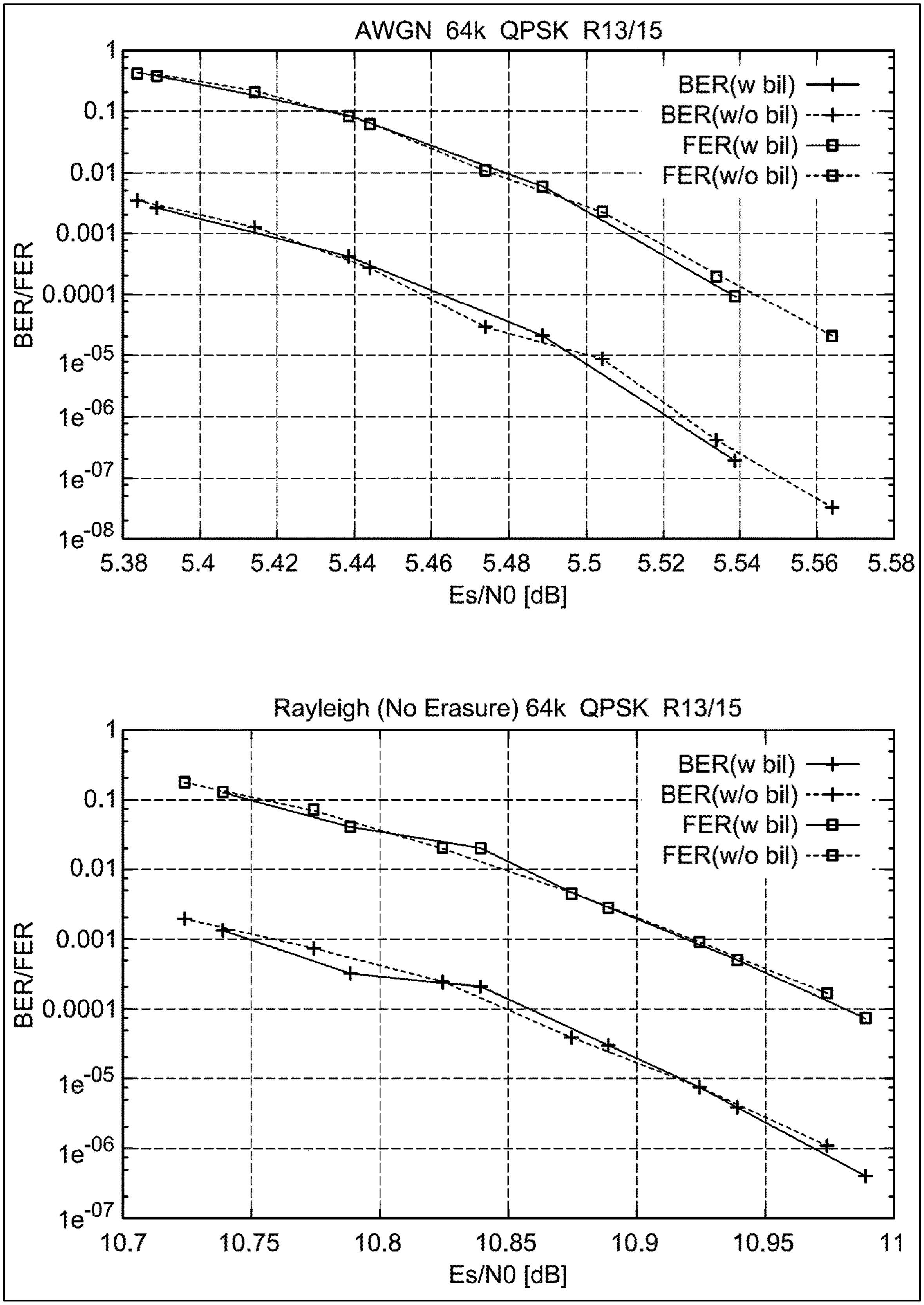

FIG. 139 is a diagram that illustrates a simulation result of a simulation of measuring an error rate.

Figure 140:
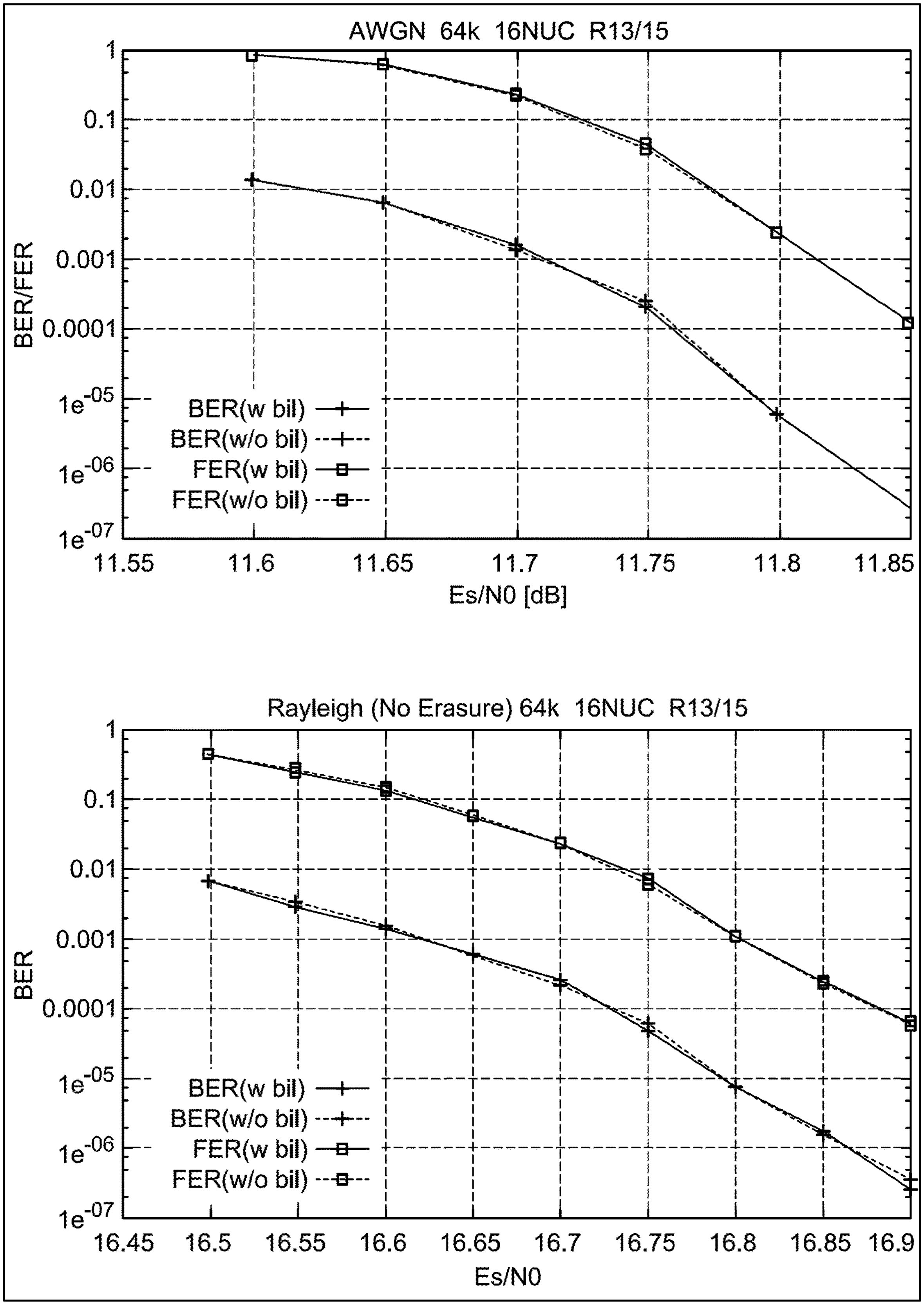

FIG. 140 is a diagram that illustrates a simulation result of a simulation of measuring an error rate.

Figure 141:
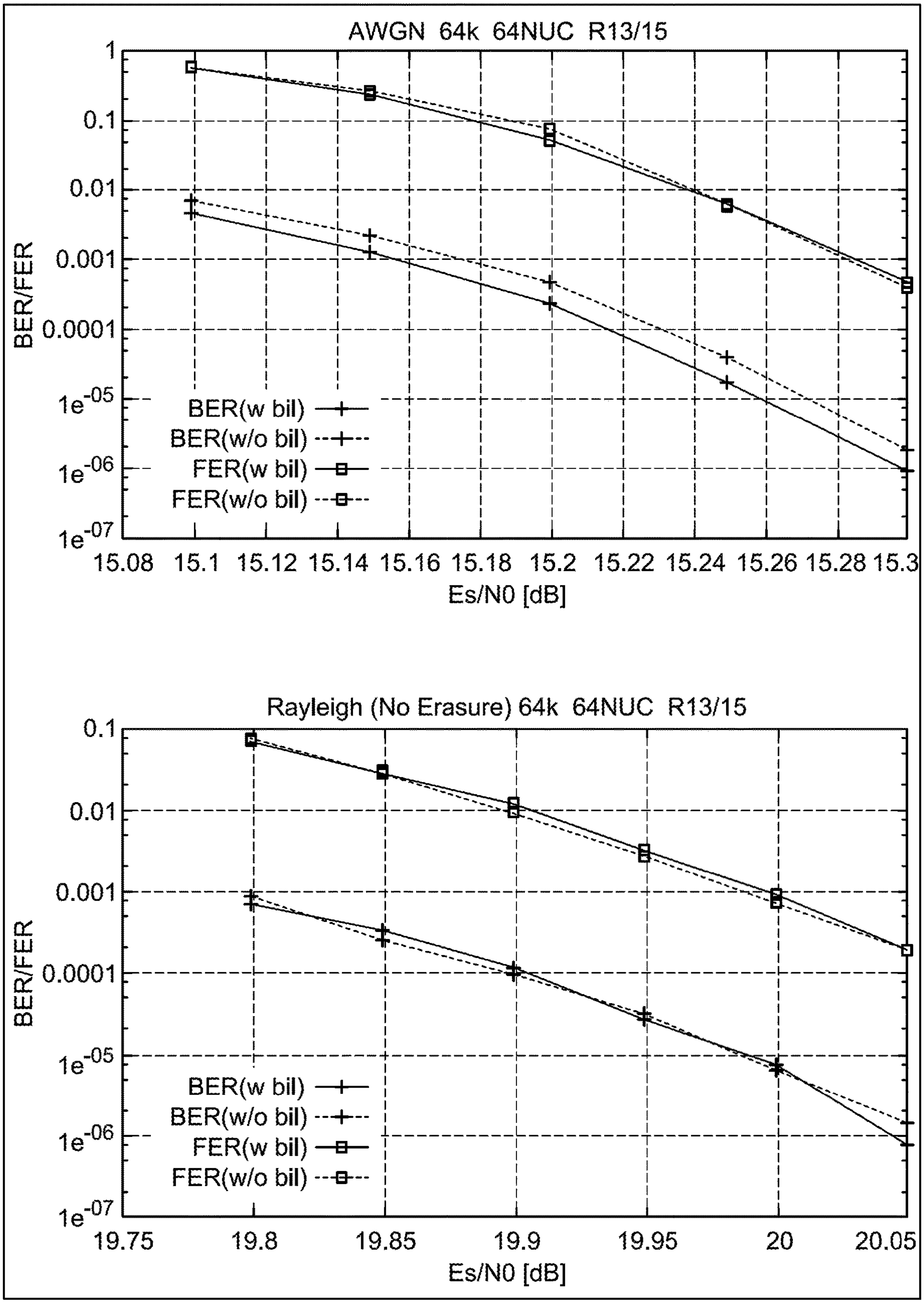

FIG. 141 is a diagram that illustrates a simulation result of a simulation of measuring an error rate.

Figure 142:
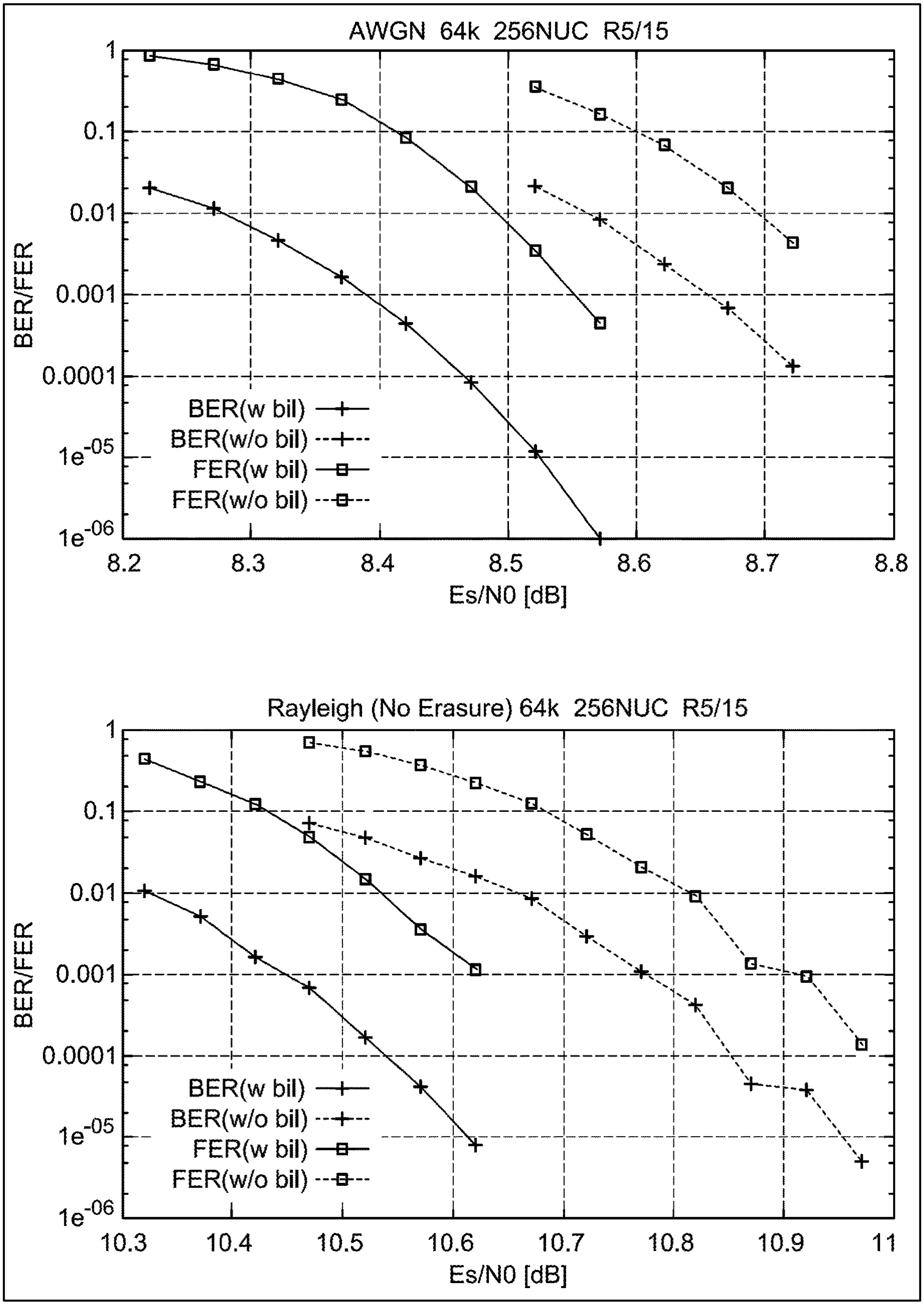

FIG. 142 is a diagram that illustrates a simulation result of a simulation of measuring an error rate.

Figure 143:
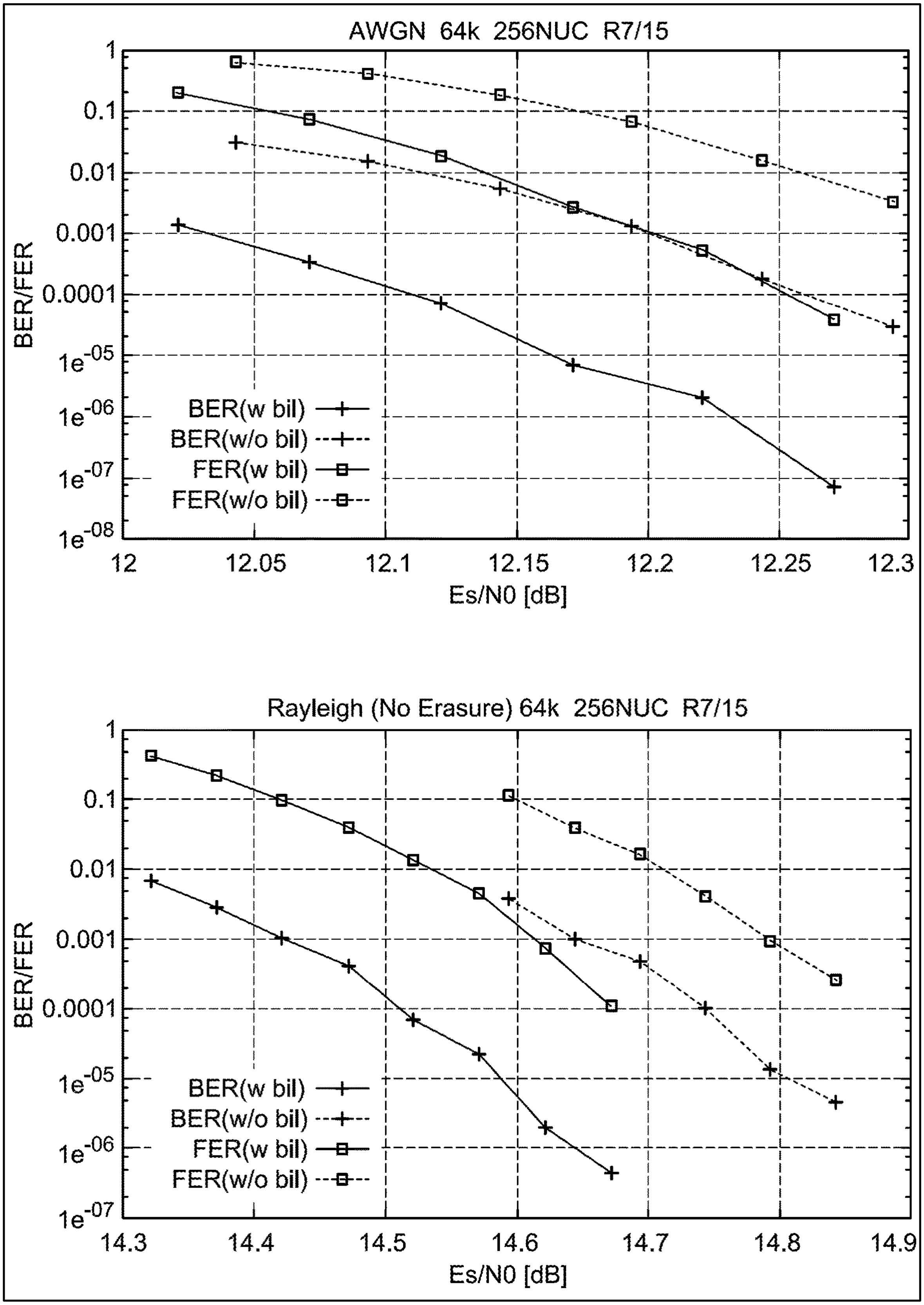

FIG. 143 is a diagram that illustrates a simulation result of a simulation of measuring an error rate.

Figure 144:
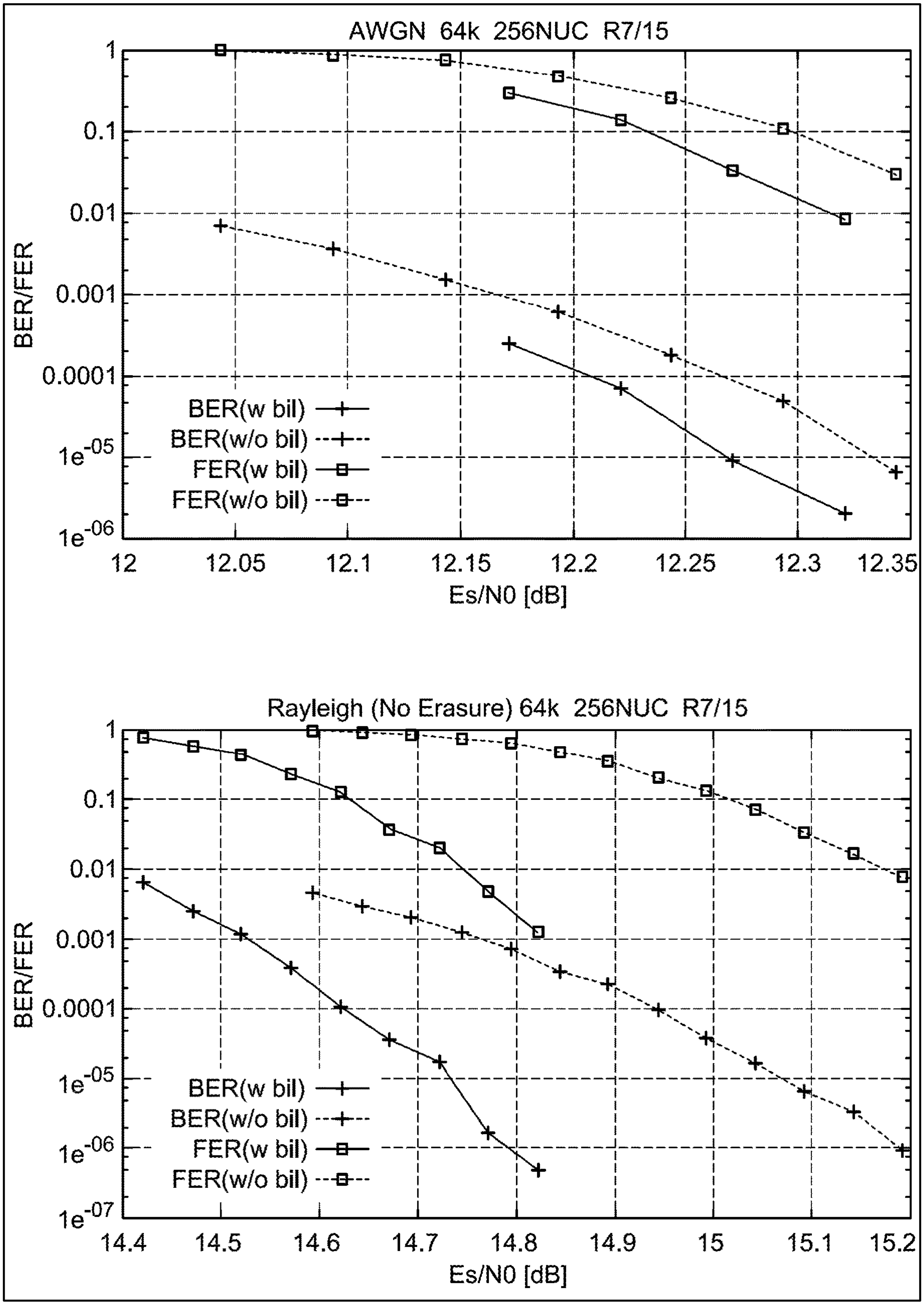

FIG. 144 is a diagram that illustrates a simulation result of a simulation of measuring an error rate.

Figure 145:
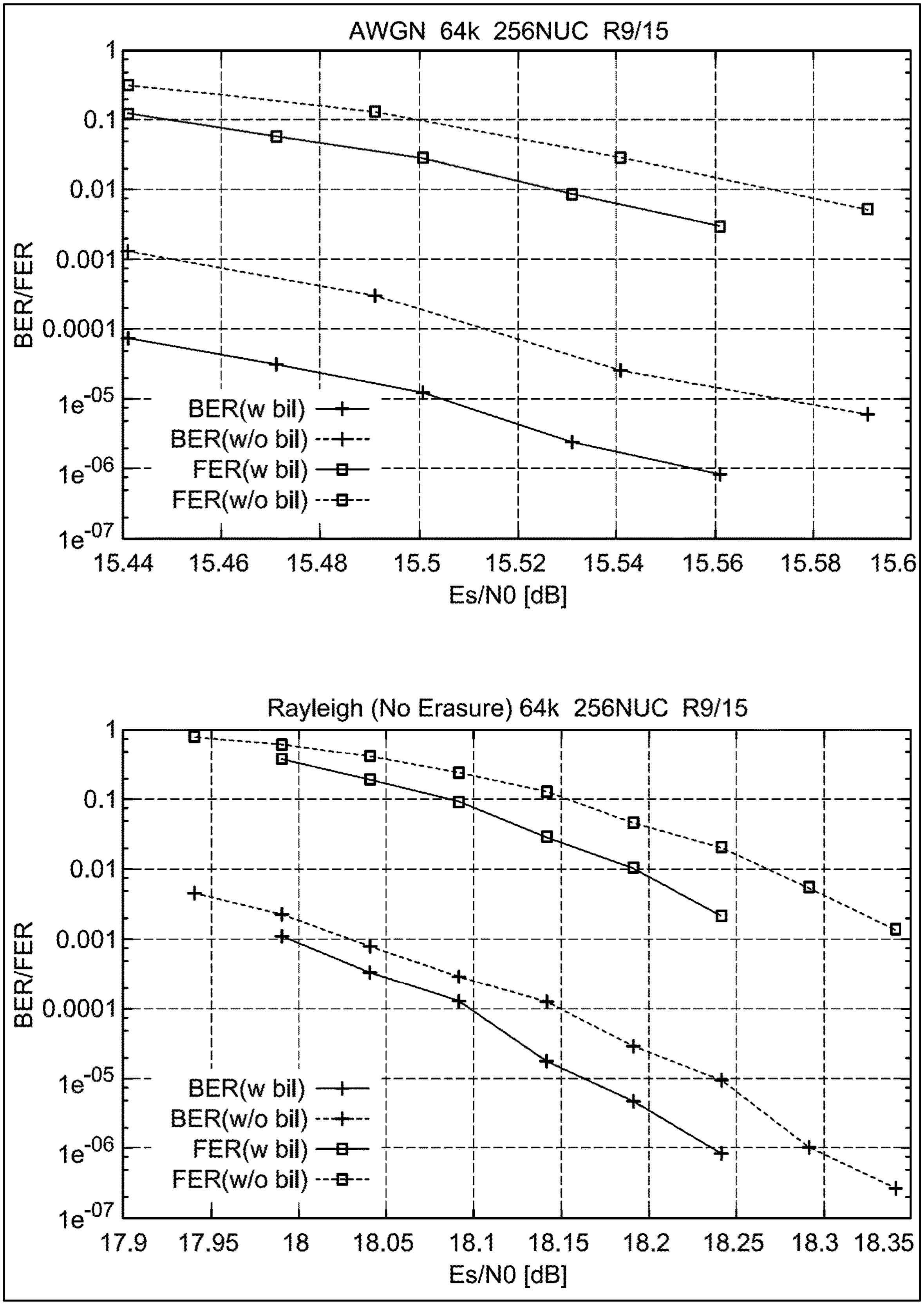

FIG. 145 is a diagram that illustrates a simulation result of a simulation of measuring an error rate.

Figure 146:
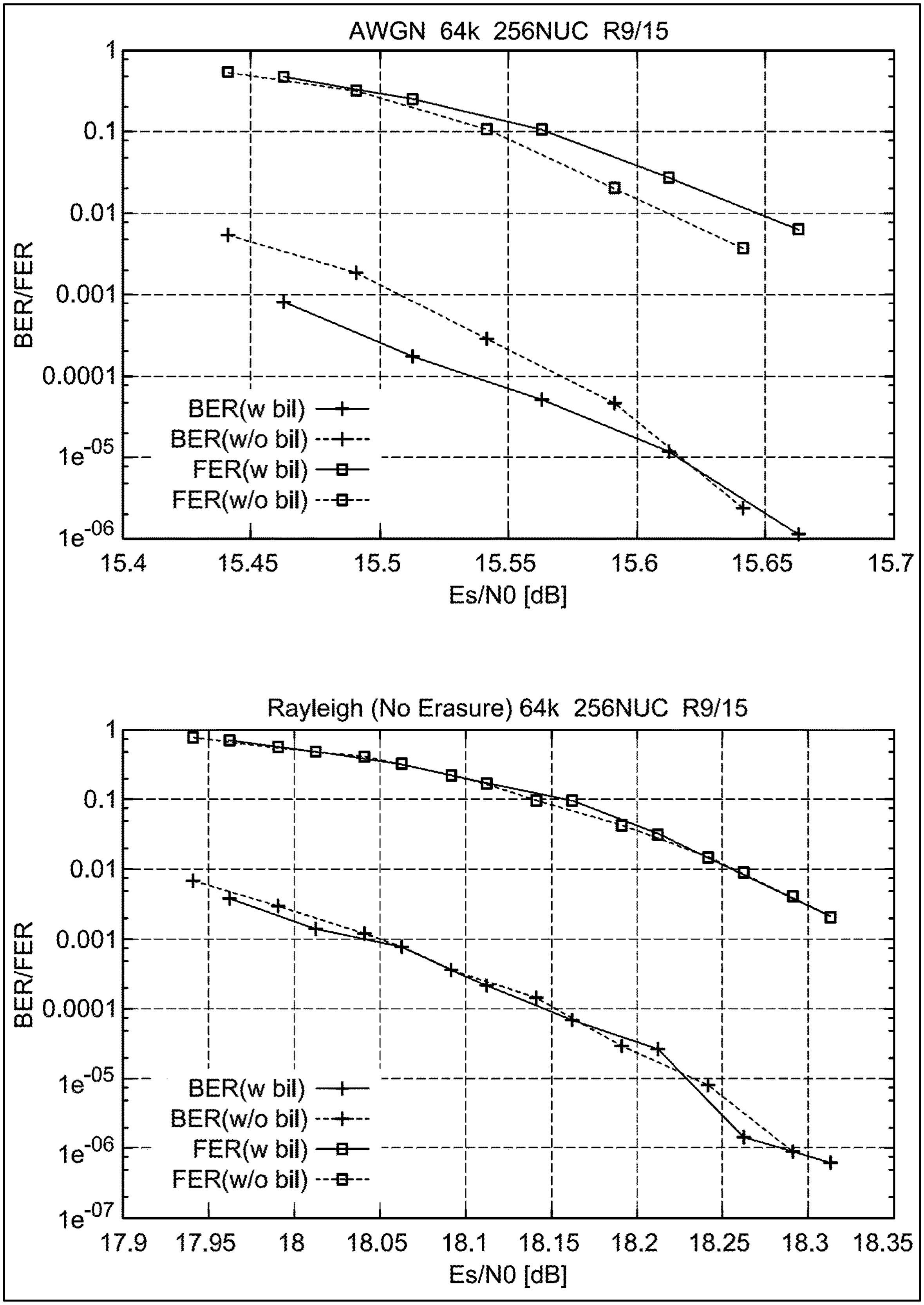

FIG. 146 is a diagram that illustrates a simulation result of a simulation of measuring an error rate.

FIG. 147 is a diagram that illustrates a simulation result of a simulation of measuring an error rate.

Figure 148:
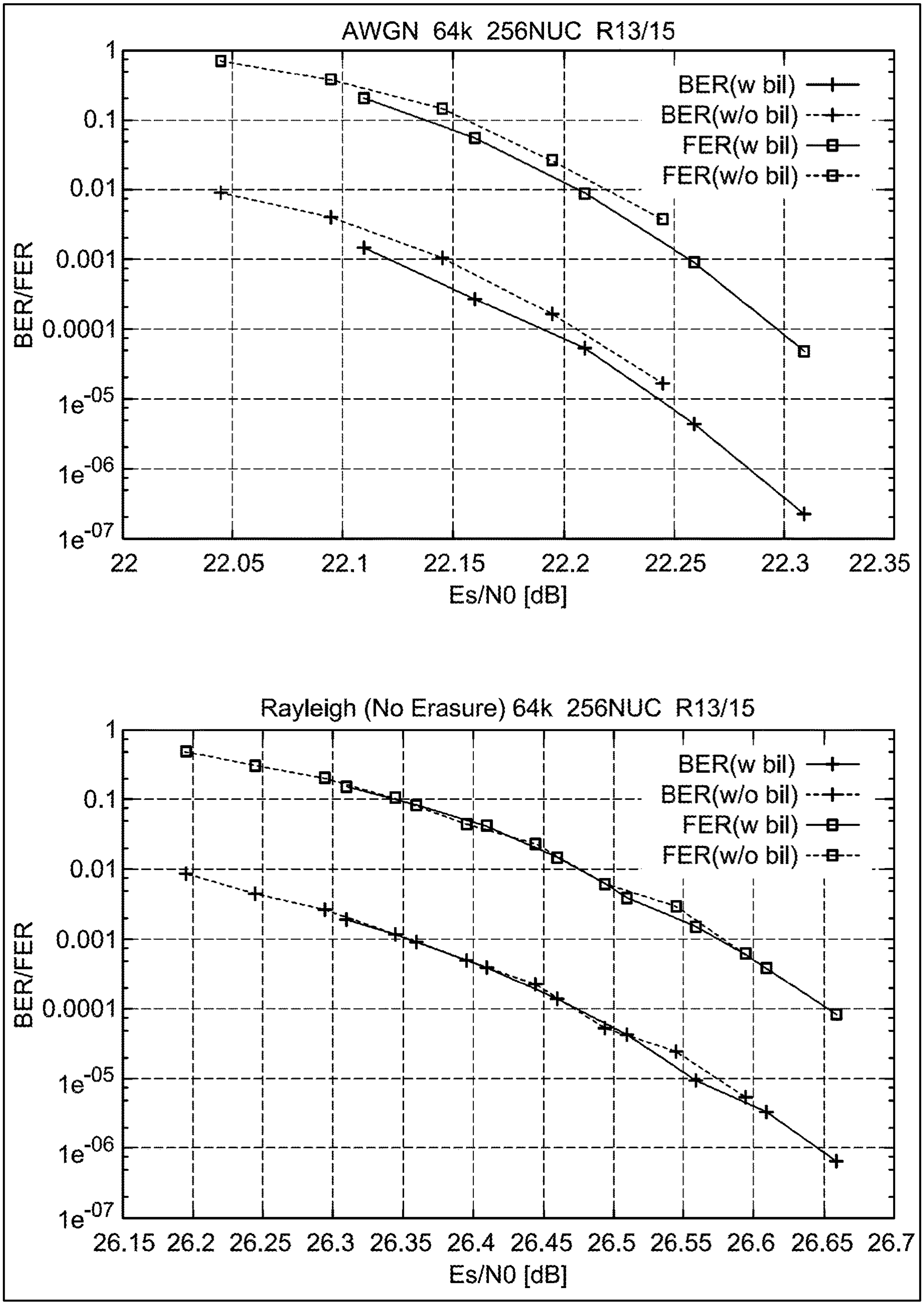

FIG. 148 is a diagram that illustrates a simulation result of a simulation of measuring an error rate.

Figure 149:
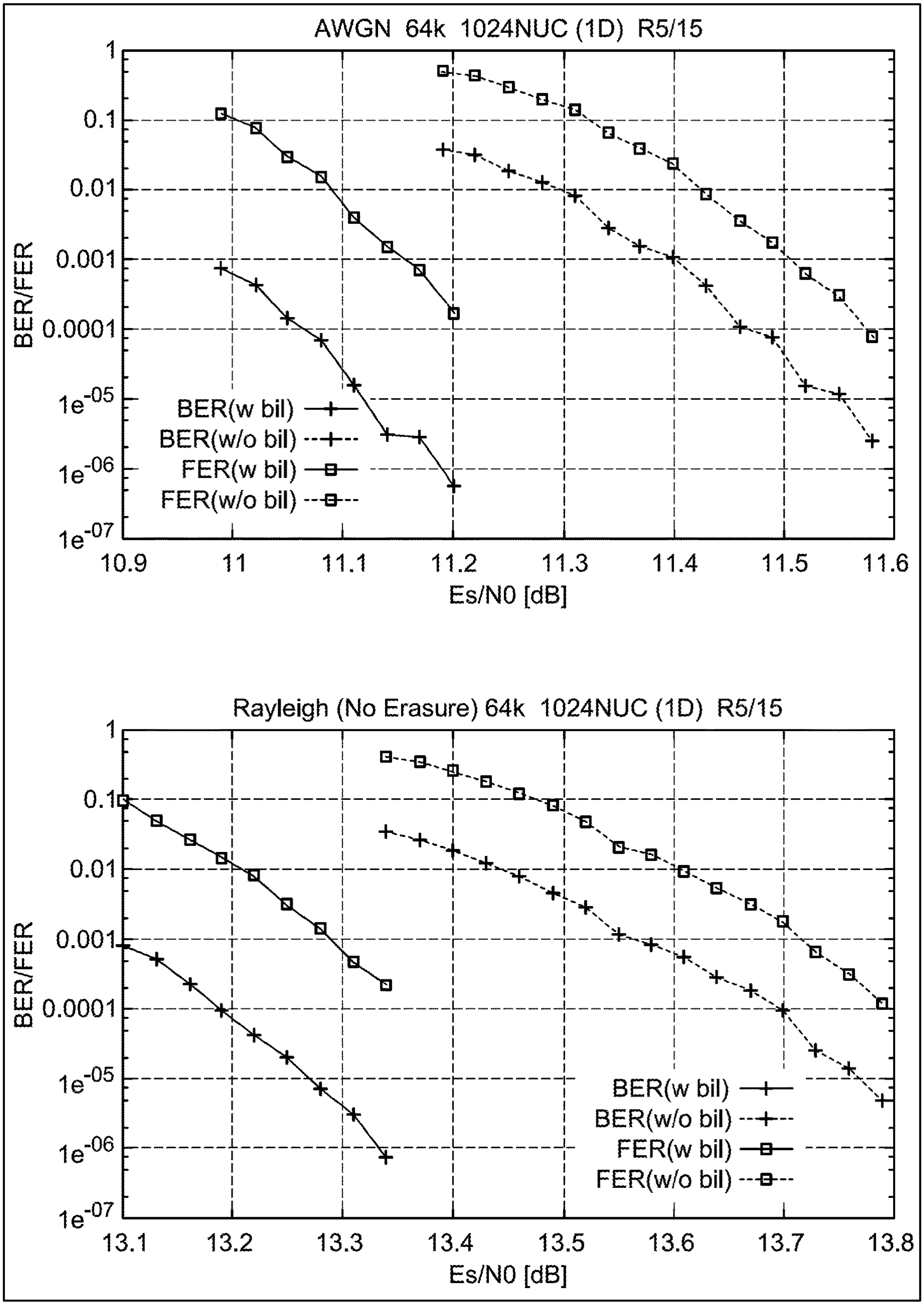

FIG. 149 is a diagram that illustrates a simulation result of a simulation of measuring an error rate.

Figure 150:
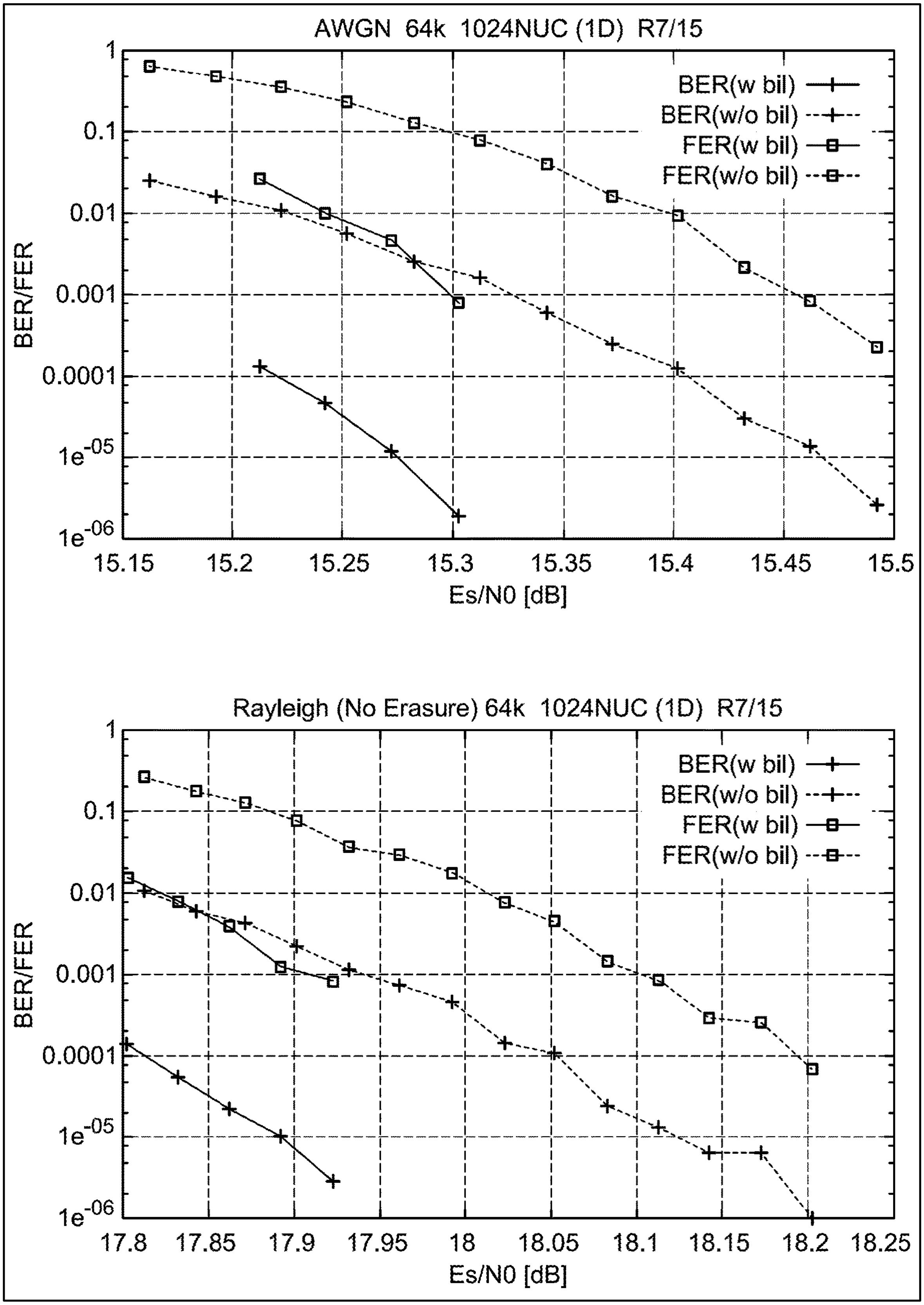

FIG. 150 is a diagram that illustrates a simulation result of a simulation of measuring an error rate.

Figure 151:
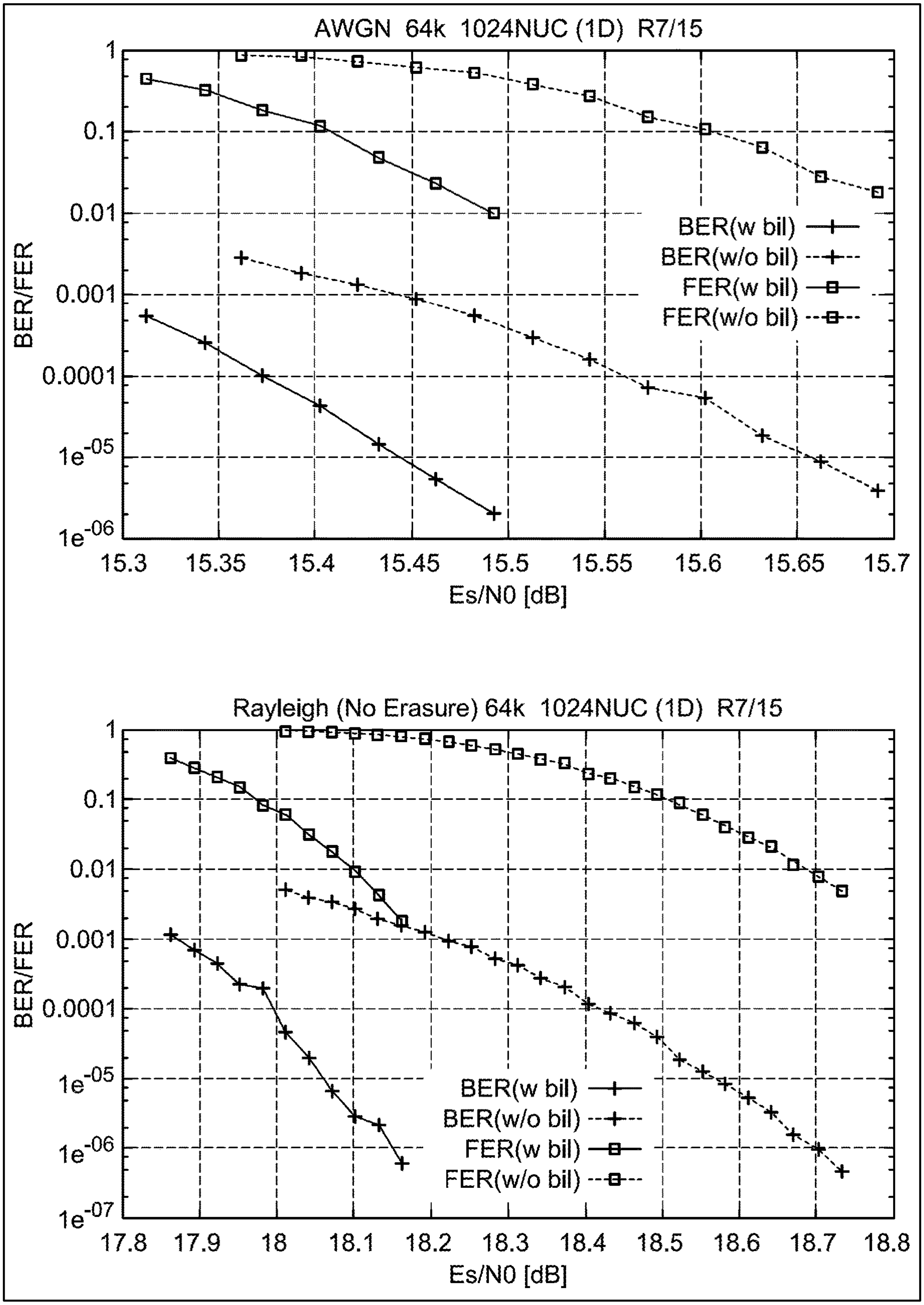

FIG. 151 is a diagram that illustrates a simulation result of a simulation of measuring an error rate.

Figure 152:
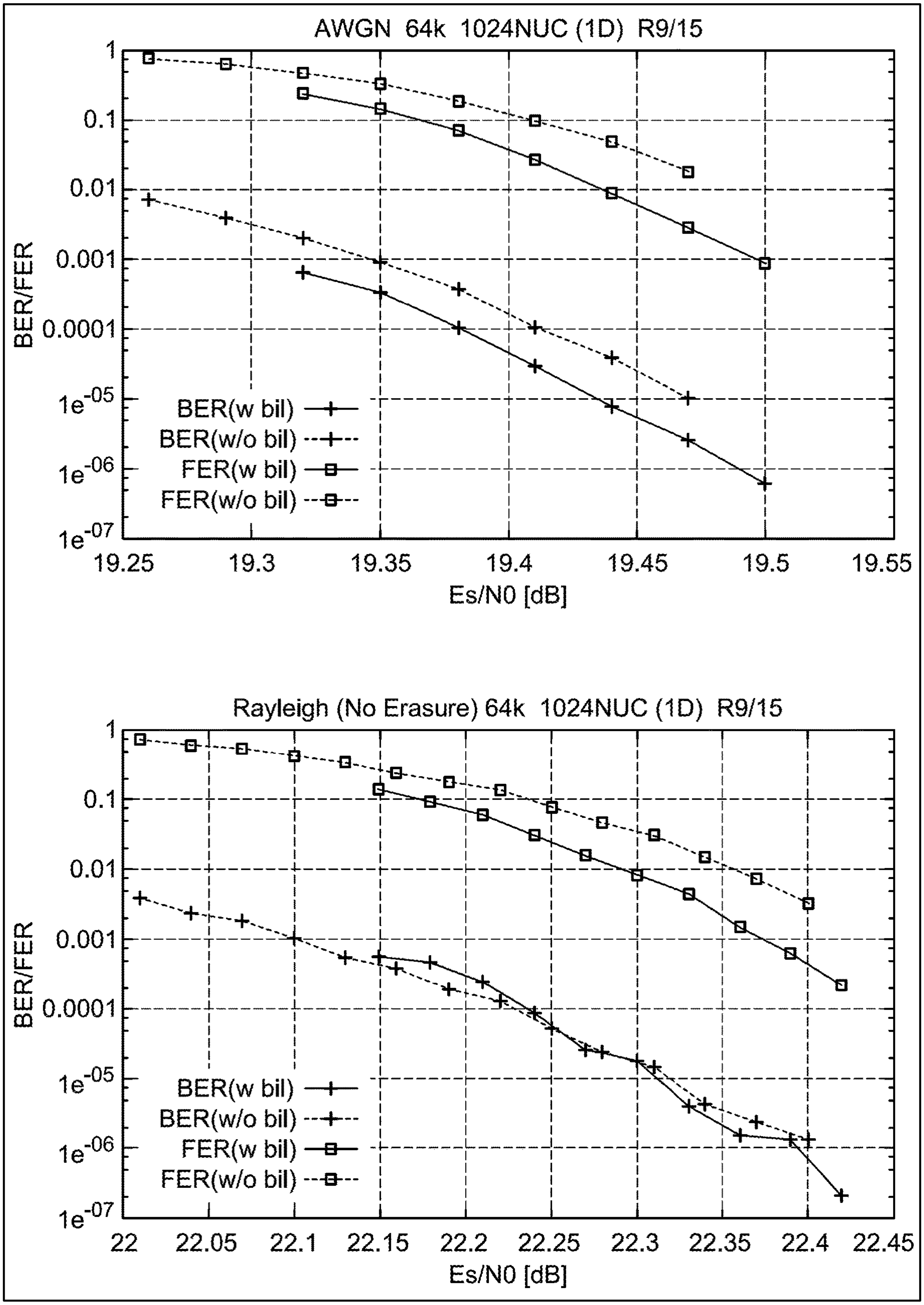

FIG. 152 is a diagram that illustrates a simulation result of a simulation of measuring an error rate.

Figure 153:
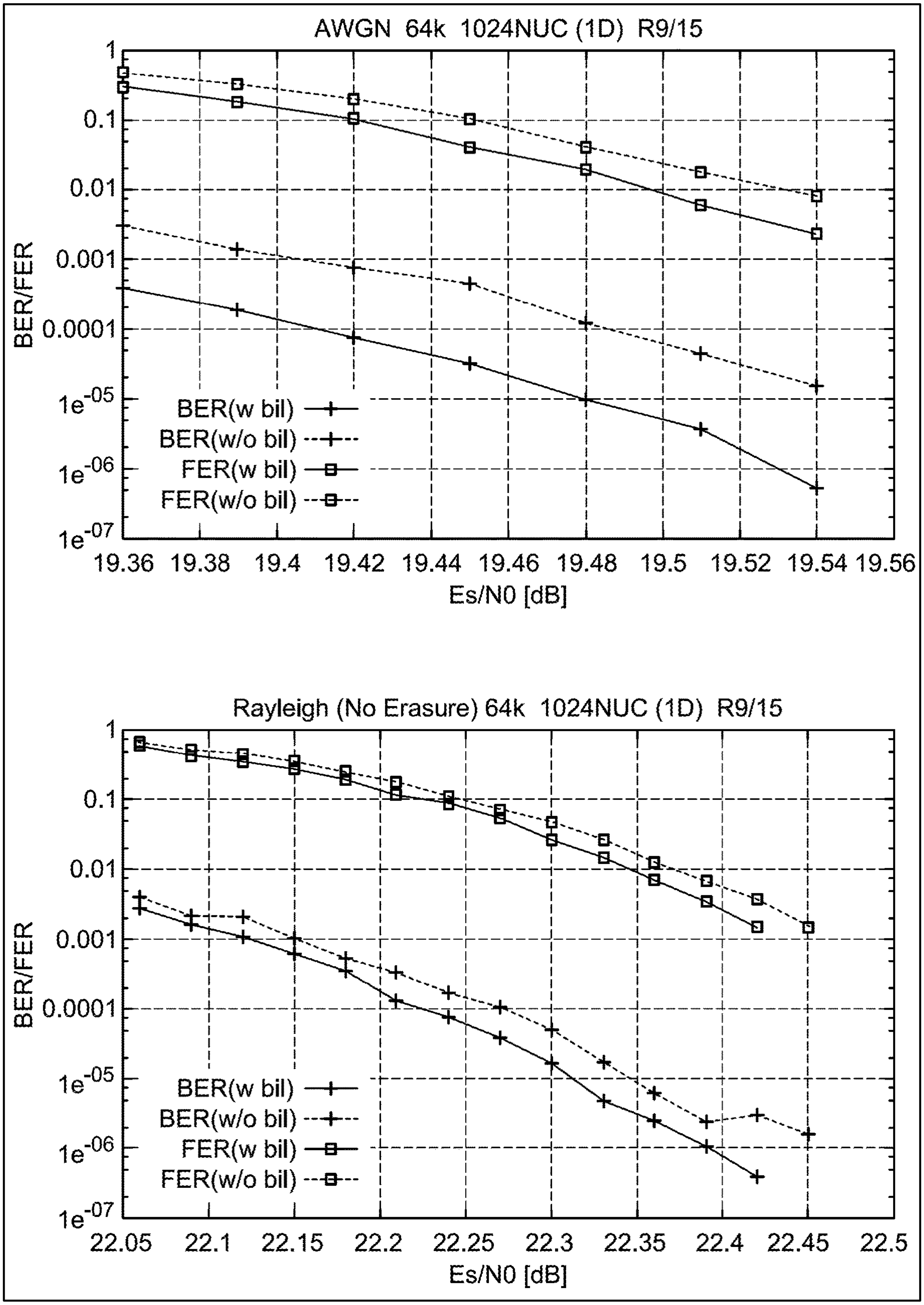

FIG. 153 is a diagram that illustrates a simulation result of a simulation of measuring an error rate.

FIG. 154 is a diagram that illustrates a simulation result of a simulation of measuring an error rate.

Figure 155:
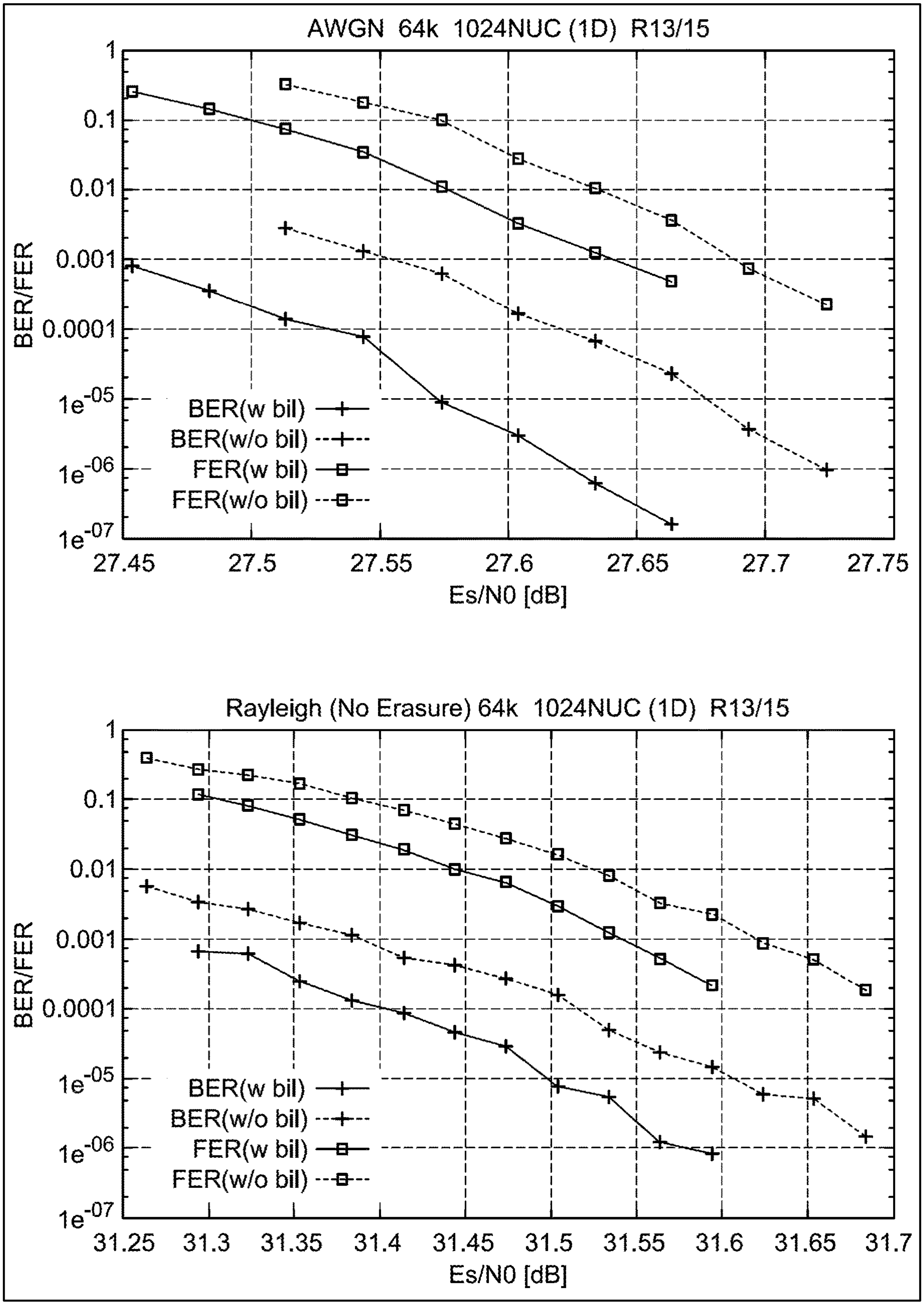

FIG. 155 is a diagram that illustrates a simulation result of a simulation of measuring an error rate.

Figure 156:
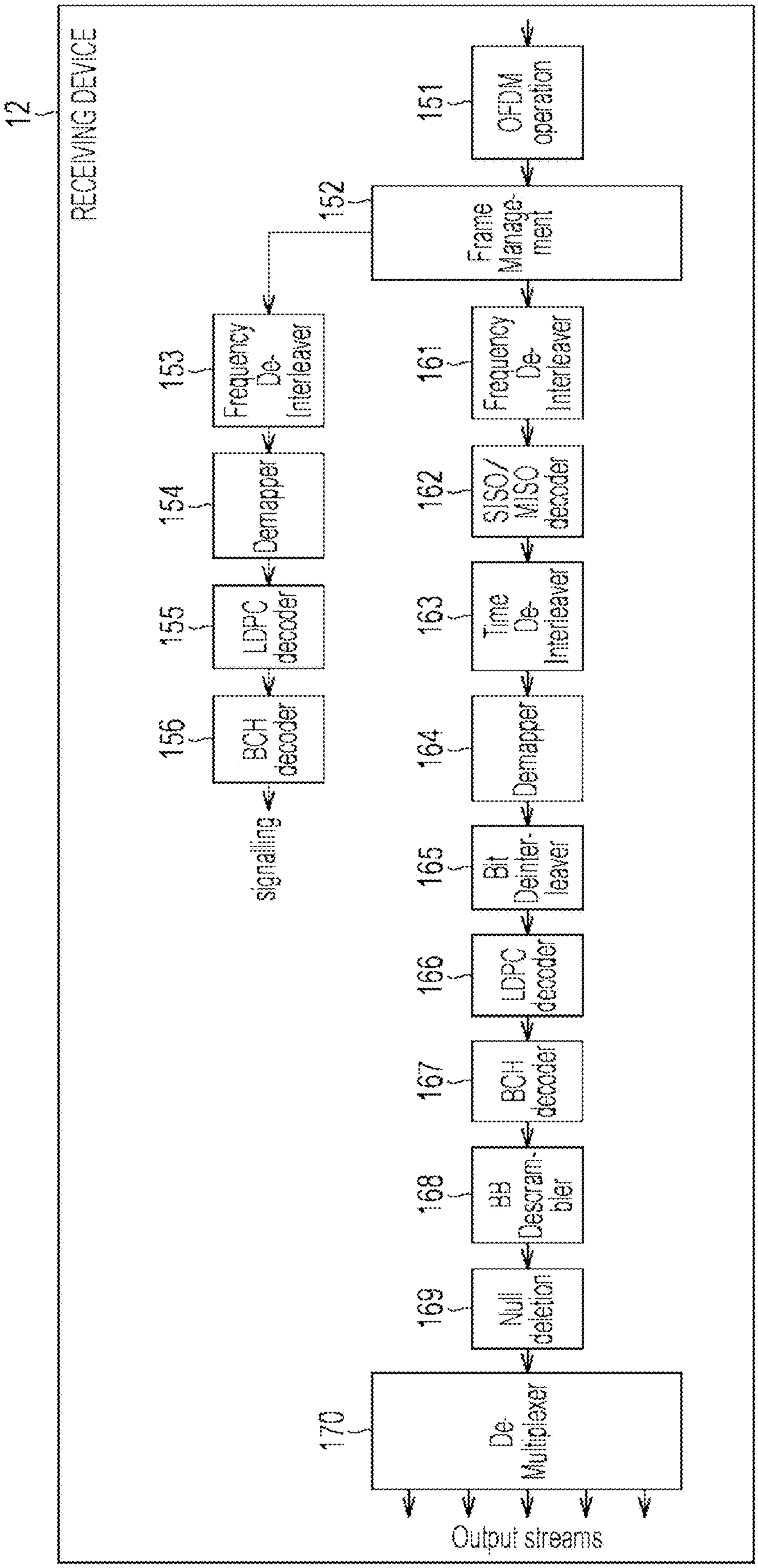

FIG. 156 is a block diagram that illustrates a configuration example of a receiving device 12.

Figure 157:
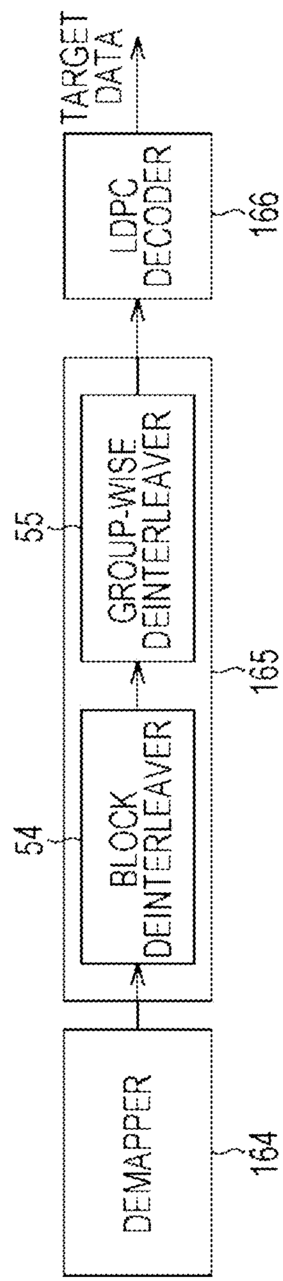

FIG. 157 is a block diagram that illustrates a configuration example of a bit deinterleaver 165.

Figure 158:
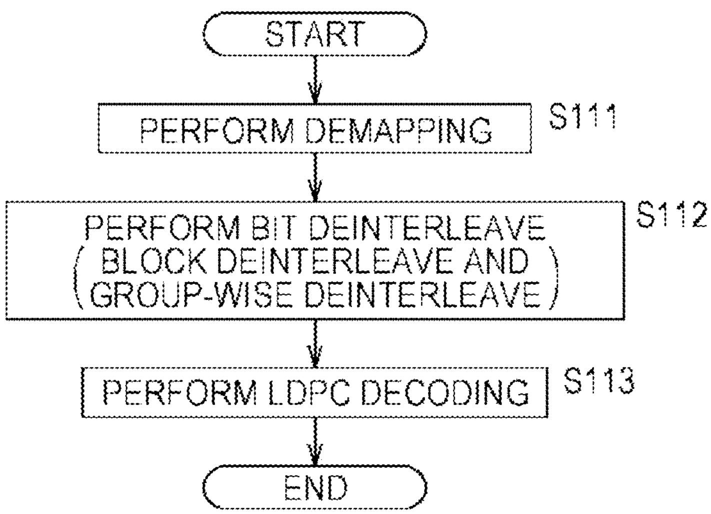

FIG. 158 is a flowchart that illustrates an example of a process performed by a demapper 164, a bit deinterleaver 165, and an LDPC decoder 166.

Figure 159:
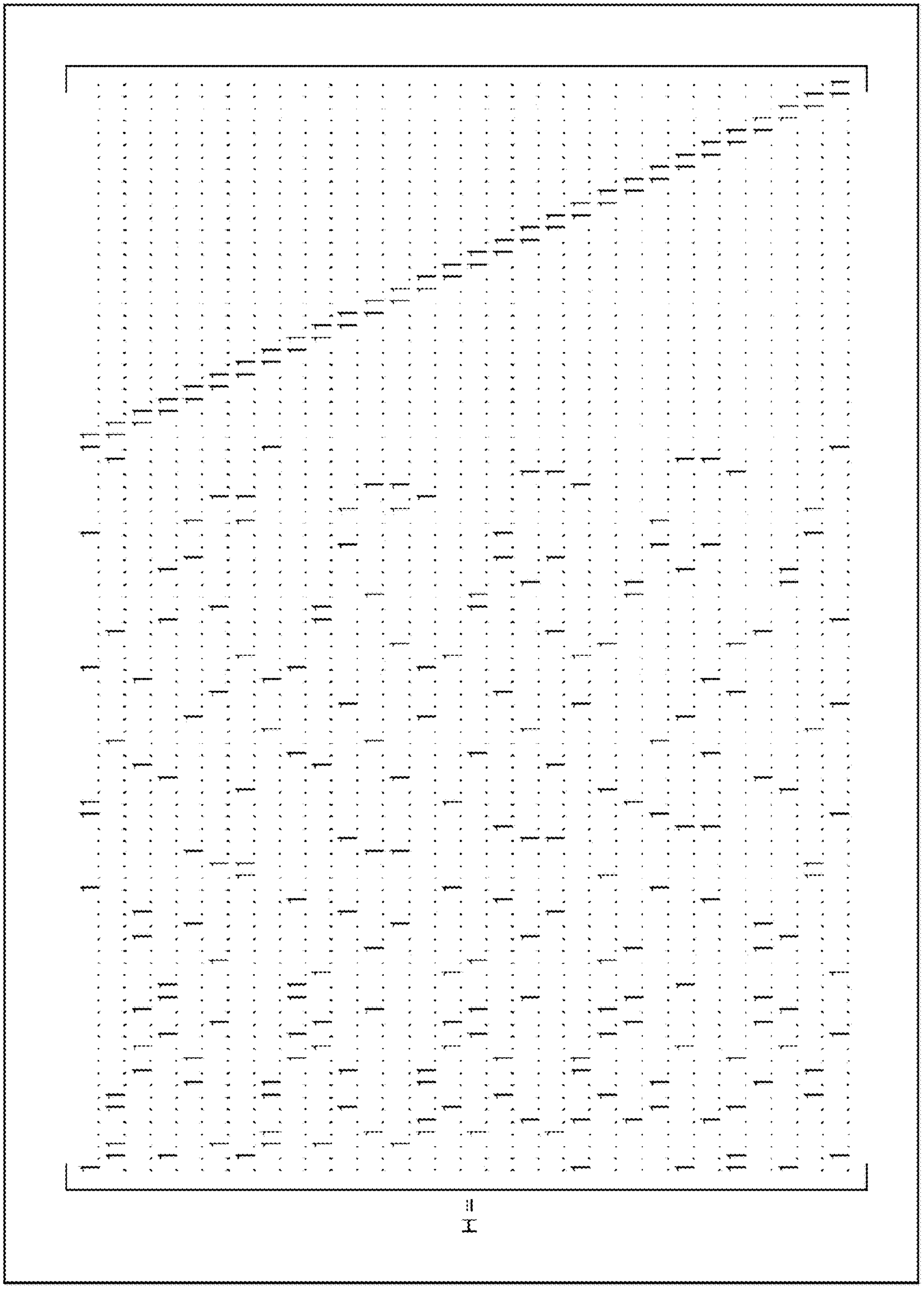

FIG. 159 is a diagram that illustrates an example of a parity check matrix of an LDPC code.

Figure 160:
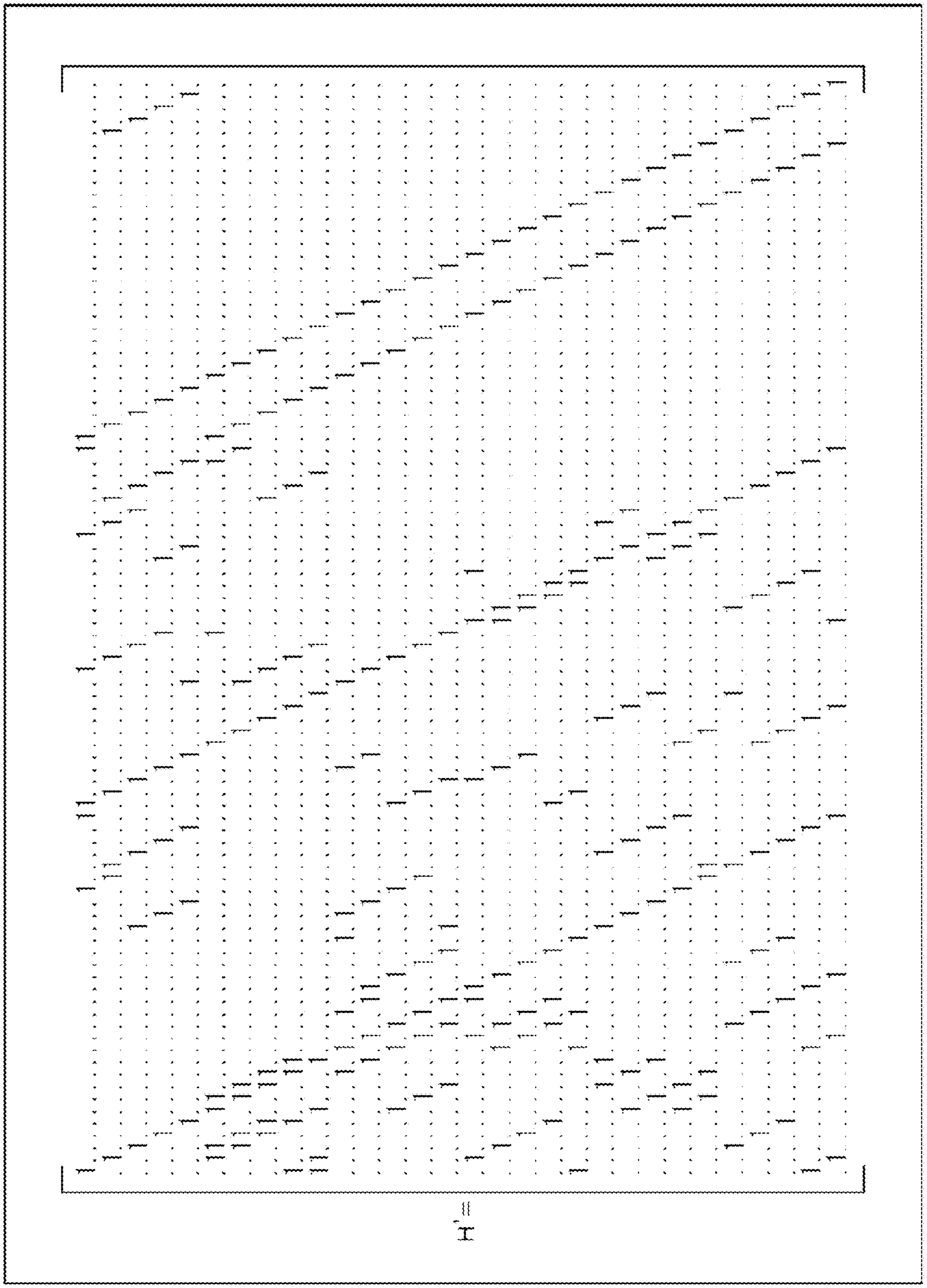

FIG. 160 is a diagram that illustrates an example of a matrix (a transformed parity check matrix) acquired by performing a row permutation and a column permutation for a parity check matrix.

Figure 161:
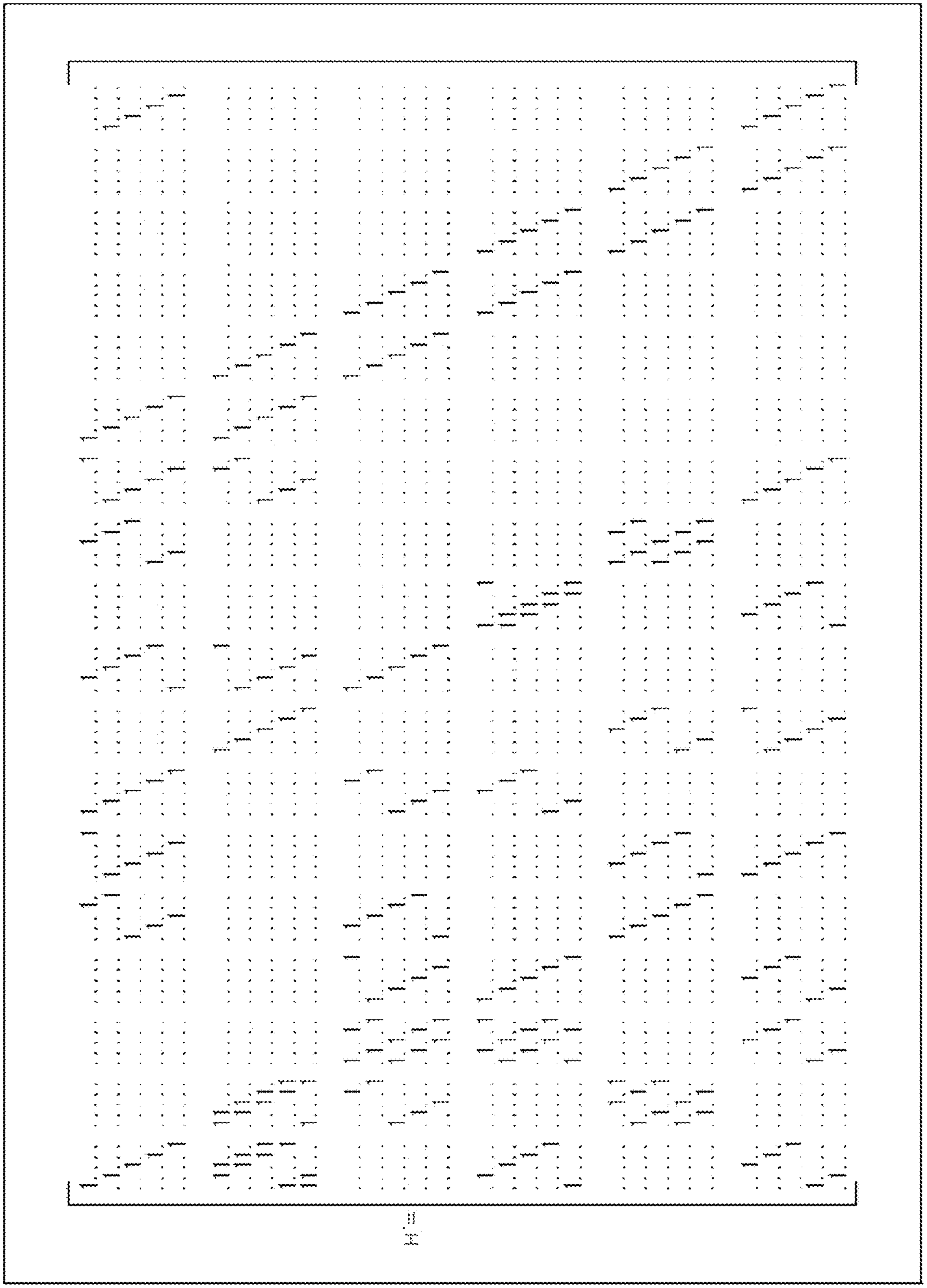

FIG. 161 is a diagram that illustrates an example of a transformed parity check matrix divided in units of 5×5.

Figure 162:
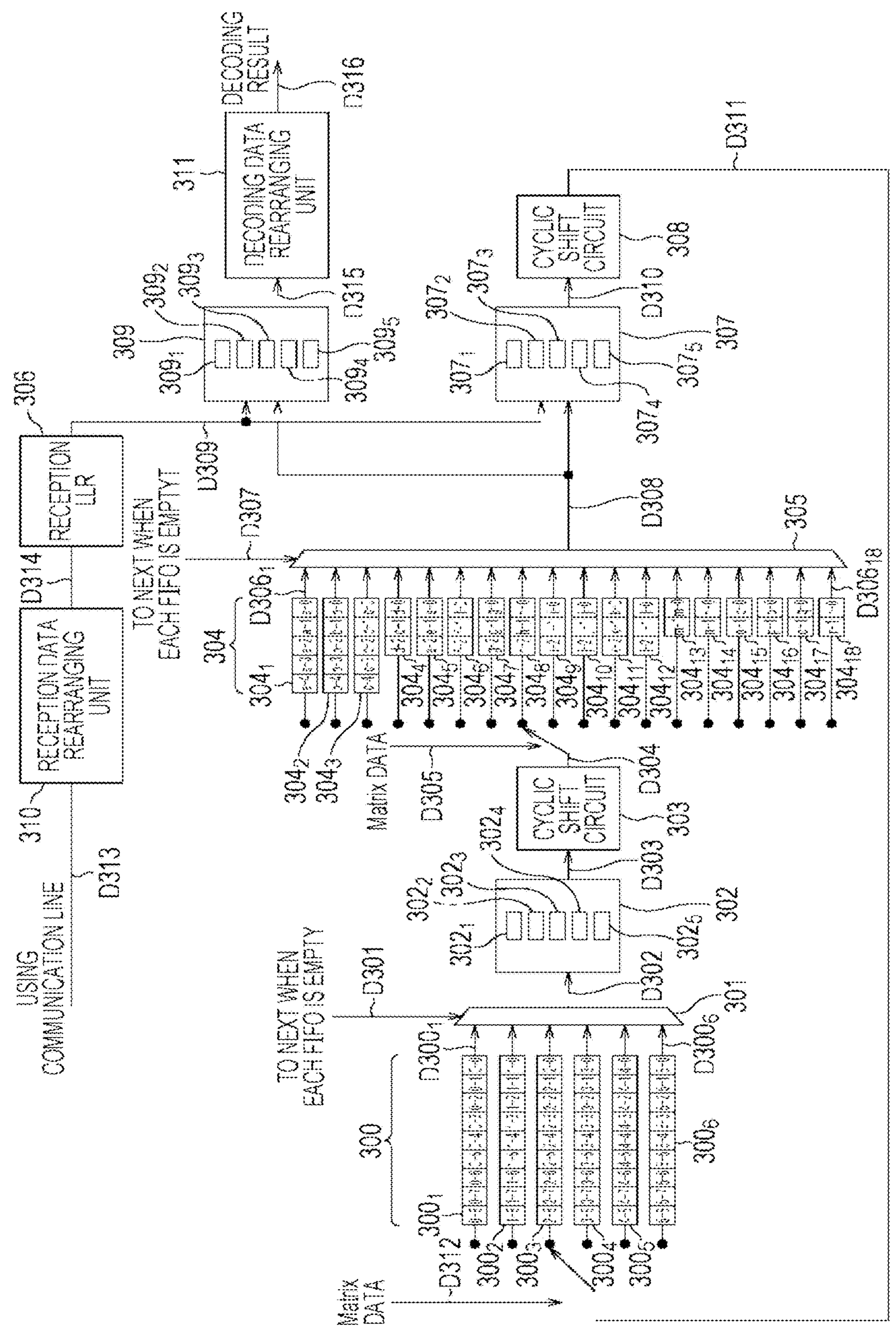

FIG. 162 is a block diagram that illustrates a configuration example of a decoding device collectively performing P node operations.

Figure 163:
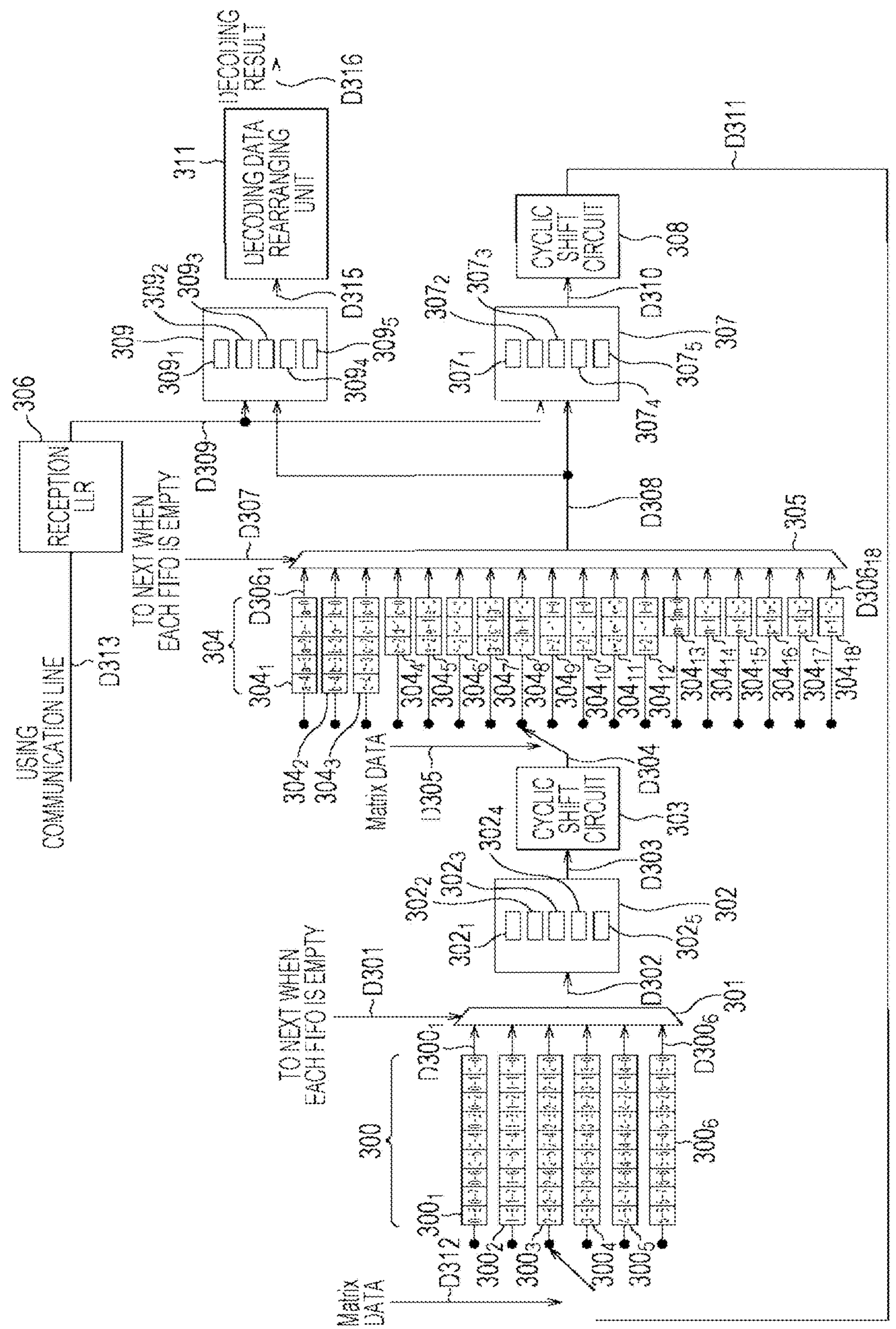

FIG. 163 is a block diagram that illustrates a configuration example of an LDPC decoder 166.

Figure 164:
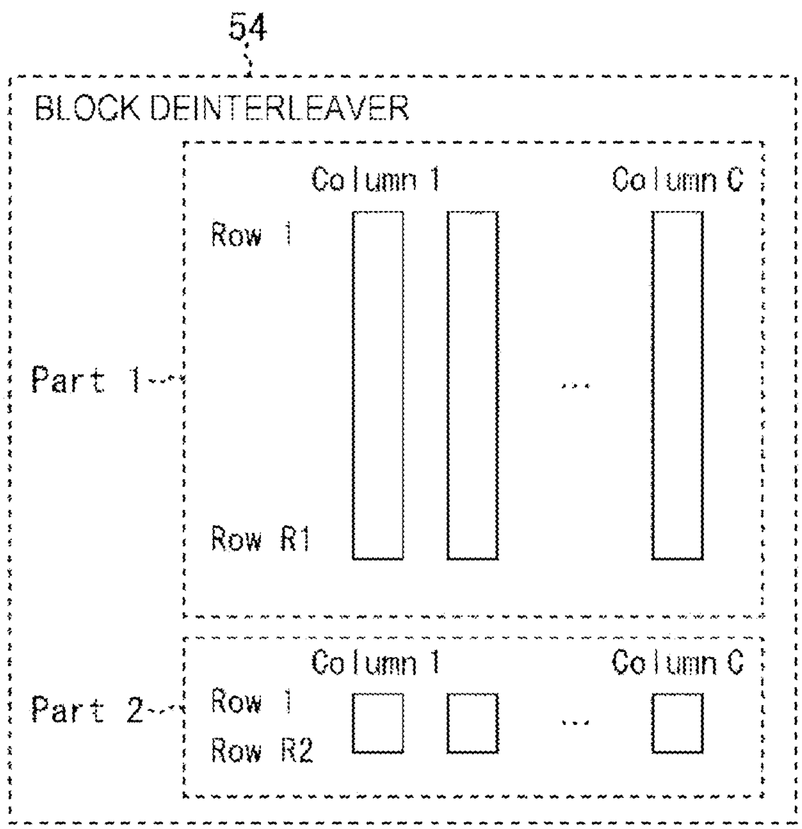

FIG. 164 is a block diagram that illustrates a configuration example of a block deinterleaver 54.

Figure 165:
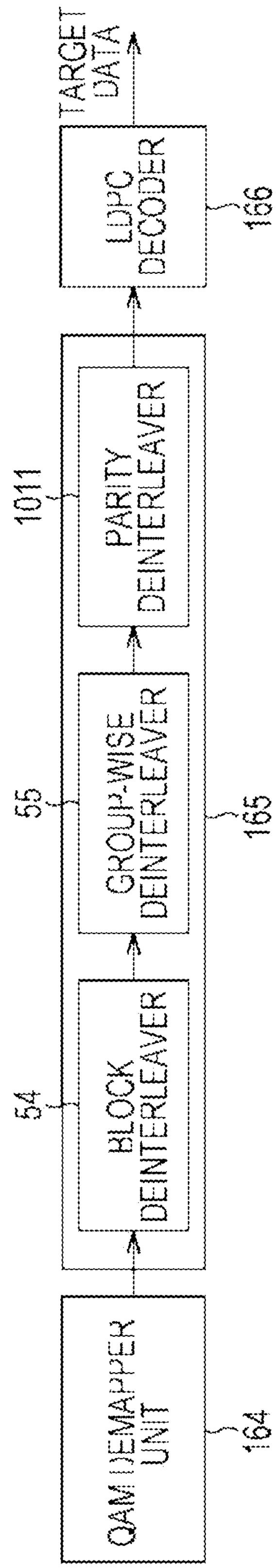

FIG. 165 is a block diagram that illustrates another configuration example of a bit deinterleaver 165.

Figure 166:
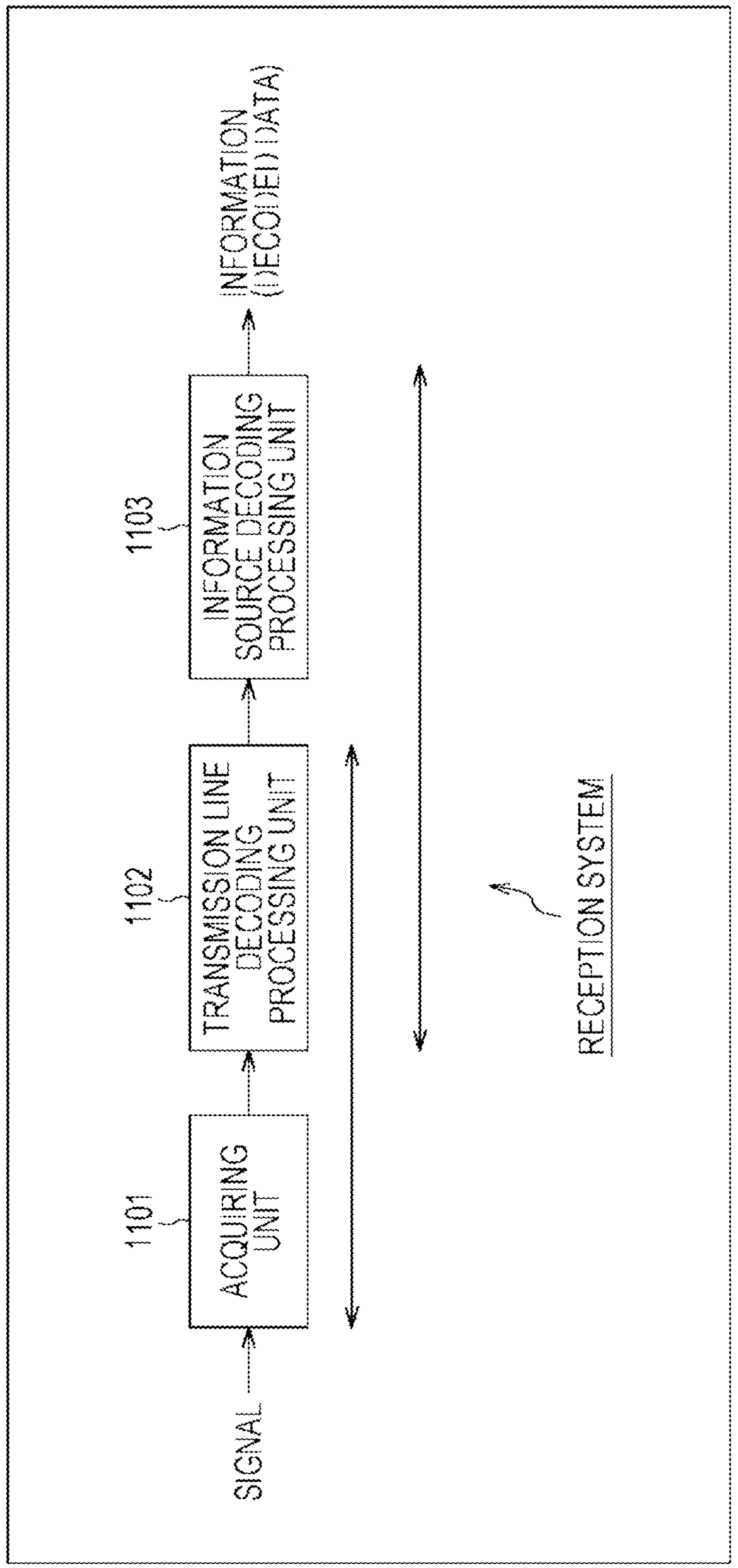

FIG. 166 is a block diagram that illustrates a first configuration example of a reception system to which the receiving device 12 can be applied.

Figure 167:
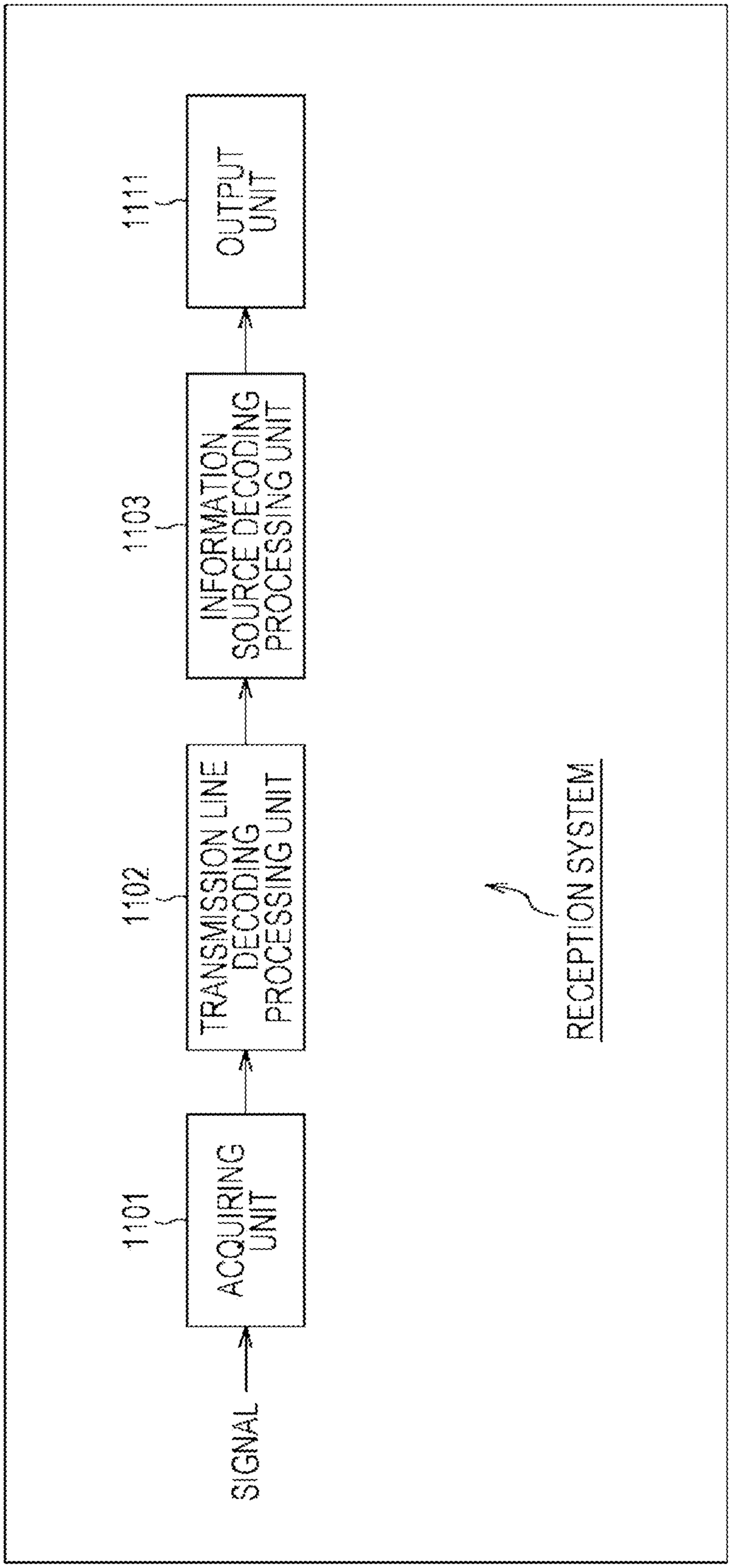

FIG. 167 is a block diagram that illustrates a second configuration example of a reception system to which the receiving device 12 can be applied.

Figure 168:
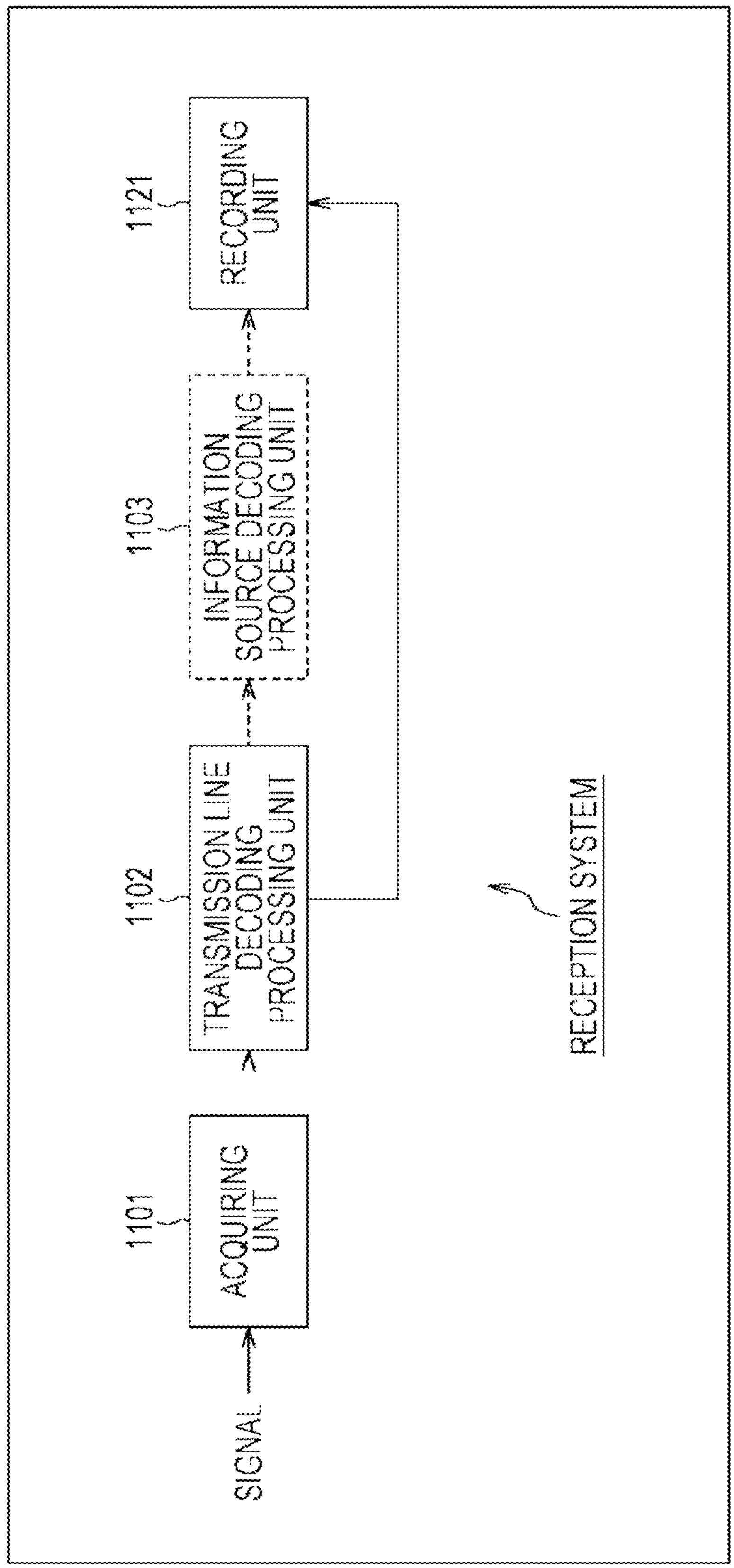

FIG. 168 is a block diagram that illustrates a third configuration example of a reception system to which the receiving device 12 can be applied.

Figure 169:
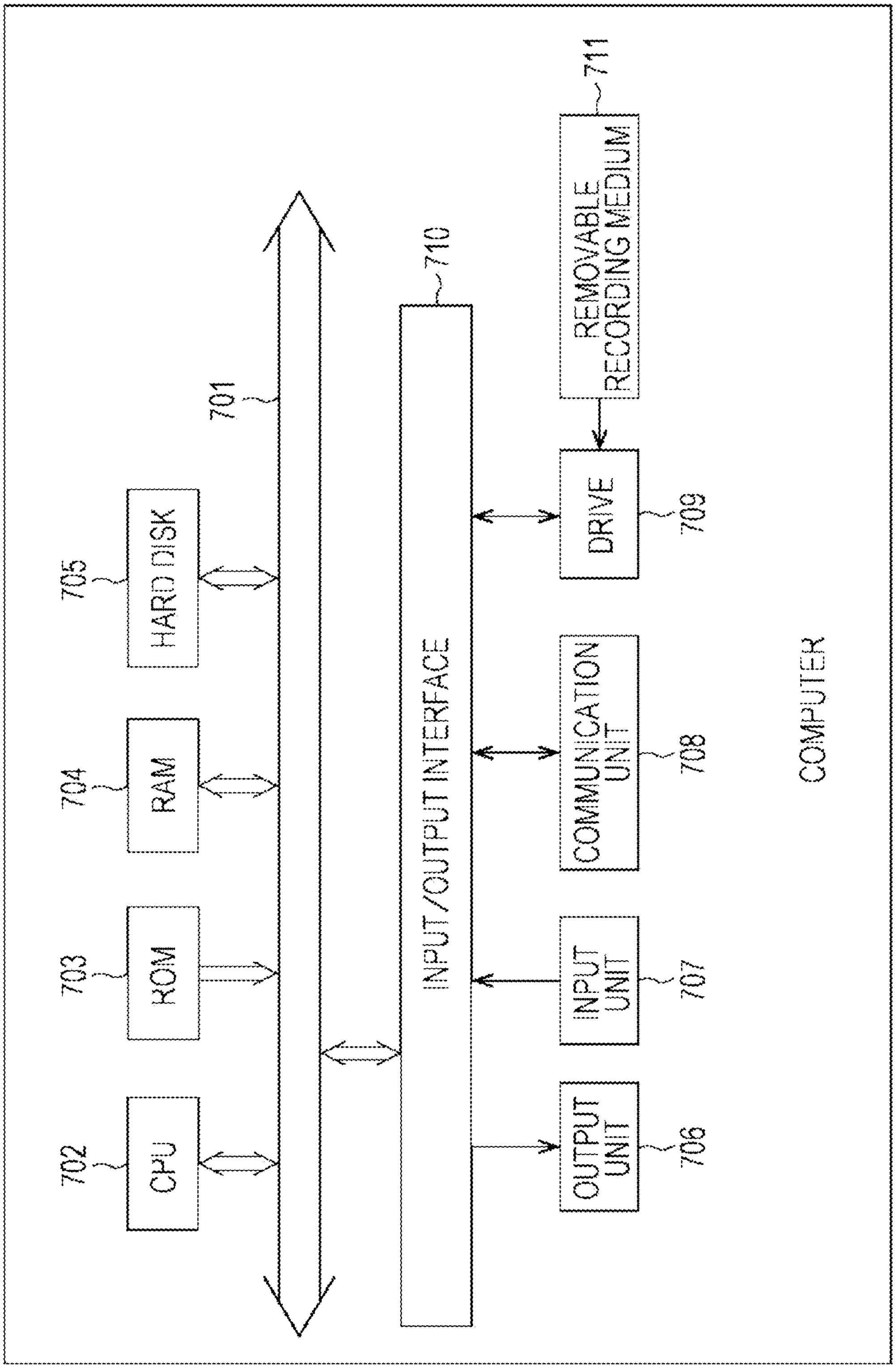

FIG. 169 is a block diagram that illustrates a configuration example a computer according to an embodiment of the present technology.

MODE FOR CARRYING OUT THE INVENTION

Hereinafter, exemplary embodiments of the present technology will be described. Before the description thereof, an LDPC code will be described.

<LDPC Code>

Note that the LDPC code is a linear code and, here, will be described to have two dimensions here, although the two dimensions are not necessary.

A major characteristic of the LDPC code is that a parity check matrix defining the LDPC code is sparse. Here, a sparse matrix is a matrix in which the number of "1"s as elements of the matrix is very small (a matrix of which most elements are 0's).

Figure 1:
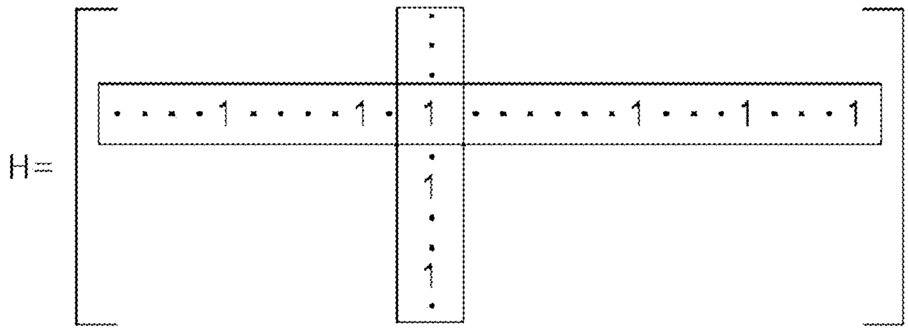
FIG. 1 is a diagram that illustrates a parity check matrix H of an LDPC code.

FIG. 1 is a diagram that illustrates a parity check matrix H of an LDPC code.

In the parity check matrix H illustrated in FIG. 1, a weight (column weight) (the number of "1"s) of each column is "3" and a weight of each row (row weight) is "6".

In coding using the LDPC code (LDPC coding), for example, a generation matrix G is generated on the basis of the parity check matrix H, and a code word (LDPC code) is generated by multiplexing information bits of two dimensions by the generation matrix G.

More specifically, a coding device that performs the LDPC coding, first, calculates the generation matrix G satisfying $GH^T=0$ for a transposed matrix $H^T$ of the parity check matrix H. Here, in a case where the generation matrix G is a K×N matrix, the coding device generates a code word c (=uG) configured by N bits by multiplying the generation matrix G by a bit string (vector u) of information bits configured by K bits. The code word (LDPC code) that is generated by the coding device is received at a reception side through a predetermined communication line.

The LDPC code can be decoded by using a message passing algorithm, which is an algorithm proposed by Gallager by calling it as probabilistic decoding, using belief propagation on a so-called a Tanner graph formed by a variable node (also referred to as a message node) and a check node. Hereinafter, the variable node and the check node will be simply referred to as nodes as is appropriate.

Figure 2:
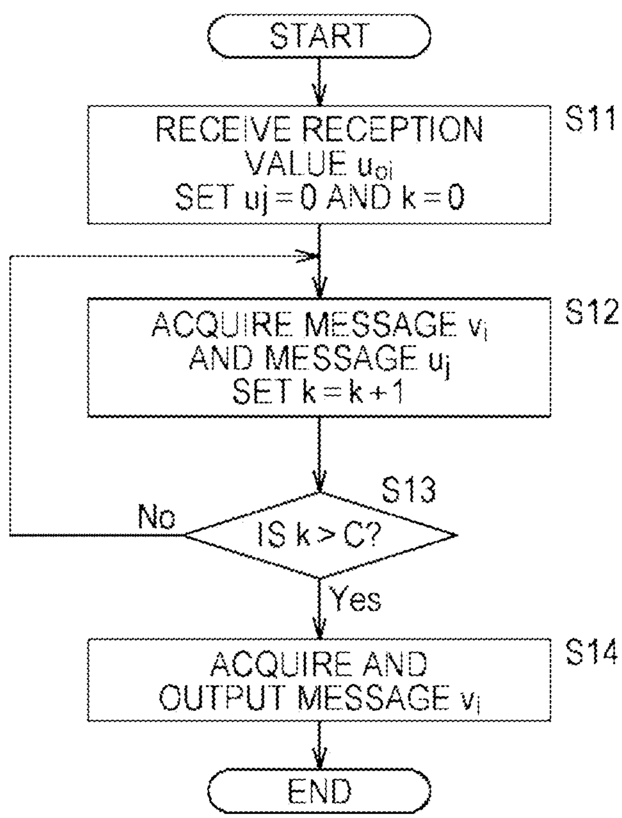
FIG. 2 is a flowchart that illustrates a decoding sequence of an LDPC code.

FIG. 2 is a flowchart that illustrates a decoding sequence of an LDPC code.

Note that, hereinafter, a real value (a received LLR) that is acquired by representing the likelihood of "0" of a value of an i-th code bit of the LDPC code (one code word) received by the reception side by using a log likelihood ratio will be appropriately referred to as a reception value $u_{0i}$. In addition, a message output from the check node will be referred to as $u_j$, and a message output from the variable node will be referred to as $v_i$.

First, in decoding the LDPC code, as illustrated in FIG. 2, in step S11, the LDPC code is received, the message (check node message) $u_j$ is initialized to "0", and a variable k taking an integer as a counter of repetition processes is initialized to "0", and the process proceeds to step S12. In step S12, the message (variable node message) $v_i$ is acquired by performing an operation (variable node operation) represented by Equation (1) on the basis of the reception value $u_{0i}$ acquired by receiving the LDPC code, and the message $u_j$ is acquired by performing an operation (check node operation) represented by Equation (2) on the basis of the message $v_i$.

[Mathematical Formula 1]

$$v_i = u_{0i} + \sum_{j=1}^{d_v-1} u_j \tag{1}$$

[Mathematical Formula 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ represented in Equations (1) and (2) respectively are parameters, which can be arbitrarily selected, representing the number of "1"s in the vertical direction (column) and the horizontal direction (row) of the parity check matrix H. For example, in case of an LDPC code ((3, 6) LDPC code) for the parity check matrix H having a column weight of 3 and a row weight of 6 as illustrated in FIG. 1, $d_v=3$ and $d_c=6$.

Note that, in the variable node operation represented in Equation (1) and the check node operation represented in Equation (2), since a message input from a branch (edge) (a line joining the variable node and the check node) from which a message is output is not a target for the operation, the range of the operation is 1 to $d_v-1$ or 1 to $d_c-1$. Actually, the check node operation represented by Equation (2) is performed by generating a table of a function R ($v_1$, $v_2$) represented by Equation (3) defined by one output for two inputs $v_1$ and $v_2$ in advance and continuously (recursively) using the table as represented by Equation (4).

[Mathematical Formula 3]

$$x=2\tan h^{-1}\{\tan h(v_1/2)\tan h(v_2/2)\}=R(v_1,v_2) \tag{3}$$

[Mathematical Formula 4]

$$u_j=R(v_1,R(v_2,R(v_3,\ldots R(v_{d_c-2},v_{d_c-1})))) \tag{4}$$

In step S12, additionally, the variable k is incremented by "1", and the process proceeds to step S13. In step S13, it is determined whether or not the variable k is larger than a predetermined repetition number C of times of decoding. In step S13, in a case where the variable k is determined not to be larger than the predetermined repetition number C of times, the process is returned to step S12, and thereafter, a similar process is repeated.

On the other hand, in a case where the variable k is determined to be larger than the predetermined repetition number C of times in step S13, the process proceeds to step S14, and, by performing an operation represented in Equation (5), a message $v_i$ that is a final decoding result to be output is acquired and output, and the process of decoding the LDPC code ends.

[Mathematical Formula 5]

$$v_i = u_{0i} + \sum_{j=1}^{d_v} u_j \tag{5}$$

Here, the operation represented in Equation (5), differently from the variable node operation represented in Equation (1), is performed using messages $u_j$ from all the branches connected to the variable node.

FIG. 3 is a diagram that illustrates an example of a parity check matrix H of a (3, 6) LDPC code (a coding rate of 1/2 and a code length of 12).

In the parity check matrix H illustrated in FIG. 3, similarly to that illustrated in FIG. 1, a column weight is configured to be 3, and a row weight is configured to be 6.

Figure 4:
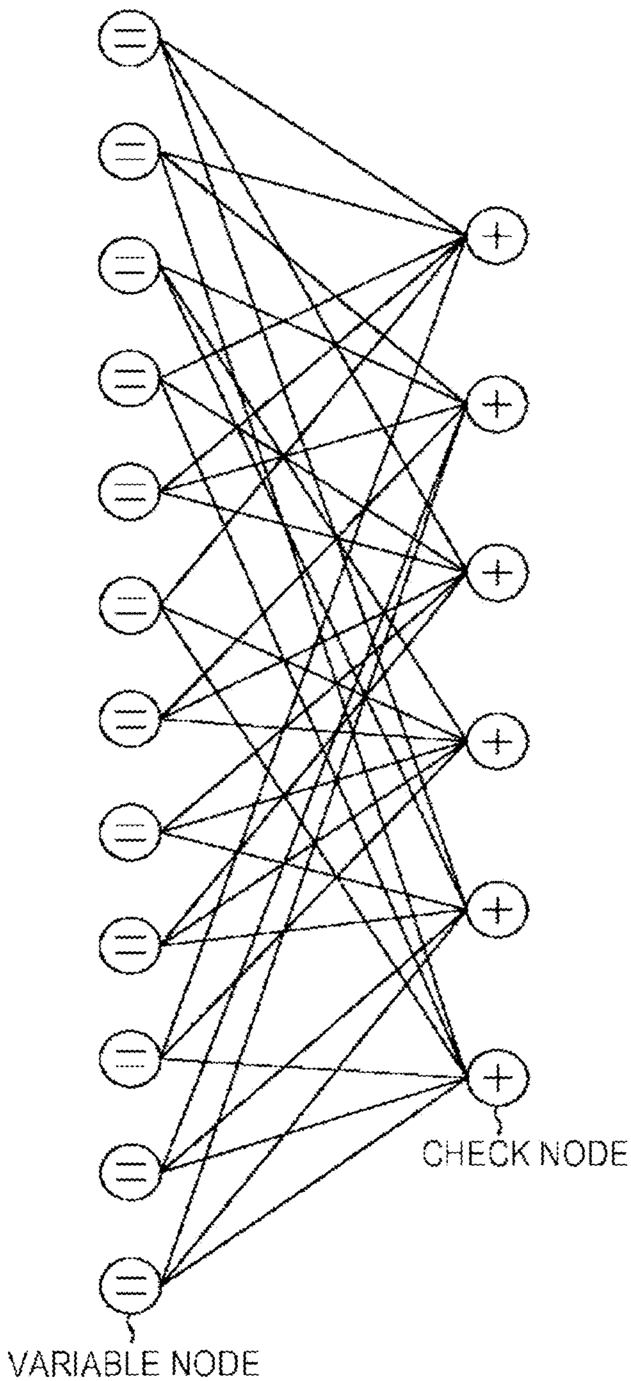
FIG. 4 is a diagram that illustrates an example of a Tanner graph of a parity check matrix.

FIG. 4 is a diagram that illustrates a Tanner graph of the parity check matrix H illustrated in FIG. 3.

Here, in FIG. 4, each check node is denoted by a plus sign "+", and each variable node is denoted by an equal sign "=". Here, check nodes and variable nodes respectively correspond to rows and columns of the parity check matrix H. A connected line between a check node and a variable node represents a branch (edge) and corresponds to "1" as an element of the parity check matrix.

In other words, in a case where an element of the j-th row and the i-th column of the parity check matrix is "1", in FIG. 4, an i-th variable node (a node of "=") from the top and a j-th check node (a node of "+") from the top are connected together using a branch. The branch represents that a code bit corresponding to the variable node has a constraint condition corresponding to the check node.

In a sum product algorithm that is a method of decoding the LDPC code, a variable node operation and a check node operation are repeatedly performed.

Figure 5:
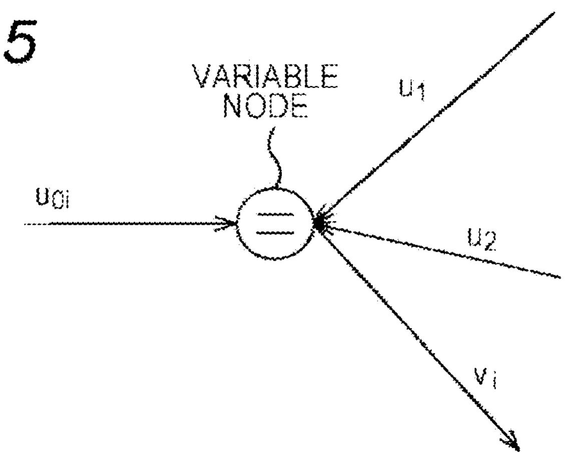
FIG. 5 is a diagram that illustrates an example of a variable node.

FIG. 5 is a diagram that illustrates a variable node operation performed at a variable node.

At the variable node, a message $v_i$ corresponding to a branch to be calculated is acquired using the variable node operation represented in Equation (1) using messages $u_1$ and $u_2$ from the remaining branches connected to the variable node and a reception value $u_{0i}$. Messages corresponding to other branches are similarly acquired.

Figure 6:
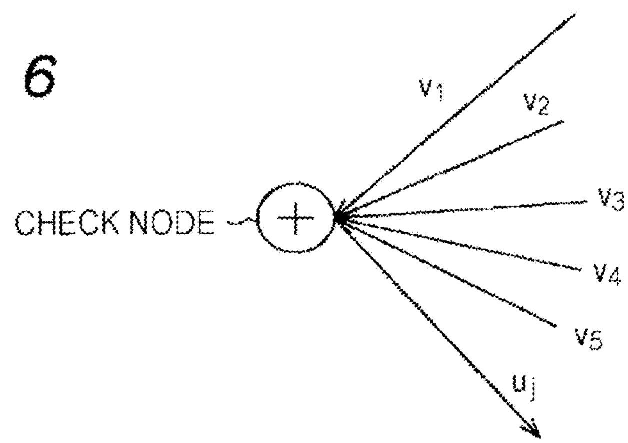
FIG. 6 is a diagram that illustrates an example of a check node.

FIG. 6 is a diagram that illustrates a check node operation performed at a check node.

Here, the check node operation represented in Equation (2) can be rewritten into Equation (6) by using a relation of "a×b=exp{ln(|a|)+ln(|b|)}×sign(a)×sign(b)". Here, sign(x) is 1 at the time of x≥0 and is −1 at the time of x<0.

[Mathematical Formula 6]

$$\begin{aligned} u_j &= 2\tanh^{-1}\left(\prod_{i=1}^{d_c-1}\tanh\left(\frac{v_i}{2}\right)\right) \\ &= 2\tanh^{-1}\left[\exp\left\{\sum_{i=1}^{d_c-1}\ln\left(\left|\tanh\left(\frac{v_i}{2}\right)\right|\right)\right\}\times \prod_{i=1}^{d_c-1}\text{sign}\left(\tanh\left(\frac{v_i}{2}\right)\right)\right] \\ &= 2\tanh^{-1}\left[\exp\left\{-\left(\sum_{i=1}^{d_c-1} -\ln\left(\tanh\left(\frac{|v_i|}{2}\right)\right)\right)\right\}\right]\times\prod_{i=1}^{d_c-1}\text{sign}(v_i) \end{aligned} \tag{6}$$

In case of x≥0, when a function φ(x) is defined using an equation φ(x)=ln(tan h(x/2)), an equation $\phi^{-1}(x)=2\tan h^{-1}(e^{-x})$ is satisfied, and accordingly, Equation (6) can be transformed into Equation (7).

[Mathematical Formula 7]

$$u_j = \phi^{-1}\left(\sum_{i=1}^{d_c-1}\phi(|v_i|)\right)\times\prod_{i=1}^{d_c-1}\text{sign}(v_i) \tag{7}$$

At a check node, the check node operation represented in Equation (2) is performed according to Equation (7).

In other words, at a check node, as illustrated in FIG. 6, a message $u_j$ corresponding to a branch to be calculated is acquired by performing the check node operation represented in Equation (7) using messages $v_1$, $v_2$, $v_3$, $v_4$, and $v_5$ from the remaining branches connected to the check node. Messages corresponding to the other branches are similarly acquired.

Note that the function φ(x) represented in Equation (7) can be represented using an equation $\phi(x)=\ln((e^x+1)/(e^x-1))$. Thus, in case of x>0, $\phi(x)=\phi^{-1}(x)$. In order to mount the functions φ(x) and $\phi^{-1}(x)$ to hardware, there are cases where the functions are mounted using a look up table (LUT). In such cases, both the functions use a same LUT.

<Configuration Example of Transmission System According to Present Technology>

Figure 7:
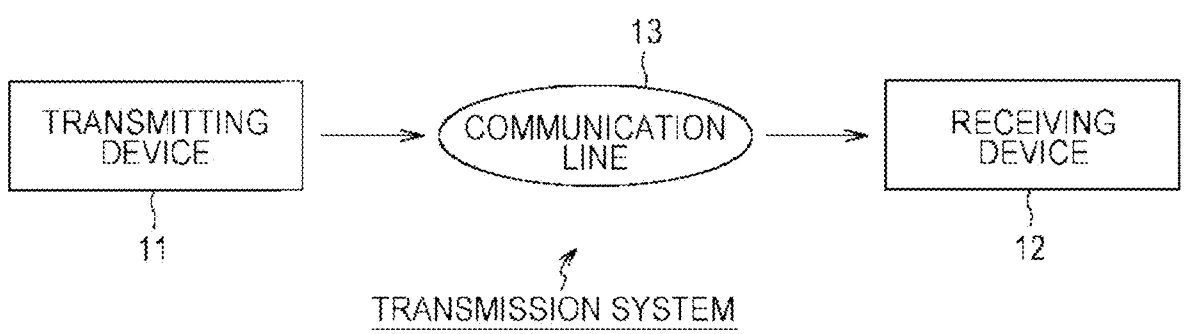
FIG. 7 is a diagram that illustrates a configuration example of a transmission system according to an embodiment of the present technology.

FIG. 7 is a diagram that illustrates a configuration example of a transmission system (here, a system represents logical aggregation of a plurality of devices regardless of whether or not the devices of configurations are arranged inside a same casing) according to an embodiment of the present technology.

As illustrated in FIG. 7, the transmission system is configured by a transmitting device 11 and a receiving device 12.

The transmitting device 11, for example, transmits (broadcasts) (sends) a program of television broadcasting or the like. In other words, the transmitting device 11, for example, codes target data that is a transmission target such as image data, audio data, and the like as a program into an LDPC code and transmits the LDPC code through a communication line 13 such as a satellite link, a terrestrial wave, or a cable (wire circuit).

The receiving device 12 receives the LDPC code transmitted from the transmitting device 11 through the communication line 13, decodes the received LDPC code into target data, and outputs the target data.

Here, it is known that the LDPC code used by the transmission system illustrated in FIG. 7 shows a very high capability in an additive white Gaussian noise (AWGN) communication line.

Meanwhile, there are cases where a burst error or an erasure occurs in the communication line 13. For example, particularly, in a case where the communication line 13 is a terrestrial wave, in an orthogonal frequency division multiplexing (OFDM) system, in a multi-path environment in which a desired to undesired ratio (D/U) is 0 dB (the power of undesired=echo is the same as the power of desired=main path), the power of a specific symbol becomes zero in accordance with a delay of the echo (a path other than the main path) (erasure).

In addition, also in a flutter (a communication line, to which an echo of a Doppler frequency is added, having a delay of zero), in a case where the D/U is 0 dB, there are cases where the power of all the symbols of the OFDM at specific time becomes zero in accordance with a Doppler frequency (erasure).

In addition, there are cases where a burst error occurs according to the status of a wiring from a receiving unit (not illustrated in the drawing) such as an antenna receiving a signal from the transmitting device 11 to the receiving device 12 on the receiving device 12 side or the instability of the power supply of the receiving device 12.

Meanwhile, in decoding the LDPC code, at a variable node corresponding to a column of the parity check matrix H or furthermore, a code bit of the LDPC code, as illustrated in FIG. 5, since the variable node operation represented in Equation (1) accompanying the addition of code bits (the reception value $u_{0i}$ thereof) of the LDPC code is performed, in a case where an error occurs in the code bits used for the variable node operation, the accuracy of an acquired message is decreased.

Then, in decoding the LDPC code, at a check node, since the check node operation represented in Equation (7) is performed using messages acquired at variable nodes connected to the check node, in a case where the number of check nodes for which errors (including erasures) simultaneously occur in a plurality of variable nodes (code bits of the LDPC code corresponding thereto) connected to each of the check nodes increases, the decoding performance is degraded.

In other words, for example, a check node, in a case where erasures simultaneously occur in two or more variable nodes connected to the check node, returns a message in which a probability of the value being "0" and a probability of the value being "1" are equal to all the variable nodes. In this case, the check node returning the message of the equal probability does not contribute to one decoding process (one set of the variable node operation and the check node operation) As a result, a large number of times of repetition of the decoding process are necessary, the decoding performance is degraded, and the power consumption of the receiving device 12 decoding the LDPC code is increased.

Thus, the transmission system illustrated in FIG. 7 can improve the resistance to a burst error or an erasure while maintaining the performance in the AWGN communication line (AWGN channel).

<Configuration Example of Transmitting Device 11>

Figure 8:
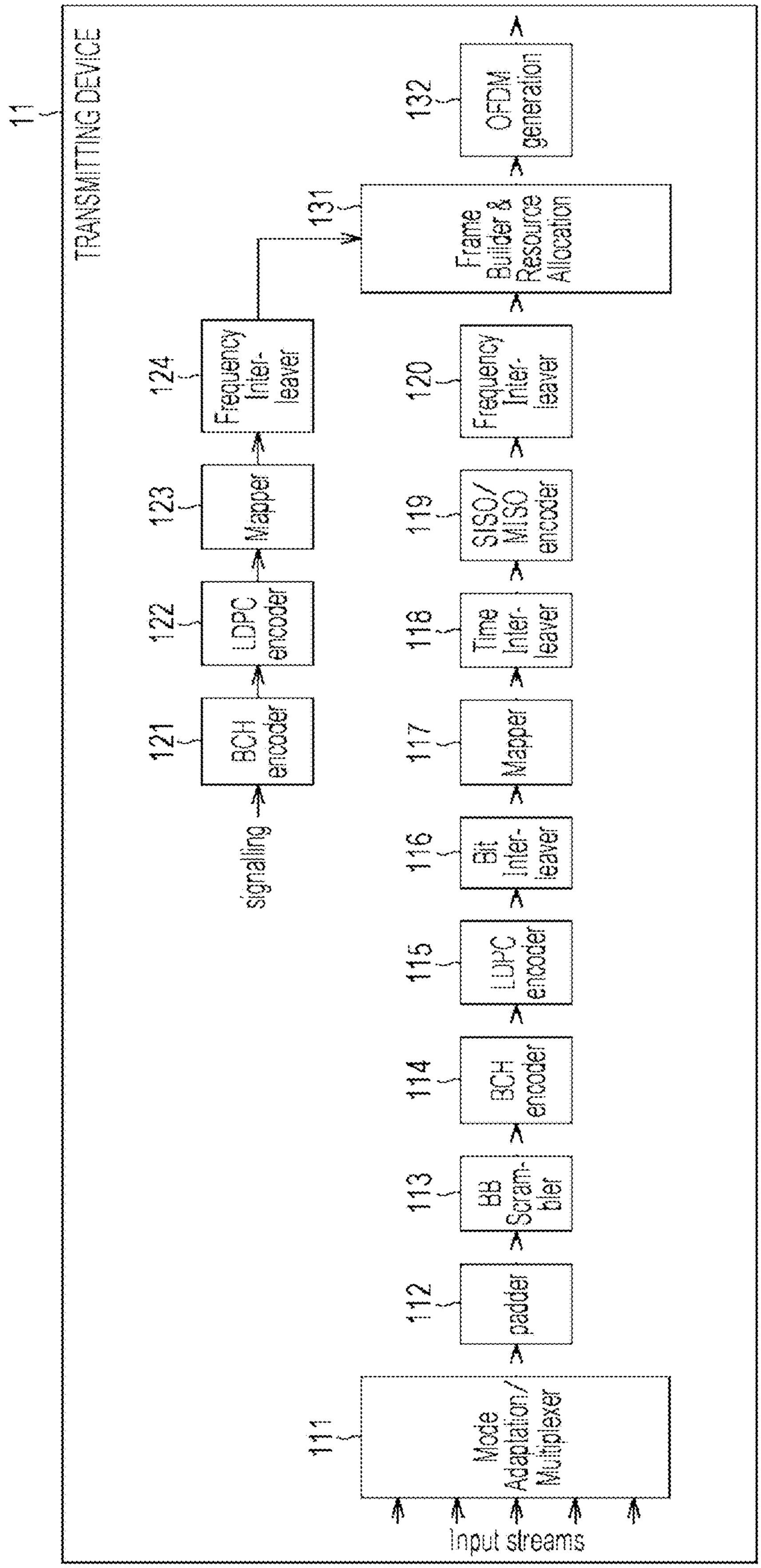
FIG. 8 is a block diagram that illustrates a configuration example of a transmitting device 11.

FIG. 8 is a block diagram that illustrates a configuration example of the transmitting device 11 illustrated in FIG. 7.

In the transmitting device 11, one or more input streams are supplied to a mode adaptation/multiplexer 111 as target data.

The mode adaptation/multiplexer 111 performs mode selection and a process of multiplexing one or more input streams supplied thereto or the like as is necessary and supplies data acquired as a result thereof to a padder 112.

The padder 112 performs necessary zero filling (insertion of Null) for the data supplied from the mode adaptation/multiplexer 111 and supplies data acquired as a result thereof to a BB scrambler 113.

The BB scrambler 113 performs base-band scrambling (BB scrambling) for the data supplied from the padder 112 and supplies data acquired as a result thereof to a BCH encoder 114.

The BCH encoder 114 performs BCH coding of the data supplied from the BB scrambler 113 and supplies data acquired as a result thereof to an LDPC encoder 115 as LDPC target data that is a target for LDPC coding.

The LDPC encoder 115 performs LDPC coding according to a parity check matrix of which a parity matrix, which is a part corresponding to a parity bit of the LDPC code, has a dual diagonal structure or the like for the LDPC target data supplied from the BCH encoder 114 and outputs an LDPC code having the LDPC target data as information bits.

In other words, the LDPC encoder 115 performs LDPC coding, for example, for coding the LDPC target data into an LDPC code defined in a predetermined standard such as DVB-S.2, the DVB-T.2, the DVB-C.2, or the like, an LDPC code to be employed (corresponding to the check parity matrix) in ATSC 3.0, or the like and outputs the LDPC code acquired as a result thereof.

Here, the LDPC code defined in the standard of the DVB-T.2 and the LDPC code to be employed in ATSC 3.0 are irregular repeat accumulate (IRA) codes, and a parity matrix of the parity check matrix of the LDPC code has a staircase structure. The parity matrix and the staircase structure will be described later. The IRA code, for example, is described in "Irregular Repeat-Accumulate Codes", H. Jin, A. Khandekar, and R. J. McEliece, in Proceedings of 2nd International Symposium on Turbo codes and Related Topics, pp. 1-8, September 2000.

The LDPC code output by the LDPC encoder 115 is supplied to a bit interleaver 116.

The bit interleaver 116 performs bit interleave to be described later for the LDPC code supplied from the LDPC encoder 115 and supplies the LDPC code after the bit interleave to a mapper 117.

The mapper 117 performs quadrature modulation (multi-value modulation) by mapping an LDPC code supplied from the bit interleaver 116 into a signal point representing one symbol of the quadrature modulation in units (symbol units) of code bits of one or more bits of the LDPC code.

In other words, the mapper 117 maps the LDPC code supplied from the bit interleaver 116 into a signal point, which is set in the modulation scheme performing quadrature modulation of the LDPC code, on an IQ plane (IQ constellation) defined by an I axis representing an I component having the same phase as the carrier wave and a Q axis representing a Q component orthogonal to the carrier wave and performs quadrature modulation.

In a case where the number of signal points set in the modulation scheme of the quadrature modulation performed by the mapper 117 is $2^m$, by using code bits of m bits of the LDPC code as a symbol (one symbol), in the mapper 117, the LDPC code supplied from the bit interleaver 116 is mapped into a signal point representing a symbol in units of symbols among the $2^m$ signal points.

Here, examples of the modulation scheme of the quadrature modulation performed by the mapper 117 include a modulation scheme defined in a standard such as DVB-T.2, a modulation scheme to be employed in ATSC 3.0, and other modulation schemes, in other words, includes Binary Phase Shift Keying (BPSK), Quadrature Phase Shift Keying (QPSK), 8 Phase-Shift Keying (PSK), 16 Amplitude Phase-Shift Keying (APSK), 32 APSK, 16 Quadrature Amplitude Modulation (QAM), 16 QAM, 64 QAM, 256 QAM, 1024 QAM, 4096QAM, and 4 Pulse Amplitude Modulation (PAM). A modulation scheme by which the quadrature modulation is performed in the mapper 117 is set in advance, for example, according to an operation performed by an operator of the transmitting device 11.

The data (a mapping result acquired by mapping a symbol into a signal point) acquired by the process performed by the mapper 117 is supplied to a time interleaver 118.

The time interleaver 118 performs time interleave (interleave in the time direction) in units of symbols for the data supplied from the mapper 117 and supplies data acquired as a result thereof to a single input single output/multiple input single output encoder (SISO/MISO encoder) 119.

The SISO/MISO encoder 119 performs space-time coding for the data supplied from the time interleaver 118 and supplies the coded data to the frequency interleaver 120.

The frequency interleaver 120 performs frequency interleave (interleave in the frequency direction) in units of symbols for the data supplied from the SISO/MISO encoder 119 and supplies resultant data to a frame builder and resource allocation unit 131.

On the other hand, for example, control data (signalling) used for transfer control such as BB signaling (Base Band Signalling) (BB Header) is supplied to the BCH encoder 121.

The BCH encoder 121, similarly to the BCH encoder 114, performs the BCH coding for control data supplied thereto and supplies data acquired as a result thereof to an LDPC encoder 122.

The LDPC encoder 122, similarly to the LDPC encoder 115, performs LDPC coding of data supplied from the BCH encoder 121 as LDPC target data and supplies an LDPC code acquired as a result thereof to a mapper 123.

The mapper 123, similarly to the mapper 117, performs quadrature modulation by mapping an LDPC code supplied from the LDPC encoder 122 into a signal point representing one symbol of the quadrature modulation in units (symbol units) of code bits of one or more bits of the LDPC code and supplies data acquired as a result thereof to a frequency interleaver 124.

The frequency interleaver 124, similarly to the frequency interleaver 120, performs frequency interleave of data supplied from the mapper 123 in units of symbols and supplies resultant data to a frame builder/resource allocation unit 131.

The frame builder/resource allocation unit 131 inserts symbols of pilots into necessary positions of the data (symbols) supplied from the frequency interleavers 120 and 124, configures a frame (for example, a physical layer (PL) frame, a T2 frame, a C2 frame, or the like) configured by a predetermined number of symbols on the basis of resultant data (symbol) thereof, and supplies the configured frame to the OFDM generating unit (OFDM generation) 132.

The OFDM generating unit 132 generates an OFDM signal corresponding to the frame from the frame supplied from the frame builder/resource allocation unit 131 and transmits the OFDM signal through the communication line 13 (FIG. 7).

Note that the transmitting device 11, for example, may be configured without arranging some of the blocks illustrated in FIG. 8 such as the time interleaver 118, the SISO/MISO encoder 119, the frequency interleaver 120 and, the frequency interleaver 124.

<Configuration Example of Bit Interleaver 116>

Figure 9:
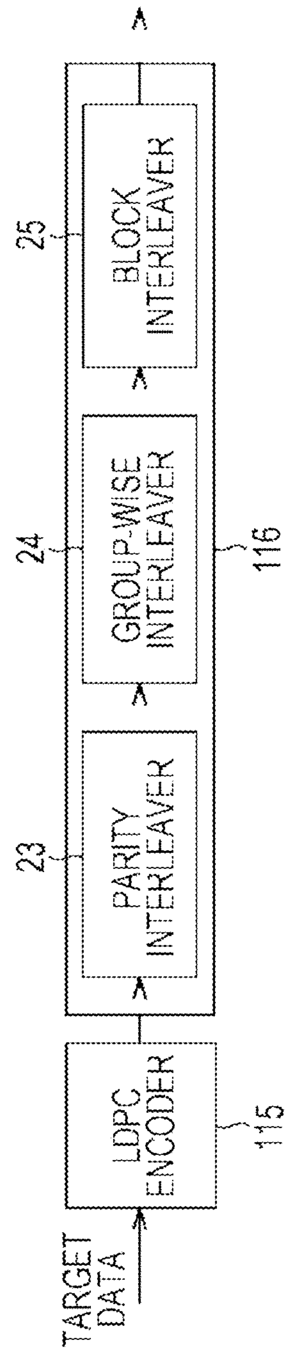
FIG. 9 is a block diagram that illustrates a configuration example of a bit interleaver 116.

FIG. 9 is a block diagram that illustrates a configuration example of the bit interleaver 116 illustrated in FIG. 8.

The bit interleaver 116 has a function of interleaving data and includes a parity interleaver 23, a group-wise interleaver 24, and a block interleaver 25.

The parity interleaver 23 performs parity interleave of interleaving the parity bits of the LDPC code supplied from the LDPC encoder 115 into positions of other parity bits and supplies the LDPC code after the parity interleave to the group-wise interleaver 24.

The group-wise interleaver 24 performs group-wise interleave for the LDPC code supplied from the parity interleaver 23 and supplies the LDPC code after the group-wise interleave to the block interleaver 25.

Here, in the group-wise interleave, an LDPC code supplied from the parity interleaver 23 is interleaved in units of bit groups by using 360 bits of one segment as a bit group that is acquired by dividing an LDPC code corresponding to one code from the start thereof in units of 360 bits that are the same as a unit size P to be described later.

In a case where the group-wise interleave is performed, the error rate can be improved to be better than that in a case where the group-wise interleave is not performed, and as a result, excellent communication quality can be secured in data transmission.

The block interleaver 25 symbolizes an LDPC code, for example, corresponding to one code into symbols of m bits as a unit for mapping by performing block interleave for demultiplexing the LDPC code supplied from the group-wise interleaver 24 and supplies the symbols to the mapper 117 (FIG. 8).

Here, in the block interleave, for example, an LDPC code corresponding to one code is converted into an m-bit symbol as the LDPC code supplied from the group-wise interleaver 24 is written in the column direction and is read in the row direction for a storage area in which columns as storage areas each storing a predetermined number of bits in the column (vertical) direction of the same number as the number m of bits of the symbol are aligned in the row (horizontal) direction.

<Parity Check Matrix H of LDPC Code>

Figure 10:
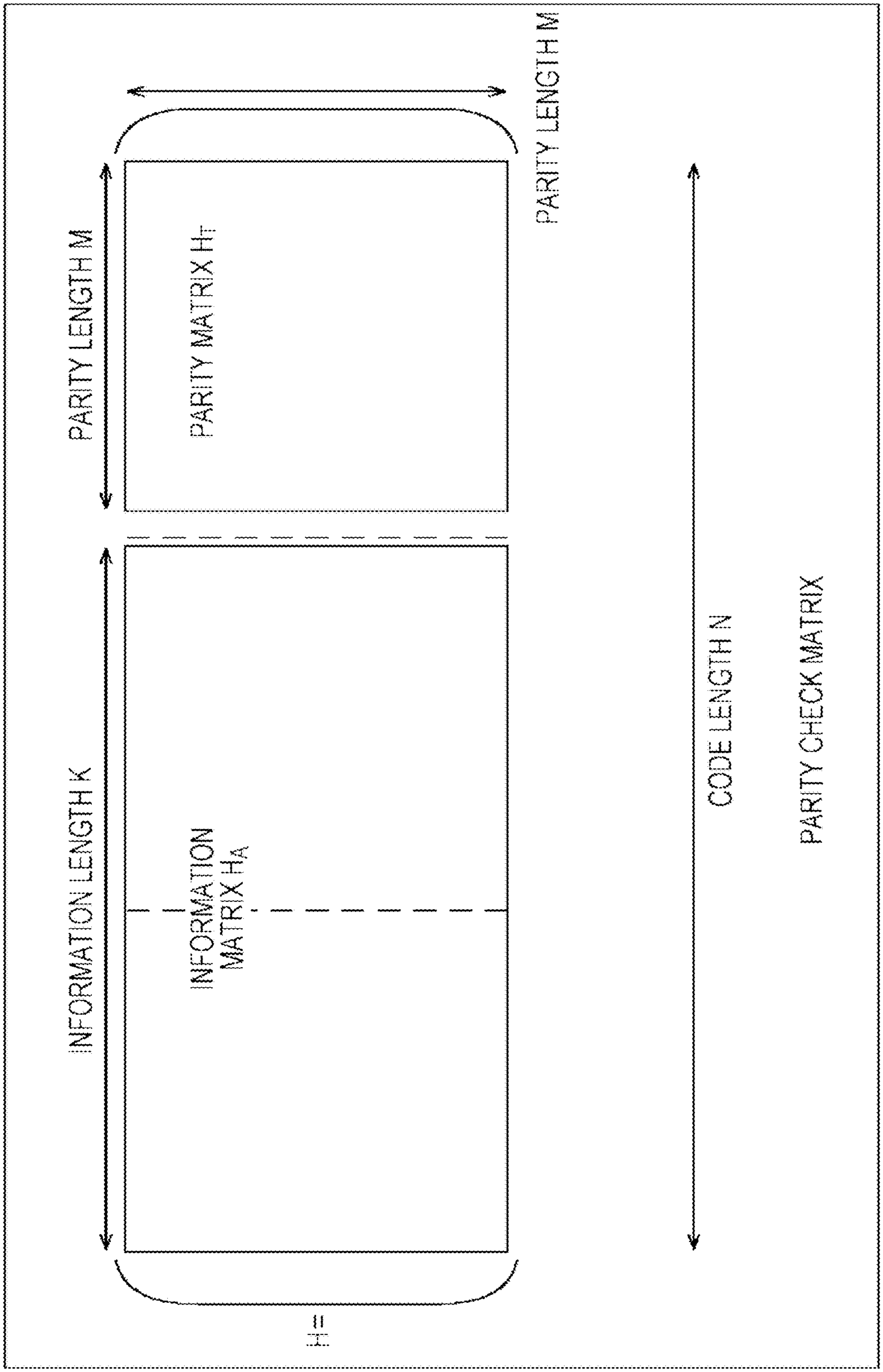
FIG. 10 is a diagram that illustrates an example of a parity check matrix.

FIG. 10 is a diagram that illustrates an example of the parity check matrix H used for LDPC coding by the LDPC encoder 115 illustrated in FIG. 8.

The parity check matrix H has a Low-Density Generation Matrix (LDGM) structure and can be represented by an equation $H=[H_A|H_T]$ (a matrix having elements of an information matrix $H_A$ as its left elements and having elements of a parity matrix $H_T$ as its right elements) using the information matrix $H_A$ Of a part corresponding to information bits among the code bits of the LDPC code and the parity matrix $H_T$ corresponding to the parity bits thereof.

Here, among the code bits of the LDPC code (one code word) of one code, the bit number of information bits and the number bits of parity bits will be respectively referred to as an information length K and a parity length M, and the bit number of the code bits of one (one code word) LDPC code will be referred to as a code length N (=K+M).

The information length K and the parity length M of the LDPC code having a certain code length N are determined by a coding rate. The parity check matrix H is a matrix in which rows×columns are M×N (a matrix of M rows and N columns). The information matrix $H_A$ is a matrix of M×K, and the parity matrix $H_T$ is a matrix of M×M.

Figure 11:
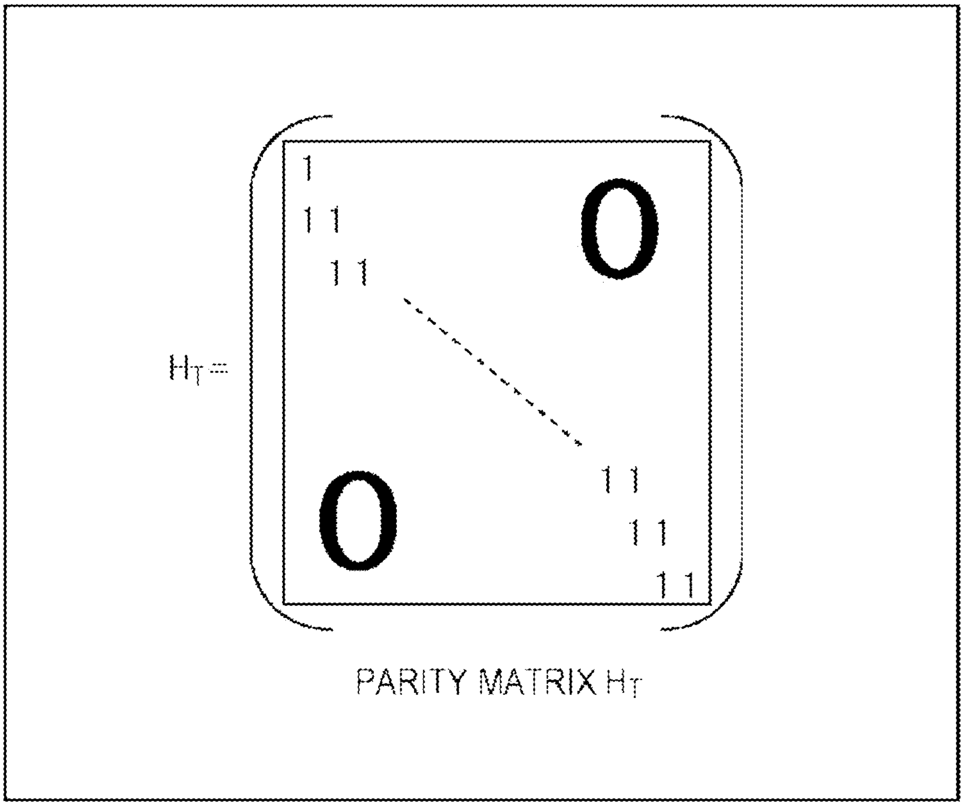
FIG. 11 is a diagram that illustrates an example of a parity matrix.

FIG. 11 is a diagram that illustrates an example of the parity matrix $H_T$ of the parity check matrix H used for LDPC coding by the LDPC encoder 115 illustrated in FIG. 8.

The parity matrix $H_T$ of the parity check matrix H used by the LDPC encoder 115 for LDPC coding, for example, is similar to a parity matrix $H_T$ of a parity check matrix H of an LDPC code defined in the standard of DVB-T.2 or the like.

The parity matrix $H_T$ of the parity check matrix H of the LDPC code that is defined in the standard of DVB-T.2 or the like, as illustrated in FIG. 11, is a matrix (lower bidiagonal matrix) having a staircase structure in which elements of "1" are aligned in a staircase pattern. The row weight of the parity matrix $H_T$ is 1 in a first row and is 2 in all the remaining rows. In addition, the column weight is 1 for the last one column and is 2 for all the remaining columns.

As described above, the LDPC code of the parity check matrix H of which the parity matrix $H_T$ has the staircase structure can be easily generated using the parity check matrix H.

In other words, the LDPC code (one code word) will be represented by a row vector c, and a column vector acquired by transposing the row vector will be represented by $c^T$. In addition, an information-bit part of the row vector c that is the LDPC code will be represented by a row vector A, and a parity-bit part thereof will be represented by a row vector T.

In this case, the row vector c can be represented by an equation c=[A|T] (having elements of a column vector A as left elements and having elements of a row vector T as right elements) by using the column vector A as information bits and the row vector T as parity bits.

In the parity check matrix H and the row vector c=[A|T] as the LDPC code need to satisfy an equation $Hc^T=0$. The row vector T as the parity bits configuring the row vector c=[A|T] satisfying the equation $Hc^T=0$ can be sequentially (orderly) acquired by setting elements of each row to "0" sequentially from elements of the first row of the column vector $Hc^T$ in the equation $Hc^T=0$ in a case where the parity matrix $H_T$ of the parity check matrix $H=[H_A|H_T]$ has the staircase structure illustrated in FIG. 11.

Figure 12:
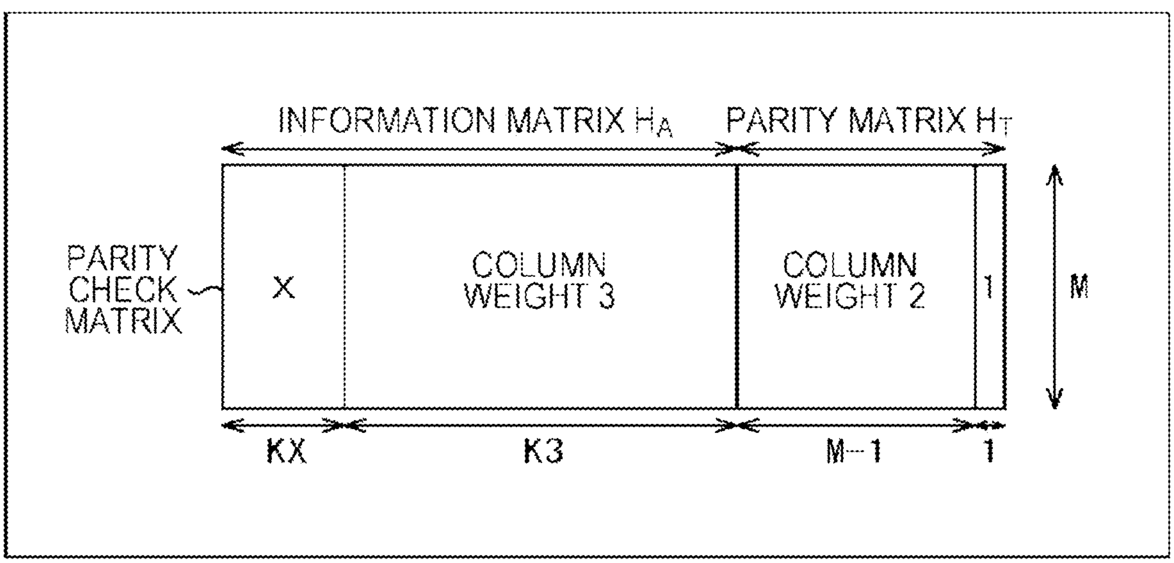
FIG. 12 is a diagram that illustrates the parity check matrix of the LDPC code that is defined in the standard of the DVB-T.2.

FIG. 12 is a diagram that illustrates a parity check matrix H of an LDPC code defined in the standard of DVB-T.2 or the like.

For KX columns from a first column of the parity check matrix H of the LDPC code defined in the standard of DVB-T.2 or the like, the column weight is set to X, for the following K3 columns, the column weight is set to "3", for the following (M−1) columns, the column weight is set to "2", and, for the last one column, the column weight is set to "1".

Here, KX+K3+M−1+1 is equal to the code length N.

FIG. 13 is a diagram that illustrates the numbers KX, K3, and M of columns and a column weight X for each coding rate r of the LDPC code defined in the standard of DVB-T.2.

In the standard of the DVB-T.2 or the like, LDPC codes, which have a code length N, of 64800 bits and 16200 bits are defined.

For the LDPC code of which the code length N is 64800 bits, 11 coding rates (nominal rates) of 1/4, 1/3, 2/5, 1/2, 3/5, 2/3, 3/4, 4/5, 5/6, 8/9, and 9/10 are defined. In addition, for the LDPC code of which the code length N is 16200 bits, 10 coding rates of 1/4, 1/3, 2/5, 1/2, 3/5, 2/3, 3/4, 4/5, 5/6, and 8/9 are defined.

Here, the code length N of the 64800 bits may be also referred to as 64 kbits, and the code length N of the 16200 bits may be also referred to as 16 kbits.

For the LDPC code, an error rate tends to be lower in a code bit corresponding to a column of which a column weight of the parity check matrix H is larger.

In the parity check matrix H, which is illustrated in FIGS. 12 and 13, defined in the standard of the DVB-T.2 or the like, a column weight of a column tends to increase as the column is disposed on a further head side (left side). Accordingly, for the LDPC code corresponding to the parity check matrix H, a code bit disposed on a further head side tends to be more resistant against an error (have resistance against an error), and, a last code bit tends to be less resistant against an error.

<Parity Interleave>

Next, the parity interleave performed by the parity interleaver 23 illustrated in FIG. 9 will be described with reference to FIGS. 14 to 16.

Figure 14:
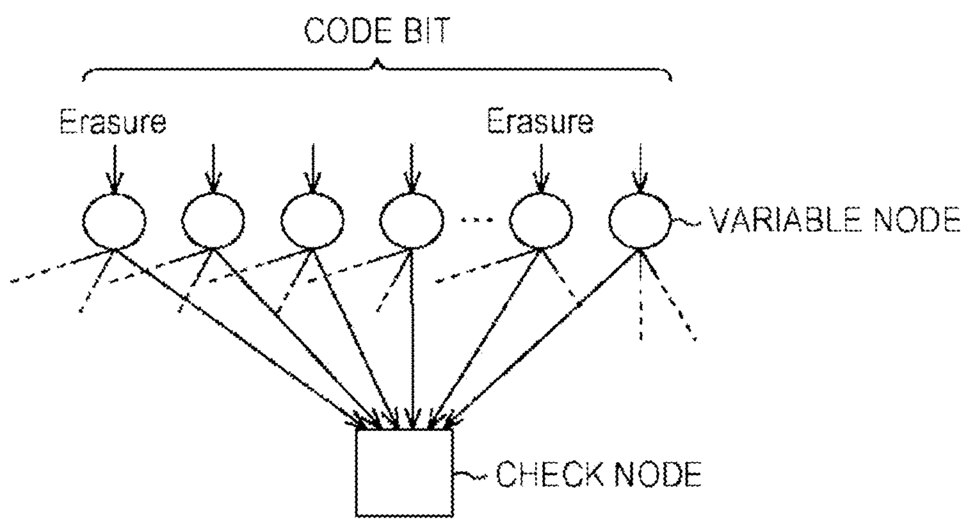
FIG. 14 is a diagram that illustrates an example of a Tanner graph for decoding an LDPC code.

FIG. 14 is a diagram that illustrates an example of a Tanner graph (a part thereof) of a parity check matrix of an LDPC code.

As illustrated in FIG. 14, when errors simultaneously occur such as erasures in a plurality of variable nodes such as two variable nodes (code bits corresponding thereto) connected to a check node, the check node returns a message in which a probability of the value being "0" and a probability of the value being "1" are equal to all the variable nodes connected to the check node. For this reason, when erasures or the like simultaneously occur in the plurality of variable nodes connected to same check node, the decoding performance is degraded.

Meanwhile, the LDPC code output by the LDPC encoder 115 illustrated in FIG. 8, for example, is an IRA code, similarly to the LDPC code defined in the standard of the DVB-T.2 or the like, and the parity matrix $H_T$ of the parity check matrix H, as illustrated in FIG. 11, has a staircase structure.

FIG. 15 is a diagram that illustrates an example of a parity matrix $H_T$ having a staircase structure and a Tanner graph corresponding to the parity matrix $H_T$, as illustrated in FIG. 11.

A of FIG. 15 illustrates an example of a parity matrix $H_T$ having a staircase structure, and B of FIG. 15 illustrates a Tanner graph corresponding to the parity matrix $H_T$ illustrated in A of FIG. 15.

In the parity matrix $H_T$ having a staircase structure, elements of "1" are adjacent to each other in each row (except for the first row). For this reason, in the Tanner graph of the parity matrix $H_T$, two adjacent variable nodes corresponding to columns of two adjacent elements of which the values of the parity matrix $H_T$ are "1"s are connected to a same check node.

Accordingly, when errors simultaneously occur in parity bits corresponding to the two adjacent variable nodes described above in accordance with burst errors, erasures, or the like, a check node connected to the two variable nodes (variable nodes acquiring messages using parity bits) corresponding to the two parity bits in which the errors occur returns a message in which a probability of the value being "0" and a probability of the value being "1" are equal to the variable nodes connected to the check node, and accordingly, the decoding performance is degraded. Then, when a burst length (the bit number of parity bits in which errors continuously occur) is large, the number of check nodes each returning a message of the equal probability increases, and the decoding performance is further degraded.

Accordingly, in order to prevent the degradation of the decoding performance described above, the parity interleaver 23 (FIG. 9) performs parity interleave in which parity bits of the LDPC code supplied from the LDPC encoder 115 are interleaved to positions of the other parity bits.

Figure 16:
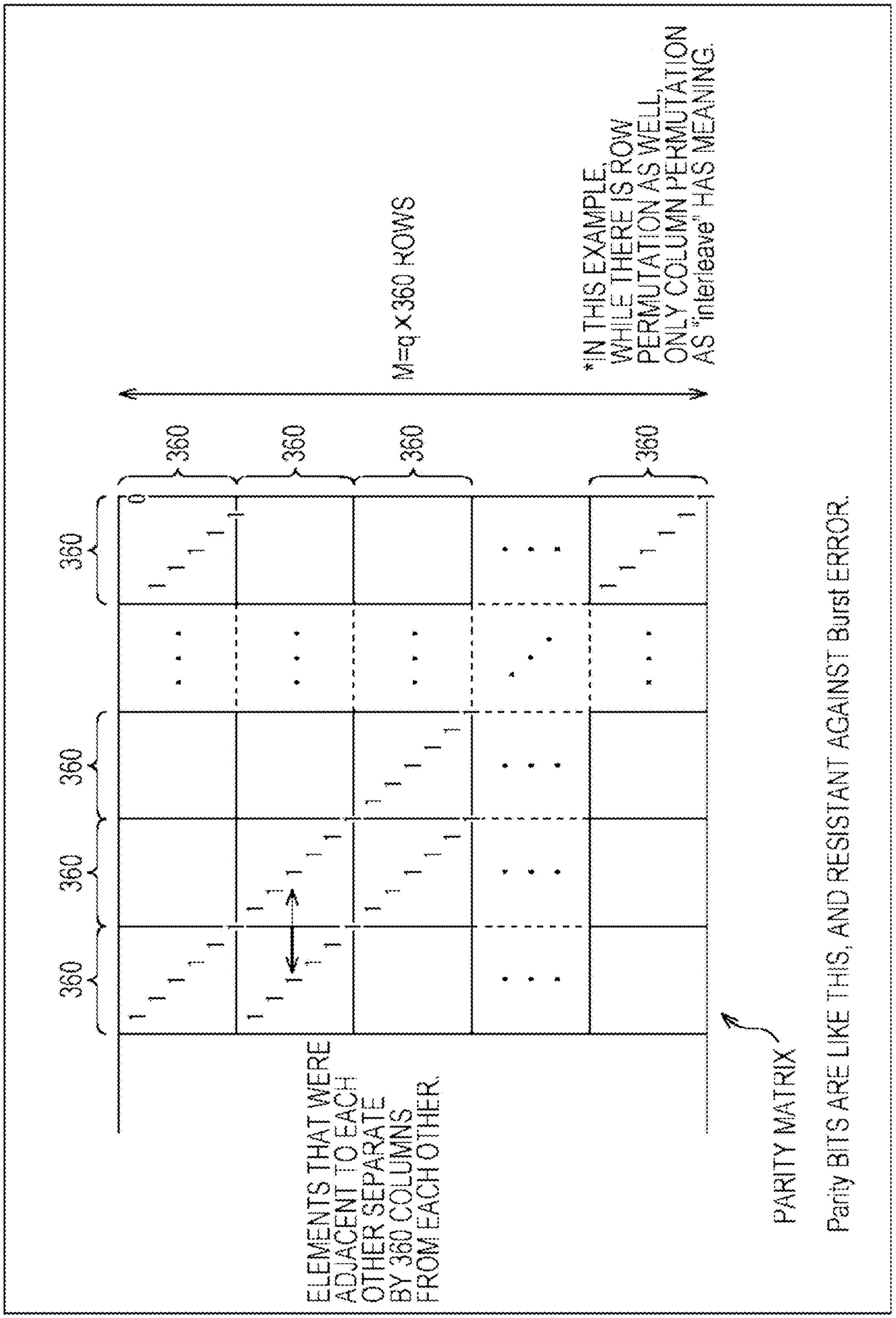
FIG. 16 is a diagram that illustrates an example of a parity matrix $H_T$ of a parity check matrix H corresponding to an LDPC code after parity interleave.

FIG. 16 is a diagram that illustrates a parity matrix $H_T$ of a parity check matrix H corresponding to an LDPC code after the parity interleave performed by the parity interleaver 23 illustrated in FIG. 9.

Here, the information matrix $H_A$ of the parity check matrix H corresponding to the LDPC code output by the LDPC encoder 115, similarly to the information matrix of the parity check matrix H corresponding to the LDPC code defined in the standard of DVB-T.2 or the like, has a cyclic structure.

The cyclic structure represents a structure in which a certain column coincides with a column acquired by cyclically shifting another column and, for example, also includes a structure in which, for every P columns, the position of "1" in each column of the P columns is a position acquired by cyclically shifting a first column of the P columns in a column direction by a predetermined value such as a value proportional to a value q acquired by dividing the parity length M. Hereinafter, P columns in the cyclic structure will be referred to as a unit size.

As LDPC codes defined in the standard of DVB-T.2 or the like, as described with reference to FIGS. 12 and 13, there are two types of LDPC codes of which the code lengths N are 64800 bits and 16200 bits, and, for each of those two types of LDPC codes, the unit size P is defined as 360 that is one of divisors of the parity length M excluding 1 and M.

The parity length M has a value other than prime numbers that is represented by an equation $M=q\times P=q\times 360$ using a value q different according to the coding rate. Therefore, similarly to the unit size P, the value q is another one of the divisors of the parity length M other than 1 and M and is acquired by dividing the parity length M by the unit size P (the product of P and q that are the divisors of the parity length M is the parity length M).

As described above, when the information length is K, an integer equal to or greater than 0 and smaller than P is set to x, and an integer equal to or greater than 0 and smaller than q is set to y, the parity interleaver 23 interleaves a (K+qx+y+1)-th code bit of code bits of an LDPC code configured by N bits at the position of the (K+Py+x+1)-th code bit as parity interleave.

Both the (K+qx+y+1)-th code bit and the (K+Py+x+1)-th code bit are code bits after the (K+1)-th bit and thus are parity bits. Therefore, according to the parity interleave, the positions of the parity bits of the LDPC code are moved.

According to the parity interleave, variable nodes (parity bits corresponding thereto) connected to a same check node are separated by the unit size P, that is, 360 bits in this case. Therefore, in a case where the burst length is less than 360 bits, a situation in which errors simultaneously occur at a plurality of variable nodes connected to the same check node can be avoided, and as a result thereof, the resistance against a burst error can be improved.

Note that the LDPC code after the parity interleave for interleaving the (K+qx+y+1)-th code bit into the position of the (K+Py+x+1)-th code bit coincides with an LDPC code of a parity check matrix (hereinafter, referred to as a transformed parity check matrix) acquired by performing column permutation for replacing a (K+qx+y+1)-th column of the original parity check matrix H with a (K+Py+x+1)-th column.

In addition, in the parity matrix of the transformed parity check matrix, as illustrated in FIG. 16, a pseudo cyclic structure configured in units of P columns (in the case illustrated in FIG. 16, 360 columns) appears.

Here, the pseudo cyclic structure is a structure in which a portion acquired by excluding a part has a cyclic structure.

In the transformed parity check matrix acquired by performing the column permutation corresponding to the parity interleave for the parity check matrix of the LDPC code defined in the standard of DVB-T.2 or the like, in a part of 360 rows×360 columns (a shift matrix to be described later) disposed in an upper right corner portion of the transformed parity check matrix, one of the elements of "1" is lacking (instead, the element is element of "0"). From that point, the transformed parity check matrix has not a (complete) cyclic structure but a so-called pseudo cyclic structure.

The transformed parity check matrix for the parity check matrix of the LDPC code output by the LDPC encoder 115, for example, similarly to the transformed parity check matrix for the parity check matrix of the LDPC code defined in the standard of DVB-T.2 or the like, has a pseudo cyclic structure.

Note that the transformed parity check matrix illustrated in FIG. 16 is a matrix acquired by performing permutation of rows for configuring the transformed parity check matrix to be a constituent matrix to be described later for the original parity check matrix H in addition to the column permutation corresponding to the parity interleave.

Figure 17:
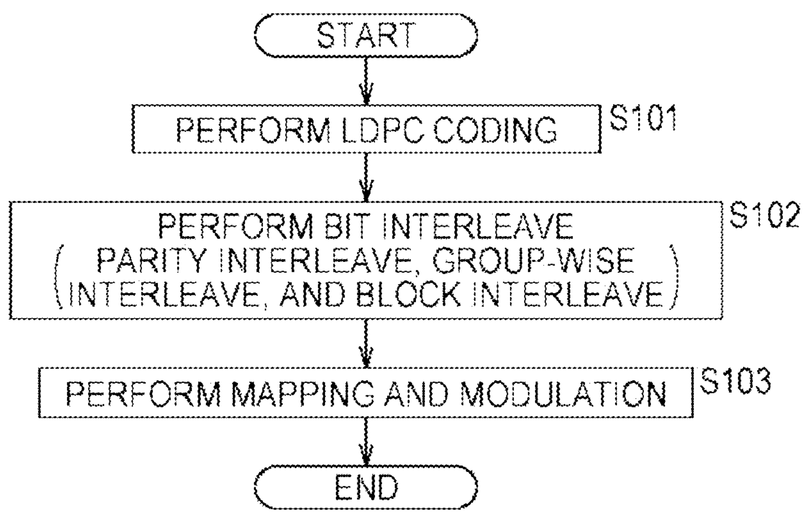
FIG. 17 is a flowchart that illustrates an example of a process performed by a bit interleaver 116 and a mapper 117.

FIG. 17 is a flowchart that illustrates a process performed by the LDPC encoder 115, the bit interleaver 116, and the mapper 117 illustrated in FIG. 8.

The LDPC encoder 115 waits for the supply of the LDPC target data from the BCH encoder 114. Then, in step S101, the LDPC encoder 115 codes LDPC target data into an LDPC code and supplies the LDPC code to the bit interleaver 116, and the process proceeds to step S102.

In step S102, the bit interleaver 116 performs bit interleave for the LDPC code supplied from the LDPC encoder 115 as a target and supplies a symbol acquired by the bit interleave to the mapper 117, and the process proceeds to step S103.

In other words, in step S102, in the bit interleaver 116 (FIG. 9), the parity interleaver 23 performs parity interleave for the LDPC code supplied from the LDPC encoder 115 as a target and supplies the LDPC code after the parity interleave to the group-wise interleaver 24.

The group-wise interleaver 24 performs the group-wise interleave for the LDPC code supplied from the parity interleaver 23 as a target and supplies resultant LDPC code to the block interleaver 25.

The block interleaver 25 performs the block interleave for the LDPC code after the group-wise interleave performed by the group-wise interleaver 24 as a target and supplies a symbol of m bits acquired as a result thereof to the mapper 117.

In step S103, the mapper 117 performs quadrature modulation by mapping the symbol supplied from the block interleaver 25 to one of $2^m$ signal points determined in the modulation scheme of the quadrature modulation performed by the mapper 117 and supplies data acquired as a result thereof to the time interleaver 118.

As described above, by performing the parity interleave and the group-wise interleave, an error rate in a case where a plurality of code bits of the LDPC code are transmitted as one symbol can be improved.

Here, in the case illustrated in FIG. 9, for the convenience of description, while the parity interleaver 23 that is a block performing the parity interleave and the group-wise interleaver 24 that is a block performing the group-wise interleave are separately configured, the parity interleaver 23 and the group-wise interleaver 24 may be integrally configured.

In other words, both the parity interleave and the group-wise interleave can be performed by writing and reading the code bits for the memory and can be represented by a matrix that converts an address (write address) into which code bits are written into an address (read address) from which code bits are read.

Accordingly, in a case where a matrix that is acquired by multiplying a matrix representing the parity interleave by a matrix representing the group-wise interleave is acquired, by converting code bits by using such matrixes, the parity interleave is performed, and a result of the group-wise interleave of the LDPC code after the parity interleave can be acquired.

In addition to the parity interleaver 23 and the group-wise interleaver 24, the block interleaver 25 can be integrally configured.

In other words, the block interleave performed by the block interleaver 25 also can be represented by using a matrix that converts a write address of the memory in which the LDPC code is stored into a read address.

Therefore, by acquiring a matrix that is acquired by multiplying the matrix representing the parity interleave by the matrix representing the group-wise interleave and the matrix representing the block interleave, the parity interleave, the group-wise interleave, and the block interleave can be performed together by using the matrix.

<Configuration Example of the LDPC Encoder 115>

Figure 18:
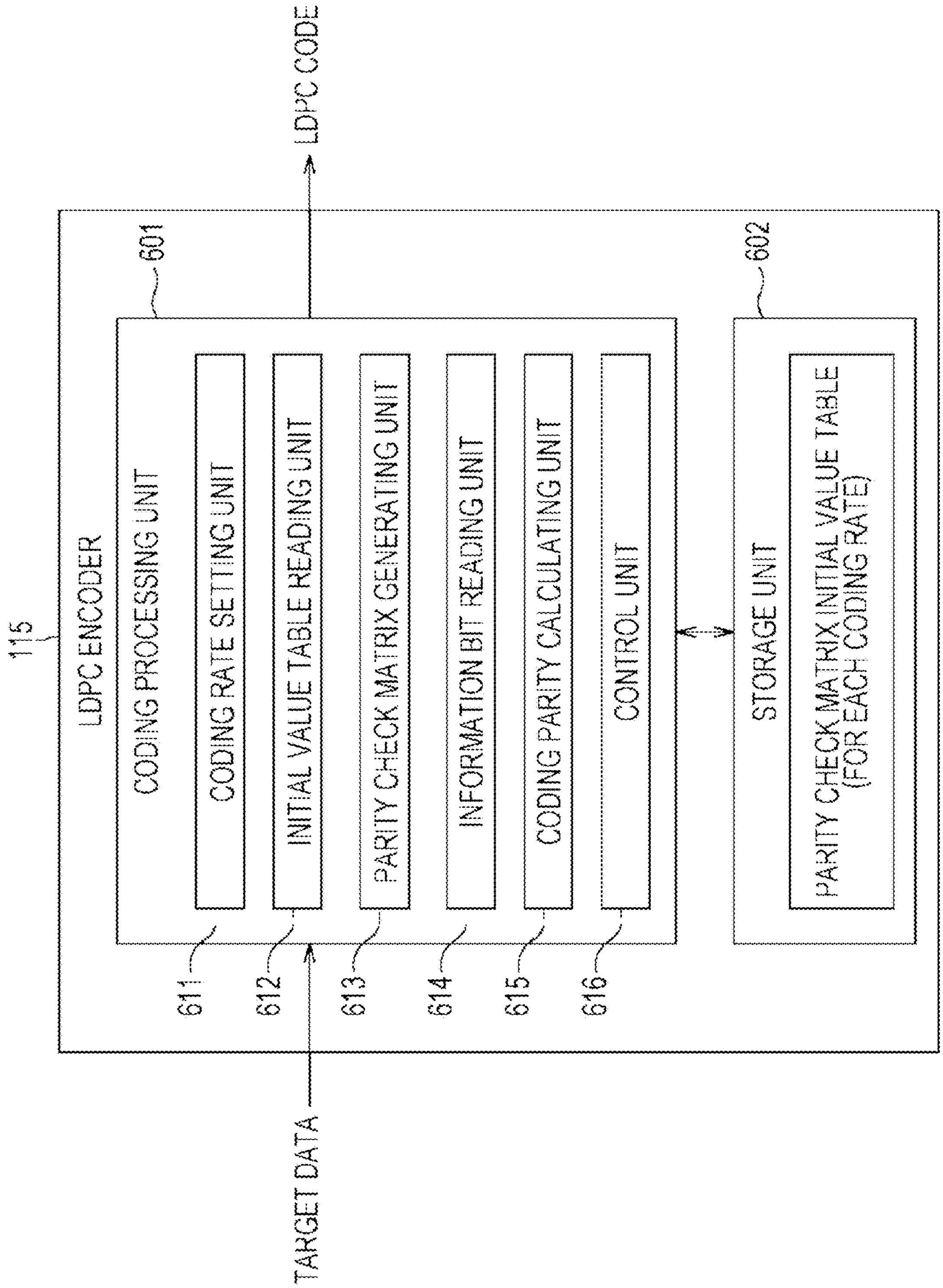
FIG. 18 is a block diagram that illustrates a configuration example of an LDPC encoder 115.

FIG. 18 is a block diagram that illustrates a configuration example of the LDPC encoder 115 illustrated in FIG. 8.

Note that the LDPC encoder 122 illustrated in FIG. 8 is similarly configured.

As described with reference to FIGS. 12 and 13, in the standard of the DVB-T.2 or the like, the LDPC codes of two types of code lengths N including 64800 bits and 16200 bits are defined.

For the LDPC code having the code length N of 64800 bits, 11 coding rates of 1/4, 1/3, 2/5, 1/2, 3/5, 2/3, 3/4, 4/5, 5/6, 8/9, and 9/10 are defined. In addition, for the LDPC code having the code length N of 16200 bits, 10 coding rates of 1/4, 1/3, 2/5, 1/2, 3/5, 2/3, 3/4, 4/5, 5/6, and 8/9 are defined (FIGS. 12 and 13).

For example, the LDPC encoder 115 can perform coding (error correction coding) using the LDPC code of each coding rate having the code length N of 64800 bits or 16200 bits by using the parity check matrix H prepared for each code length N and each coding rate.

The LDPC encoder 115 includes a coding processing unit 601 and a storage unit 602.

The coding processing unit 601 is configured by: a coding rate setting unit 611, an initial value table reading unit 612; a parity check matrix generating unit 613; an information bit reading unit 614; a coding parity calculating unit 615; and a control unit 616. The coding processing unit 601 performs the LDPC coding of LDPC target data supplied to the LDPC encoder 115 and supplies an LDPC code acquired as a result thereof to the bit interleaver 116 (FIG. 8).

In other words, the coding rate setting unit 611, for example, sets the code length N and the coding rate of the LDPC code in accordance with operator's operation or the like.

The initial value table reading unit 612 reads a parity check matrix initial value table to be described later corresponding to the code length N and the coding rate set by the coding rate setting unit 611 from the storage unit 602.

The parity check matrix generating unit 613 generates a parity check matrix H by arranging elements of 1 of an information matrix $H_A$ corresponding to an information length K (=code length N−parity length M) according to the code length N and the coding rate set by the coding rate setting unit 611 in the column direction at the period of 360 columns (unit size P) on the basis of the parity check matrix initial value table read by the initial value table reading unit 612 and stores the parity check matrix H in the storage unit 602.

The information bit reading unit 614 reads (extracts) information bits corresponding to the information length K from the LDPC target data supplied to the LDPC encoder 115.

The coding parity calculating unit 615 reads the parity check matrix H generated by the parity check matrix generating unit 613 from the storage unit 602 and generates a code word (LDPC code) by calculating parity bits for the information bits read by the information bit reading unit 614 by using the parity check matrix H on the basis of a predetermined equation.

The control unit 616 controls each block that configures the coding processing unit 601.

In the storage unit 602, a plurality of parity check matrix initial value tables corresponding to the plurality of coding rates, which are illustrated in FIGS. 12 and 13, for the code lengths N such as 64800 bits and 16200 bits are stored. In addition, the storage unit 602 temporarily stores data that is necessary for processing performed by the coding processing unit 601.

Figures 19, 20:
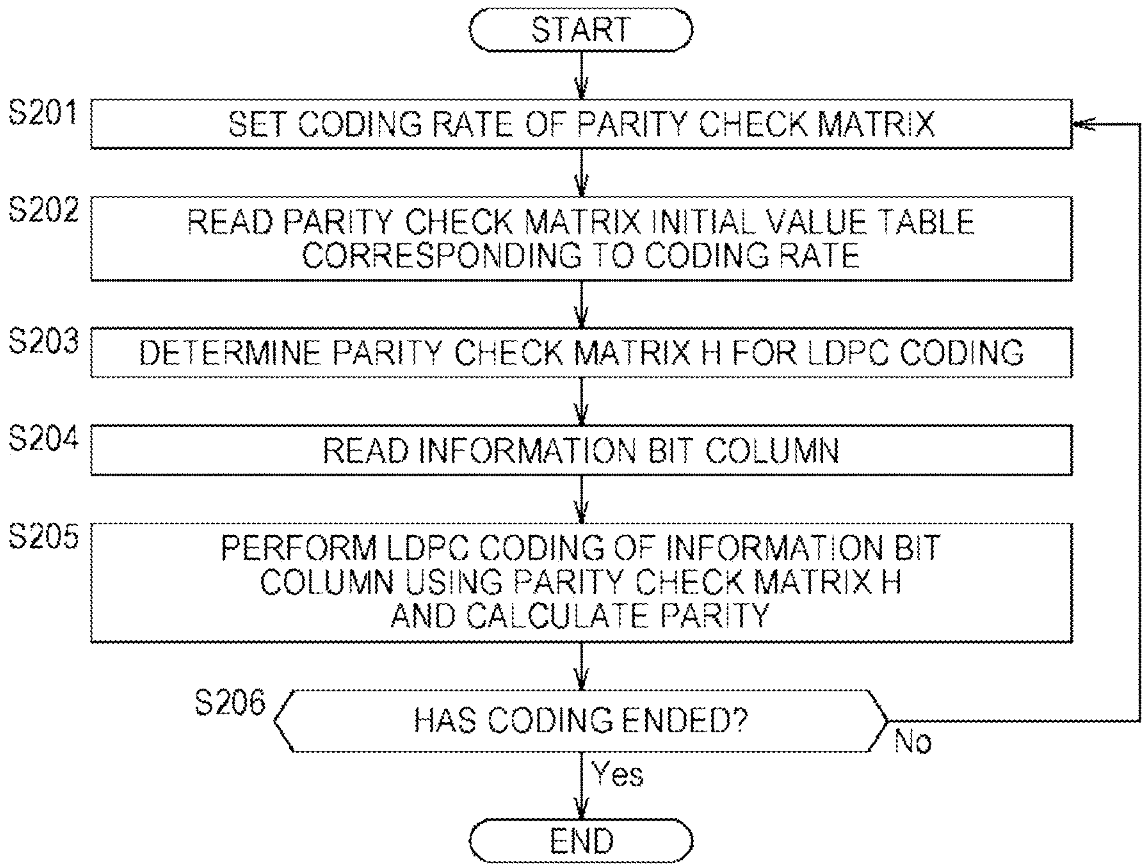
FIG. 19 is a flowchart that illustrates an example of the process of the LDPC encoder 115.
FIG. 20 is a diagram that illustrates an example of a parity check matrix initial value table in which a coding rate is 1/4 and a code length is 16200.

FIG. 19 is a flowchart that illustrates an example of the process performed by the LDPC encoder 115 illustrated in FIG. 18.

In step S201, the coding rate setting unit 611 determines (sets) the code length N and the coding rate r for performing the LDPC coding.

In step S202, the initial value table reading unit 612 reads a parity check matrix initial value table, which is set in advance, corresponding to the code length N and the coding rate r determined by the coding rate setting unit 611 from the storage unit 602.

In step S203, the parity check matrix generating unit 613 acquires (generates) the parity check matrix H of the LDPC code of the code length N and the coding rate r determined by the coding rate setting unit 611 by using the parity check matrix initial value table read from the storage unit 602 by the initial value table reading unit 612 and supplies the acquired parity check matrix H to the storage unit 602 so as to be stored therein.

In step S204, the information bit reading unit 614 reads the information bits of the information length K (=N×r) corresponding to the code length N and the coding rate r determined by the coding rate setting unit 611 from the LDPC target data supplied to the LDPC encoder 115, reads the parity check matrix H acquired by the parity check matrix generating unit 613 from the storage unit 602, and supplies the information bits and the parity check matrix to the coding parity calculating unit 615.

In step S205, the coding parity calculating unit 615 sequentially calculates parity bits of a code word c satisfying Equation (8) using the information bits and the parity check matrix H supplied from the information bit reading unit 614.

$$Hc^T=0 \quad (8)$$

In Equation (8), c represents a row vector as a code word (LDPC code), and $c^T$ represents transposition of the row vector c.

Here, as described above, when a portion of information bits of the row vector c as the LDPC code (one code word) is represented as a row vector A, and a portion of parity bits thereof is represented as a row vector T, the row vector c can be represented by Equation c=[A|T] using the row vector A as the information bits and the row vector T as the parity bits.

The parity check matrix H and the row vector c=[A|T] as an LDPC code need to satisfy an equation $Hc^T=0$. The row vector T as the parity bits configuring the row vector c=[A|T] satisfying the equation $Hc^T=0$ can be sequentially calculated by setting elements of each row to 0 sequentially from elements of a first row of the column vector $Hc^T$ in the equation $Hc^T=0$ in a case where the parity matrix $H_T$ of the parity check matrix $H=[H_A|H_T]$ has the staircase structure illustrated in FIG. 11.

The coding parity calculating unit 615 acquires parity bits T for the information bits A supplied from the information bit reading unit 614 and outputs a codeword c=[A|T] represented by the information bits A and the parity bits T as a result of the LDPC coding of the information bits A.

Thereafter, in step S206, the control unit 616 determines whether or not the LDPC coding ends. In a case where the LDPC coding is determined not to end in step S206, in other words, in a case where there is still LDPC target data for which the LDPC coding is performed, the process is returned to step S201 (or step S204). Thereafter, the process of steps S201 (or step S204) to S206 is repeated.

On the other hand, in step S206, in a case where the LDPC coding is determined to end, in other words, for example, in a case where there is no LDPC target data for which the LDPC coding is performed, the LDPC encoder 115 ends the process.

As described above, the parity check matrix initial value table corresponding to each code length N and each coding rate r is prepared in advance, and the LDPC encoder 115 performs the LDPC coding of the predetermined code length N and the predetermined coding rate r by using the parity check matrix H generated from the parity check matrix initial value table corresponding to the predetermined code length N and the predetermined coding rate r.

<Example of the Parity Check Matrix Initial Value Table>

The parity check matrix initial value table is a table that represents positions of elements of "1" in of the information matrix $H_A$ (FIG. 10) of the parity check matrix H corresponding to the information length K according to the code length N and the coding rate r of the LDPC code (LDPC code defined according to the parity check matrix H) for every 360 columns (unit size P) and is generated in advance for each parity check matrix H of each code length N and each coding rate r.

In other words, the parity check matrix initial value table represents at least positions of elements of "1" in the information matrix $H_A$ for every 360 columns (unit size P).

In addition, as such parity check matrixes H, there are a parity check matrix in which the (whole) parity matrix $H_T$ has a staircase structure defined in DVB-T.2 or the like and a parity check matrix in which a part of the parity matrix $H_T$ has a staircase structure, and the remaining portion is a diagonal matrix (unit matrix) proposed by CRC/ETRI.

Hereinafter, a representation scheme of a parity check matrix initial value table representing the parity check matrix in which the parity matrix $H_T$ has the staircase structure defined in DVB-T.2 or the like will be referred to as a DVB type, and a representation scheme of a parity check matrix initial value table representing the parity check matrix proposed by CRC/ETRI will be referred to as an ETRI type.

FIG. 20 is a diagram that illustrates an example of the parity check matrix initial value table of the DVB type.

In other words, FIG. 20 illustrates a parity check matrix initial value table for the parity check matrix H, which is defined in the standard of the DVB-T.2, having a code length N of 16200 bits and a coding rate (a coding rate in the notation of the DVB-T.2) r of 1/4.

The parity check matrix generating unit 613 (FIG. 18) acquires the parity check matrix H as below by using the parity check matrix initial value table of the DVB type.

Figure 21:
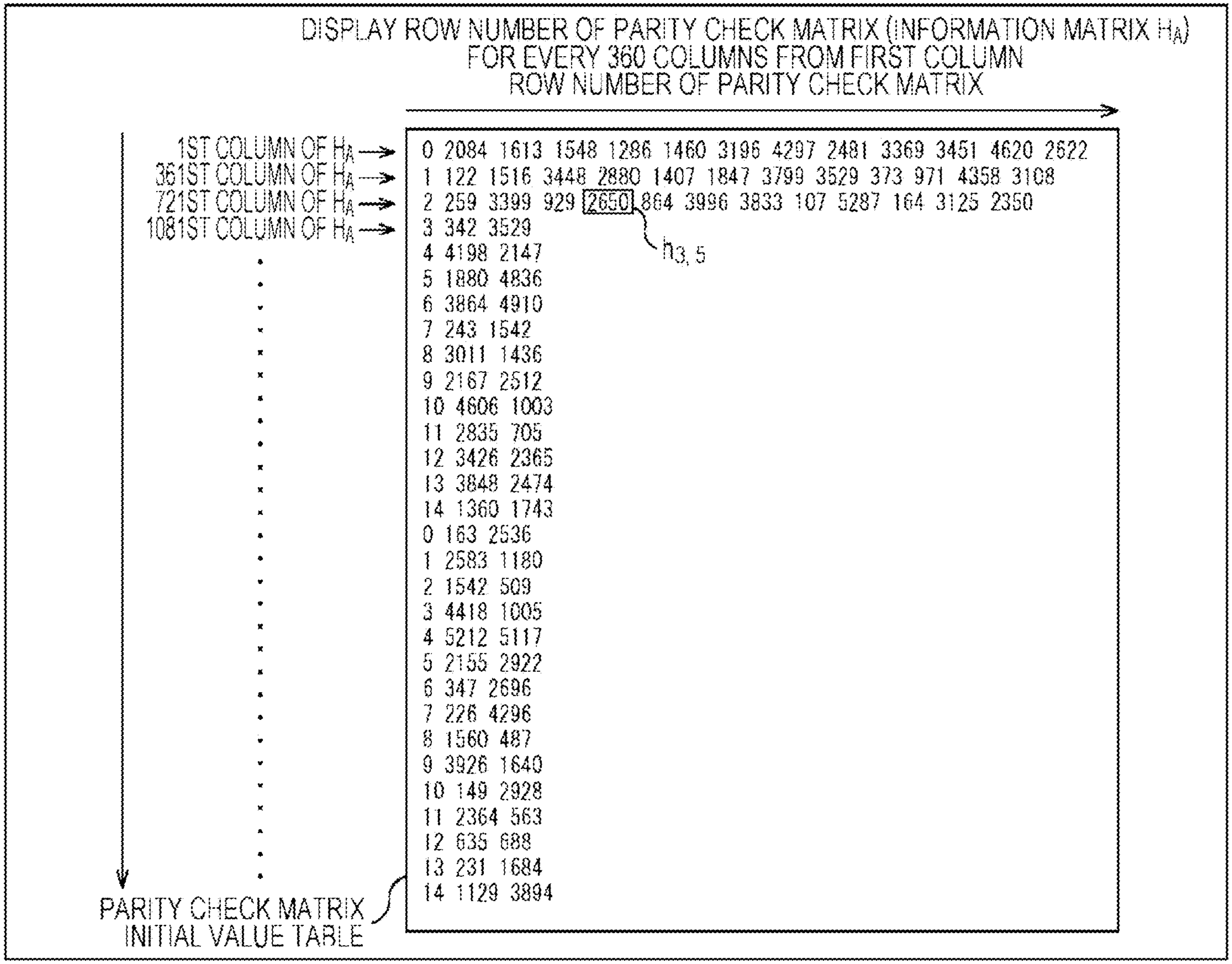
FIG. 21 is a diagram that illustrates a method of calculating a parity check matrix H by using a parity check matrix initial value table.

FIG. 21 is a diagram that illustrates a method of calculating a parity check matrix H by using a parity check matrix initial value table of the DVB type.

In other words, FIG. 21 illustrates a parity check matrix initial value table for the parity check matrix H, which is defined in the standard of the DVB-T.2, having a code length N of 16200 bits and a coding rate r of 2/3.

The parity check matrix initial value table of the DVB type is the table that represents the positions of elements of "1" of the whole information matrix $H_A$ corresponding to the information length K according to the code length N and the coding rate r of the LDPC code for every 360 columns (unit size P). In the i-th row thereof, row numbers (row numbers when a row number of a first row of the parity check matrix H is set to "0") of elements of "1" of a (1+360×(i−1))-th column of the parity check matrix H are arranged corresponding to the number of column weights of the (1+360×(i−1))-th column.

Here, since the parity matrix $H_T$ (FIG. 10) of the parity check matrix H of the DVB type that corresponds to the parity length M is set to the staircase structure illustrated in FIG. 15, the parity check matrix H can be acquired in a case where the information matrix $H_A$ (FIG. 10) corresponding to the information length K can be acquired using the parity check matrix initial value table.

The number k+1 of the rows of the parity check matrix initial value table of the DVB type is different according to the information length K.

A relation of Equation (9) is satisfied between the information length K and the number k+1 of rows of the parity check matrix initial value table.

$$K=(k+1)\times 360 \quad (9)$$

Here, 360 represented in Equation (9) is the unit size P described with reference to FIG. 16.

In the parity check matrix initial value table illustrated in FIG. 21, 13 numerical values are arranged from the first row to the third row, and three numerical values are arranged from the fourth row to the (k+1)-th row (in FIG. 21, the 30th row).

Accordingly, the column weights of the parity check matrix H that are acquired from the parity check matrix initial value table illustrated in FIG. 21 are 13 from the first column to the (1+360×(3−1)−1)-th column and are 3 from the (1+360×(3−1))-th column to the K-th column.

The first row of the parity check matrix initial value table of FIG. 21 represents 0, 2084, 1613, 1548, 1286, 1460, 3196, 4297, 2481, 3369, 3451, 4620, and 2622, which represents that elements of rows having row numbers of 0, 2084, 1613, 1548, 1286, 1460, 3196, 4297, 2481, 3369, 3451, 4620, and 2622 are "1"s (and the other elements are "0") in the first column of the parity check matrix H.

In addition, the second row of the parity check matrix initial value table illustrated in FIG. 21 represents 1, 122, 1516, 3448, 2880, 1407, 1847, 3799, 3529, 373, 971, 4358, and 3108, which represents that elements of rows having row numbers of 1, 122, 1516, 3448, 2880, 1407, 1847, 3799, 3529, 373, 971, 4358, and 3108 are "1"s in the 361 (=1+360×(2−1))-th column of the parity check matrix H.

As described above, the parity check matrix initial value table represents positions of elements of "1" in the information matrix $H_A$ Of the parity check matrix H for every 360 columns.

The columns other than the (1+360×(i−1))-th column of the parity check matrix H, in other words, the columns of the (2+360×(i−1))-th column to the (360×i)-th column are arranged by cyclically shifting elements of "1" of the (1+360×(i−1))-th column set in the parity check matrix initial value table periodically in a downward direction (downward direction of the columns) along the parity length M.

In other words, for example, the (2+360×(i−1))-th column is acquired by cyclically shifting the (1+360×(i−1))-th column in the downward direction by M/360 (=q), and the next (3+360×(i−1))-th column is acquired by cyclically shifting the (1+360×(i−1))-th column in the downward direction by 2×M/360 (=2×q) (acquired by cyclically shifting the (2+360×(i−1))-th column in the downward direction by M/360 (=q)).

When a numerical value of a j-th column (a j-th column from the left side) of an i-th row (an i-th row from the upper side) of the parity check matrix initial value table is represented as $h_{i,j}$, and a row number of the j-th element of "1" of the w-th column of the parity check matrix H is represented as $H_{w-j}$, the row number $H_{w-j}$ of the element of "1" of the w-th column that is a column other than the (1+360×(i−1))-th column of the parity check matrix H can be calculated using Equation (10).

$$H_{w-j}=\mathrm{mod}\{h_{i,j}+\mathrm{mod}((w-1),P)\times q,M) \tag{10}$$

Here, mod(x, y) represents a remainder that is acquired by dividing x by y.

In addition, P is the unit size described above and, in this embodiment is 360, for example, similarly to the standards of the DVB-S.2, the DVB-T.2, and the DVB-C.2. Furthermore, q is a value M/360 that is acquired by dividing the parity length M by the unit size P (=360).

The parity check matrix generating unit 613 (FIG. 18) specifies the row numbers of elements of "1" of the (1+360×(i−1))-th column of the parity check matrix H by using the parity check matrix initial value table.

In addition, the parity check matrix generating unit 613 (FIG. 18) calculates the row number $H_{w-j}$ of the element of "1" of the w-th column that is a column other than the (1+360×(i−1))-th column of the parity check matrix H by using Equation (10) and generates a parity check matrix H in which the element of the row number acquired as above is set to "1".

Figures 22, 23:
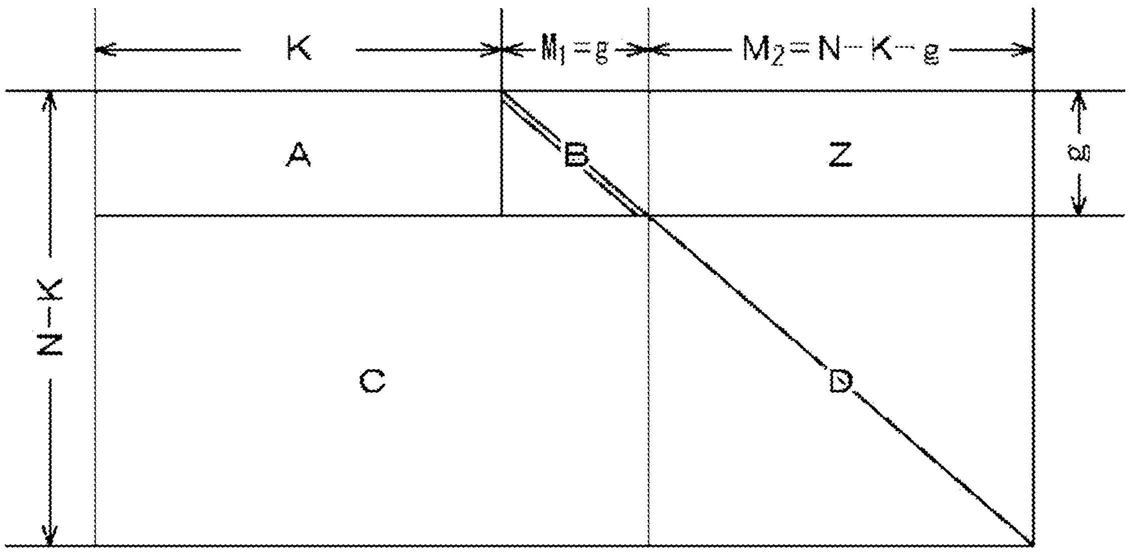
FIG. 22 is a diagram that illustrates a structure of a parity check matrix.
FIG. 23 is a diagram that illustrates an example of the parity check matrix initial value table.

FIG. 22 is a diagram that illustrates the structure of the parity check matrix of the ETRI type.

The parity check matrix of the ETRI type is configured by an A matrix, a B matrix, a C matrix, a D matrix, and a Z matrix.

The A matrix is an upper left matrix of the parity check matrix that has g rows and K columns represented by a predetermined value g and the information length K of the LDPC code wherein K=code length N×coding rate r.

The B matrix is a matrix having the staircase structure, which is configured by g rows and g columns, adjacent to the right side of the A matrix.

The C matrix is a matrix, which is configured by (N−K−g) rows and (K+g) columns, adjacent to the lower side of the A matrix and the B matrix.

The D matrix is a unit matrix, which is configured by (N−K−g) rows and (N−K−g) columns, adjacent to the right of the C matrix.

The Z matrix is a zero matrix (zero matrix), which is configured by g rows and (N−K−g) columns, adjacent to the right side of the B matrix.

In the parity check matrix of the ETRI type configured by the A to D matrices and the Z matrix as above, the A matrix and a portion of the C matrix configure an information matrix, and the B matrix, the remaining portion of the C matrix, the D matrix, and the Z matrix configure a parity matrix.

Note that, since the B matrix is a matrix having the staircase structure, and the D matrix is a unit matrix, a portion (a portion of the B matrix) of the parity matrix of the parity check matrix of the ETRI type has a staircase structure, and the remaining portion (the portion of the D matrix) is a diagonal matrix (unit matrix).

Similarly to the information matrix of the parity check matrix of the DVB type, the A matrix and the C matrix have a cyclic structure for every 360 columns (the unit size P), and the parity check matrix initial value table of the ETRI type represents positions of elements of "1" of the A matrix and the C matrix for every 360 columns.

Here, as described above, since the A matrix and a portion of the C matrix configure the information matrix, it can be determined that the parity check matrix initial value table of the ETRI type representing positions of elements "1" of the A matrix and the C matrix for every 360 columns represents at least positions of elements "1" of the information matrix for every 360 columns.

FIG. 23 is a diagram that illustrates an example of a parity check matrix initial value table of the ETRI type.

In other words, FIG. 23 illustrates an example of a parity check matrix initial value table for a parity check matrix having a code length N of 50 bits and a coding rate r of 1/2.

The parity check matrix initial value table of the ETRI type is a table that represents positions of elements "1" of the A matrix and the C matrix for each unit size P, and, in an i-th row, row numbers (row numbers when a row number of a first row of the parity check matrix is 0) of elements "1" of a (1+P×(i−1))-th column of the parity check matrix that correspond to the number of column weights included in the (1+P×(i−1))-th column are arranged.

Note that, here, for the simplification of description, the unit size P, for example, is assumed to be set to 5.

In addition, for the parity check matrix of the ETRI type, as parameters, there are $g=M_1$, $M_2$, $Q_1$, and $Q_2$.

$g=M_1$ is a parameter used for determining the size of the B matrix and has a value that is a multiple of the unit size P. The performance of the LDPC code is changed by adjusting $g=M_1$, and $g=M_1$ is adjusted to a predetermined value when the parity check matrix is determined. Here, 15, which is three times the unit size P=5, is assumed to be employed as $g=M_1$.

$M_2$ has a value $M-M_1$ acquired by subtracting $M_1$ from the parity length M.

Here, since the information length K is $N \times r = 50 \times 1/2 = 25$, and the parity length M is $N-K=50-25=25$, $M_2$ is $M-M_1=25-15=10$.

$Q_1$ is acquired using an equation $Q_1=M_1/P$ and represents the number of shifts (the number of rows) of the cyclic shift in the A matrix.

In other words, in each column other than the $(1+P\times(i-1))$-th column of the A matrix of the parity check matrix of the ETRI type, in other words, in each of a $(2+P\times(i-1))$-th column to a $(P\times i)$-th column, elements "1" of a $(1+360\times(i-1))$-th column set in the parity check matrix initial value table are periodically cyclically shifted in a downward direction (a downward direction of the column) so as to be arranged, and $Q_1$ represents the number of shifts of the cyclic shift in the A matrix.

$Q_2$ is acquired using an equation $Q_2=M_2/P$ and represents the number of shifts (the number of rows) of the cyclic shift in the C matrix.

In other words, in each column other than the $(1+P\times(i-1))$-th column of the C matrix of the parity check matrix of the ETRI type, in other words, in each of a $(2+P\times(i-1))$-th column to a $(P\times i)$-th column, elements "1" of a $(1+360\times(i-1))$-th column set in the parity check matrix initial value table are periodically cyclically shifted in the downward direction (the downward direction of the column) so as to be arranged, and $Q_2$ represents the number of shifts of the cyclic shift in the C matrix.

Here, $Q_1$ is $M_1/P=15/5=3$, and $Q_2$ is $M_2/P=10/5=2$.

In the parity check matrix initial value table illustrated in FIG. 23, 3 numerical values are arranged in 1st and 2nd rows, and one numerical value is arranged in 3rd to 5th rows, and according to such an arrangement of the numerical values, the column weight of the parity check matrix acquired from the parity check matrix initial value table illustrated in FIG. 23 is 3 in the 1st column to a $(1+5\times(2-1)-1)$-th column and is 1 in a $(1+5\times(2-1))$-th column to a 5th column.

In other words, 2, 6, and 18 are arranged in the 1st row of the parity check matrix initial value table illustrated in FIG. 23, which represents that elements of rows having row numbers of 2, 6, and 18 are "1" (and the other elements are "0") in the 1st column of the parity check matrix.

Here, in this case, since the A matrix is a matrix having 15 rows and 25 columns (g rows and K columns), and the C matrix is a matrix having 10 rows and 40 columns ((N−K−g) rows and (K+g) columns), rows having the row numbers of 0 to 14 in the parity check matrix are rows of the A matrix, and rows having the row numbers of 15 to 24 in the parity check matrix are rows of the C matrix.

Thus, among the rows having the row numbers of 2, 6, and 18 (hereinafter represented as rows #2, #6, and #18), the rows #2 and #6 are the rows of the A matrix, and the row #18 is the row of the C matrix.

In the 2nd row of the parity check matrix initial value table illustrated in FIG. 23, 2, 10, and 19 are arranged, which represents that elements of the rows #2, #10, and #19 are "1"s in a 6 $(=1+5\times(2-1))$-th column of the parity check matrix.

Here, in the 6 $(=1+5\times(2-1))$-th column of the parity check matrix, among rows #2, #10, and #19, the rows #2 and #10 are the rows of the A matrix, and the row #19 is the row of the C matrix.

In the 3rd row of the parity check matrix initial value table illustrated in FIG. 23, 22 is arranged, which represents that an element of the row #22 is "1" in an 11 $(=1+5\times(3-1))$-th column of the parity check matrix.

Here, in the 11 $(=1+5\times(3-1))$-th column of the parity check matrix, the row #22 is the row of the C matrix.

Similarly, 19 arranged in the 4th row of the parity check matrix initial value table illustrated in FIG. 23 represents that an element of the row #19 is "1" in a 16 $(=1+5\times(4-1))$-th column of the parity check matrix, and 15 arranged in the 5th row of the parity check matrix initial value table illustrated in FIG. 23 represents that an element of the row #15 is "1" in a 21$(=1+5\times(5-1))$-st column of the parity check matrix.

As described above, the parity check matrix initial value table represents the positions of elements "1" of the A matrix and the C matrix of the parity check matrix for each unit size P=5 columns.

In each column other than a $(1+5\times(i-1))$-th column of the A matrix and the C matrix of the parity check matrix, in other words, in each of a $(2+5\times(i-1))$-th column to a $(5\times i)$-th column, the elements "1" of the $(1+5\times(i-1))$-th column set in the parity check matrix initial value table are periodically cyclically shifted in the downward direction (the downward direction of the column) so as to be arranged according to the parameters $Q_1$ and $Q_2$.

In other words, for example, in the $(2+5\times(i-1))$-th column of the A matrix, the $(1+5\times(i-1))$-th column is cyclically shifted in the downward direction by $Q_1$ (=3), and, in the next $(3+5\times(i-1))$-th column, the $(1+5\times(i-1))$-th column is cyclically shifted in the downward direction by $2\times Q_1$ $(=2\times3)$ (the $(2+5\times(i-1))$-th column is cyclically shifted in the downward direction by $Q_1$).

In addition, for example, in the $(2+5\times(i-1))$-th column of the C matrix, the $(1+5\times(i-1))$-th column is cyclically shifted in the downward direction by $Q_2$ (=2), and in the next $(3+5\times(i-1))$-th column, the $(1+5\times(i-1))$-th column is cyclically shifted in the downward direction by $2\times Q_2$ $(=2\times2)$ (the $(2+5\times(i-1))$-th column is cyclically shifted in the downward direction by $Q_2$).

Figure 24:
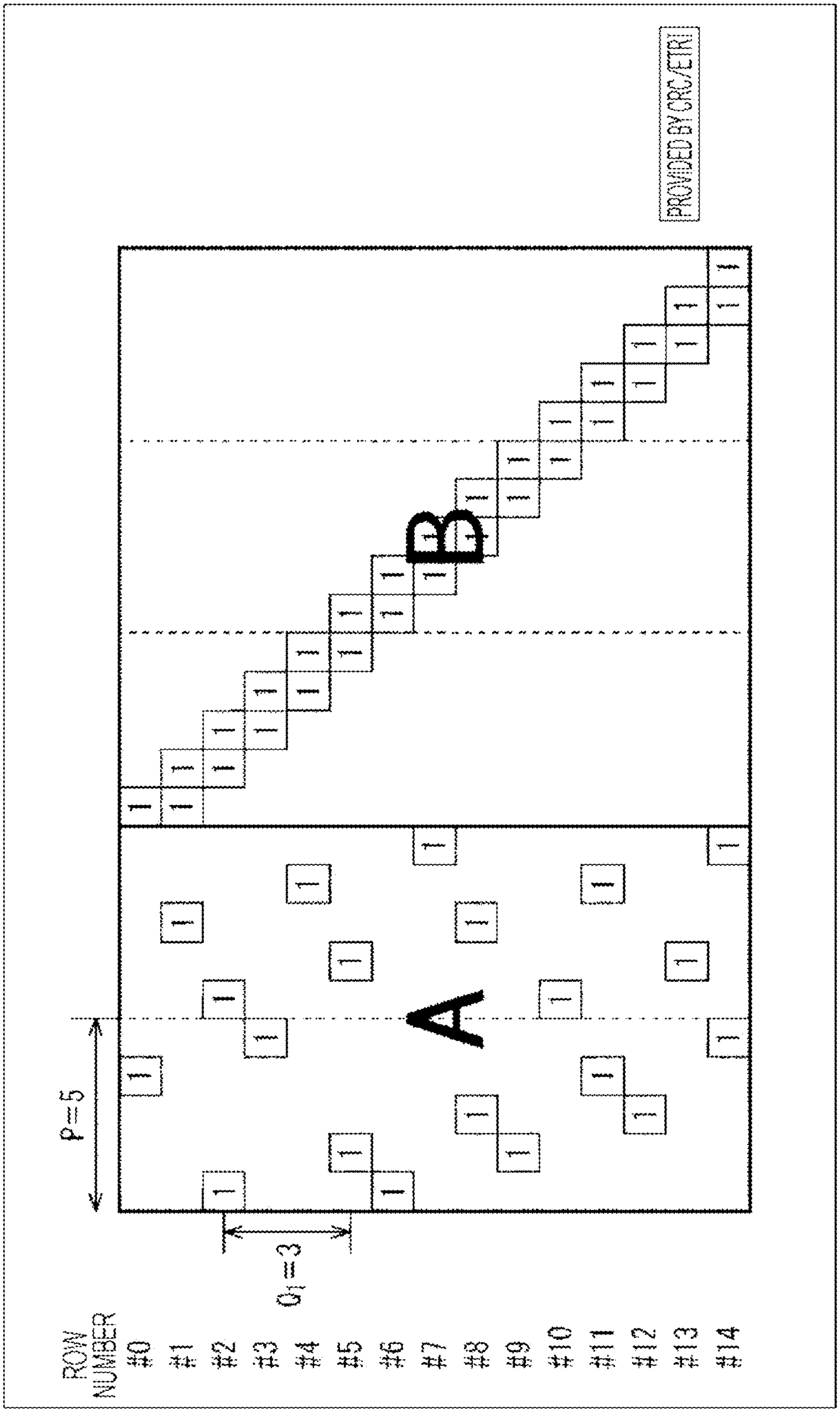
FIG. 24 is a diagram that illustrates an A matrix generated from a parity check matrix initial value table.

FIG. 24 is a diagram that illustrates the A matrix generated from the parity check matrix initial value table illustrated in FIG. 23.

In the A matrix illustrated in FIG. 24, according to the 1st row of the parity check matrix initial value table illustrated in FIG. 23, elements of rows #2 and #6 of a 1 $(=1+5\times(1-1))$-st column are 1.

Then, in each of a 2 $(=2+5\times(1-1))$-nd column to a 5 $(=5+5\times(1-1))$-th column, an immediately previous column is cyclically shifted in the downward direction by $Q_1=3$.

In addition, in the A matrix illustrated in FIG. 24, according to the 2nd row of the parity check matrix initial value table illustrated in FIG. 23, elements of rows #2 and #10 of a 6 $(=1+5\times(2-1))$-th column are 1.

Furthermore, in each of a 7 $(=2+5\times(2-1))$-th column to a 10 $(=5+5\times(2-1))$-th column, an immediately previous column is cyclically shifted in the downward direction by $Q_1=3$.

Figure 25:
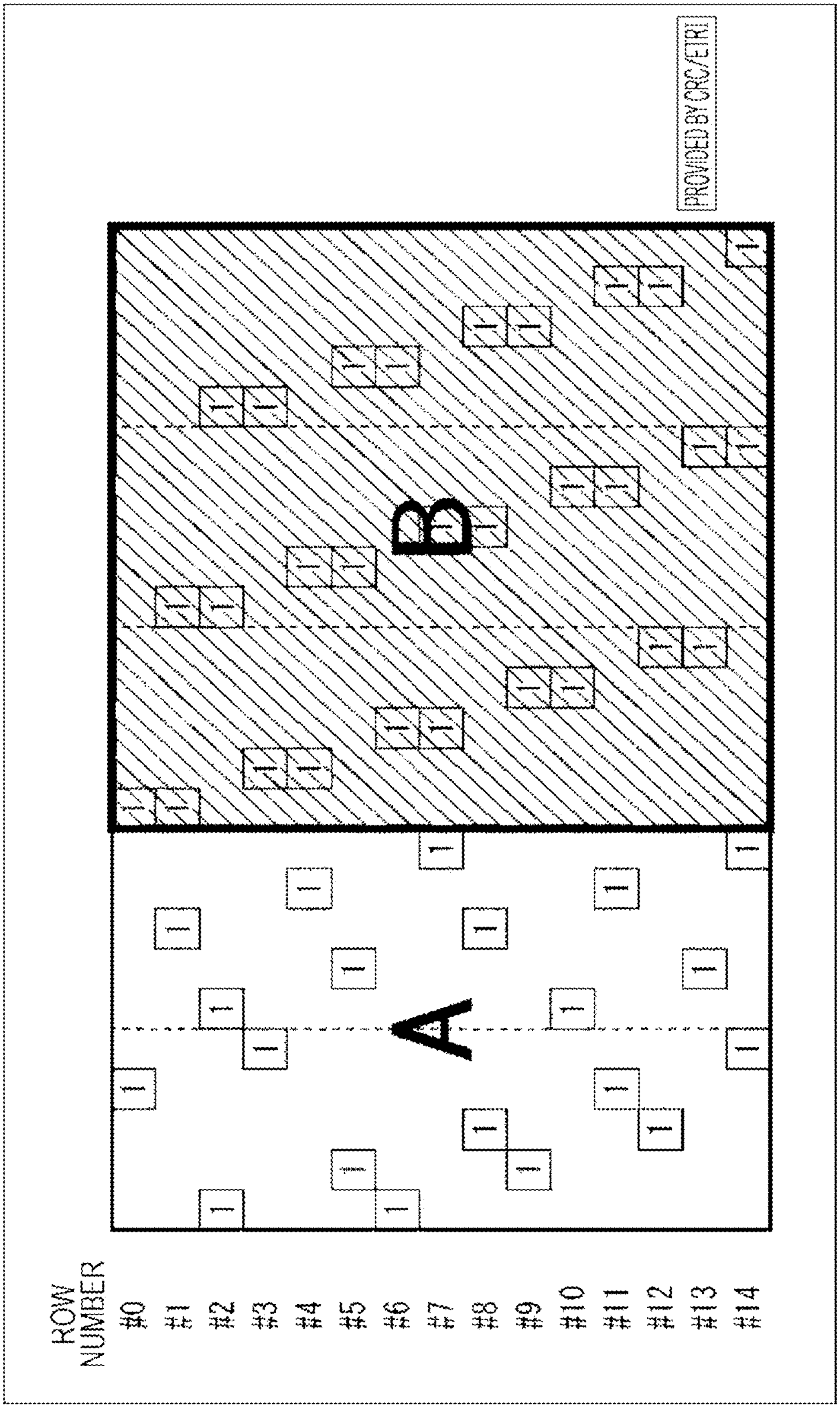
FIG. 25 is a diagram that illustrates parity interleave of a B matrix.

FIG. 25 is a diagram that illustrates the parity interleave of the B matrix.

The parity check matrix generating unit 613 (FIG. 18) generates the A matrix using the parity check matrix initial value table and arranges the B matrix having the staircase structure neighboring to the right side of the A matrix. Then, the parity check matrix generating unit 613 regards the B matrix as the parity matrix and performs parity interleave such that adjacent elements "1" of the B matrix having the staircase structure are separate from each other in the row direction by the unit size P=5.

FIG. 25 illustrates the A matrix and the B matrix after the parity interleave of the B matrix.

Figure 26:
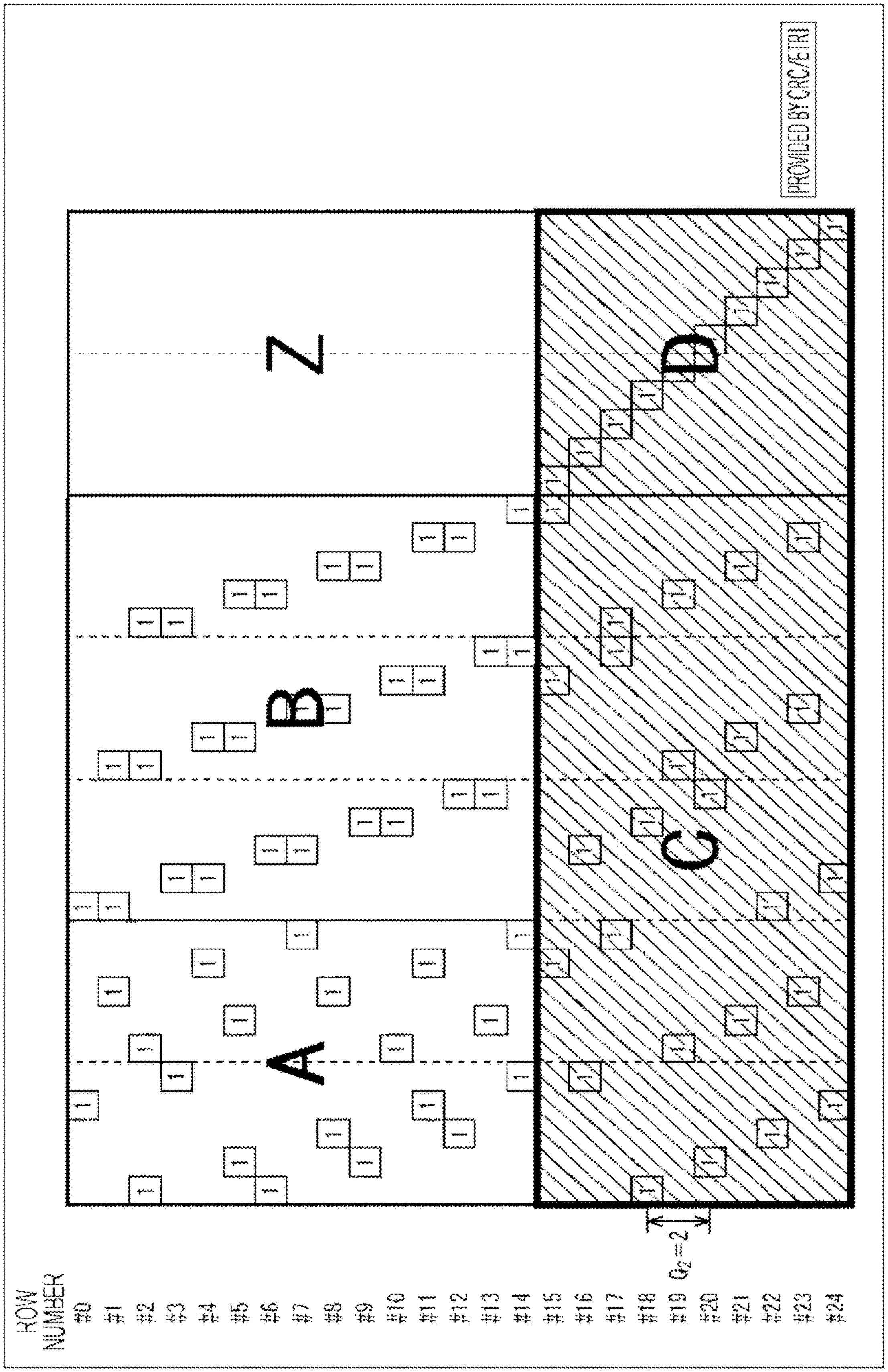
FIG. 26 is a diagram that illustrates a C matrix generated from a parity check matrix initial value table.

FIG. 26 is a diagram that illustrates the C matrix generated from the parity check matrix initial value table illustrated in FIG. 23.

In the C matrix illustrated in FIG. 26, according to the 1st row of the parity check matrix initial value table illustrated in FIG. 23, an element of a row #18 of a 1 (=1+5×(1−1))-st column of the parity check matrix is “1”.

In addition, in each of a 2 (=2+5×(1−1))-nd column to a 5 (=5+5×(1×1))-th column of the C matrix, an immediately previous column is cyclically shifted in the downward direction by $Q_2$=2.

Furthermore, in the C matrix illustrated in FIG. 26, according to the 2nd to 5th rows of the parity check matrix initial value table illustrated in FIG. 23, elements of a row #19 of a 6 (=1+5×(2−1))-th column of the parity check matrix, a row #22 of an 11 (=1+5×(3−1))-th column, a row #19 of a 16 (=1+5×(4−1))-th column, and a row #15 of a 21 (=1+5×(5−1))-th column are “1”s.

In addition, in each of the 7 (=2+5×(2−1))-th column to the 10 (=5+5×(2−1))-th column, each of a 12 (=2+5×(3−1))-th column to a 15 (=5+5×(3−1))-th column, each of a 17 (=2+5×(4−1))-th column to a 20 (=5+5×(4−1))-th column, and each of a 22 (=2+5×(5−1))-nd column to a 25 (=5+5×(5−1))-th column, an immediately previous column is cyclically shifted in the downward direction by $Q_2$=2.

The parity check matrix generating unit 613 (FIG. 18) generates the C matrix using the parity check matrix initial value table and arranges the C matrix below the A matrix and the B matrix (after the parity interleave thereof).

In addition, the parity check matrix generating unit 613 arranges the Z matrix neighboring to the right side of the B matrix and arranges the D matrix neighboring to the right side of the C matrix, thereby generating the parity check matrix illustrated in FIG. 26.

Figure 27:
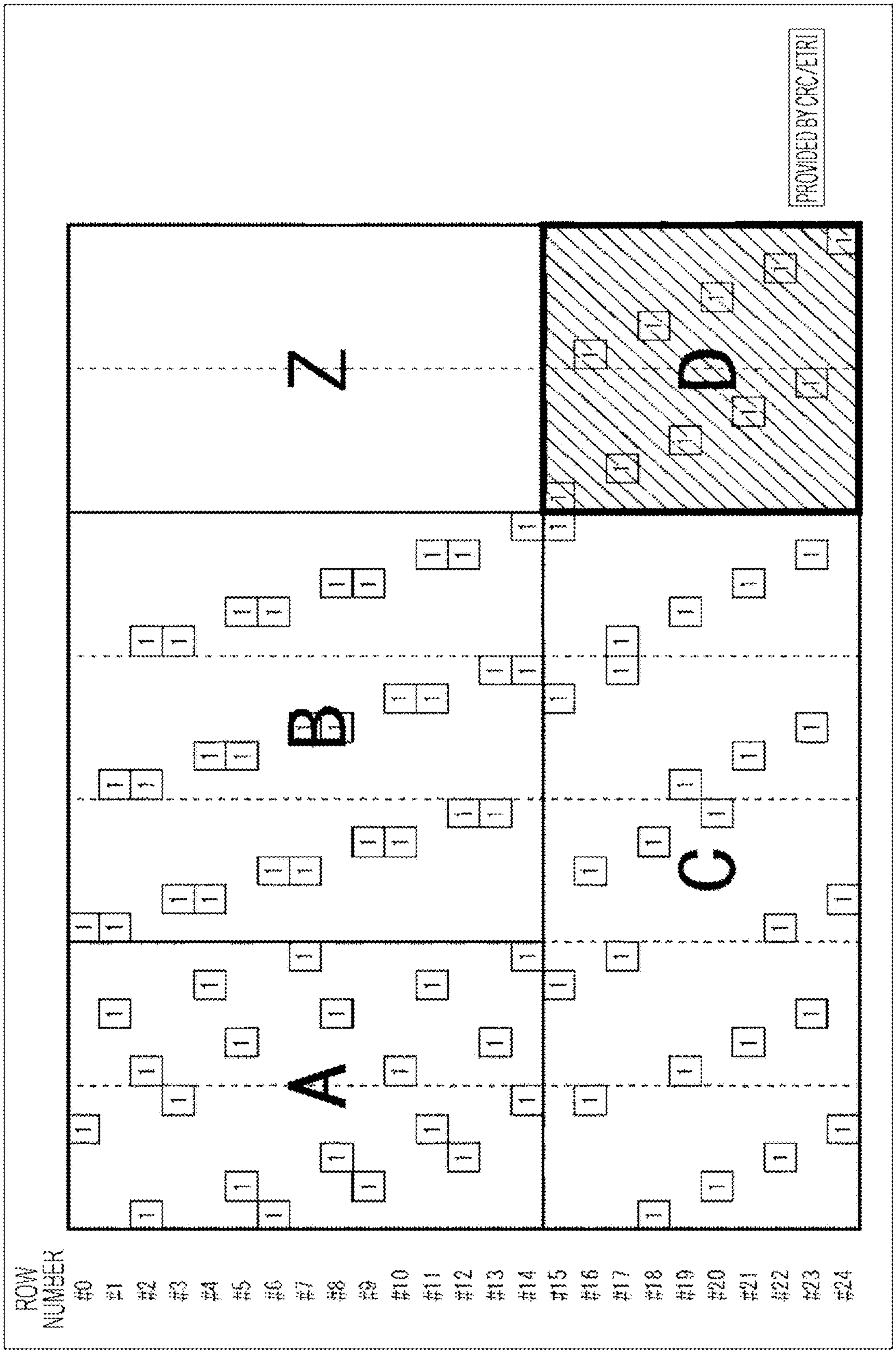
FIG. 27 is a diagram that illustrates parity interleave of a D matrix.

FIG. 27 is a diagram that illustrates parity interleave of the D matrix.

After generating the parity check matrix illustrated in FIG. 26, the parity check matrix generating unit 613 regards the D matrix as the parity matrix and performs the parity interleave (of only the D matrix) such that the elements “1” of odd-numbered rows and the next even-numbered rows of the D matrix of the unit matrix are separate from each other in the row direction by the unit size P (=5).

FIG. 27 illustrates the parity check matrix after the parity interleave of the D matrix is performed for the parity check matrix illustrated in FIG. 26.

The LDPC encoder 115 (the coding parity calculating unit 615 (FIG. 18) thereof) performs LDPC coding (generation of an LDPC code), for example, by using the parity check matrix illustrated in FIG. 27.

Here, the LDPC code generated using the parity check matrix illustrated in FIG. 27 is the LDPC code for which the parity interleave has been performed, and accordingly, it is unnecessary for the parity interleaver 23 (FIG. 9) to perform the parity interleave for the LDPC code generated using the parity check matrix illustrated in FIG. 27.

Figure 28:
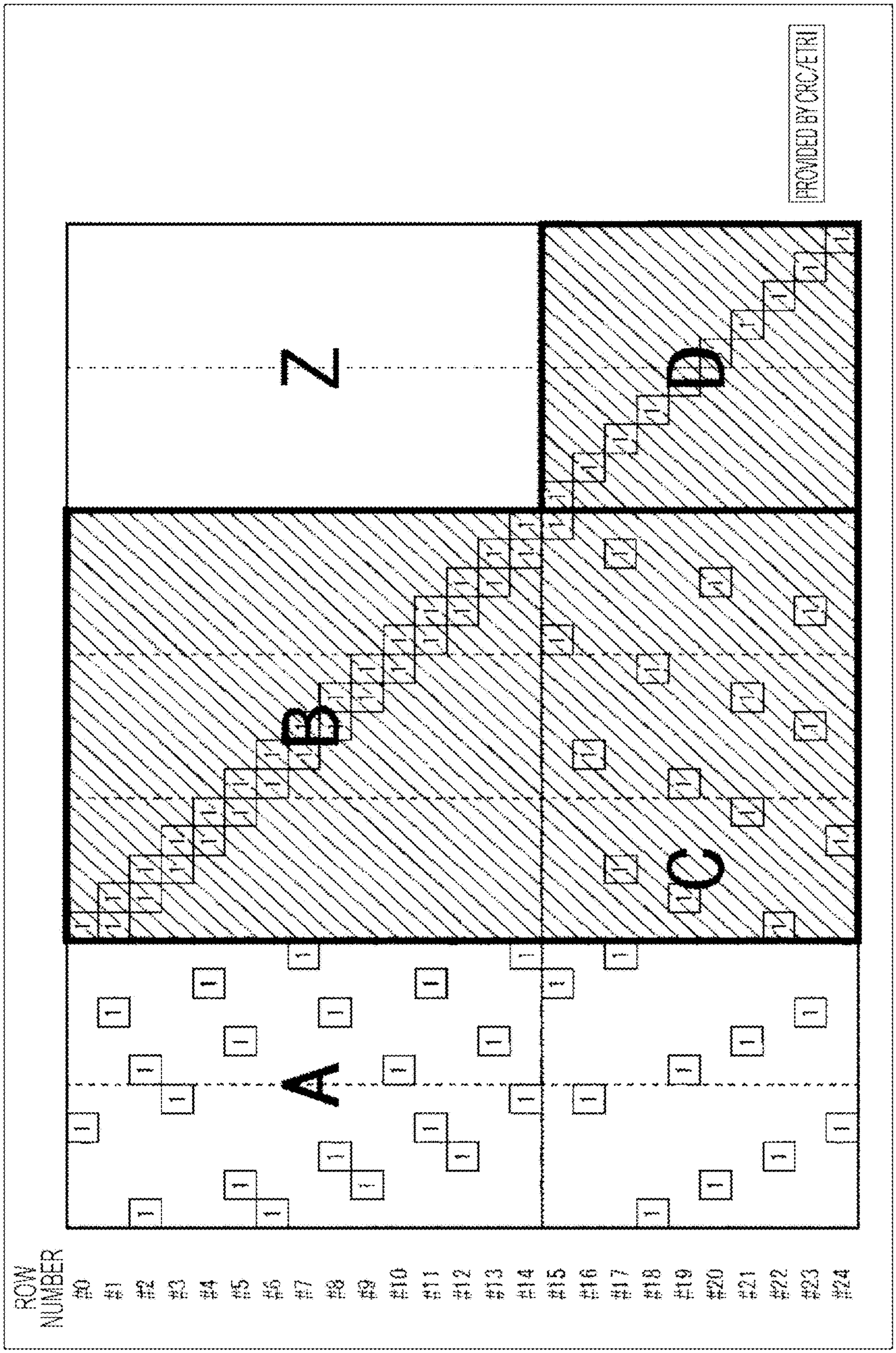
FIG. 28 is a diagram that illustrates a parity check matrix acquired by performing a column permutation as parity deinterleave for restoring parity interleave to an original state for a parity check matrix.

FIG. 28 is a diagram that illustrates the parity check matrix acquired by performing column permutation as parity deinterleave for restoring the parity interleave to an original state for the B matrix, a portion of the C matrix (a portion of the C matrix arranged below the B matrix) and the D matrix of the parity check matrix illustrated in FIG. 27.

The LDPC encoder 115 can perform LDPC coding (generation of an LDPC code) using the parity check matrix illustrated in FIG. 28.

In a case where the LDPC coding is performed using the parity check matrix illustrated in FIG. 28, the LDPC code for which the parity interleave is not performed is acquired according to the LDPC coding. Thus, in a case where the LDPC coding is performed using the parity check matrix illustrated in FIG. 28, the parity interleaver 23 (FIG. 9) performs the parity interleave.

Figure 29:
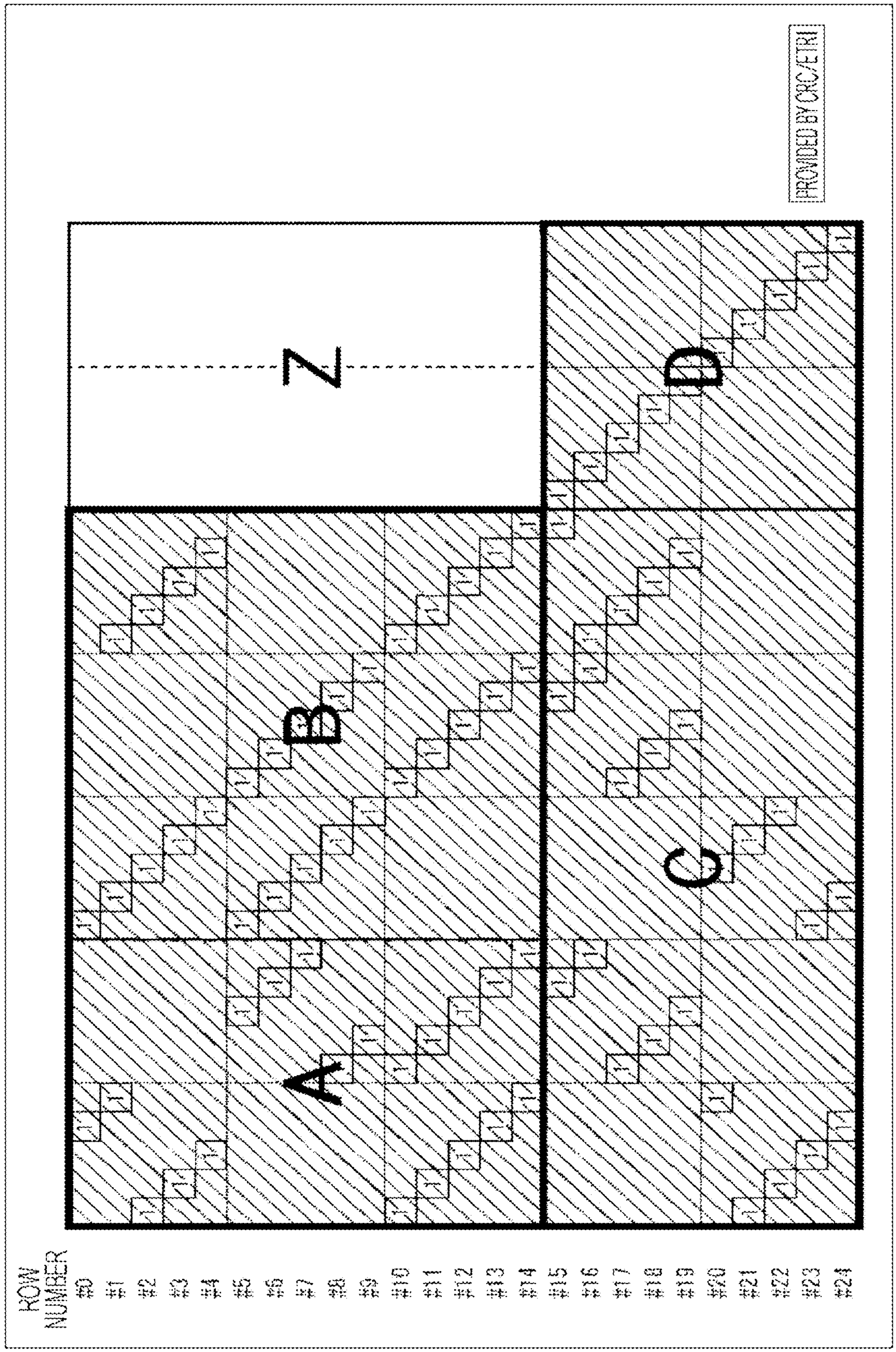
FIG. 29 is a diagram that illustrates a transformed parity check matrix acquired by performing a row permutation for a parity check matrix.

FIG. 29 is a diagram that illustrates a transformed parity check matrix acquired by performing the row permutation for the parity check matrix illustrated in FIG. 27.

As will be described later, the transformed parity check matrix is a matrix represented by a combination of a unit matrix of P×P, a quasi unit matrix acquired by setting one or more “1”s to “0” in the unit matrix, a shift matrix acquired by cyclically shifting the unit matrix or the quasi unit matrix, a sum matrix that is a sum of two or more matrices among the unit matrix, the quasi unit matrix, and the shift matrix, and a zero matrix of P×P.

By using the transformed parity check matrix for decoding an LDPC code, an architecture, which will be described later, for performing P check node operations and P variable node operations at the same time can be employed in decoding the LDPC code.

<New LDPC Code>

Meanwhile, the standardization of digital television broadcasting of terrestrial waves called ATSC 3.0 is currently formulated.

Thus, a new LDPC code (hereinafter also referred to as a new LDPC code) that can be used in ATSC 3.0 and other data transmission will be described.

As the new LDPC code, for example, an LDPC code of the DVB type or an LDPC code of the ETRI type having a unit size P of 360, similar to DVB-T.2 or the like, corresponding to the parity check matrix having a cyclic structure may be employed.

The LDPC encoder 115 (FIGS. 8 and 18) can perform LDPC coding for generating a new LDPC code using a parity check matrix acquired from the parity check matrix initial value table of the new LDPC code having a code length N of 16 kbits or 64 kbits and a coding rate r of one of 5/15, 6/15, 7/15, 8/15, 9/15, 10/15, 11/15, 12/15, and 13/15 as below.

In this case, the storage unit 602 of the LDPC encoder 115 (FIG. 8) stores the parity check matrix initial value table of the new LDPC code.

Figure 30:
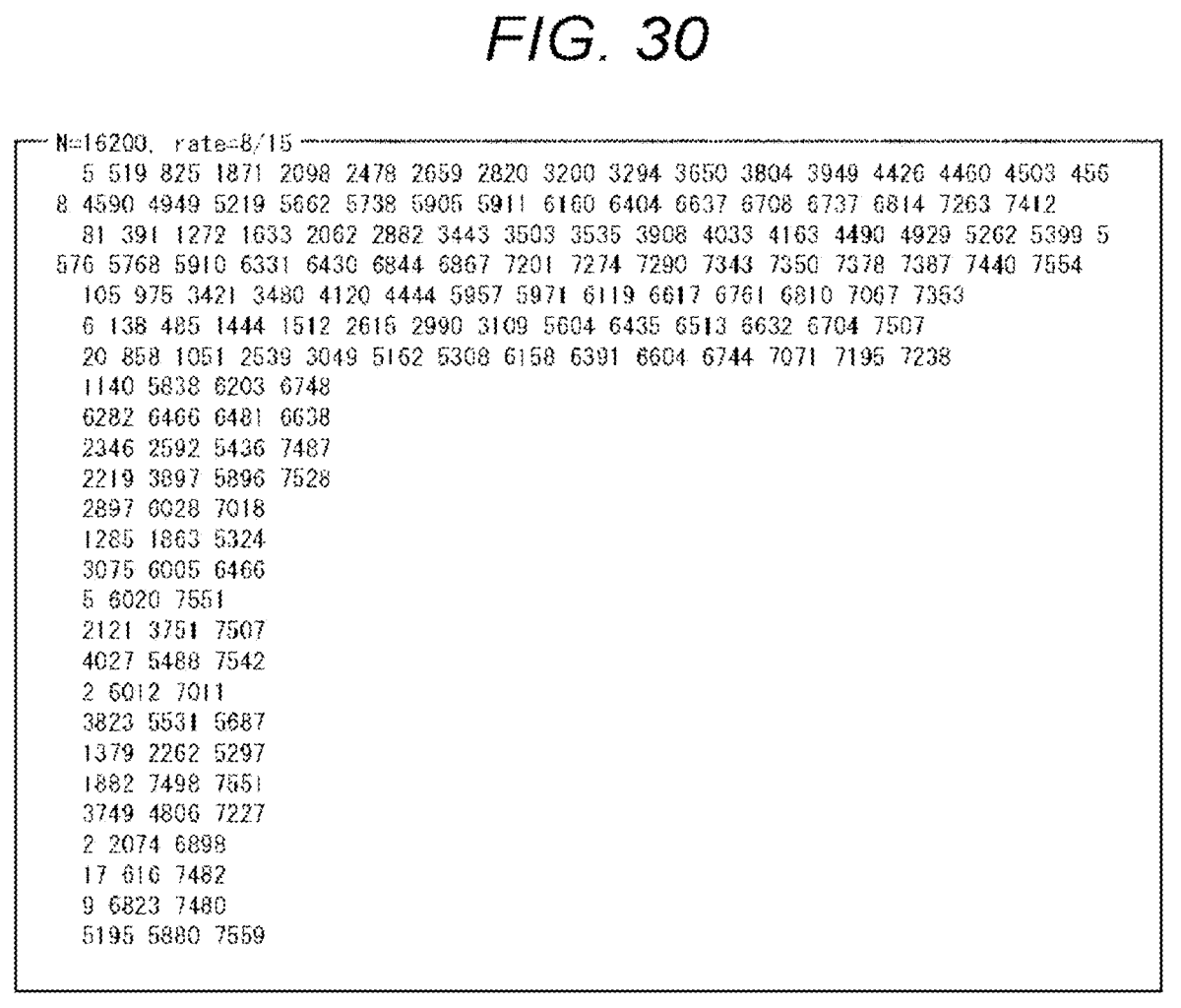

FIG. 30 is a diagram that illustrates an example of a parity check matrix initial value table of the DVB type for a parity check matrix of a new LDPC code having a code length N of 16 kbits and a coding rate r of 8/15 (hereinafter, also referred to as Sony code of (16 k, 8/15)), proposed by the applicant of the present application.

Figure 31:
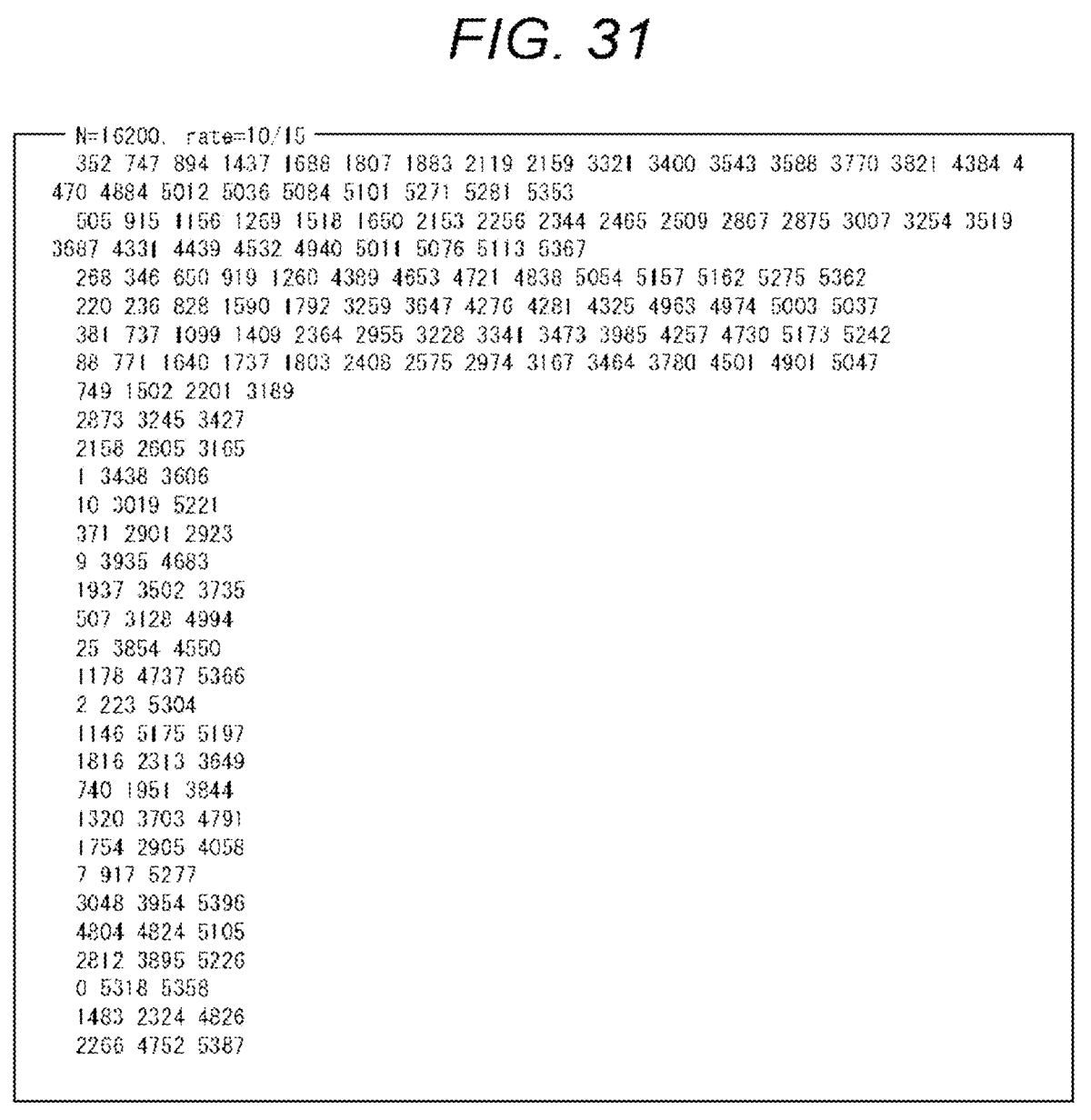

FIG. 31 is a diagram that illustrates an example of a parity check matrix initial value table of the DVB type for a parity check matrix of a new LDPC code in which the code length N is 16 kbits, and the coding rate r is 10/15 (hereinafter, also referred to as Sony code (16 k, 10/15)), proposed by the applicant of the present application.

Figure 32:
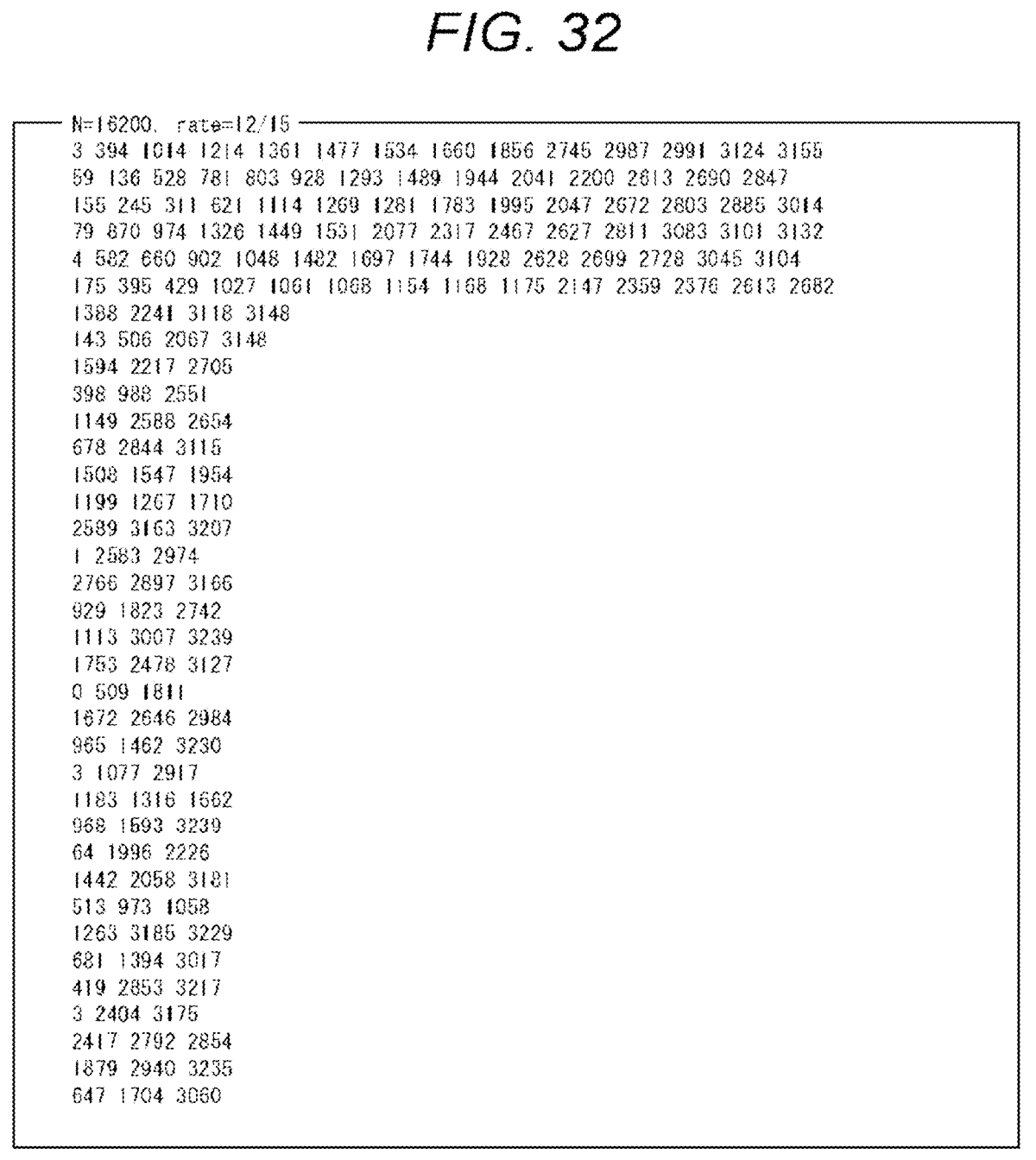

FIG. 32 is a diagram that illustrates an example of a parity check matrix initial value table of the DVB type for a parity check matrix of a new LDPC code having a code length N of 16 kbits and a coding rate r of 12/15 (hereinafter, also referred to as Sony code of (16 k, 12/15)), proposed by the applicant of the present application.

Figure 33:
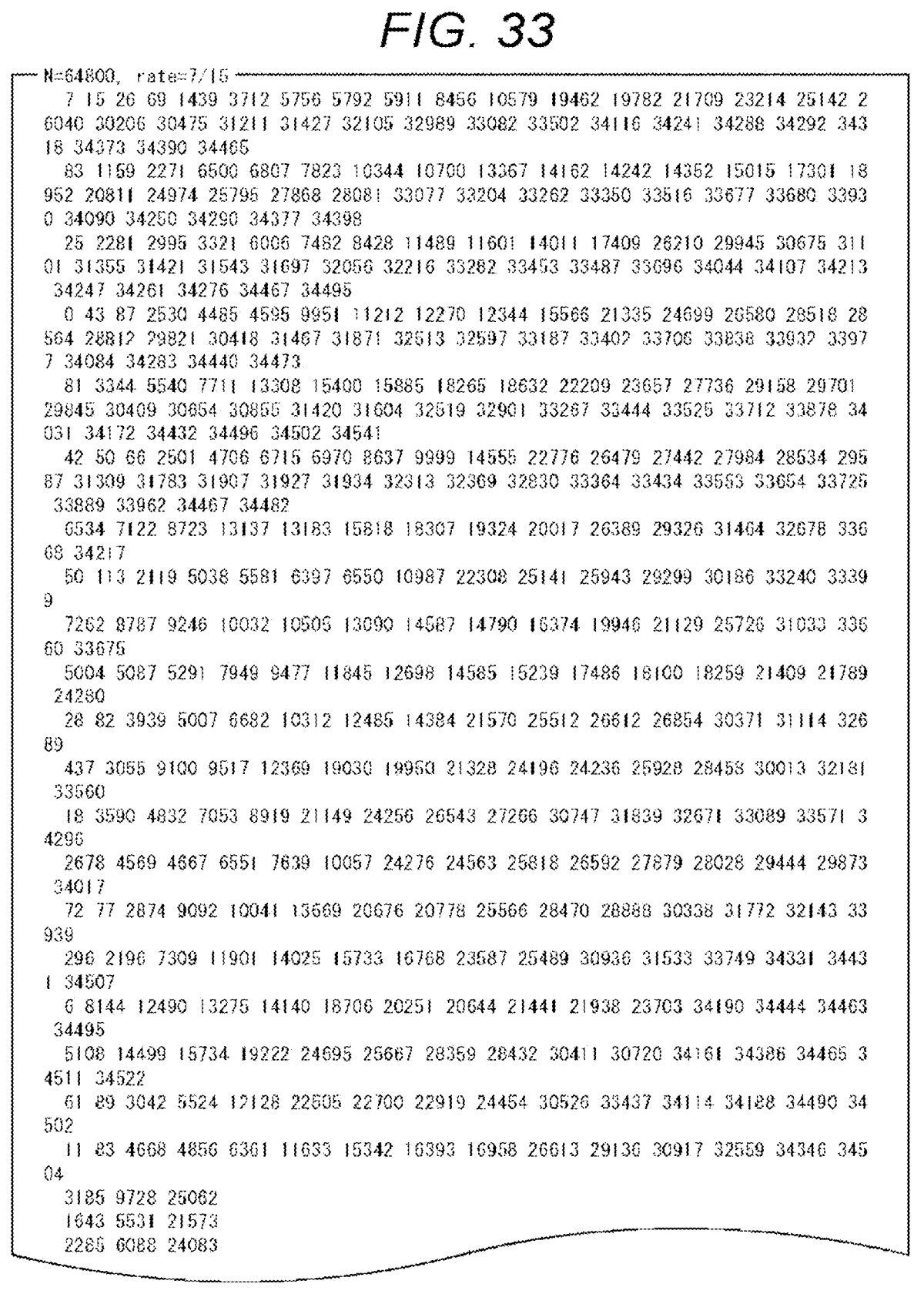
Figure 34:
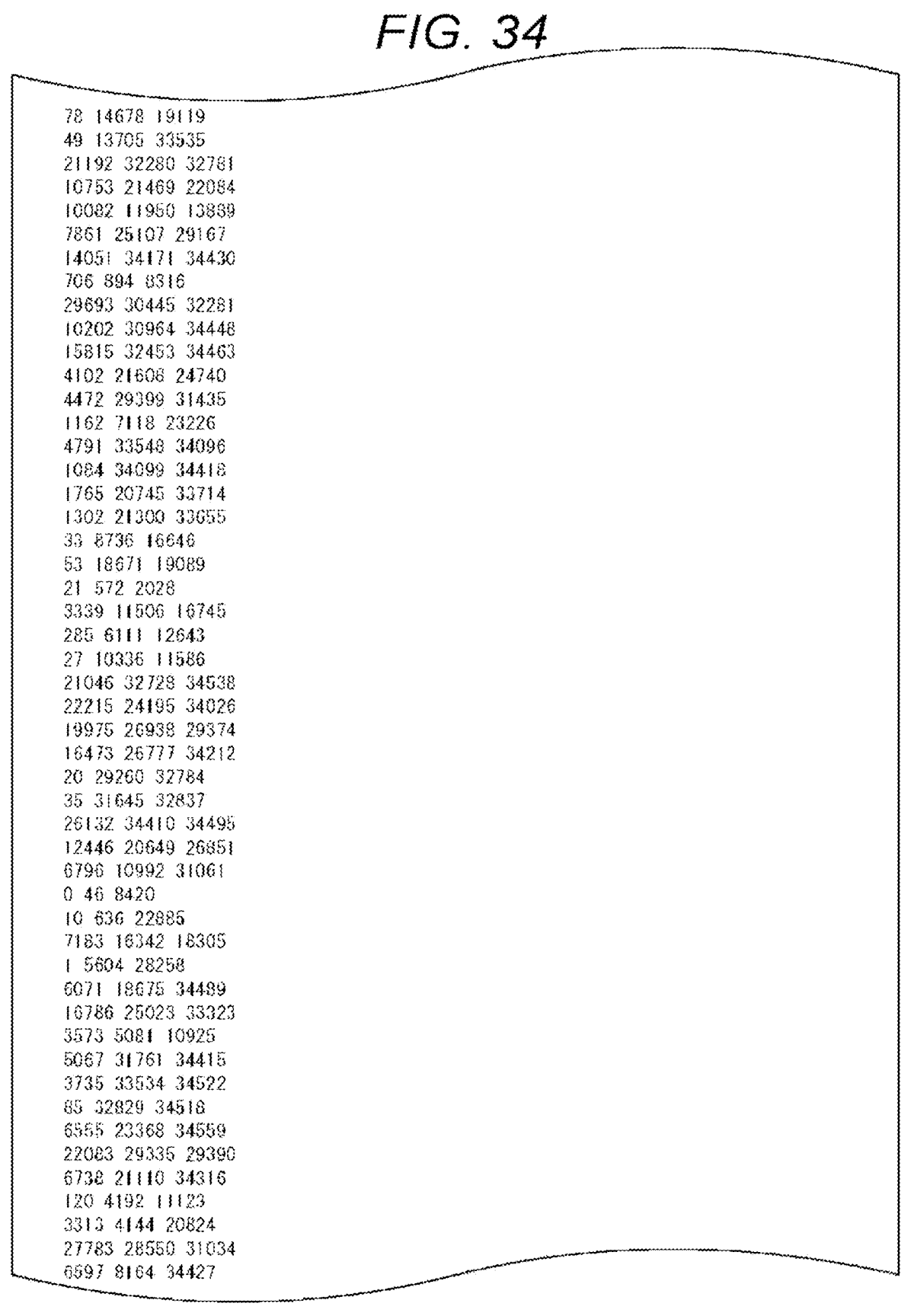
Figure 35:
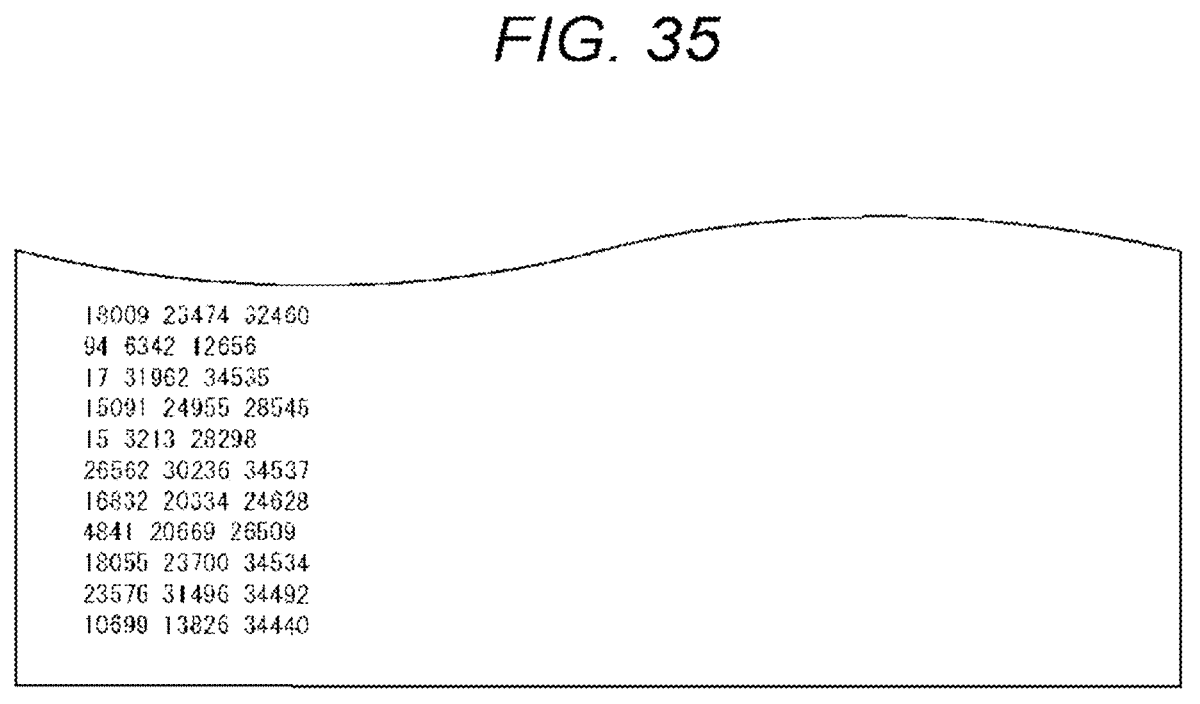

FIGS. 33, 34, and 35 are diagrams that illustrate an example of a parity check matrix initial value table of the DVB type for a parity check matrix of a new LDPC code having a code length N of 64 kbits and a coding rate r of 7/15 (hereinafter, also referred to as Sony code of (64 k, 7/15)), proposed by the applicant of the present application.

Note that FIG. 34 is a diagram following FIG. 33, and FIG. 35 is a diagram following FIG. 34.

FIGS. 36, 37, and 38 are diagrams that illustrate an example of a parity check matrix initial value table of the DVB type for a parity check matrix of a new LDPC code having a code length N of 64 kbits and a coding rate r of 9/15 (hereinafter, also referred to as Sony code of (64 k, 9/15)), proposed by the applicant of the present application.

Note that FIG. 37 is a diagram following FIG. 36, and FIG. 38 is a diagram following FIG. 37.

FIGS. 39, 40, 41 and 42 are diagrams that illustrate an example of a parity check matrix initial value table of the DVB type for a parity check matrix of a new LDPC code having a code length N of 64 kbits and a coding rate r of 11/15 (hereinafter, also referred to as Sony code of (64 k, 11/15)), proposed by the applicant of the present application.

Note that FIG. 40 is a diagram following FIG. 39, FIG. 41 is a diagram following FIG. 40, and FIG. 42 is a diagram following FIG. 41.

FIGS. 43, 44, 45, and 46 are diagrams that illustrate an example of a parity check matrix initial value table of the DVB type for a parity check matrix of a new LDPC code having a code length N of 64 kbits and a coding rate r of 13/15 (hereinafter, also referred to as Sony code of (64 k, 13/15)), proposed by the applicant of the present application.

Note that FIG. 44 is a diagram following FIG. 43, FIG. 45 is a diagram following FIG. 44, and FIG. 46 is a diagram following FIG. 45.

FIGS. 47 and 48 are diagrams that illustrate an example of a parity check matrix initial value table of the DVB type for a parity check matrix of a new LDPC code having a code length N of 64 kbits and a coding rate r of 6/15 (hereinafter, also referred to as Samsung code of (64 k, 6/15)), proposed by Samsung.

Note that FIG. 48 is a diagram following FIG. 47

Figure 50:
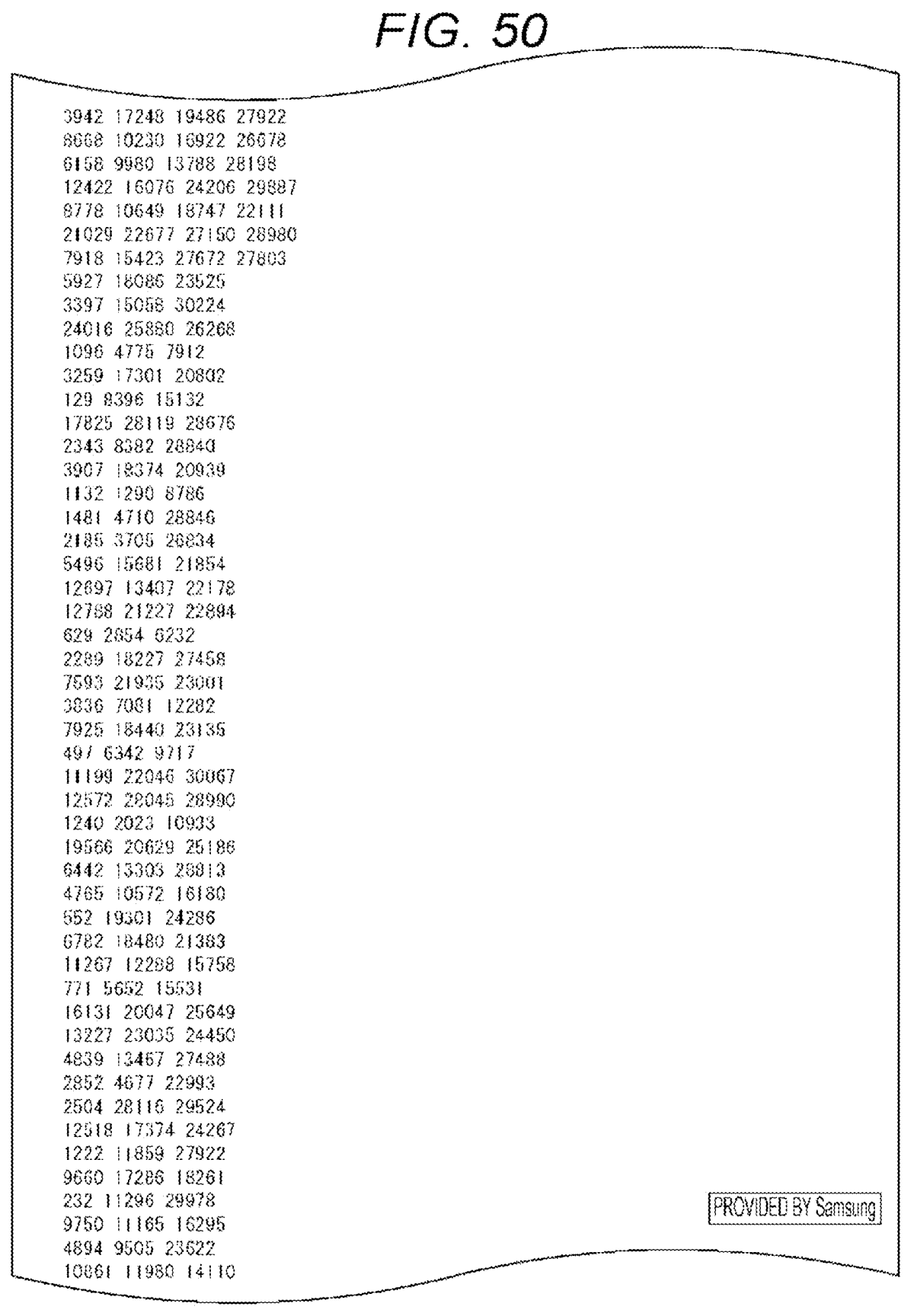
Figure 51:
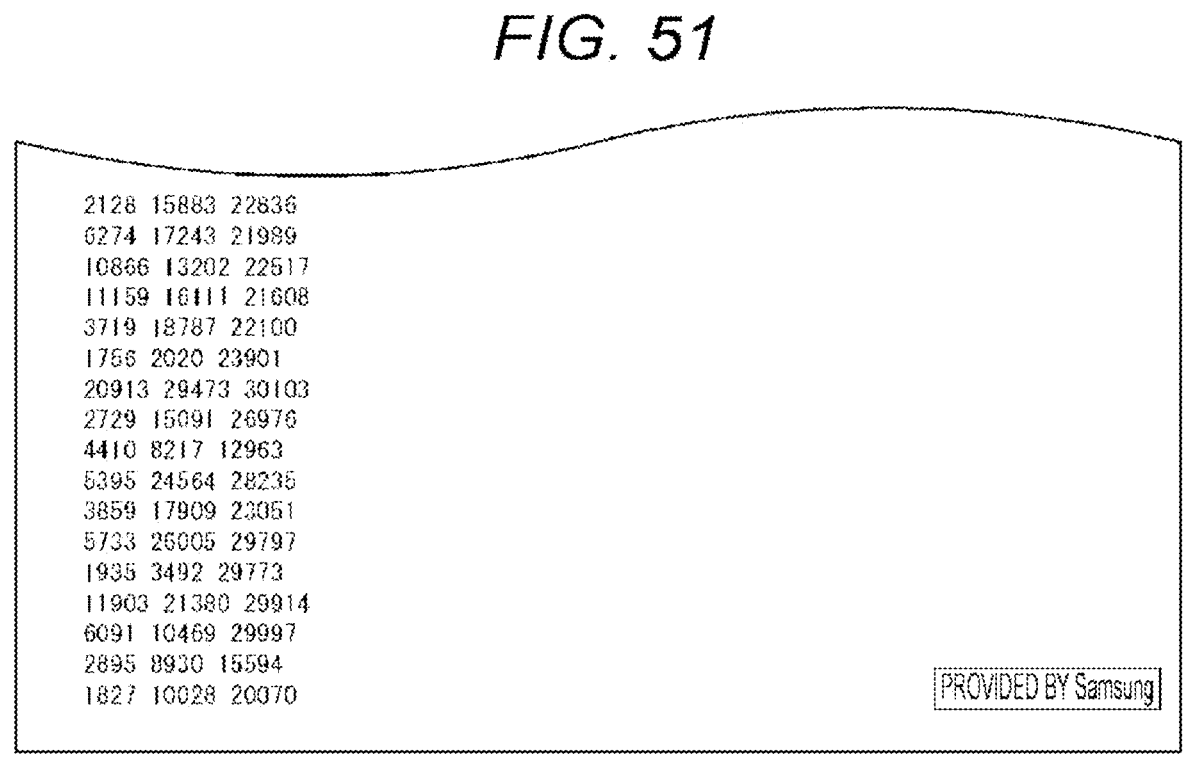

FIGS. 49, 50, and 51 are diagrams that illustrate an example of a parity check matrix initial value table of the DVB type for a parity check matrix of a new LDPC code having a code length N of 64 kbits and a coding rate r of 8/15 (hereinafter, also referred to as Samsung code of (64 k, 8/15)), proposed by Samsung.

Note that FIG. 50 is a diagram following FIG. 49, and FIG. 51 is a diagram following FIG. 50.

Figure 53:
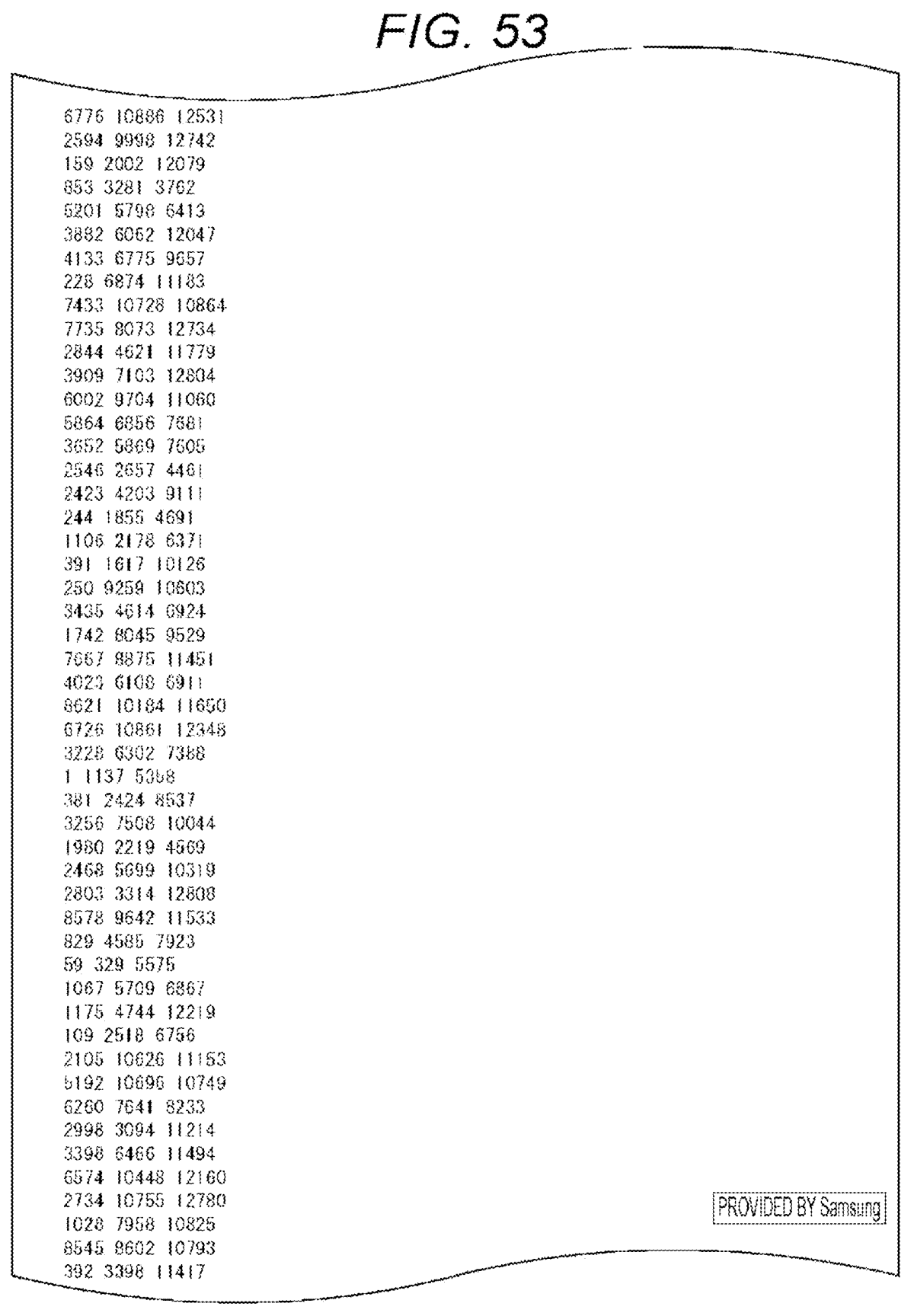
Figure 54:
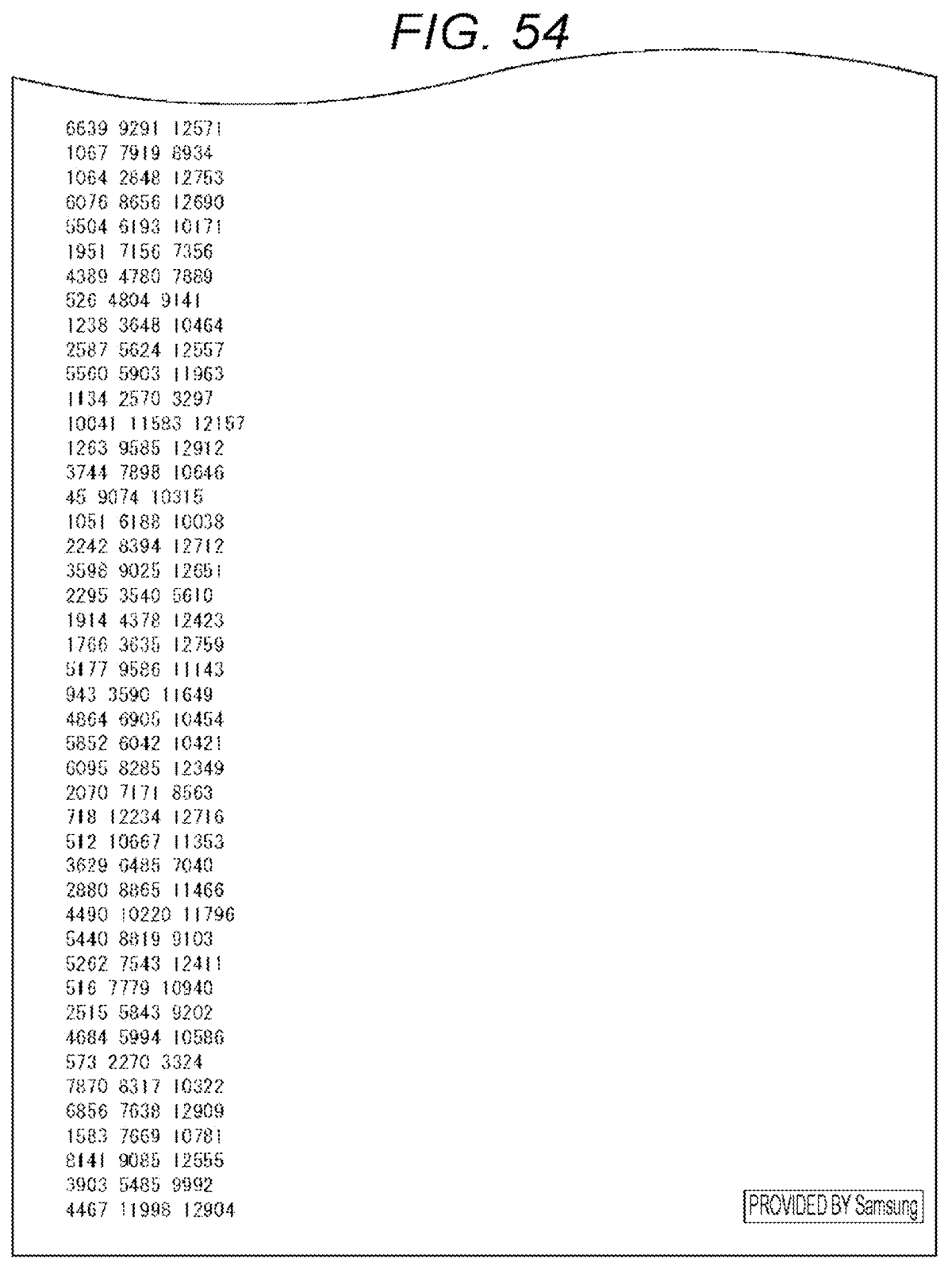

FIGS. 52, 53, and 54 are diagrams that illustrate an example of a parity check matrix initial value table of the DVB type for a parity check matrix of a new LDPC code having a code length N of 64 kbits and a coding rate r of 12/15 (hereinafter, also referred to as Samsung code of (64 k, 12/15)), proposed by Samsung.

Note that FIG. 53 is a diagram following FIG. 52, and FIG. 54 is a diagram following FIG. 53.

FIG. 55 is a diagram that illustrates an example of a parity check matrix initial value table of the DVB type for a parity check matrix of a new LDPC code having a code length N of 16 kbits and a coding rate r of 6/15 (hereinafter, also referred to as LGE code of (16 k, 6/15)), proposed by LGE.

FIG. 56 is a diagram that illustrates an example of a parity check matrix initial value table of the DVB type for a parity check matrix of a new LDPC code having a code length N of 16 kbits and a coding rate r of 7/15 (hereinafter, also referred to as LGE code of (16 k, 7/15)), proposed by LGE.

FIG. 57 is a diagram that illustrates an example of a parity check matrix initial value table of the DVB type for a parity check matrix of a new LDPC code having a code length N of 16 kbits and a coding rate r of 9/15 (hereinafter, also referred to as LGE code of (16 k, 9/15)), proposed by LGE.

FIG. 58 is a diagram that illustrates an example of a parity check matrix initial value table of the DVB type for a parity check matrix of a new LDPC code having a code length N of 16 kbits and a coding rate r of 11/15 (hereinafter, also referred to as LGE code of (16 k, 11/15)), proposed by LGE.

FIG. 59 is a diagram that illustrates an example of a parity check matrix initial value table of the DVB type for a parity check matrix of a new LDPC code having a code length N of 16 kbits and a coding rate r of 13/15 (hereinafter, also referred to as LGE code of (16 k, 13/15)), proposed by LGE.

Figure 61:
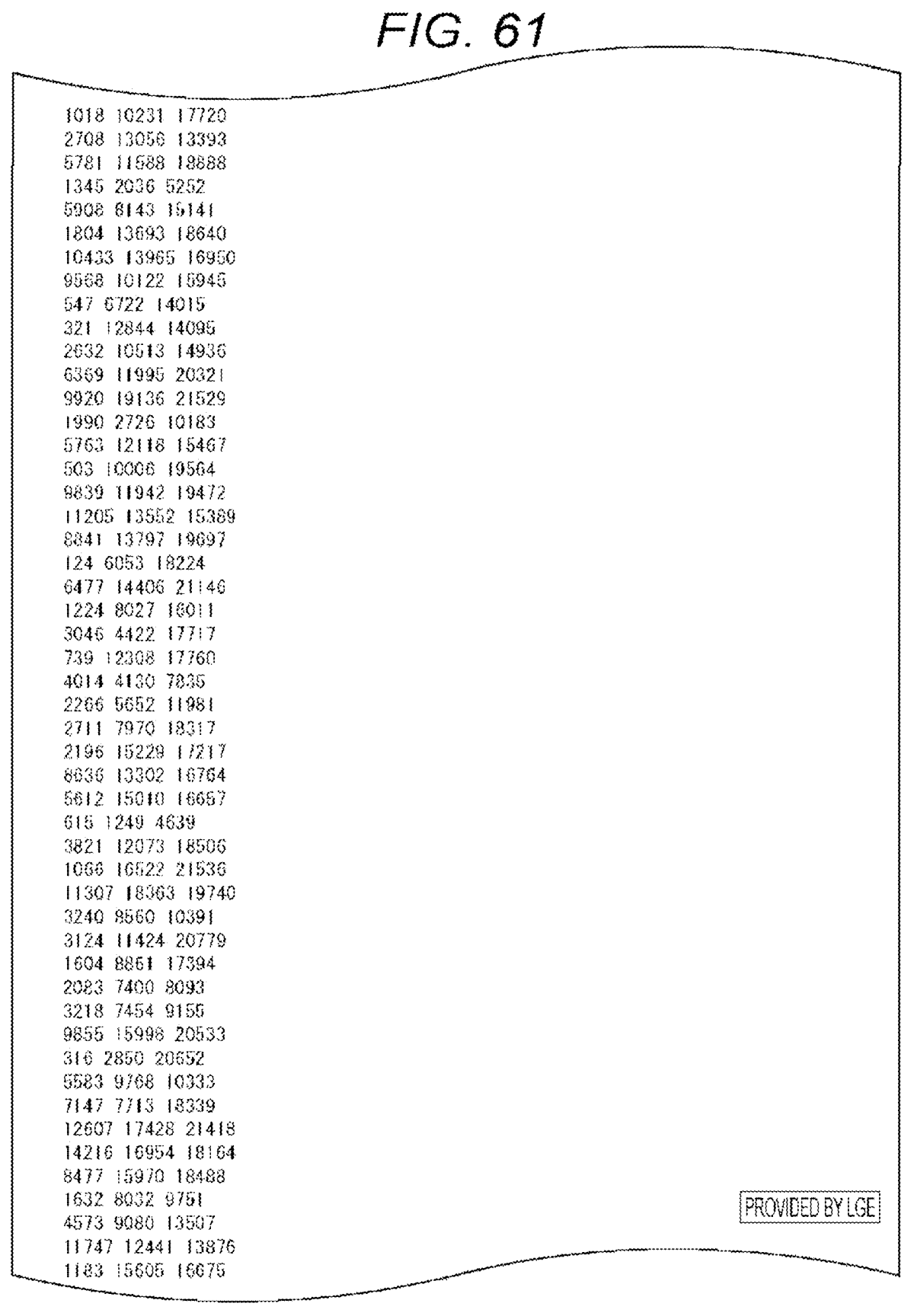
Figure 62:
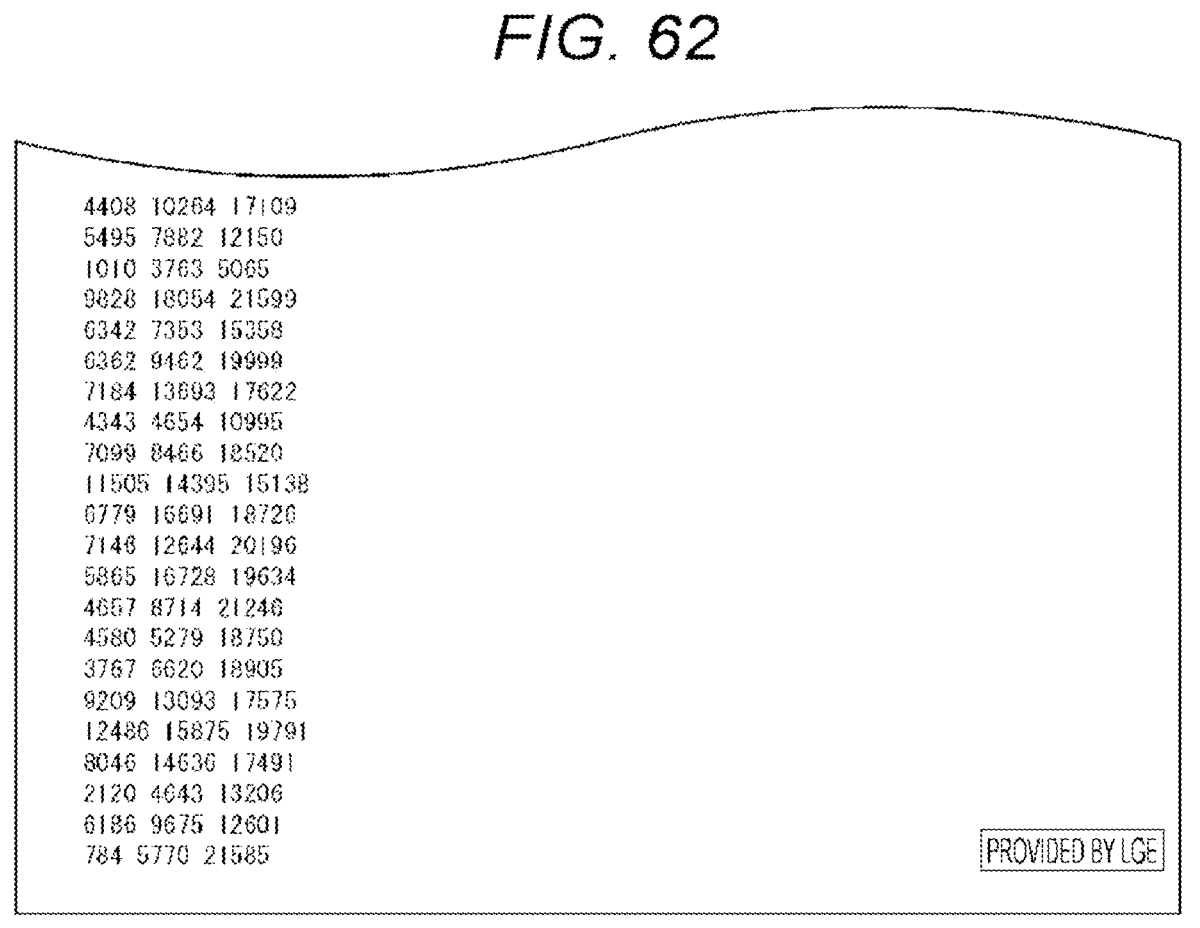

FIGS. 60, 61, and 62 are diagrams that illustrate an example of a parity check matrix initial value table of the DVB type for a parity check matrix of a new LDPC code having a code length N of 64 kbits and a coding rate r of 10/15 (hereinafter, also referred to as LGE code of (64 k, 10/15)), proposed by LGE.

Note that FIG. 61 is a diagram following FIG. 60, and FIG. 62 is a diagram following FIG. 61.

Figure 64:
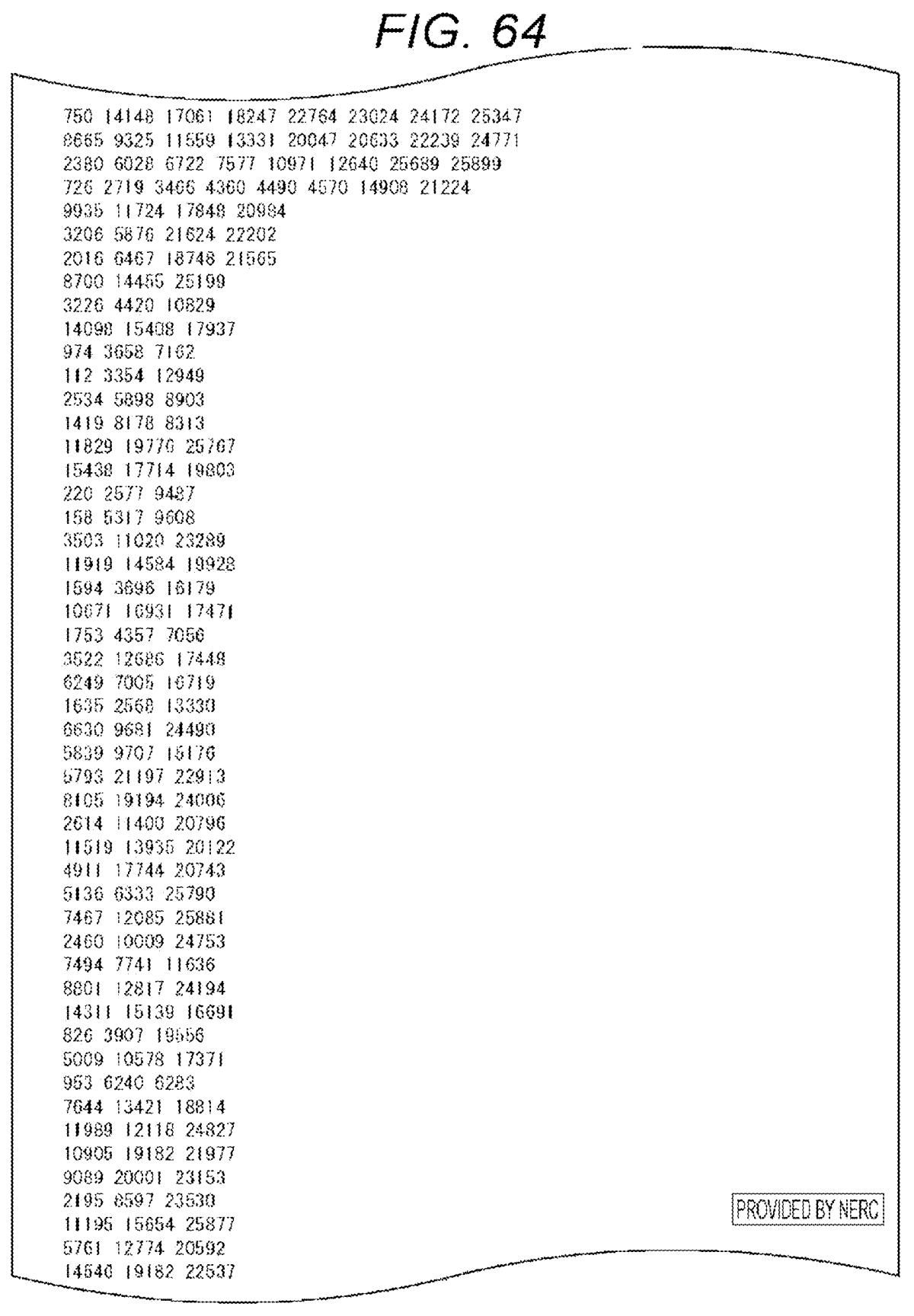

FIGS. 63, 64, and 65 are diagrams that illustrate an example of a parity check matrix initial value table of the DVB type for a parity check matrix of a new LDPC code having a code length N of 64 kbits and a coding rate r of 9/15 (hereinafter, also referred to as NERC code of (64 k, 9/15)), proposed by NERC.

Note that FIG. 64 is a diagram following FIG. 63, and FIG. 65 is a diagram following FIG. 64.

FIG. 66 is a diagram that illustrates an example of a parity check matrix initial value table of the ETRI type for a parity check matrix of a new LDPC code having a code length N of 16 kbits and a coding rate r of 5/15 (hereinafter, also referred to as ETRI code of (16 k, 5/15)), proposed by CRC/ETRI.

Figure 68:
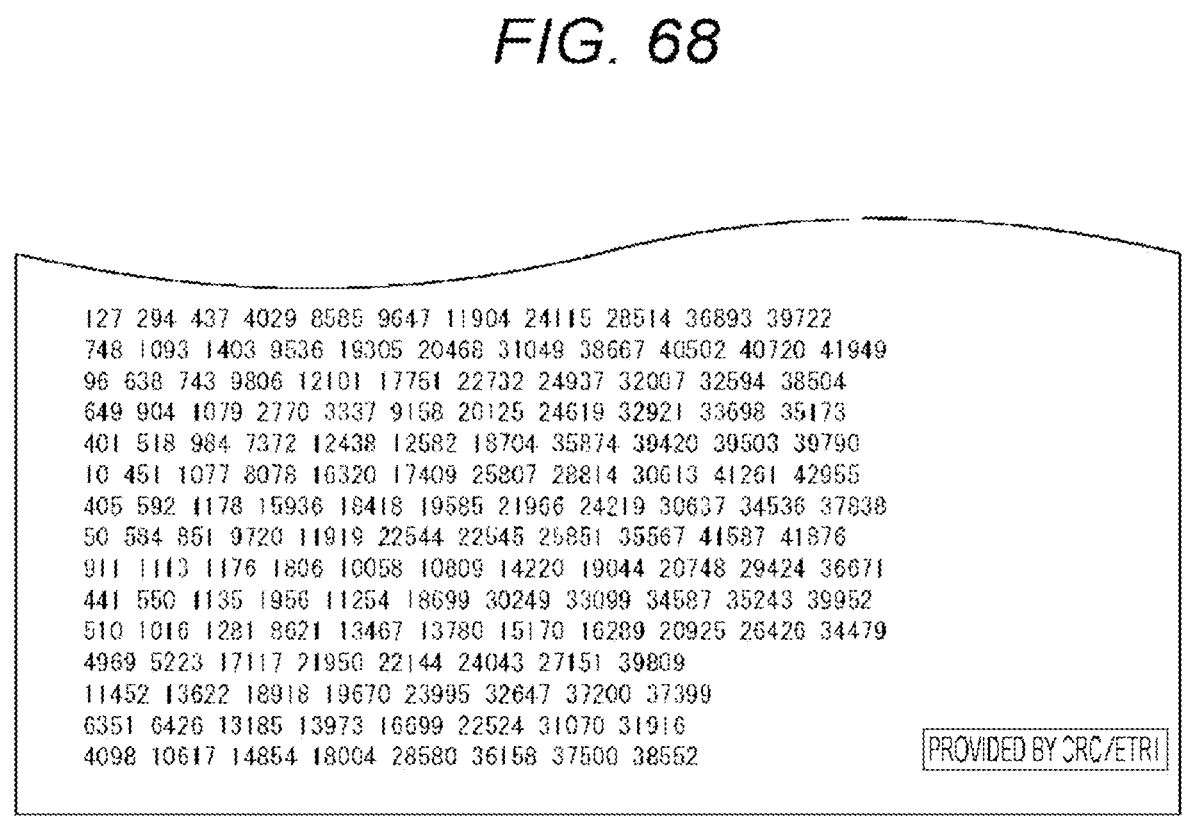

FIGS. 67 and 68 are diagrams that illustrate an example of a parity check matrix initial value table of the ETRI type for a parity check matrix of a new LDPC code having a code length N of 64 kbits and a coding rate r of 5/15 (hereinafter, also referred to as ETRI code of (64 k, 5/15)), proposed by CRC/ETRI.

Note that FIG. 68 is a diagram following FIG. 67.

Figure 70:
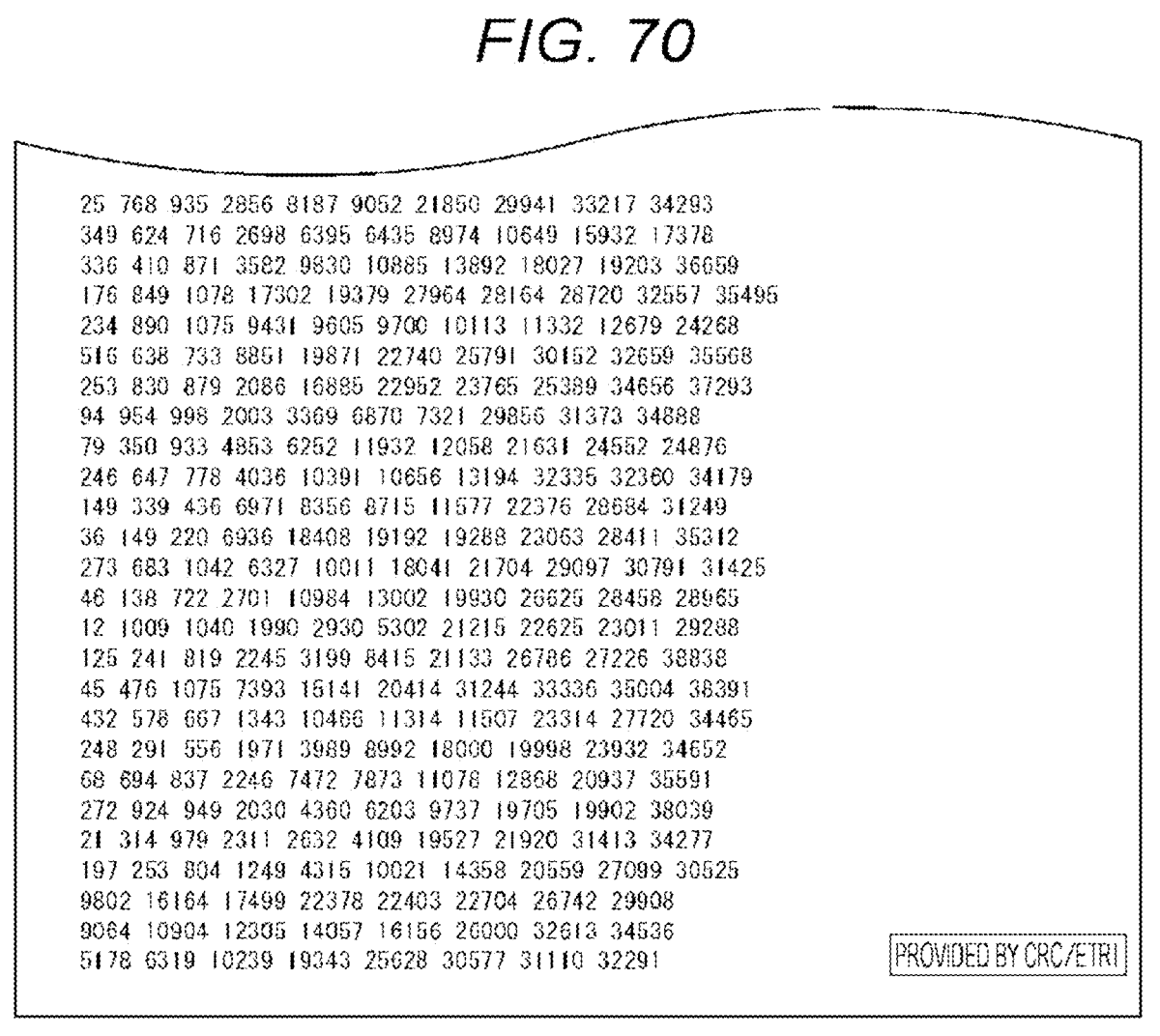

FIGS. 69 and 70 are diagrams that illustrate an example of a parity check matrix initial value table of the ETRI type for a parity check matrix of a new LDPC code having a code length N of 64 kbits and a coding rate r of 6/15 (hereinafter, also referred to as ETRI code of (64 k, 6/15)), proposed by CRC/ETRI.

Note that FIG. 70 is a diagram following FIG. 69.

FIGS. 71 and 72 are diagrams that illustrate an example of a parity check matrix initial value table of the ETRI type for a parity check matrix of a new LDPC code having a code length N of 64 kbits and a coding rate r of 7/15 (hereinafter, also referred to as ETRI code of (64 k, 7/15)), proposed by CRC/ETRI.

Note that FIG. 72 is a diagram following FIG. 71.

Among the new LDPC codes, particularly, the Sony code is an LDPC code having good performance.

Here, the LDPC code of good performance is an LDPC code that is acquired from an appropriate parity check matrix H.

The appropriate parity check matrix H, for example, is a parity check matrix satisfying a predetermined condition that a bit error rate (BER) (and a frame error rate (FER)) becomes smaller when an LDPC code acquired from the parity check matrix H is transmitted with low $E_s/N_0$ or $E_b/N_o$(signal-to-noise power ratio per bit).

For example, the appropriate parity check matrix H can be acquired by performing simulation of measuring a BER at the time of transmitting LDPC codes acquired from various parity check matrices satisfying a predetermined condition at a low $E_s/N_o$.

As a predetermined condition to be satisfied by the appropriate parity check matrix H, for example, an analysis result acquired by a code performance analysis method called density evolution (Density Evolution) is good, and there is no loop of elements of "1" called cycle-4, or the like.

Here, in the information matrix $H_A$, it is known that the decoding performance of an LDPC code is degraded in a case where elements of "1" are densely formed like in case of cycle-4. For this reason, it is requested that there is no cycle-4 as the predetermined condition to be satisfied by the appropriate parity check matrix H.

Note that the predetermined condition to be satisfied by the appropriate parity check matrix H can be appropriately determined from the viewpoints of the improvement in the decoding performance of an LDPC code, the facilitation (simplification) of the decoding process of an LDPC code, and the like.

Figure 73:
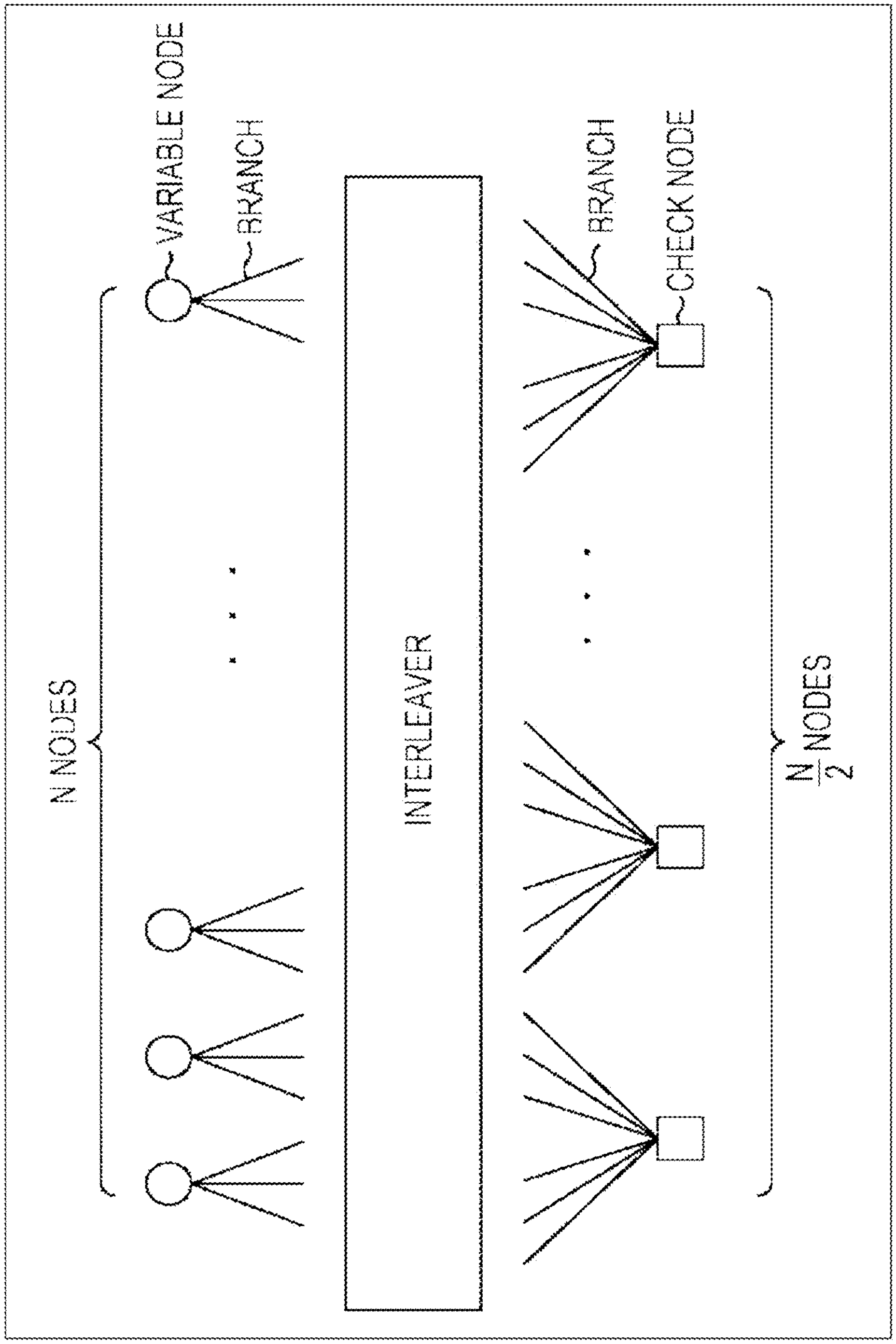
FIG. 73 is a diagram that illustrates an example of a Tanner graph of an ensemble of a degree sequence in which a column weight is 3, and a row weight is 6.
Figure 74:
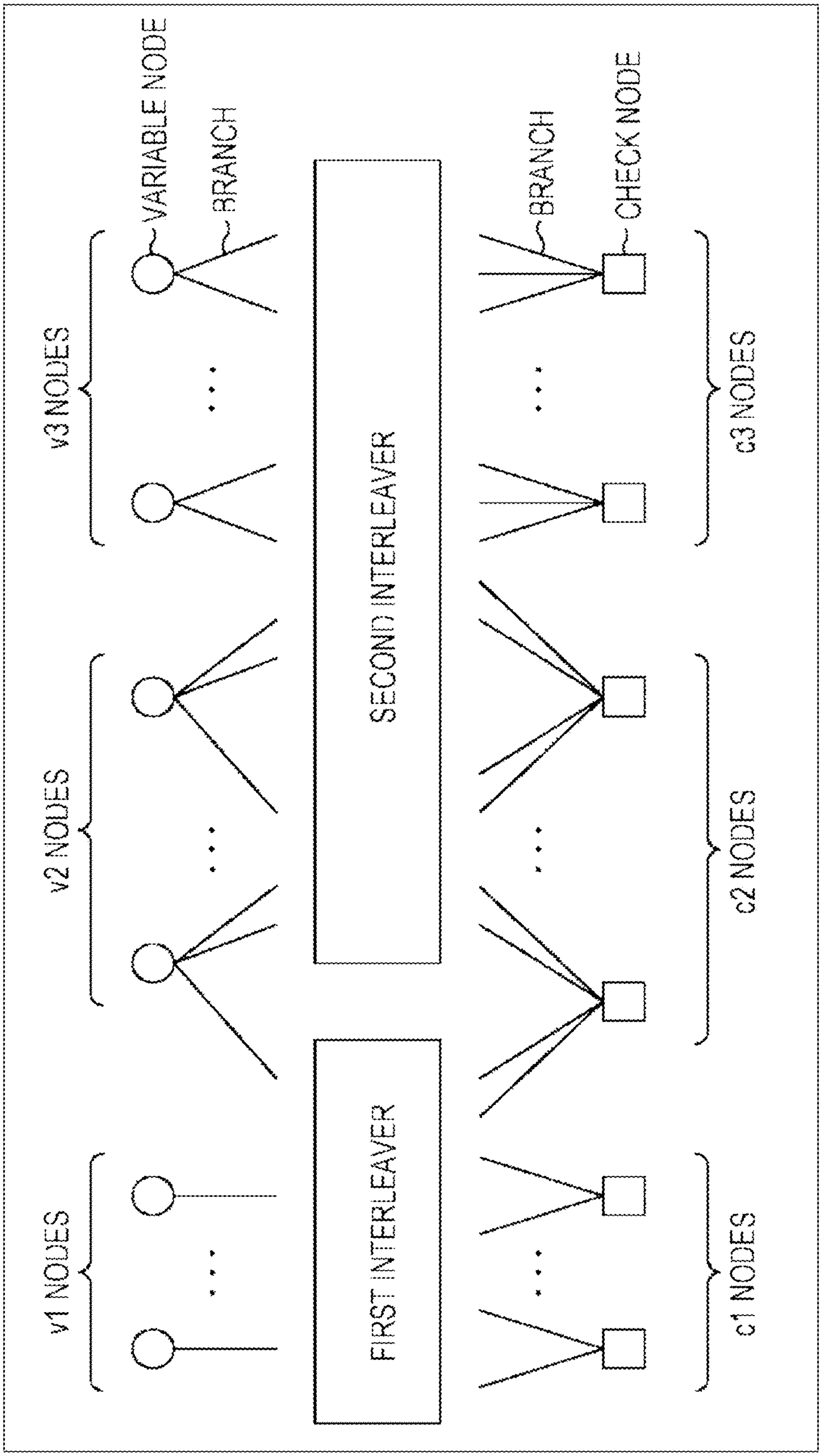
FIG. 74 is a diagram that illustrates an example of a Tanner graph of an ensemble of a multi-edge type.

FIGS. 73 and 74 are diagrams that illustrate the density evolution acquiring an analysis result as a predetermined condition to be satisfied by the appropriate parity check matrix H.

The density evolution is a code analysis method for calculating the expectation value of an error probability of the entire LDPC code (ensemble) having a code length N of ∞ that is characterized by a degree sequence described later.

For example, as the dispersion value of noise is gradually increased from 0 on the AWGN channel, while, first, the expectation value of the error probability of a certain ensemble is "0". However, when the dispersion value of noise becomes a certain threshold or more, the expectation value is not "0".

According to the density evolution, by comparing the thresholds of the dispersion values of noise (hereinafter, also referred to as a performance threshold) for which the expectation value of the error probability is not "0", it can be determined whether the performance (the appropriateness of the parity check matrix) of the ensemble is good or bad.

Note that, for a specific LDPC code, when an ensemble to which the LDPC code belongs is determined, and the density evolution is performed for the ensemble, rough performance of the LDPC code can be predicted.

Accordingly, in a case where an ensemble of good performance is found, an LDPC code of good performance can be found from among LDPC codes that belong to the ensemble.

Here, the degree sequence described above represents at what percentage a variable node or a check node having the weight of each value is present for the code length N of an LDPC code.

For example, a regular (3, 6) LDPC code having a coding rate of 1/2 belongs to an ensemble that is characterized by a degree sequence in which the weight (column weight) of all the variable nodes is 3, and the weight (row weight) of all the check nodes is 6.

FIG. 73 illustrates a Tanner graph of such an ensemble.

In the Tanner graph illustrated in FIG. 73, there are N variable nodes represented as circles (mark "○") in the diagram wherein N is equal to the code length N, and there are N/2 check nodes represented as squares (mark "□") wherein N/2 is equal to a multiplication value acquired by multiplying the code length N by the coding rate "1/2".

Three branches (edges) are connected to each variable node, wherein three is equal to the column weight, and accordingly, there are a total of 3N branches connected to the N variable nodes.

In addition, six branches are connected to each check node wherein six is equal to the row weight, and accordingly, there are a total of 3N branches connected to the N/2 check nodes.

Furthermore, there is one interleaver in the Tanner graph illustrated in FIG. 73.

The interleaver randomly rearranges 3N branches connected to the N variable nodes and connects each branch after the rearrangement to one of 3N branches connected to the N/2 check nodes.

There are (3N)! (=(3N)×(3N−1)× . . . ×1) rearrangement patterns for the rearrangement of the 3N branches connected to the N variable nodes in the interleaver. Accordingly, an ensemble characterized by the degree sequence in which the weight of all the variable nodes is 3, and the weight of all the check nodes is 6 is a set of (3N)! LDPC codes.

In simulation for acquiring an LDPC code of good performance (appropriate parity check matrix), an ensemble of a multi-edge type is used in the density evolution.

In the multi-edge type, an interleaver through which the branches connected to the variable nodes and the branches connected to the check nodes pass is divided into a plurality of parts (multi edges), and, accordingly, the ensemble is more strictly characterized.

FIG. 74 illustrates an example of a Tanner graph of an ensemble of the multi-edge type.

In the Tanner graph illustrated in FIG. 74, there are two interleavers including the first interleaver and the second interleaver.

In addition, in the Tanner graph illustrated in FIG. 74, there are v1 variable nodes each having one branch connected to the first interleaver and no branch connected to the second interleaver, there are v2 variable nodes each having one branch connected to the first interleaver and two branches connected to the second interleaver, and there are v3 variable nodes each having no branch connected to the first interleaver and two branches connected to the second interleaver.

Furthermore, in the Tanner graph illustrated in FIG. 74, there are c1 check nodes each having two branches connected to the first interleaver and no branch connected to the second interleaver, there are c2 check nodes each having two branches connected to the first interleaver and two branches connected to the second interleaver, and there are c3 check nodes each having no branch connected to the first interleaver and three branches connected to the second interleaver.

Here, the density evolution and the mounting thereof, for example, are described in "On the Design of Low-Density Parity-Check Codes within 0.0045 dB of the Shannon Limit", S. Y Chung, G. D. Forney, T. J. Richardson, R. Urbanke, IEEE Communications Leggers, VOL. 5, NO. 2, February 2001.

In simulation for acquiring a Sony code (a parity check matrix initial value table thereof), according to the density evolution of the multi-edge type, an ensemble for which a performance threshold that is $E_b/N_0$ (signal-to-noise power ratio per bit), at which the BER starts to fall (decrease), is a predetermined value or less is retrieved, and an LDPC code for which the BER in a case where one or more quadrature modulations such as QPSK are used is low is selected from among LDPC codes belonging to the ensemble as an LDPC code of good performance.

The parity check matrix initial value table of the Sony code is acquired through the simulation described above.

Thus, according to the Sony code acquired from the parity check matrix initial value table, excellent communication quality can be secured in data transmission.

Figure 75:
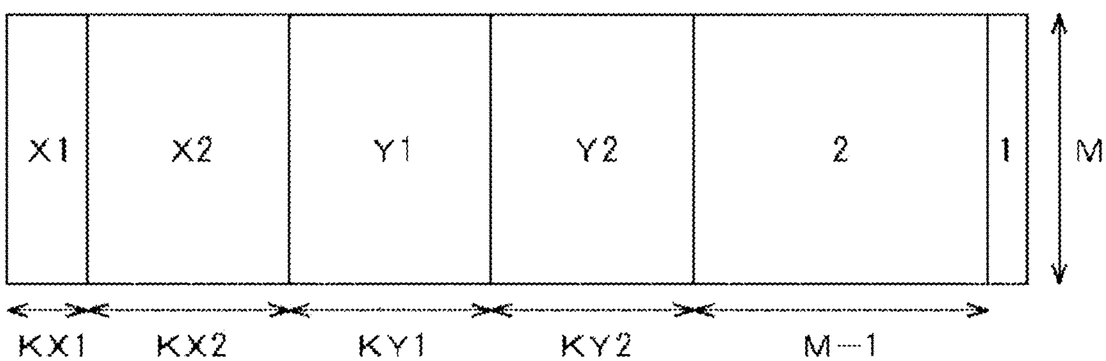
FIG. 75 is a diagram that illustrates a parity check matrix.

FIG. 75 is a diagram that illustrates parity check matrices H (hereinafter, also referred to as "parity check matrices H of Sony codes of (16 k, 8/15), (16 k, 10/15), and (16 k, 12/15)") acquired from the parity check matrix initial value table of the Sony codes (16 k, 8/15), (16 k, 10/15), and (16 k, 12/15).

Each of all the minimum cycle lengths of the parity check matrices H of the Sony codes (16 k, 8/15), (16 k, 10/15), and (16 k, 12/15) has a value exceeding cycle-4, and thus there is no cycle 4 (a loop of elements of "1" having a loop length of 4). Here, the minimum cycle length (girth) represents a minimum value of a length (a loop length) of a loop configured by elements of "1" in the parity check matrix H.

In addition, a performance threshold of the Sony code of (16 k, 8/15) is set to 0.805765, a performance threshold of the Sony code of (16 k, 10/15) is set to 2.471011, and a performance threshold of the Sony code of (16 k, 12/15) is set to 4.269922.

The column weight is set to X1 for KX1 columns of the parity check matrices H of the Sony codes of (16 k, 8/15), (16 k, 10/15), and (16 k, 12/15) starting from the 1st column, the column weight is set to X2 for the following KX2 columns, the column weight is set to Y1 for the following KY1 columns, the column weight is set to Y2 for the following KY2 columns, the column weight is set to 2 for the following (M−1) columns, and the column weight is set to 1 for the last column.

Here, KX1+KX2+KY1+KY2+M−1+1 is equal to the code length N (=16200 bits) of the Sony codes of (16 k, 8/15), (16 k, 10/15), and (16 k, 12/15).

In the parity check matrices H of the Sony codes of (16 k, 8/15), (16 k, 10/15), and (16 k, 12/15), the numbers KX1, KX2, KY1, KY2, and M of columns and column weights X1, X2, Y1, and Y2 are set as represented in FIG. 75.

In the parity check matrices H of the Sony codes of (16 k, 8/15), (16 k, 10/15), and (16 k, 12/15), similarly to the parity check matrix described above with reference to FIGS. 12 and 13, a column disposed on a further head side (the left side) tends to have a higher column weight, and thus a code bit of the Sony code disposed on a further head side tends to be more resistant against an error (have resistance against an error).

According to the simulation conducted by the applicant of the present application, an excellent BER/FER is acquired for the Sony codes of (16 k, 8/15), (16 k, 10/15), and (16 k, 12/15), and thus excellent communication quality can be secured in data transmission using the Sony codes of (16 k, 8/15), (16 k, 10/15), and (16 k, 12/15).

Figure 76:
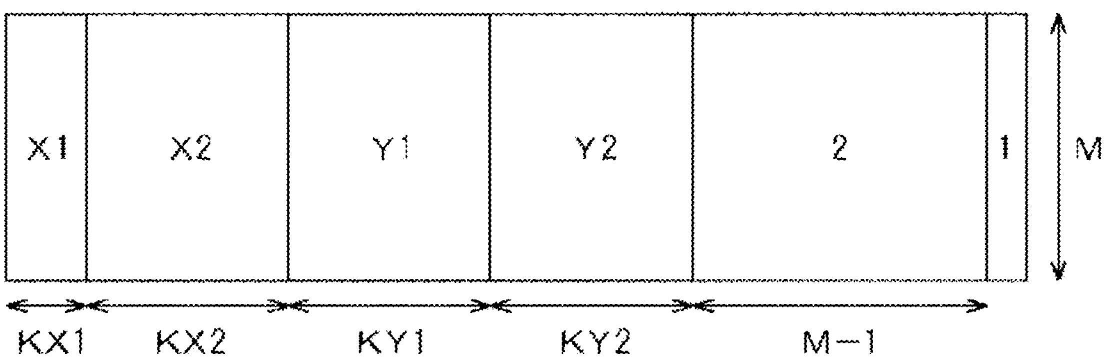
FIG. 76 is a diagram that illustrates a parity check matrix.

FIG. 76 is a diagram that illustrates parity check matrices H of the Sony codes of (64 k, 7/15), (64 k, 9/15), (64 k, 11/15), and (64 k, 13/15).

Each of all the minimum cycle lengths of the parity check matrices H of the Sony codes of (64 k, 7/15), (64 k, 9/15), (64 k, 11/15), and (64 k, 13/15) has a value exceeding cycle-4, and thus there is no cycle-4.

In addition, a performance threshold value of the Sony code of (64 k, 7/15) is set to −0.093751, a performance threshold value of the Sony code of (64 k, 9/15) is set to 1.658523, a performance threshold value of the Sony code of (64 k, 11/15) is set to 3.351930, and a performance threshold value of the Sony code of (64 k, 13/15) is set to 5.301749.

The column weight is set to X1 for KX1 columns of the parity check matrices H of the Sony codes of (64 k, 7/15), (64 k, 9/15), (64 k, 11/15), and (64 k, 13/15) starting from the 1st column, the column weight is set to X2 for the following KX2 columns, the column weight is set to Y1 for the following KY1 columns, the column weight is set to Y2 for the following KY2 columns, the column weight is set to 2 for the following (M−1) columns, and the column weight is set to 1 for the last column.

Here, KX1+KX2+KY1+KY2+M−1+1 is equal to the code length N=64800 bits of the Sony codes of (64 k, 7/15), (64 k, 9/15), (64 k, 11/15), and (64 k, 13/15).

In the parity check matrices H of the Sony codes of (64 k, 7/15), (64 k, 9/15), (64 k, 11/15), and (64 k, 13/15), the numbers KX1, KX2, KY1, KY2, and M of columns and column weights X1, X2, Y1, and Y2 are set as illustrated in FIG. 76.

In the parity check matrices H of the Sony codes of (64 k, 7/15), (64 k, 9/15), (64 k, 11/15), and, (64 k, 13/15), similarly to the parity check matrix described above with reference to FIGS. 12 and 13, a column disposed on a further head side (the left side) tends to have a higher column weight, and thus a code bit of the Sony code disposed on a further front side tends to be more resistant against an error.

According to the simulation conducted by the applicant of the present application, an excellent BER/FER is acquired for the Sony codes of (64 k, 7/15), (64 k, 9/15), (64 k, 11/15), and (64 k, 13/15), and thus excellent communication quality can be secured in data transmission using the Sony codes of (64 k, 7/15), (64 k, 9/15), (64 k, 11/15), and (64 k, 13/15).

Figure 77:
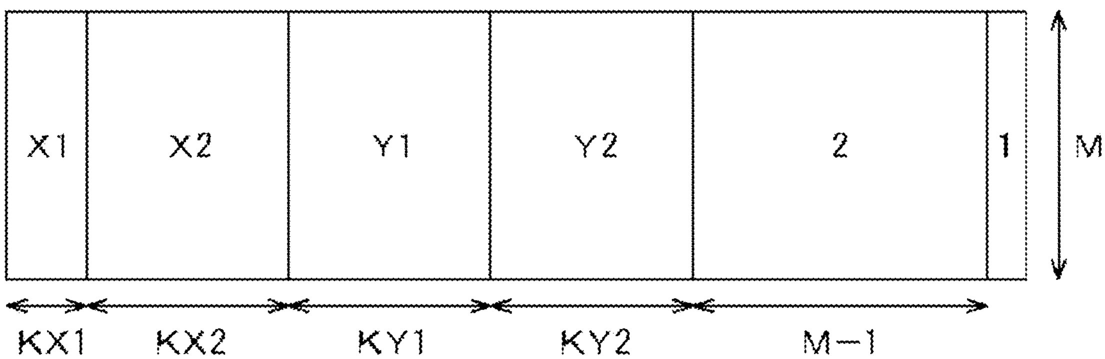
FIG. 77 is a diagram that illustrates a parity check matrix.

FIG. 77 is a diagram that illustrates parity check matrices H of the Samsung codes of (64 k, 6/15), (64 k, 8/15), and (64 k, 12/15).

The column weight is set to X1 for KX1 columns of the parity check matrices H of the Samsung codes of (64 k, 6/15), (64 k, 8/15), and (64 k, 12/15) starting from the 1st column, the column weight is set to X2 for the following KX2 columns, the column weight is set to Y1 for the following KY1 columns, the column weight is set to Y2 for the following KY2 columns, the column weight is set to 2 for the following (M−1) columns, and the column weight is set to 1 for the last column.

Here, KX1+KX2+KY1+KY2+M−1+1 is equal to the code length N=64800 bits of the Samsung codes of (64 k, 6/15), (64 k, 8/15), and (64 k, 12/15).

In the parity check matrices H of the Samsung codes of (64 k, 6/15), (64 k, 8/15), and (64 k, 12/15), the numbers KX1, KX2, KY1, KY2, and M of columns and column weights X1, X2, Y1, and Y2 are set as illustrated in FIG. 77.

Figure 78:
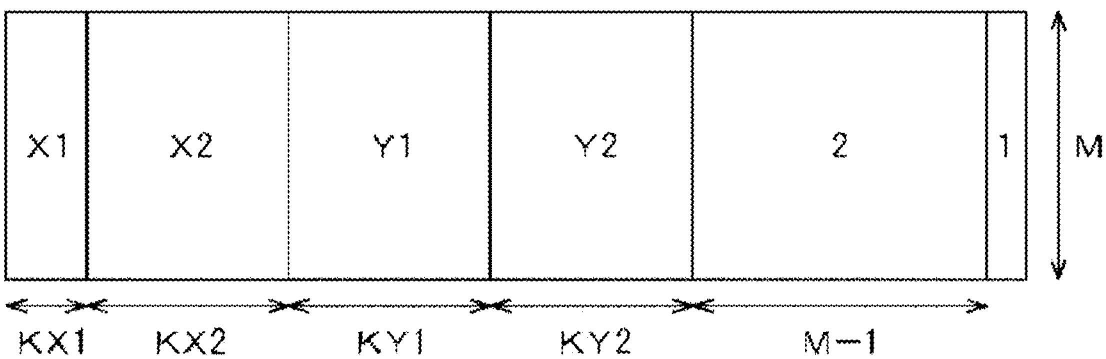
FIG. 78 is a diagram that illustrates a parity check matrix.

FIG. 78 is a diagram that illustrates parity check matrices H of the LGE codes of (16 k, 6/15), (16 k, 7/15), (16 k, 9/15), (16 k, 11/15), and (16 k, 13/15).

The column weight is set to X1 for KX1 columns of the parity check matrices H of the LGE codes of (16 k, 6/15), (16 k, 7/15), (16 k, 9/15), (16 k, 11/15), and (16 k, 13/15) starting from the 1st column, the column weight is set to X2 for the following KX2 columns, the column weight is set to Y1 for the following KY1 columns, the column weight is set to Y2 for the following KY2 columns, the column weight is set to 2 for the following (M−1) columns, and the column weight is set to 1 for the last column.

Here, KX1+KX2+KY1+KY2+M−1+1 is equal to the code length N=16200 bits of the LGE codes of (16 k, 6/15), (16 k, 7/15), (16 k, 9/15), (16 k, 11/15), and (16 k, 13/15).

In the parity check matrices H of the LGE codes of (16 k, 6/15), (16 k, 7/15), (16 k, 9/15), (16 k, 11/15), and (16 k, 13/15), the numbers KX1, KX2, KY1, KY2, and M of columns and column weights X1, X2, Y1, and Y2 are set as illustrated in FIG. 78.

Figure 79:
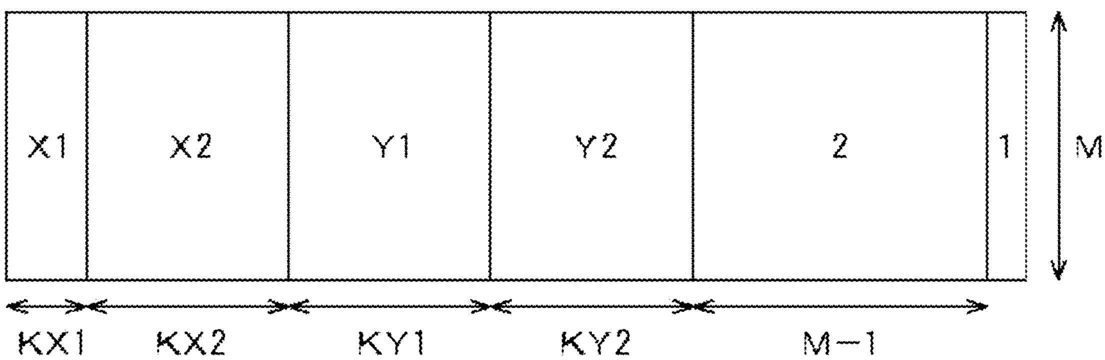
FIG. 79 is a diagram that illustrates a parity check matrix.

FIG. 79 is a diagram that illustrates a parity check matrix H of the LGE code of (64 k, 10/15).

The column weight is set to X1 for KX1 columns of the parity check matrix H of the LGE code of (64 k, 10/15) starting from the 1st column, the column weight is set to X2 for the following KX2 columns, the column weight is set to Y1 for the following KY1 columns, the column weight is set to Y2 for the following KY2 columns, the column weight is set to 2 for the following (M−1) columns, and the column weight is set to 1 for the last column.

Here, KX1+KX2+KY1+KY2+M−1+1 is equal to the code length N=64800 bits of the LGE code of (64 k, 10/15).

In the parity check matrix H of the LGE code of (64 k, 10/15), the numbers KX1, KX2, KY1, KY2, and M of columns and column weights X1, X2, Y1, and Y2 are set as illustrated in FIG. 79.

Figure 80:
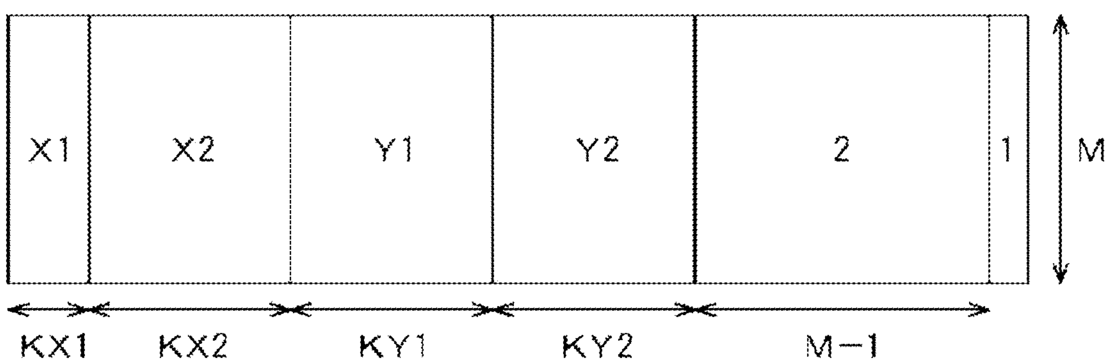
FIG. 80 is a diagram that illustrates a parity check matrix.

FIG. 80 is a diagram that illustrates a parity check matrix H of the NERC code of (64 k, 9/15).

The column weight is set to X1 for KX1 columns of the parity check matrix H of the NERC code of (64 k, 9/15) starting from the 1st column, the column weight is set to X2 for the following KX2 columns, the column weight is set to Y1 for the following KY1 columns, the column weight is set to Y2 for the following KY2 columns, the column weight is set to 2 for the following (M−1) columns, and the column weight is set to 1 for the last column.

Here, KX1+KX2+KY1+KY2+M−1+1 is equal to the code length N=64800 bits of the NERC code of (64 k, 9/15).

In the parity check matrix H of the NERC code of (64 k, 9/15), the numbers KX1, KX2, KY1, KY2, and M of columns and column weights X1, X2, Y1, and Y2 are set as illustrated in FIG. 80.

Figure 81:
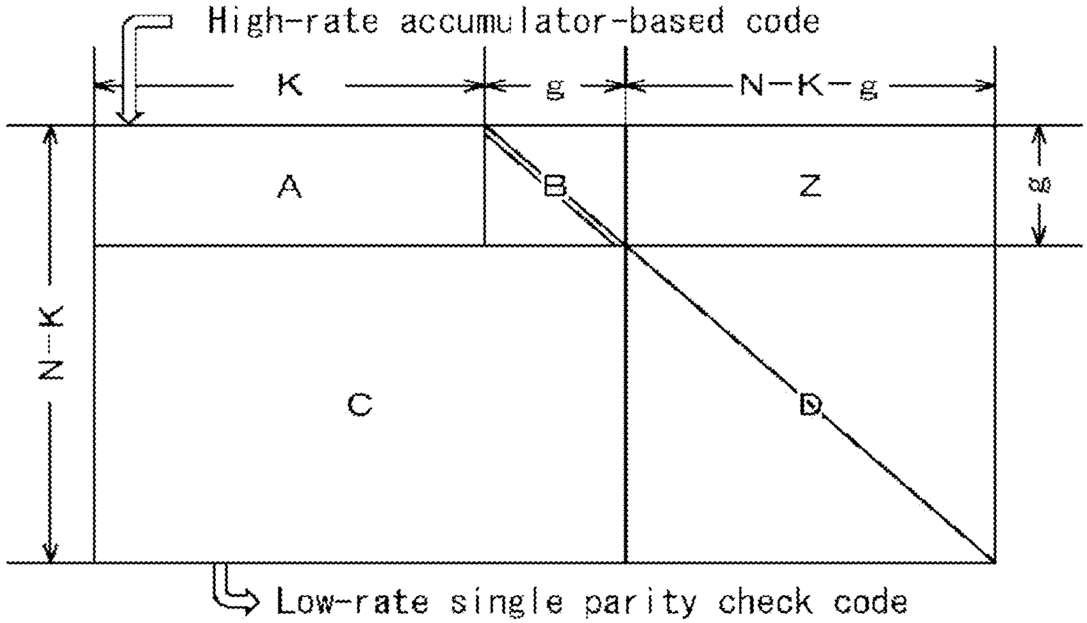
FIG. 81 is a diagram that illustrates a parity check matrix.

FIG. 81 is a diagram that illustrates a parity check matrix H of the ETRI code of (16 k, 5/15).

For the parity check matrix H of the ETRI code of (16 k, 5/15), the parameter $g=M_1$ is 720.

In addition, for the ETRI code of (16 k, 5/15), since the code length N is 16200 and the coding rate r is 5/15, the information length K=N×r is 16200×5/15=5400, and the parity length M=N−K is 16200-5400=10800.

Furthermore, the parameter $M_2=M-M_1=N-K-g$ is 10800−720=10080.

Thus, the parameter $Q_1=M_1/P$ is 720/360=2, and the parameter $Q_2=M_2/P$ is 10080/360=28.

Figure 82:
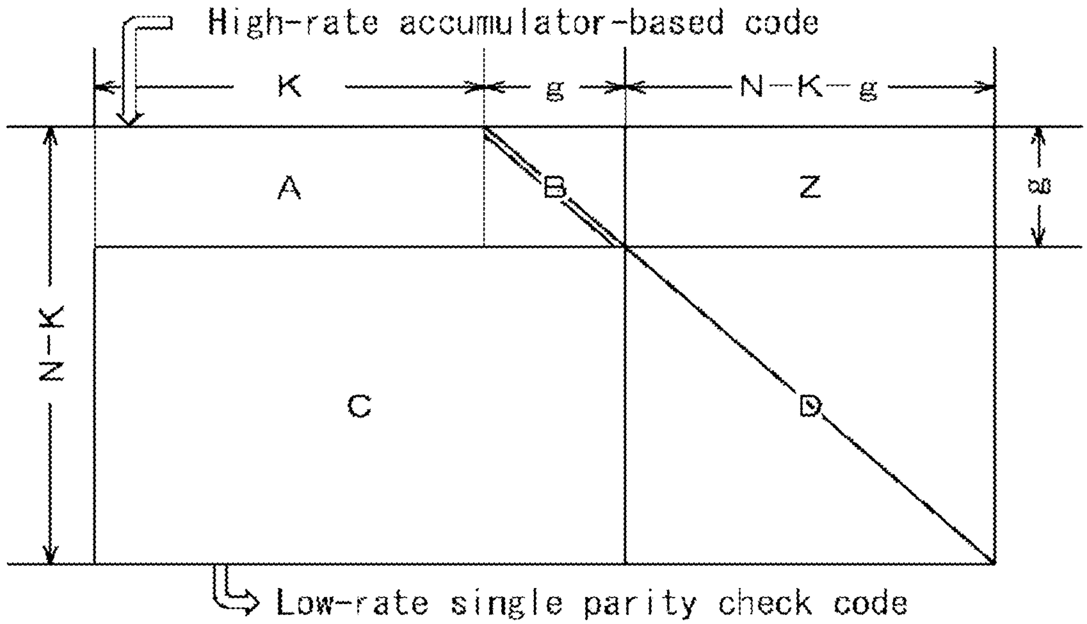
FIG. 82 is a diagram that illustrates a parity check matrix.

FIG. 82 is a diagram that illustrates parity check matrices H of ETRI codes of (64 k, 5/15), (64 k, 6/15), and (64 k, 7/15).

For the parity check matrices H of the ETRI codes of (64 k, 5/15), (64 k, 6/15), and (64 k, 7/15), the parameters $g=M_1$, $M_2$, $Q_1$, and $Q_2$ are set as illustrated in FIG. 82.

<Constellation>

FIGS. 83 to 93 are diagrams that illustrate examples of constellation types employed in the transmission system illustrated in FIG. 7.

In the transmission system illustrated in FIG. 7, for example, a constellation to be employed in ATSC 3.0 may be employed.

In ATSC 3.0, for MODCOD that is a combination of a modulation scheme and an LDPC code, a constellation to be used in the MODCOD is set.

Here, in ATSC 3.0, five types of modulation schemes including QPSK, 16 QAM, 64 QAM, 256 QAM, and 1024 QAM (1 k QAM) are planned to be employed.

In addition, in ATSC 3.0, for each of two types of code length N including 16 kbits and 64 kbits, LDPC codes of nine types of coding rates r including 5/15, 6/15, 7/15, 8/15, 9/15, 10/15, 11/15, 12/15, and 13/15, in other words, 9×2=18 types of LDPC codes are planned to be employed.

In ATSC 3.0, 18 types of LDPC codes are classified into 9 types on the basis of the coding rate r (regardless of the code length N), and 45 (=9×5) types of combinations of the 9 types of LDPC codes (LDPC codes having coding rates r of 5/15, 6/15, 7/15, 8/15, 9/15, 10/15, 11/15, 12/15, and 13/15) and the five types of modulation schemes are planned to be employed as the MODCOD.

In addition, in the ATSC 3.0, for one MODCOD, one or more constellations are planned to be employed.

The constellations include uniform constellations (UC) in which the arrangement of signal points is uniform and non-uniform constellations (NUC) in which the arrangement of signal points is not uniform.

In addition, examples of NUCs include a constellation called a 1-dimensional $M^2$-QAM non-uniform constellation (1D NUC) and a constellation called a 2-dimensional QQAM non-uniform constellation (2D NUC).

Generally, the 1D NUC has a BER that is better than that of the UC, and the 2D NUC has a BER that is better than that of the 1D NUC.

As the constellation of the QPSK, the UC is employed. In addition, as the constellation of the 16 QAM, the 64 QAM, or the 256 QAM, for example, the 2D NUC is employed, and, as the constellation of the 1024 QAM, for example, the 1D NUC is employed.

Hereinafter, a constellation of the NUC used in the MODCOD having a modulation scheme in which an m-bit symbol is mapped into one of $2^m$ signal points and a coding rate of an LDPC code of r will be also referred to as NUC_$2^m$_r (here, m=4, 6, 8, and 10).

For example, "NUC_16_6/15" represents a constellation of the NUC used in the MODCOD having a modulation scheme of 16 QAM and a coding rate r of the LDPC code of 6/15.

In ATSC 3.0, in a case where the modulation scheme is the QPSK, for 9 types of coding rates r of the LDPC code, the same constellation is planned to be used.

In addition, in ATSC 3.0, in a case where the modulation scheme is the 16 QAM, the 64 QAM, or the 256 QAM, a different constellation of the 2D NUC is planned to be used for each of 9 types of coding rates r of the LDPC code.

Furthermore, in ATSC 3.0, in a case where the modulation scheme is the 1024 QAM, a different constellation of the 1D NUC is planned to be used for each of 9 types of coding rates r of the LDPC code.

Thus, in ATSC 3.0, for the QPSK, one type of constellation is planned to be prepared, for each of the 16 QAM, the 64 QAM, and the 256 QAM, 9 types of constellations of the 2D NUC are planned to be prepared, and, for the 1024 QAM, 9 types of constellations of the 1D NUC are planned to be prepared.

Figure 83:
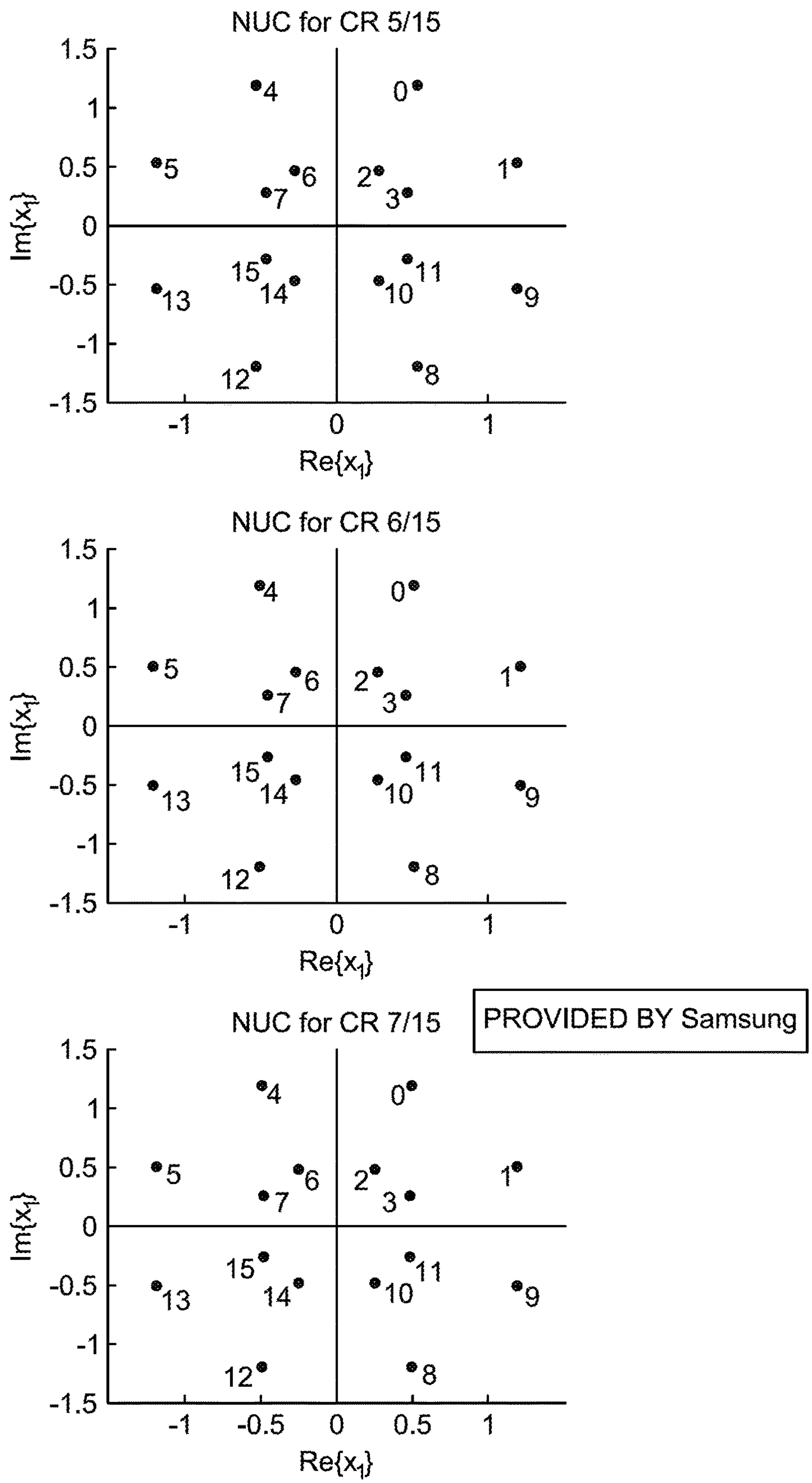
FIG. 83 is a diagram that illustrates an example of a constellation in a case where a modulation scheme is 16 QAM.
Figure 83:
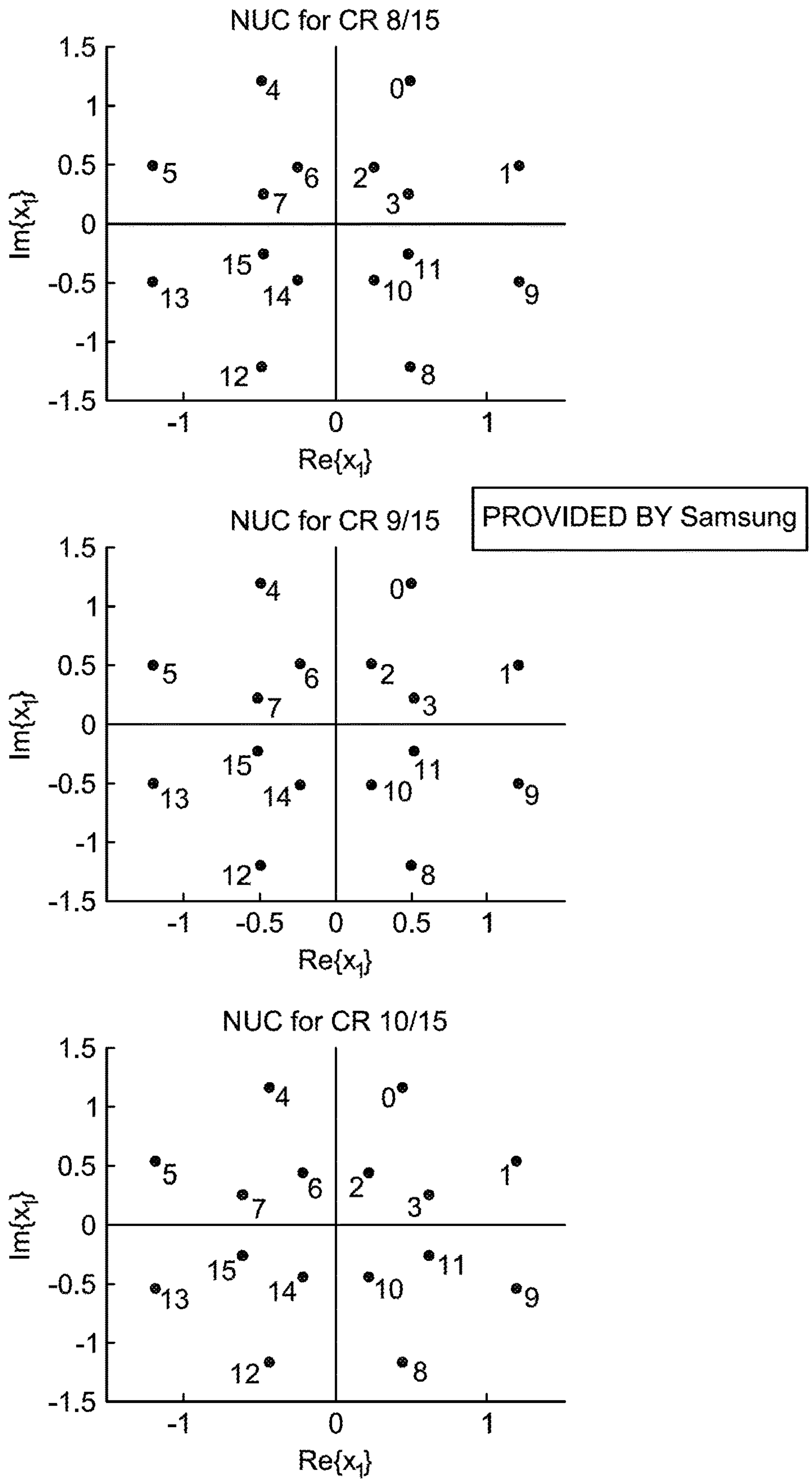
Figure 83:
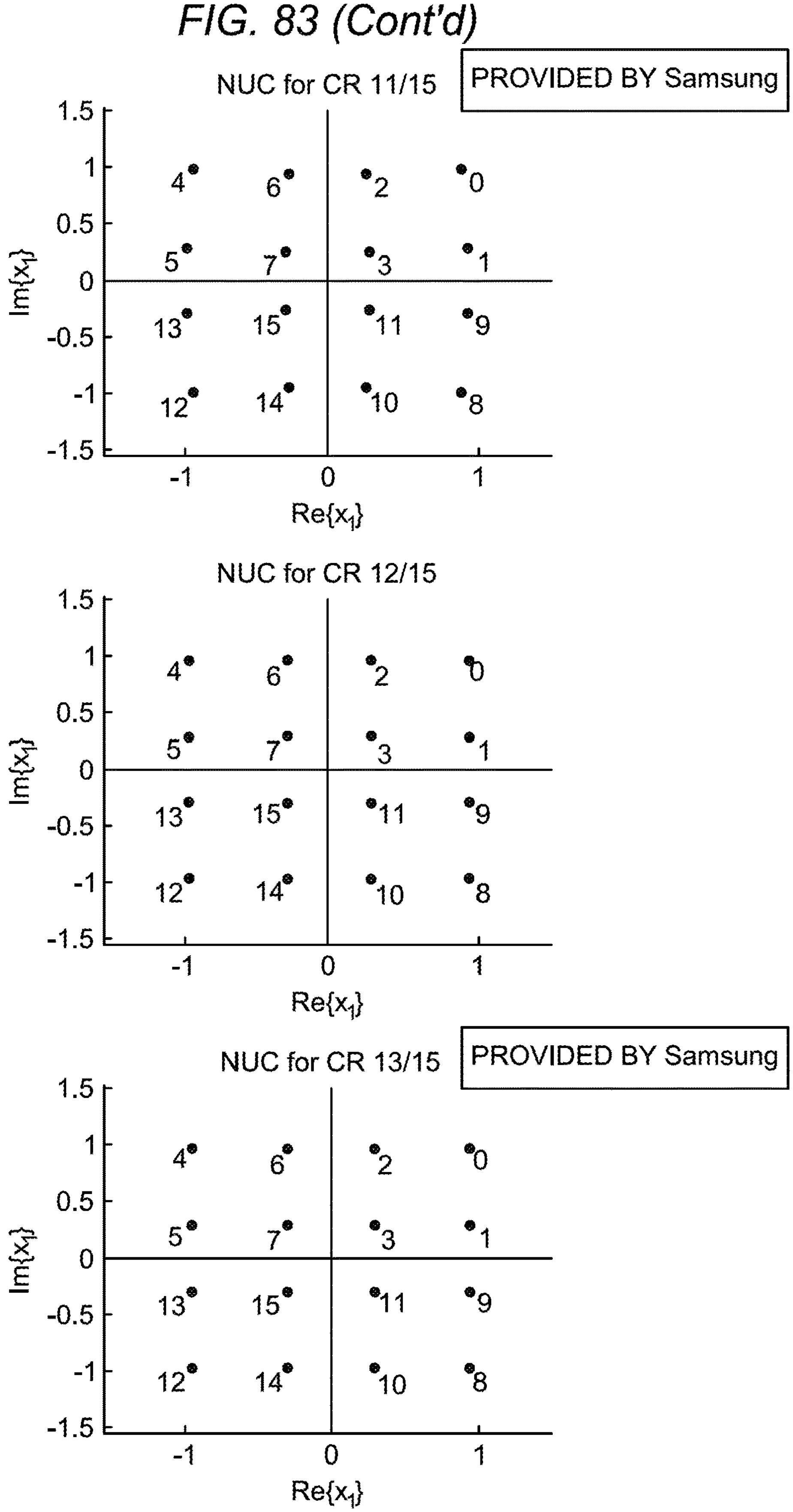

FIG. 83 is a diagram that illustrates an example of a constellation of the 2D NUC for each of 9 types of coding rates r (=5/15, 6/15, 7/15, 8/15, 9/15, 10/15, 11/15, 12/15, and 13/15) of LDPC codes in a case where the modulation scheme is the 16 QAM.

Figure 84:
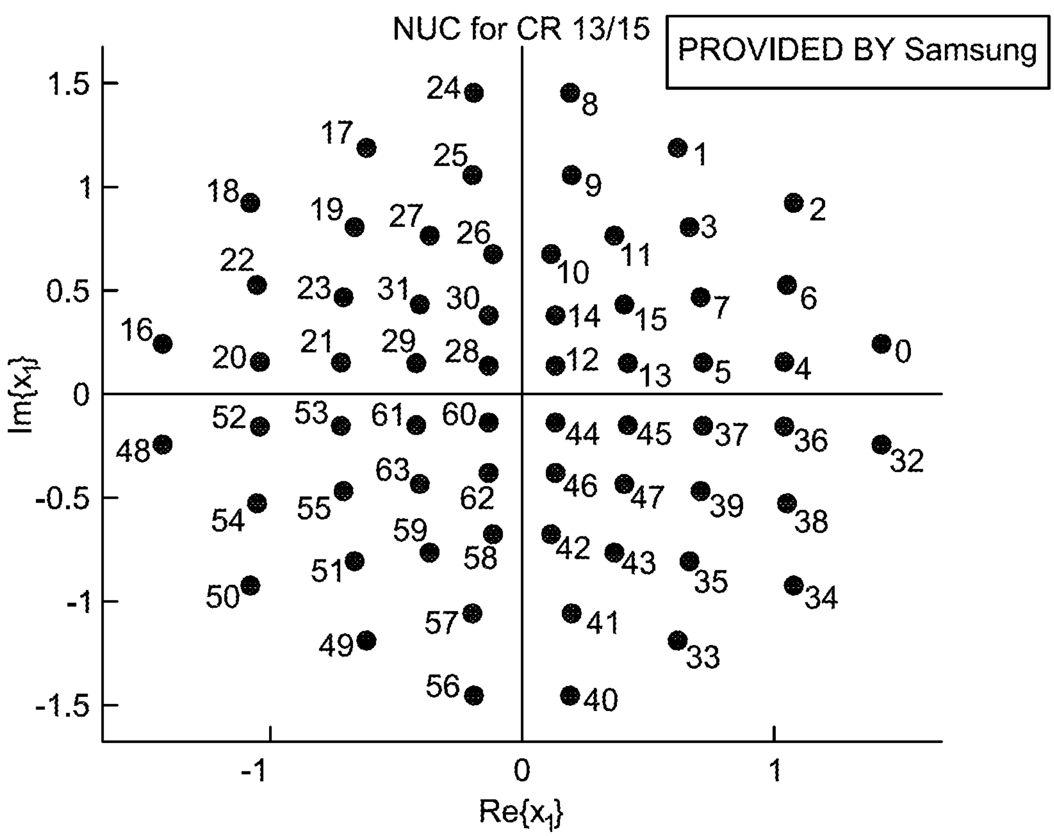
FIG. 84 is a diagram that illustrates an example of a constellation in a case where a modulation scheme is 64 QAM.

FIG. 84 is a diagram that illustrates an example of a constellation of the 2D NUC for each of 9 types of coding rates r (=5/15, 6/15, 7/15, 8/15, 9/15, 10/15, 11/15, 12, 15, and 13/15) of LDPC codes in a case where the modulation scheme is the 64 QAM.

Figure 85:
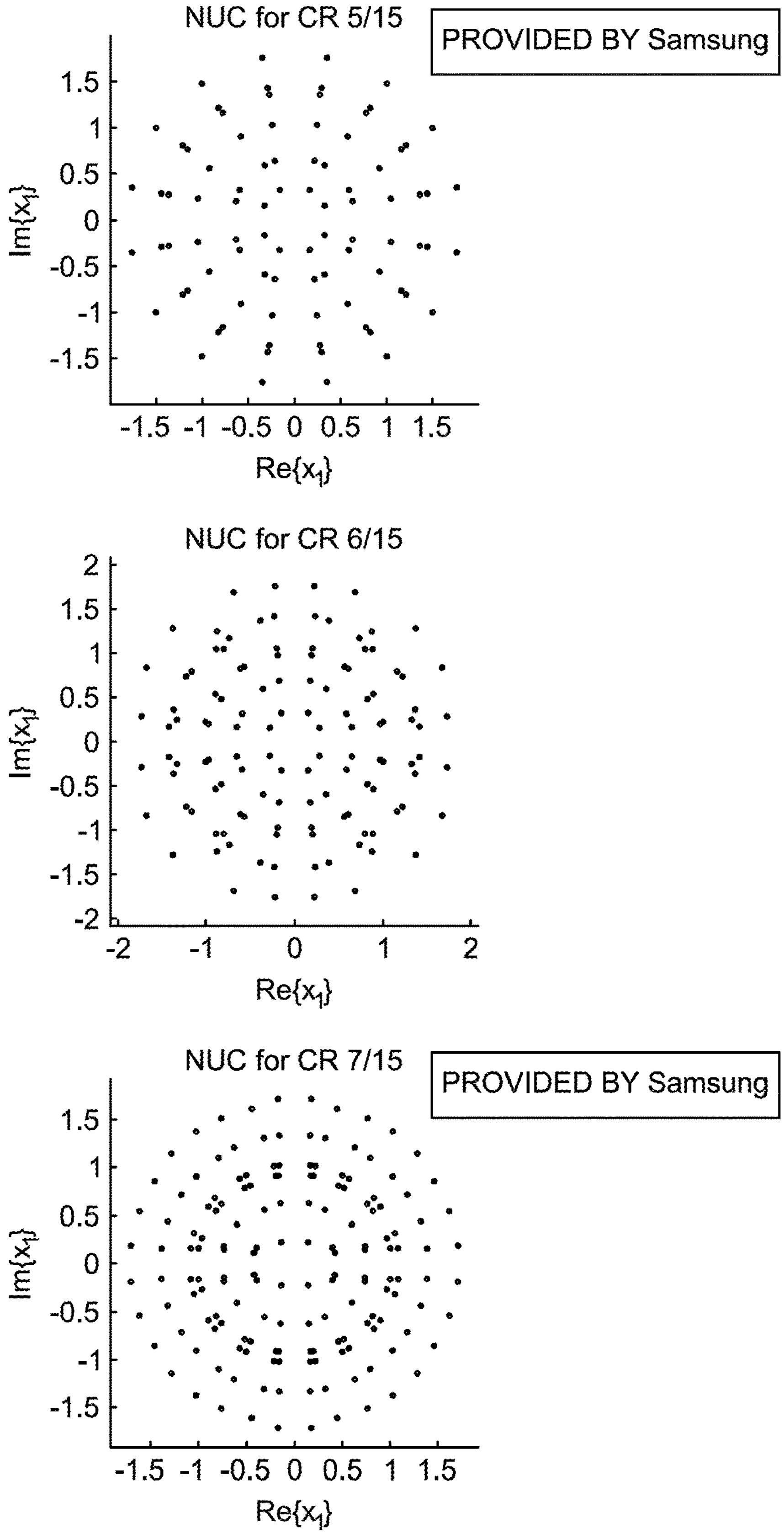
FIG. 85 is a diagram that illustrates an example of a constellation in a case where a modulation scheme is 256 QAM.
Figure 85:
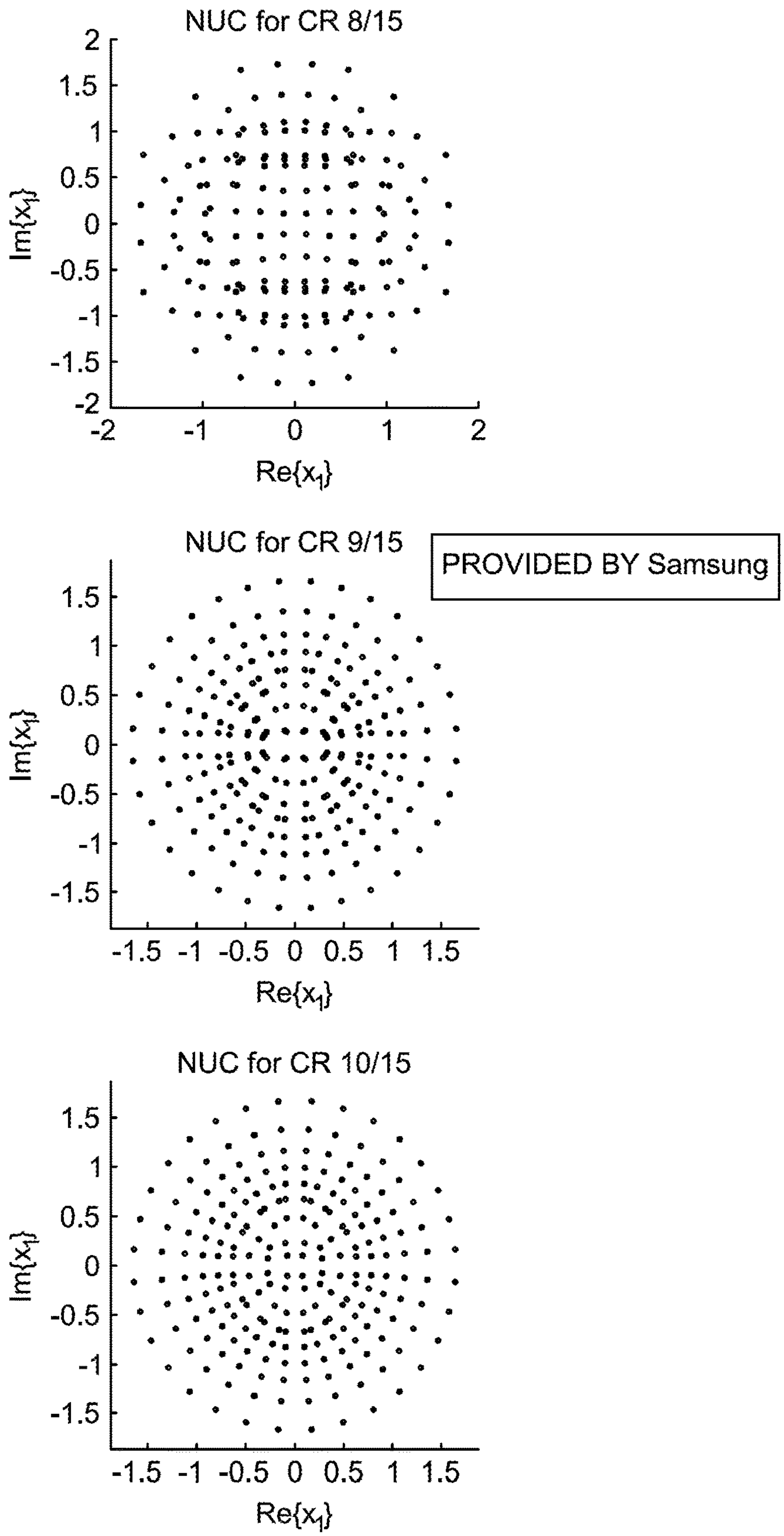
Figure 85:
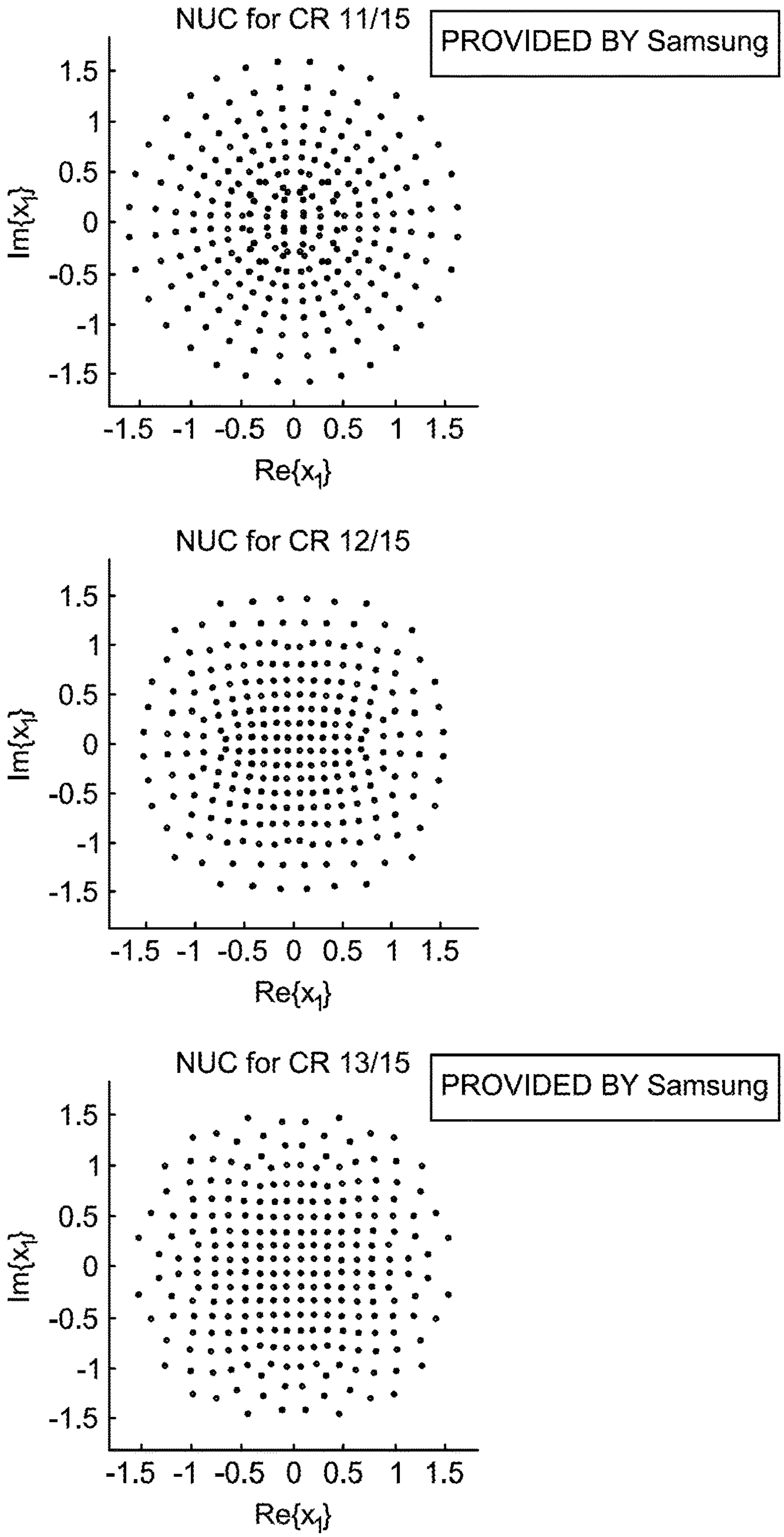

FIG. 85 is a diagram that illustrates an example of a constellation of the 2D NUC for each of 9 types of coding rates r (=5/15, 6/15, 7/15, 8/15, 9/15, 10/15, 11/15, 12/15, and 13/15) of LDPC codes in a case where the modulation scheme is the 256 QAM.

Figure 86:
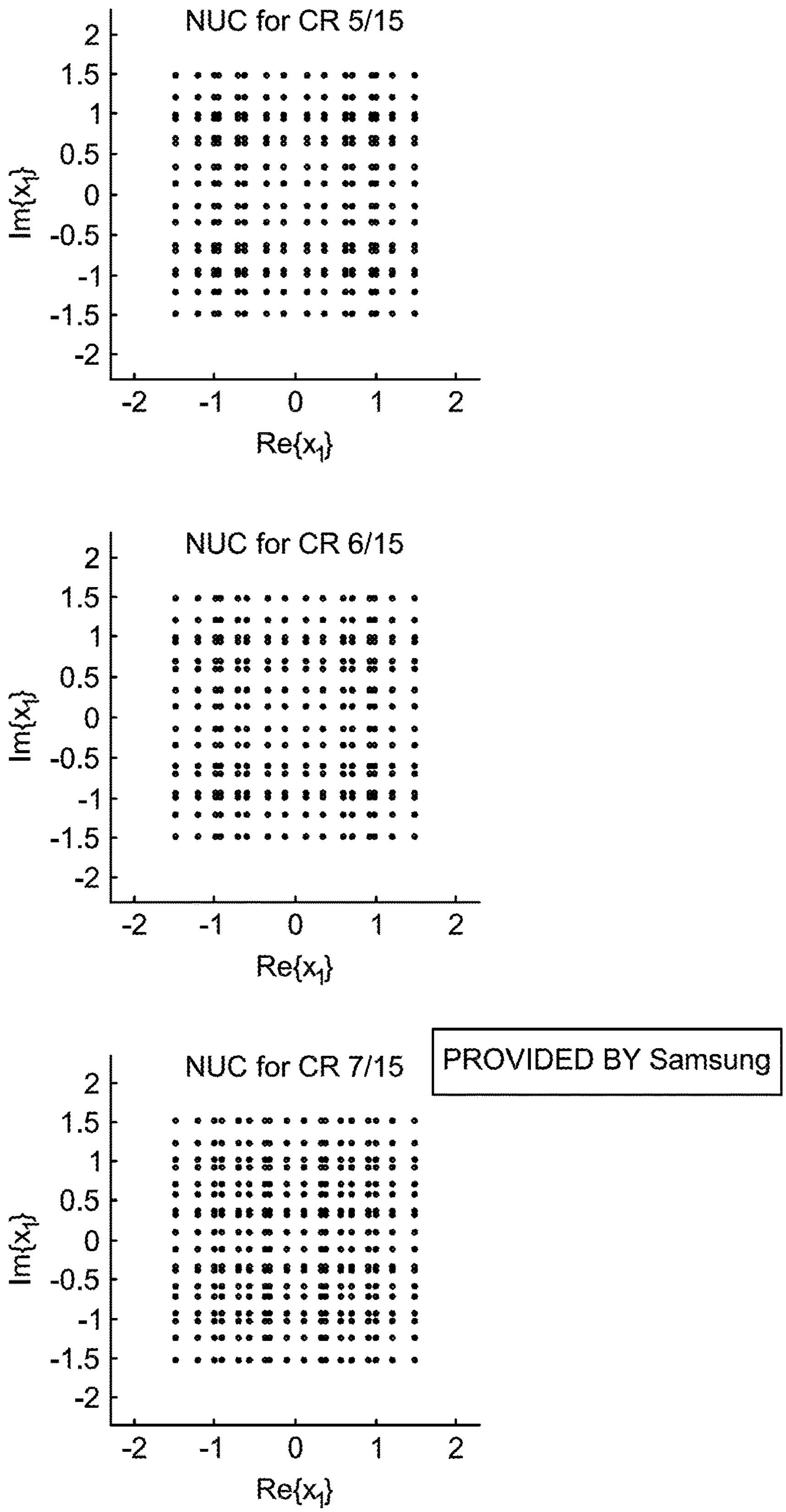
FIG. 86 is a diagram that illustrates an example of a constellation in a case where a modulation scheme is 1024 QAM.

FIG. 86 is a diagram that illustrates an example of a constellation of the 1D NUC for each of 9 types of coding rates r (=5/15, 6/15, 7/15, 8/15, 9/15, 10/15, 11/15, 12/15, and 13/15) of LDPC codes in a case where the modulation scheme is 1024 QAM.

In FIGS. 83 to 86, the horizontal axis and the vertical axis are respectively an I axis and a Q axis, and $Re\{x_1\}$ and $Im\{x_1\}$ respectively represent a real part and an imaginary part of a signal point $x_1$ as coordinates of the signal point $x_1$.

In addition, in FIGS. 83 to 86, a numerical value written after "for CR" represents the coding rate r of the LDPC code.

FIG. 87 is a diagram that illustrates an example of coordinates of a signal point of the UC that is used in common to 9 types of coding rates r (=5/15, 6/15, 7/15, 8/15, 9/15, 10/15, 11/15, 12, 15, and 13/15) of LDPC codes in a case where the modulation scheme is the QPSK.

In FIG. 87, "Input cell word y" represents a 2-bit symbol that is mapped into a UC of the QPSK, and "Constellation point $z_q$" represents the coordinates of a signal point $z_q$. In addition, an index q of the signal point $z_q$ represents a discrete time between symbols (a time interval between a certain symbol and a next symbol).

In FIG. 87, the coordinates of the signal point $z_q$ are represented in the form of a complex number, and i represents an imaginary unit ($\sqrt{(-1)}$).

FIG. 88 is a diagram that illustrates an example of the coordinates of a signal point of the 2D NUC used for 9 types of coding rates r (=5/15, 6/15, 7/15, 8/15, 9/15, 10/15, 11/15, 12/15, and 13/15) of the LDPC codes in a case where the modulation scheme is the 16 QAM.

FIG. 89 is a diagram that illustrates an example of the coordinates of a signal point of the 2D NUC used for 9 types of coding rates r (=5/15, 6/15, 7/15, 8/15, 9/15, 10/15, 11/15, 12/15, and 13/15) of LDPC codes in a case where the modulation scheme is the 64 QAM.

FIGS. 90 and 91 are diagrams that illustrate an example of the coordinates of a signal point of the 2D NUC used for 9 types of coding rates r (=5/15, 6/15, 7/15, 8/15, 9/15, 10/15, 11/15, 12, 15, and 13/15) of LDPC codes in a case where the modulation scheme is the 256 QAM.

In FIGS. 88 to 91, NUC_$2^m$_r represents the coordinates of a signal point of the 2D NUC used in a case where the modulation scheme is the $2^m$ QAM, and the coding rate of LDPC codes is r.

In FIGS. 88 to 91, similarly to the case illustrated in FIG. 87, the coordinates of the signal point $z_q$ are represented in the form of a complex number, and i represents an imaginary unit.

In FIGS. 88 to 91, w #k represents the coordinates of a signal point in a first quadrant of the constellation.

In the 2D NUC, a signal point in a second quadrant of the constellation is arranged at a position acquired by moving the signal point disposed in the first quadrant symmetrically with respect to the Q axis, and a signal point in a third quadrant of the constellation is arranged at a position acquired by moving the signal point disposed in the first quadrant symmetrically with respect to the origin. In addition, a signal point in a fourth quadrant of the constellation is arranged at a position acquired by moving the signal point disposed in the first quadrant symmetrically with respect to the I axis.

Here, in a case where the modulation scheme is the $2^m$ QAM, m bits are configured as one symbol, and one symbol is mapped into a signal point corresponding to the symbol.

The m-bit symbol, for example, is represented by an integer value of 0 to $2^m-1$, and, when $b=2^m/4$, symbols y(0), y(1), . . . , y($2^m-1$) represented by the integer value of 0 to $2^m-1$ can be classified into four symbols of y(0) to y(b−1), y(b) to y(2b−1), y(2b) to y(3b−1), and y(3b) to y(4b−1).

In FIGS. 88 to 91, a suffix k of w #k takes an integer value in the range of 0 to b−1, and w #k represents the coordinates of a signal point corresponding to a symbol y(k) in the range of the symbols y(0) to y(b−1).

In addition, the coordinates of a signal point corresponding to a symbol y(k+b) in the range of the symbols y(b) to y(2b−1) are represented by −conj (w #k), and the coordinates of a signal point corresponding to a symbol y(k+2b) in the range of the symbols y(2b) to y(3b−1) are represented by conj (w #k). Furthermore, the coordinates of a signal point corresponding to a symbol y(k+3b) in the range of the symbols y(3b) to y(4b−1) are represented by −w #k.

Here, conj (w #k) represents a complex conjugate of w #k.

For example, in a case where the modulation scheme is the 16 QAM, the symbols y(0), y(1), . . . , y(15) of m=4 bits are classified into four symbols of y(0) to y(3), y(4) to y(7), y(8) to y(11), and y(12) to y(15) with $b=2^4/4=4$.

Then, among the symbols y(0) to y(15), for example, the symbol y(12) is a symbol y(k+3b)=y(0+3×4) in the range of the symbols y(3b) to y(4b−1), and k=0. Accordingly, the coordinates of the signal point corresponding to the symbol y(12) are −w #k=−w0.

Now, when the coding rate r of the LDPC code, for example, is 9/15, by referring to FIG. 88, in a case where the modulation scheme is the 16 QAM, and the coding rate r is 9/15, w0 of (NUC_16_9/15) is 0.4967+1.1932i. Accordingly, the coordinates −w0 of the signal point corresponding to the symbol y(12) are −(0.4967+1.1932i).

FIG. 92 is a diagram that illustrates an example of the coordinates of a signal point of the 1D NUC used for 9 types of coding rates r (=5/15, 6/15, 7/15, 8/15, 9/15, 10/15, 11/15, 12, 15, and 13/15) of LDPC codes in a case where the modulation scheme is the 1024 QAM.

In FIG. 92, a column of NUC_1k_r represents a value taken by u #k representing the coordinates of a signal point of the 1D NUC used in a case where the modulation scheme is the 1024 QAM, and the coding rate of LDPC codes is r.

u #k represents the real part $Re(z_q)$ and the imaginary part $Im(z_q)$ of a complex number as the coordinates of the signal point $z_q$ of the 1D NUC.

FIG. 93 is a diagram that illustrates a relation between the symbol y and u #k as each of the real part $Re(z_q)$ and the imaginary part $Im(z_q)$ of the complex number representing the coordinates of the signal point $z_q$ of the 1D NUC corresponding to the symbol y.

Now, a 10-bit symbol y of the 1024 QAM is assumed to be represented by $y_{0,q}$, $y_{1,q}$, $y_{2,q}$, $y_{3,q}$, $y_{4,q}$, $y_{5,q}$, $y_{6,q}$, $y_{7,q}$, $y_{8,q}$, and $y_{9,q}$ from the first bit (the most significant bit).

A of FIG. 93 illustrates a correspondence relation between 5 odd-numbered bits $y_{0,q}$, $y_{2,q}$, $y_{4,q}$, $y_{6,q}$, $y_{8,q}$ of the symbol y and u #k representing the real part $Re(z_q)$ (of the coordinates) of a signal point $z_q$ corresponding to the symbol y.

B of FIG. 93 illustrates a correspondence relation between 5 even-numbered bits $y_{1,q}$, $y_{3,q}$, $y_{5,q}$, $y_{7,q}$, and $y_{9,q}$ of the symbol y and u #k representing the imaginary part $Im(z_q)$ (of the coordinates) of a signal point $z_q$ corresponding to the symbol y.

For example, in a case where the 10-bit symbol y=($y_{0,q}$, $y_{1,q}$, $y_{2,q}$, $y_{3,q}$, $y_{4,q}$, $y_{5,q}$, $y_{6,q}$, $y_{7,q}$, $y_{8,q}$, $y_{9,q}$) of the 1024

QAM is (0, 0, 1, 0, 0, 1, 1, 1, 0, 0), the 5 odd-numbered bits ($y_{0,q}$, $y_{2,q}$, $y_{4,q}$, $y_{6,q}$, $y_{8,q}$) are (0, 1, 0, 1, 0), and the 5 even-numbered bits ($y_{1,q}$, $y_{3,q}$, $y_{5,q}$, $y_{7,q}$, and $y_{9,q}$) are (0, 0, 1, 1, 0).

In A of FIG. 93, the 5 odd-numbered bits (0, 1, 0, 1, 0) are associated with u3, and thus, the real part $Re(z_q)$ of the signal point $z_q$ corresponding to the symbol y=(0, 0, 1, 0, 0, 1, 1, 1, 0, 0) is u3.

In addition, in B of FIG. 93, the 5 even-numbered bits (0, 0, 1, 1, 0) are associated with u11, and thus, the imaginary part $Im(z_q)$ of the signal point $z_q$ corresponding to the symbol y=(0, 0, 1, 0, 0, 1, 1, 1, 0, 0) is u11.

Meanwhile, in a case where the coding rate r of the LDPC code, for example, is 7/15, by referring to FIG. 92 described above, for the 1D NUC (NUC_1 k_7/15) used in a case where the modulation scheme is the 1024 QAM and the coding rate r of LDPC codes is 7/15, u3 is 1.1963, and u11 is 6.9391.

Accordingly, the real part $Re(z_q)$ of the signal point $z_q$ corresponding to the symbol y=(0, 0, 1, 0, 0, 1, 1, 1, 0, 0) is u3 (=1.1963), and $Im(z_q)$ is u11 (=6.9391). As a result, the coordinates of the signal point $z_q$ corresponding to the symbol y=(0, 0, 1, 0, 0, 1, 1, 1, 0, 0) are represented by 1.1963+6.9391i.

Note that the signal points of the 1D NUC are arranged in a grid form on a straight line parallel to the I axis or a straight line parallel to the Q axis. However, an interval between the signal points is not constant. In addition, in the transmission of the signal point (the mapped data), average power of the signal points on the constellation is normalized. When a root mean square value of absolute values of all the signal points (the coordinates thereof) on the constellation is represented by $P_{ave}$, the normalization is performed by multiplying each signal point $z_q$ on the constellation by a reciprocal $1/(\sqrt{P_{ave}})$ of the square root $\sqrt{P_{ave}}$ of the root mean square value $P_{ave}$.

According to the constellations described above with reference to FIGS. 83 to 93, it is confirmed that an excellent error rate is acquired.

<Block Interleaver 25>

Figure 94:
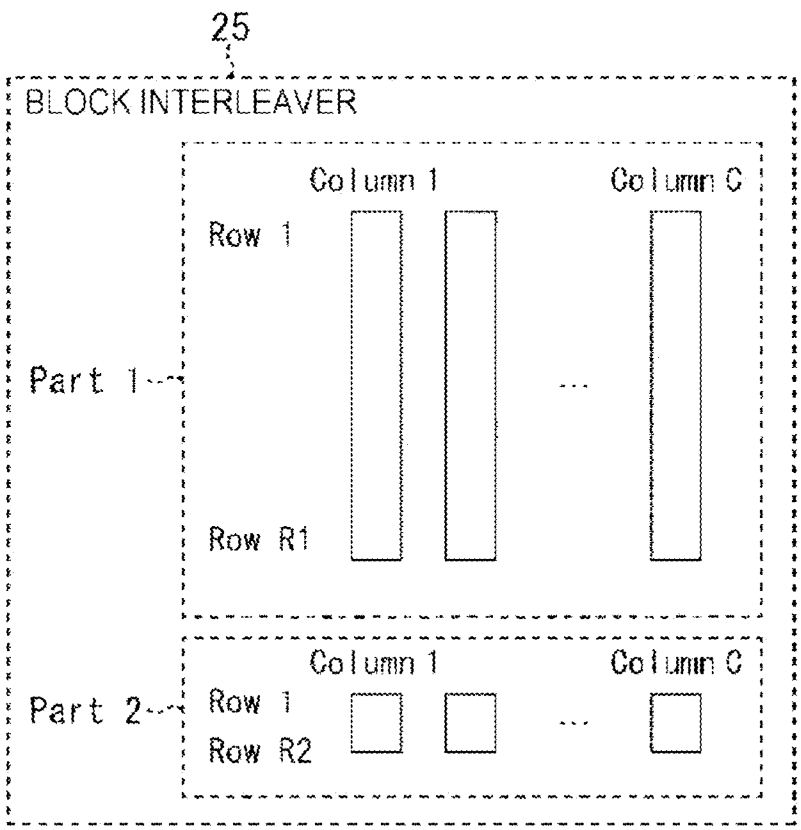
FIG. 94 is a block diagram that illustrates a configuration example of a block interleaver 25.

FIG. 94 is a block diagram that illustrates a configuration example of the block interleaver 25 illustrated in FIG. 9.

The block interleaver 25 includes a storage area called a part 1 and a storage area called a part 2.

Each of the parts 1 and 2 is configured by aligning columns as storage areas each storing one bit in the row (horizontal) direction and storing a predetermined number of bits in the column (vertical) direction that correspond to the same number C as the number m of bits of a symbol in the row direction.

When the number of bits (hereinafter, also referred to as apart column length) that are stored in the column direction by the column of the part 1 is represented by R1, and the part column length of the column of the part 2 is represented by R2, (R1+R2)×C is equal to the code length N (64800 bits or 16200 bits in the present embodiment) of an LDPC code that is a block interleave target.

In addition, the part column length R1 is equal to a multiple of 360 bits that corresponds to the unit size P, and the part column length R2 is equal to a remainder acquired when a sum (hereinafter, also referred to as a column length) R1+R2 of the part column length R1 of the part 1 and the part column length R2 of the part 2 is divided by 360 bits corresponding to the unit size P.

Here, the column length R1+R2 is equal to a value acquired by dividing the code length N of the LDPC code that is the block interleave target by the number m of bits of the symbol.

For example, in a case where 16 QAM is employed as the modulation scheme for the LDPC code of which the code length N is 16200 bits, the number m of bits of the symbol is 4 bits, and accordingly, the column length R1+R2 is 4050 (=16200/4) bits.

In addition, since a remainder acquired when the column length R1+R2=4050 is divided by 360 bits used as the unit size P is 90, the part column length R2 of the part 2 is 90 bits.

Furthermore, the part column length R1 of the part 1 is R1+R2−R2=4050−90=3960 bits.

FIG. 95 is a diagram that illustrates the number C of columns of the parts 1 and 2 and the part column lengths (the number of rows) R1 and R2 for a combination of the code length N and the modulation scheme.

FIG. 95 illustrates the number C of columns of the parts 1 and 2 and the part column lengths R1 and R2 for combinations of LDPC codes in a case where the LDPC codes respectively have code lengths N of 16200 bits and 64800 bits and the modulation schemes of QPSK, 16 QAM, 64 QAM, 256 QAM, and 1024 QAM.

Figure 96:
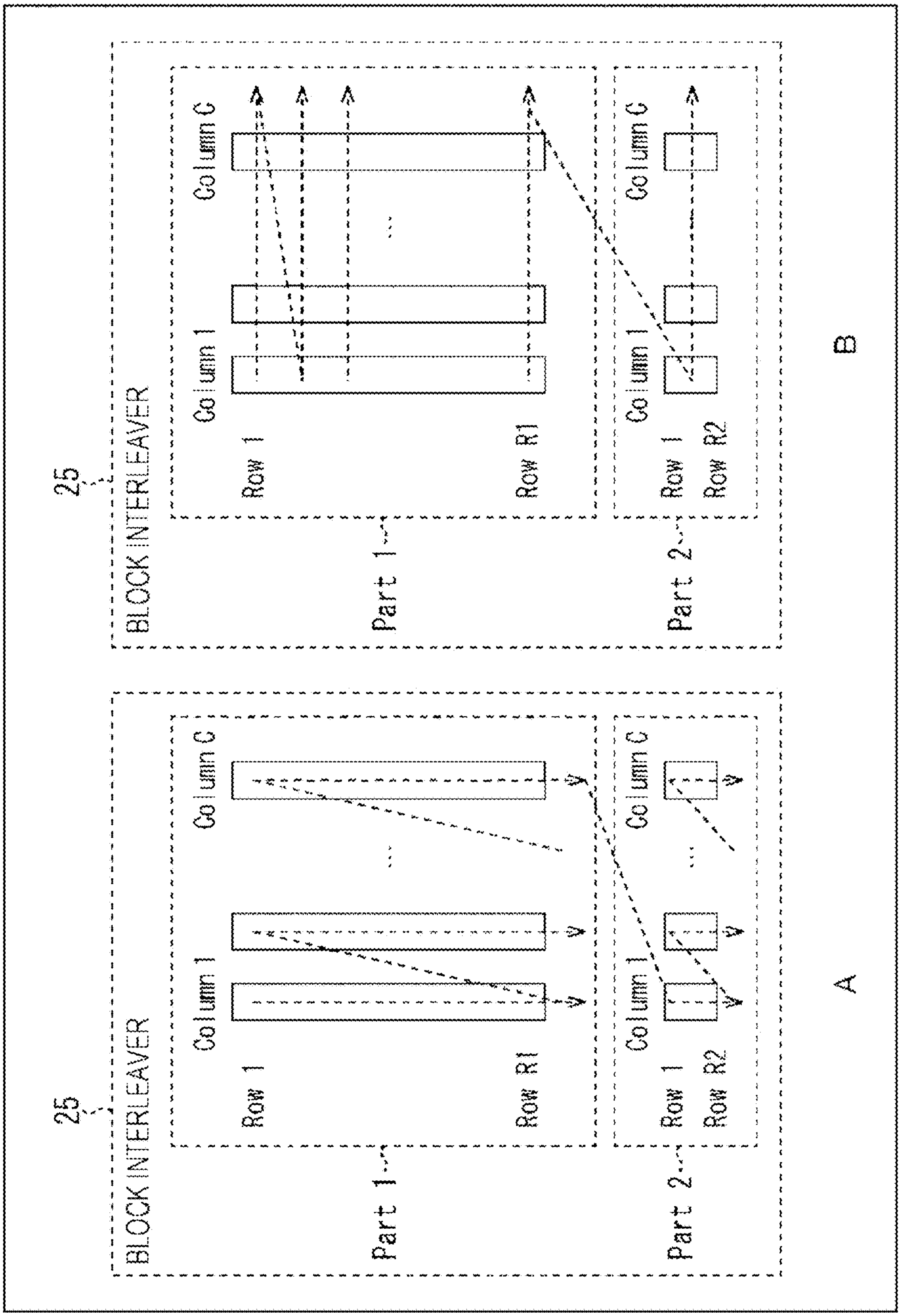
FIG. 96 is a diagram that illustrates block interleave performed by a block interleaver 25.

FIG. 96 is a diagram that illustrates the block interleave performed by the block interleaver 25 illustrated in FIG. 94.

The block interleaver 25 performs the block interleave by writing and reading LDPC codes for the parts 1 and 2.

In other words, in the block interleave, as illustrated in A of FIG. 96, writing of code bits of LDPC codes of one code word in the downward direction (in the column direction) from the top of the columns of the part 1 is performed from the left side toward a rightward column.

Then, when the writing of the code bits is completed up to the bottom of the rightmost column (C-th column) of the columns of the part 1, writing of the remaining code bits in the downward direction (in the column direction) from the top of the column of the part 2 is performed from the left side toward a rightward column.

Thereafter, when the writing of the code bits is completed up to the bottom of the rightmost column (C-th column) of the columns of the part 2, as illustrated in B of FIG. 96, the code bits are read from the 1st rows of all the C columns of the part 1 in the row direction in units of C=m bits.

Then, the reading of the code bits from all the C columns of the part 1 is sequentially performed toward a row disposed on the lower side, and, when the reading is completed up to an R1-th row that is the last row, the code bits are read from the 1st rows of all the C columns of the part 2 in the row direction in units of C=m bits.

The reading of the code bits from all the C columns of the part 2 is sequentially performed toward a row disposed on the lower side, and the reading is performed up to an R2-th row that is the last row.

As above, the code bits read from the parts 1 and 2 in units of m bits are supplied to the mapper 117 (FIG. 8) as the symbol.

<Group-Wise Interleave>

Figure 97:
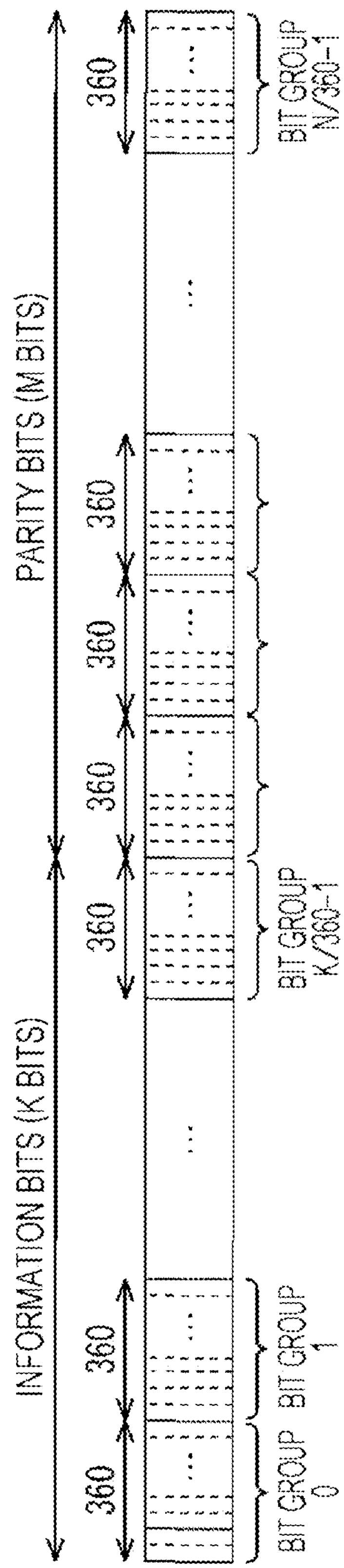
FIG. 97 is a diagram that illustrates group-wise interleave performed by a group-wise interleaver 24.

FIG. 97 is a diagram that illustrates group-wise interleave performed by the group-wise interleaver 24 illustrated in FIG. 9.

In the group-wise interleave, 360 bits of one segment are used as the bit group, wherein the LDPC code of one code word is divided into segments from the head in units of 360 bits that is equal to the unit size P, and the LDPC code of one code word is interleaved according to a predetermined pattern (hereinafter, also referred to as a GW pattern) in units of bit groups.

Here, when the LDPC code of one code word is segmented into the bit groups, an (i+1)-th bit group from the head will be also referred to as a bit group i.

In a case where the unit size P is 360, for example, the LDPC code of which the code length N is 1800 bits is segmented into 5 (=1800/360) bit groups of bit groups 0, 1, 2, 3, and 4. In addition, for example, the LDPC code of which the code length N is 16200 bits is segmented into 45 (=16200/360) bit groups of bit groups 0, 1, . . . , and 44, and the LDPC code of which the code length N is 64800 bits is segmented into 180 (=64800/360) bit groups of bit groups 0, 1, . . . , 179.

In addition, hereinafter, the GW pattern is assumed to be represented by a sequence of numbers indicating a bit group. For example, for a LDPC code of which the code length N is 1800 bits, for example, the GW patterns 4, 2, 0, 3, 1 represent that a sequence of bit groups 0, 1, 2, 3, and 4 is interleaved (rearranged) into a sequence of bit groups 4, 2, 0, 3, and 1.

The GW pattern can be set at least for each code length N of the LDPC code.

FIG. 98 is a diagram that illustrates a first example of the GW pattern for an LDPC code of which the code length N is 64 kbits.

According to the GW pattern illustrated in FIG. 98, a sequence of bit groups 0 to 179 of the LDPC code of 64 kbits is interleaved into a sequence of the following bit groups.

39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, 88

FIG. 99 is a diagram that illustrates a second example of the GW pattern for an LDPC code of which the code length N is 64 kbits.

According to the GW pattern illustrated in FIG. 99, a sequence of bit groups 0 to 179 of the LDPC code of 64 kbits is interleaved into a sequence of the following bit groups.

6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, 165

Figure 100:
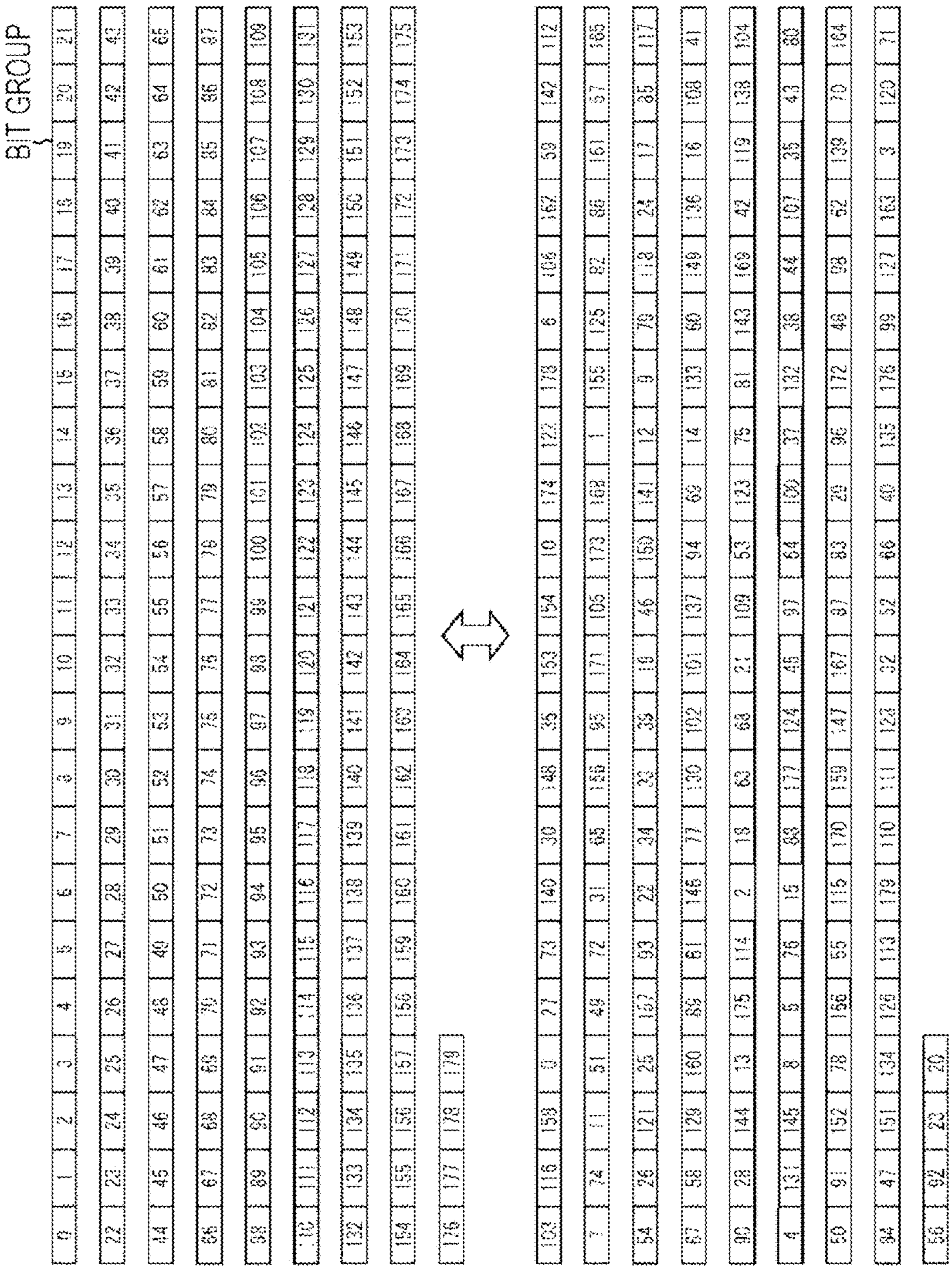
FIG. 100 is a diagram that illustrates a third example of a GW pattern for an LDPC code having a code length N of 64 k bits.

FIG. 100 is a diagram that illustrates a third example of the GW pattern for an LDPC code of which the code length N is 64 kbits.

According to the GW pattern illustrated in FIG. 100, a sequence of bit groups 0 to 179 of the LDPC code of 64 kbits is interleaved into a sequence of the following bit groups.

103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, 20

Figure 101:
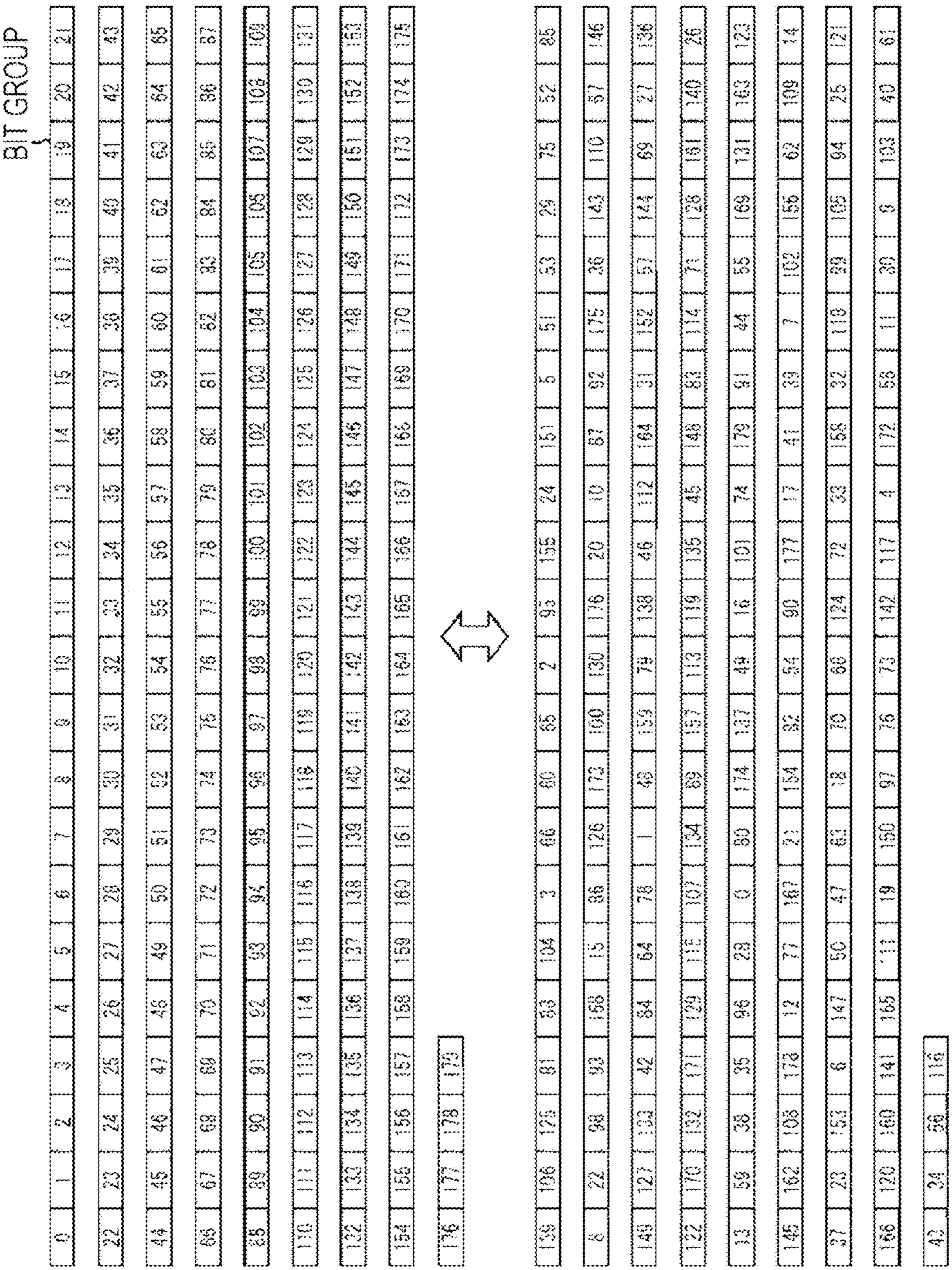
FIG. 101 is a diagram that illustrates a fourth example of a GW pattern for an LDPC code having a code length N of 64 k bits.

FIG. 101 is a diagram that illustrates a fourth example of the GW pattern for an LDPC code of which the code length N is 64 kbits.

According to the GW pattern illustrated in FIG. 101, a sequence of bit groups 0 to 179 of the LDPC code of 64 kbits is interleaved into a sequence of the following bit groups.

139, 106, 125, 81, 88, 104, 3, 66, 60, 65, 2, 95, 155, 24, 151, 5, 51, 53, 29, 75, 52, 85, 8, 22, 98, 93, 168, 15, 86, 126, 173, 100, 130, 176, 20, 10, 87, 92, 175, 36, 143, 110, 67, 146, 149, 127, 133, 42, 84, 64, 78, 1, 48, 159, 79, 138, 46, 112, 164, 31, 152, 57, 144, 69, 27, 136, 122, 170, 132, 171, 129, 115, 107, 134, 89, 157, 113, 119, 135, 45, 148, 83, 114, 71, 128, 161, 140, 26, 13, 59, 38, 35, 96, 28, 0, 80, 174, 137, 49, 16, 101, 74, 179, 91, 44, 55, 169, 131, 163, 123, 145, 162, 108, 178, 12, 77, 167, 21, 154, 82, 54, 90, 177, 17, 41, 39, 7, 102, 156, 62, 109, 14, 37, 23, 153, 6, 147, 50, 47, 63, 18, 70, 68, 124, 72, 33, 158, 32, 118, 99, 105, 94, 25, 121, 166, 120, 160, 141, 165, 111, 19, 150, 97, 76, 73, 142, 117, 4, 172, 58, 11, 30, 9, 103, 40, 61, 43, 34, 56, 116

Figure 102:
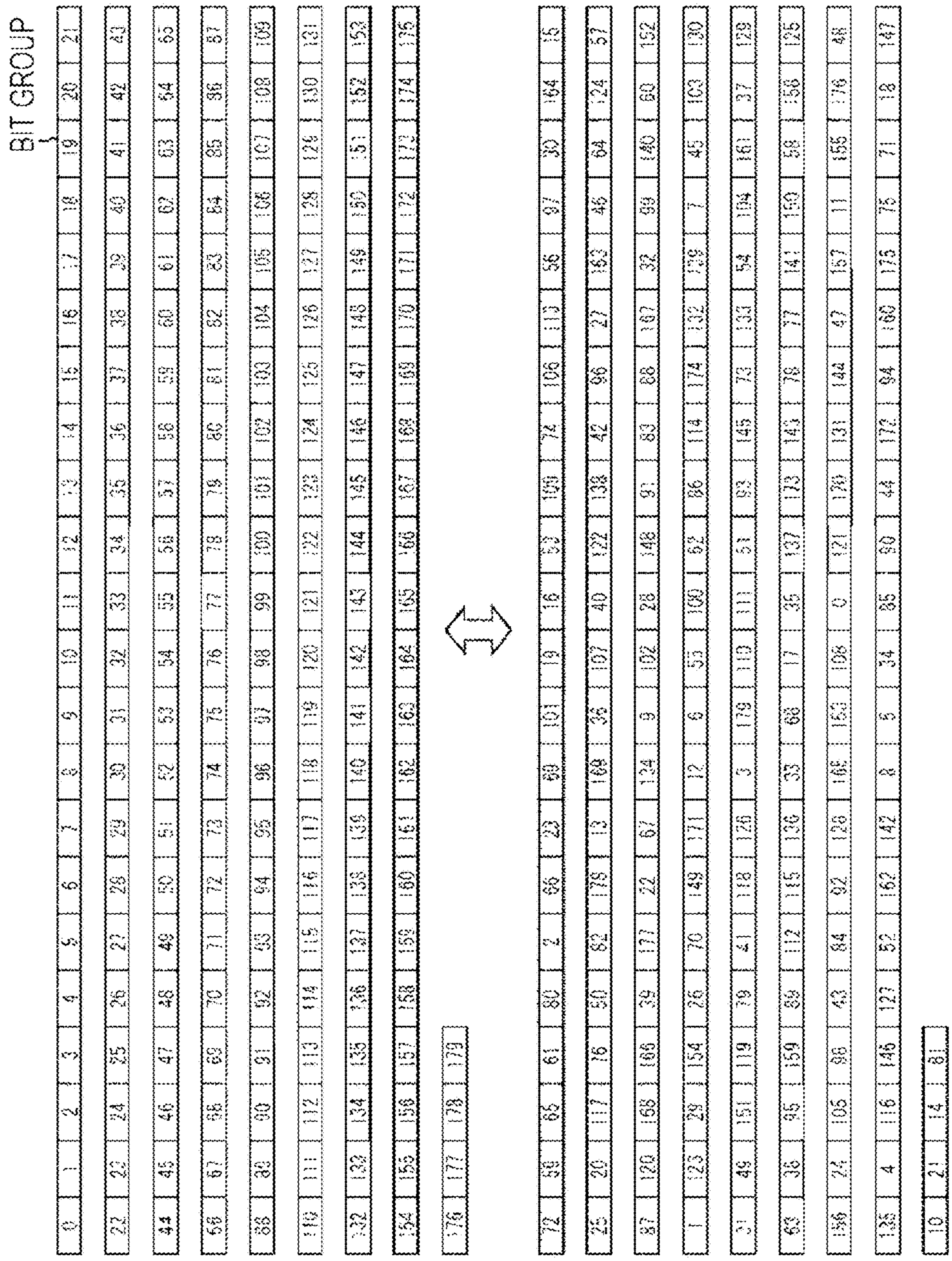
FIG. 102 is a diagram that illustrates a fifth example of a GW pattern for an LDPC code having a code length N of 64 k bits.

FIG. 102 is a diagram that illustrates a fifth example of the GW pattern for an LDPC code of which the code length N is 64 kbits.

According to the GW pattern illustrated in FIG. 102, a sequence of bit groups 0 to 179 of the LDPC code of 64 kbits is interleaved into a sequence of the following bit groups.

72, 59, 65, 61, 80, 2, 66, 23, 69, 101, 19, 16, 53, 109, 74, 106, 113, 56, 97, 30, 164, 15, 25, 20, 117, 76, 50, 82, 178, 13, 169, 36, 107, 40, 122, 138, 42, 96, 27, 163, 46, 64, 124, 57, 87, 120, 168, 166, 39, 177, 22, 67, 134, 9, 102, 28, 148, 91, 83, 88, 167, 32, 99, 140, 60, 152, 1, 123, 29, 154, 26, 70, 149, 171, 12, 6, 55, 100, 62, 86, 114, 174, 132, 139, 7, 45, 103, 130, 31, 49, 151, 119, 79, 41, 118, 126, 3, 179, 110, 111, 51, 93, 145, 73, 133, 54, 104, 161, 37, 129, 63, 38, 95, 159, 89, 112, 115, 136, 33, 68, 17, 35, 137, 173, 143, 78, 77, 141, 150, 58, 158, 125, 156, 24, 105, 98, 43, 84, 92, 128, 165, 153, 108, 0, 121, 170, 131, 144, 47, 157, 11, 155, 176, 48, 135, 4, 116, 146, 127, 52, 162, 142, 8, 5, 34, 85, 90, 44, 172, 94, 160, 175, 75, 71, 18, 147, 10, 21, 14, 81

Figure 103:
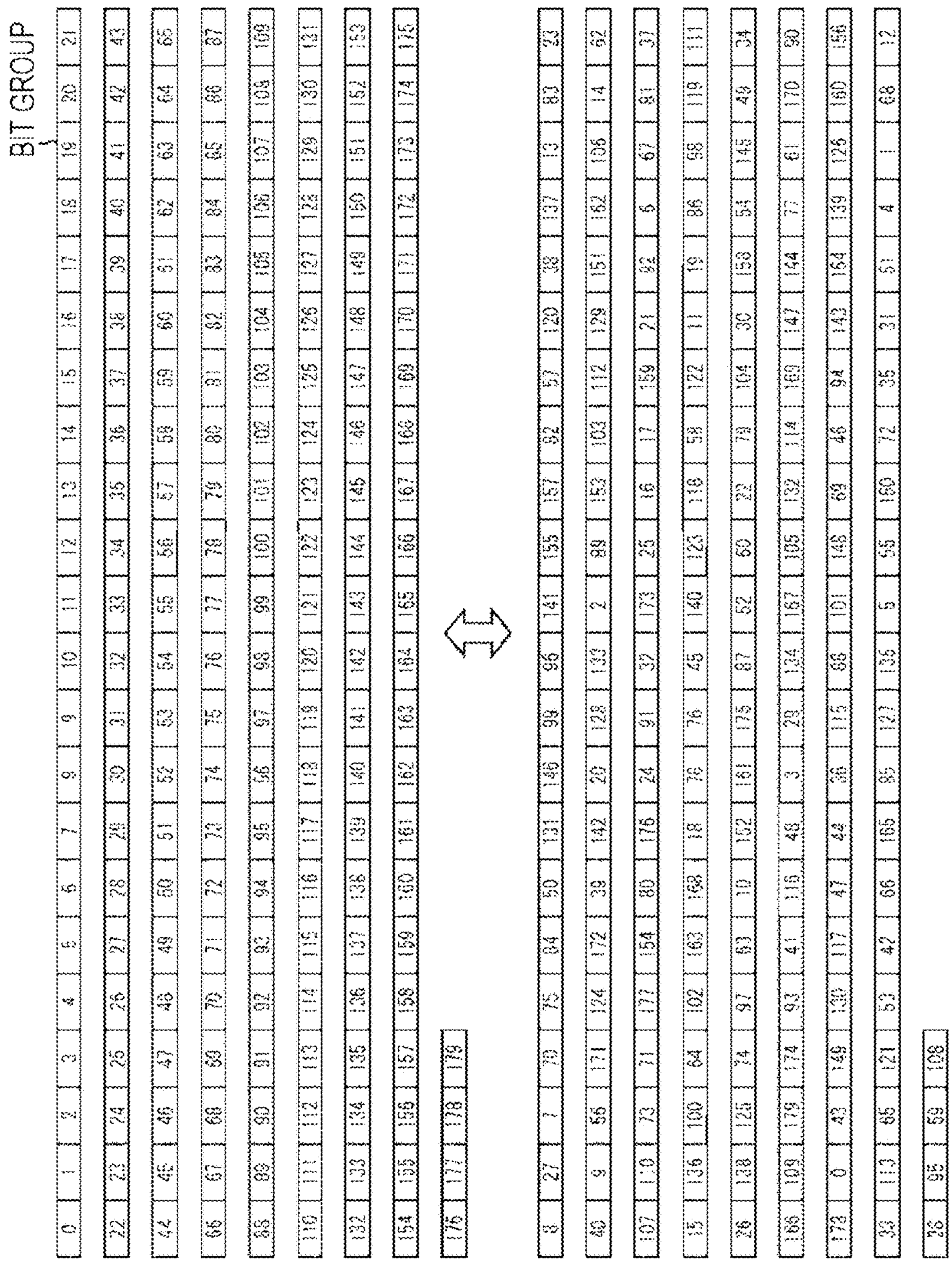
FIG. 103 is a diagram that illustrates a sixth example of a GW pattern for an LDPC code having a code length N of 64 k bits.

FIG. 103 is a diagram that illustrates a sixth example of the GW pattern for an LDPC code of which the code length N is 64 kbits.

According to the GW pattern illustrated in FIG. 103, a sequence of bit groups 0 to 179 of the LDPC code of 64 kbits is interleaved into a sequence of the following bit groups.

8, 27, 7, 70, 75, 84, 50, 131, 146, 99, 96, 141, 155, 157, 82, 57, 120, 38, 137, 13, 83, 23, 40, 9, 56, 171, 124, 172, 39, 142, 20, 128, 133, 2, 89, 153, 103, 112, 129, 151, 162, 106, 14, 62, 107, 110, 73, 71, 177, 154, 80, 176, 24, 91, 32, 173, 25, 16, 17, 159, 21, 92, 6, 67, 81, 37, 15, 136, 100, 64, 102, 163, 168, 18, 78, 76, 45, 140, 123, 118, 58, 122, 11, 19, 86, 98, 119, 111, 26, 138, 125, 74, 97, 63, 10, 152, 161, 175, 87, 52, 60, 22, 79, 104, 30, 158, 54, 145, 49, 34, 166, 109, 179, 174, 93, 41, 116, 48, 3, 29, 134, 167, 105, 132, 114, 169, 147, 144, 77, 61, 170, 90, 178, 0, 43, 149, 130, 117, 47, 44, 36, 115, 88, 101, 148, 69, 46, 94, 143, 164, 139, 126, 160, 156, 33, 113, 65, 121, 53, 42, 66, 165, 85, 127, 135, 5, 55, 150, 72, 35, 31, 51, 4, 1, 68, 12, 28, 95, 59, 108

Figure 104:
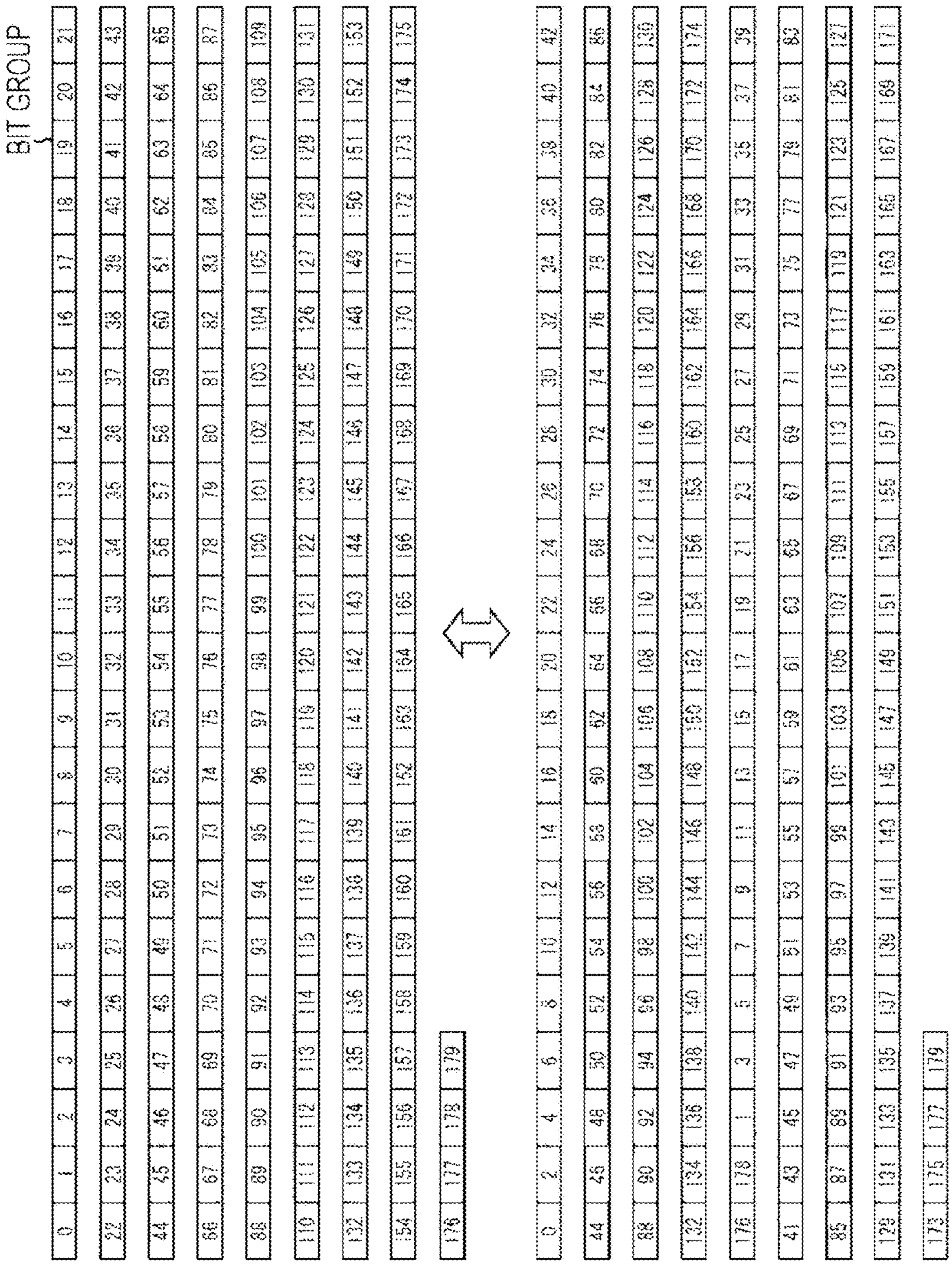
FIG. 104 is a diagram that illustrates a seventh example of a GW pattern for an LDPC code having a code length N of 64 k bits.

FIG. 104 is a diagram that illustrates a seventh example of the GW pattern for an LDPC code of which the code length N is 64 kbits.

According to the GW pattern illustrated in FIG. 104, a sequence of bit groups 0 to 179 of the LDPC code of 64 kbits is interleaved into a sequence of the following bit groups.

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179

Figure 105:
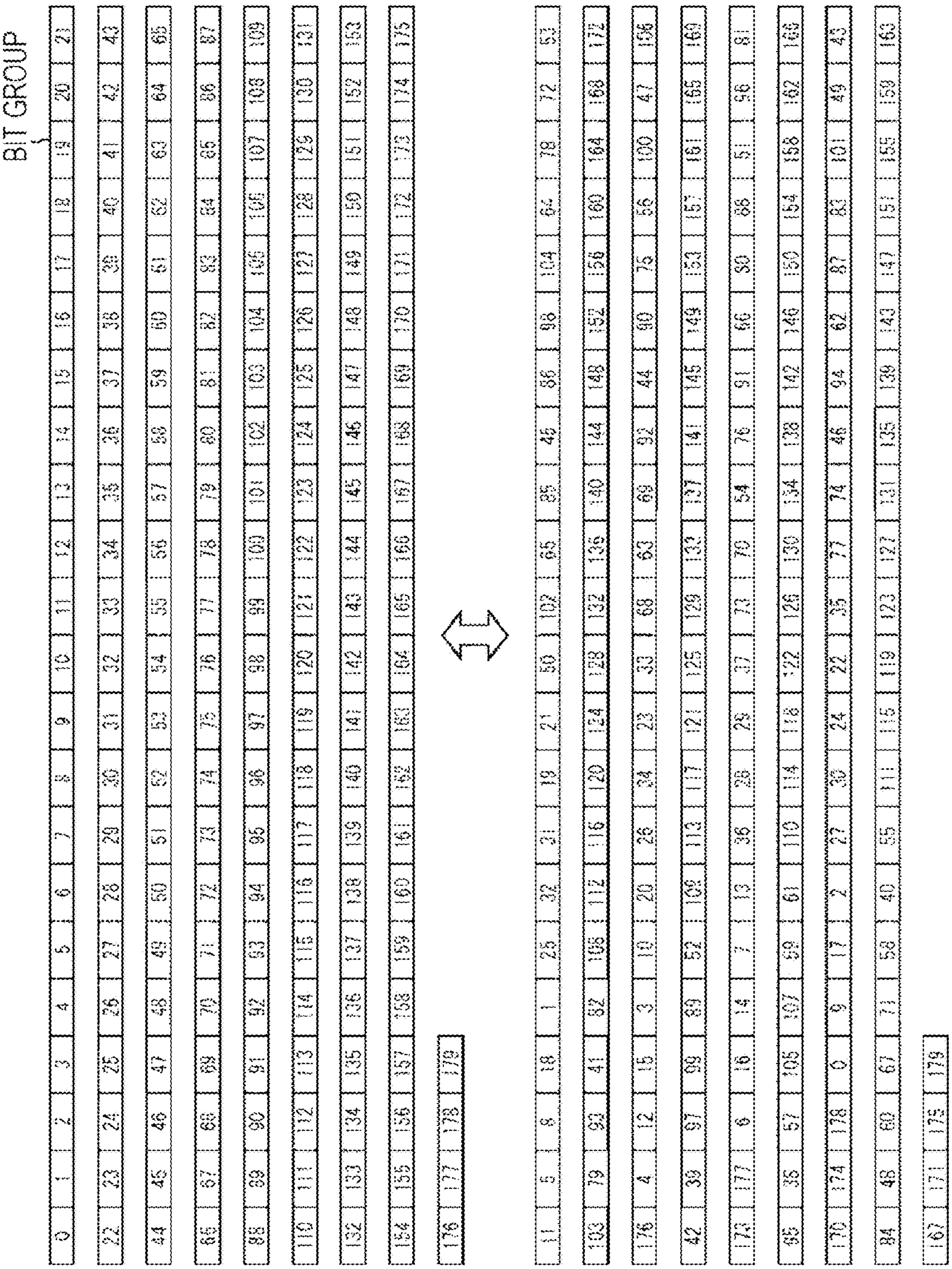
FIG. 105 is a diagram that illustrates an eighth example of a GW pattern for an LDPC code having a code length N of 64 k bits.

FIG. 105 is a diagram that illustrates an eighth example of the GW pattern for an LDPC code of which the code length N is 64 kbits.

According to the GW pattern illustrated in FIG. 105, a sequence of bit groups 0 to 179 of the LDPC code of 64 kbits is interleaved into a sequence of the following bit groups.

11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, 179

Figure 106:
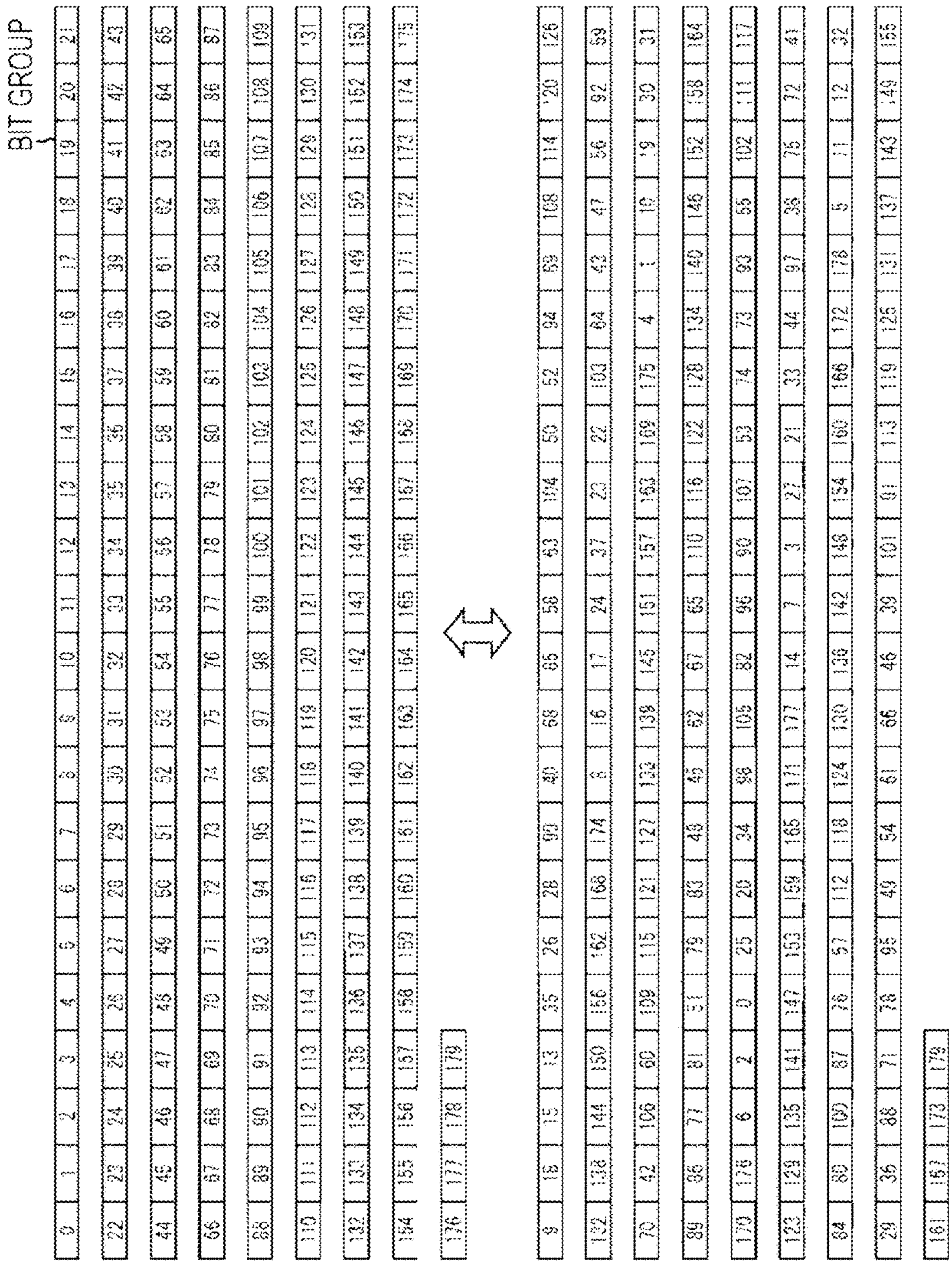
FIG. 106 is a diagram that illustrates a ninth example of a GW pattern for an LDPC code having a code length N of 64 k bits.

FIG. 106 is a diagram that illustrates a ninth example of the GW pattern for an LDPC code of which the code length N is 64 kbits.

According to the GW pattern illustrated in FIG. 106, a sequence of bit groups 0 to 179 of the LDPC code of 64 kbits is interleaved into a sequence of the following bit groups.

9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, 179

Figure 107:
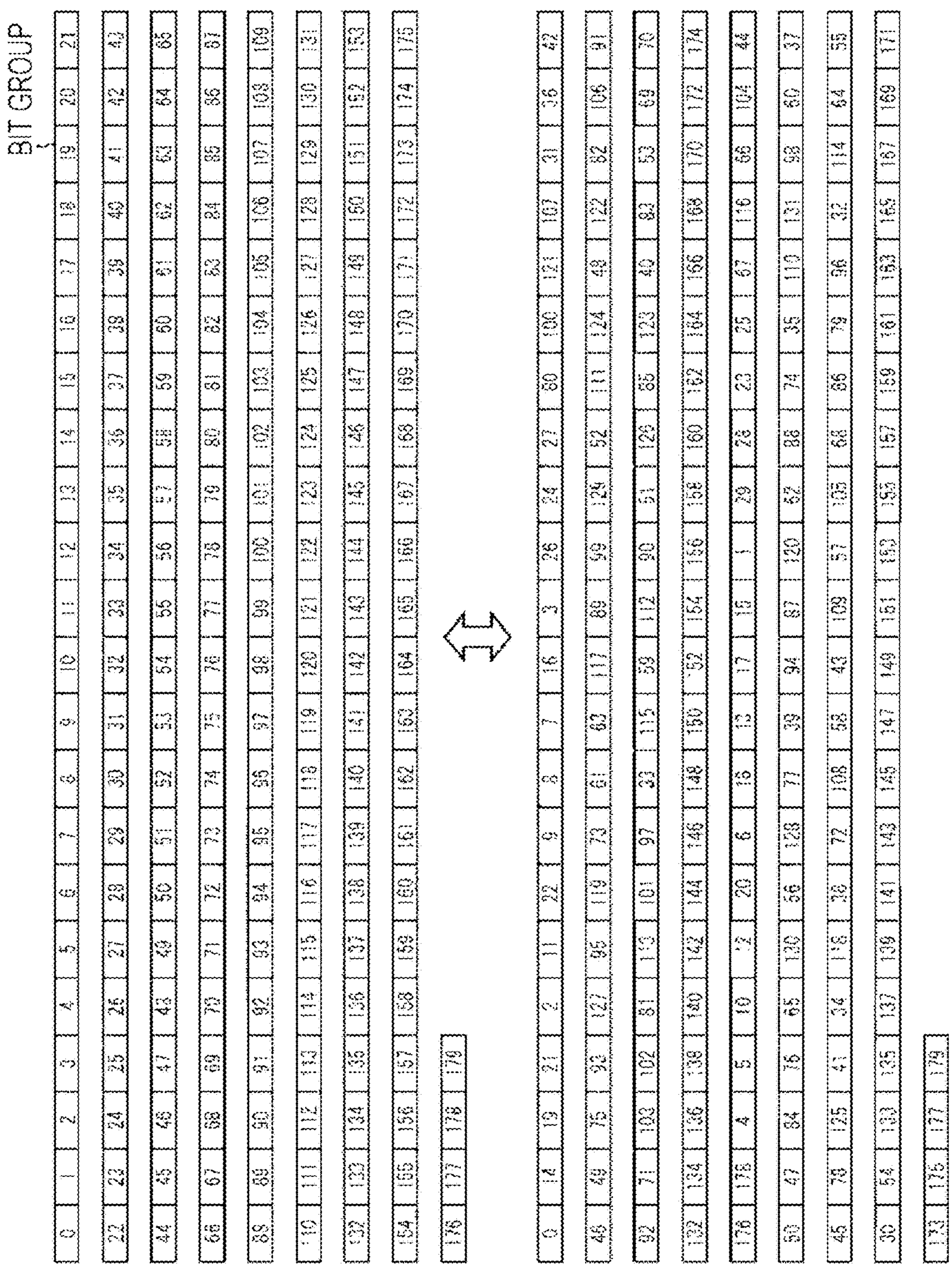
FIG. 107 is a diagram that illustrates a tenth example of a GW pattern for an LDPC code having a code length N of 64 k bits.

FIG. 107 is a diagram that illustrates a tenth example of the GW pattern for an LDPC code of which the code length N is 64 kbits.

According to the GW pattern illustrated in FIG. 107, a sequence of bit groups 0 to 179 of the LDPC code of 64 kbits is interleaved into a sequence of the following bit groups.

0, 14, 19, 21, 2, 11, 22, 9, 8, 7, 16, 3, 26, 24, 27, 80, 100, 121, 107, 31, 36, 42, 46, 49, 75, 93, 127, 95, 119, 73, 61, 63, 117, 89, 99, 129, 52, 111, 124, 48, 122, 82, 106, 91, 92, 71, 103, 102, 81, 113, 101, 97, 33, 115, 59, 112, 90, 51, 126, 85, 123, 40, 83, 53, 69, 70, 132, 134, 136, 138, 140, 142, 144, 146, 148, 150, 152, 154, 156, 158, 160, 162, 164, 166, 168, 170, 172, 174, 176, 178, 4, 5, 10, 12, 20, 6, 18, 13, 17, 15, 1, 29, 28, 23, 25, 67, 116, 66, 104, 44, 50, 47, 84, 76, 65, 130, 56, 128, 77, 39, 94, 87, 120, 62, 88, 74, 35, 110, 131, 98, 60, 37, 45, 78, 125, 41, 34, 118, 38, 72, 108, 58, 43, 109, 57, 105, 68, 86, 79, 96, 32, 114, 64, 55, 30, 54, 133, 135, 137, 139, 141, 143, 145, 147, 149, 151, 153, 155, 157, 159, 161, 163, 165, 167, 169, 171, 173, 175, 177, 179

Figure 108:
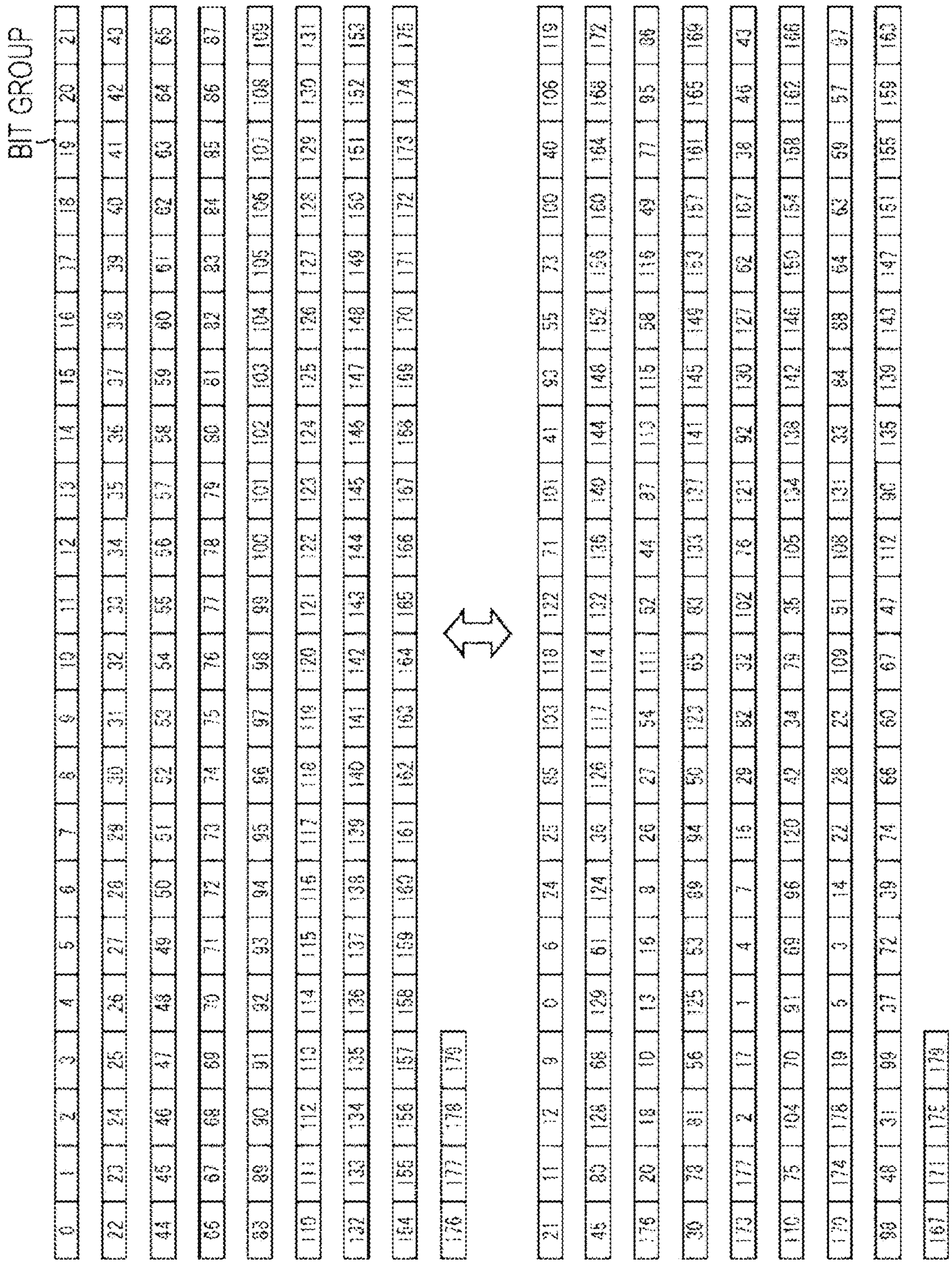
FIG. 108 is a diagram that illustrates an 11th example of a GW pattern for an LDPC code having a code length N of 64 k bits.

FIG. 108 is a diagram that illustrates an 11th example of the GW pattern for an LDPC code of which the code length N is 64 kbits.

According to the GW pattern illustrated in FIG. 108, a sequence of bit groups 0 to 179 of the LDPC code of 64 kbits is interleaved into a sequence of the following bit groups.

21, 11, 12, 9, 0, 6, 24, 25, 85, 103, 118, 122, 71, 101, 41, 93, 55, 73, 100, 40, 106, 119, 45, 80, 128, 68, 129, 61, 124, 36, 126, 117, 114, 132, 136, 140, 144, 148, 152, 156, 160, 164, 168, 172, 176, 20, 18, 10, 13, 16, 8, 26, 27, 54, 111, 52, 44, 87, 113, 115, 58, 116, 49, 77, 95, 86, 30, 78, 81, 56, 125, 53, 89, 94, 50, 123, 65, 83, 133, 137, 141, 145, 149, 153, 157, 161, 165, 169, 173, 177, 2, 17, 1, 4, 7, 15, 29, 82, 32, 102, 76, 121, 92, 130, 127, 62, 107, 38, 46, 43, 110, 75, 104, 70, 91, 69, 96, 120, 42, 34, 79, 35, 105, 134, 138, 142, 146, 150, 154, 158, 162, 166, 170, 174, 178, 19, 5, 3, 14, 22, 28, 23, 109, 51, 108, 131, 33, 84, 88, 64, 63, 59, 57, 97, 98, 48, 31, 99, 37, 72, 39, 74, 66, 60, 67, 47, 112, 90, 135, 139, 143, 147, 151, 155, 159, 163, 167, 171, 175, 179

FIG. 109 is a diagram that illustrates a 12th example of the GW pattern for an LDPC code of which the code length N is 64 kbits.

According to the GW pattern illustrated in FIG. 109, a sequence of bit groups 0 to 179 of the LDPC code of 64 kbits is interleaved into a sequence of the following bit groups.

12, 15, 2, 16, 27, 50, 35, 74, 38, 70, 108, 32, 112, 54, 30, 122, 72, 116, 36, 90, 49, 85, 132, 138, 144, 150, 156, 162, 168, 174, 0, 14, 9, 5, 23, 66, 68, 52, 96, 117, 84, 128, 100, 63, 60, 127, 81, 99, 53, 55, 103, 95, 133, 139, 145, 151, 157, 163, 169, 175, 10, 22, 13, 11, 28, 104, 37, 57, 115, 46, 65, 129, 107, 75, 119, 110, 31, 43, 97, 78, 125, 58, 134, 140, 146, 152, 158, 164, 170, 176, 4, 19, 6, 8, 24, 44, 101, 94, 118, 130, 69, 71, 83, 34, 86, 124, 48, 106, 89, 40, 102, 91, 135, 141, 147, 153, 159, 165, 171, 177, 3, 20, 7, 17, 25, 87, 41, 120, 47, 80, 59, 62, 88, 45, 56, 131, 61, 126, 113, 92, 51, 98, 136, 142, 148, 154, 160, 166, 172, 178, 21, 18, 1, 26, 29, 39, 73, 121, 105, 77, 42, 114, 93, 82, 111, 109, 67, 79, 123, 64, 76, 33, 137, 143, 149, 155, 161, 167, 173, 179

Figure 110:
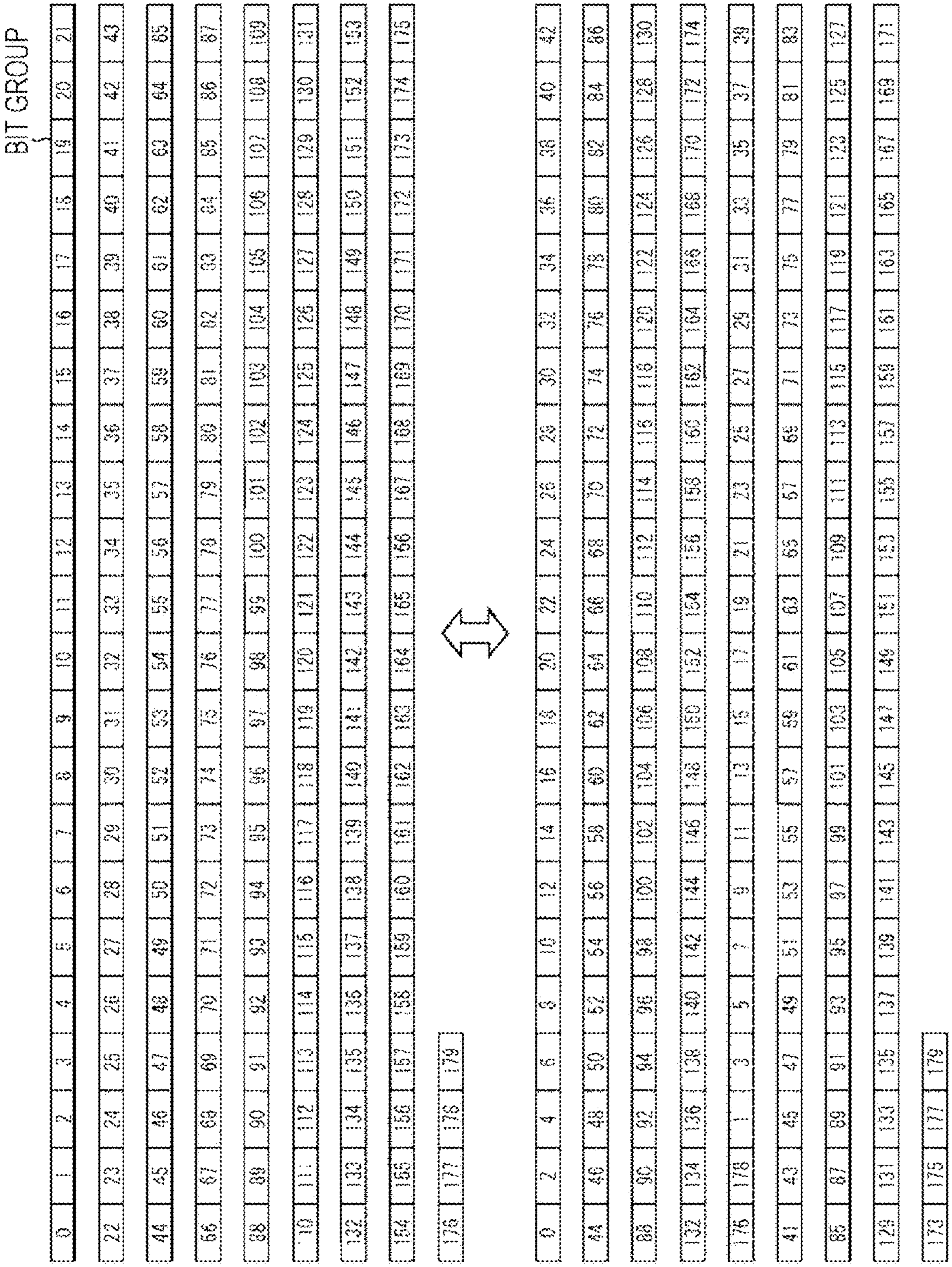
FIG. 110 is a diagram that illustrates a 13th example of a GW pattern for an LDPC code having a code length N of 64 k bits.

FIG. 110 is a diagram that illustrates a 13th example of the GW pattern for an LDPC code of which the code length N is 64 kbits.

According to the GW pattern illustrated in FIG. 110, a sequence of bit groups 0 to 179 of the LDPC code of 64 kbits is interleaved into a sequence of the following bit groups.

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179

Figure 111:
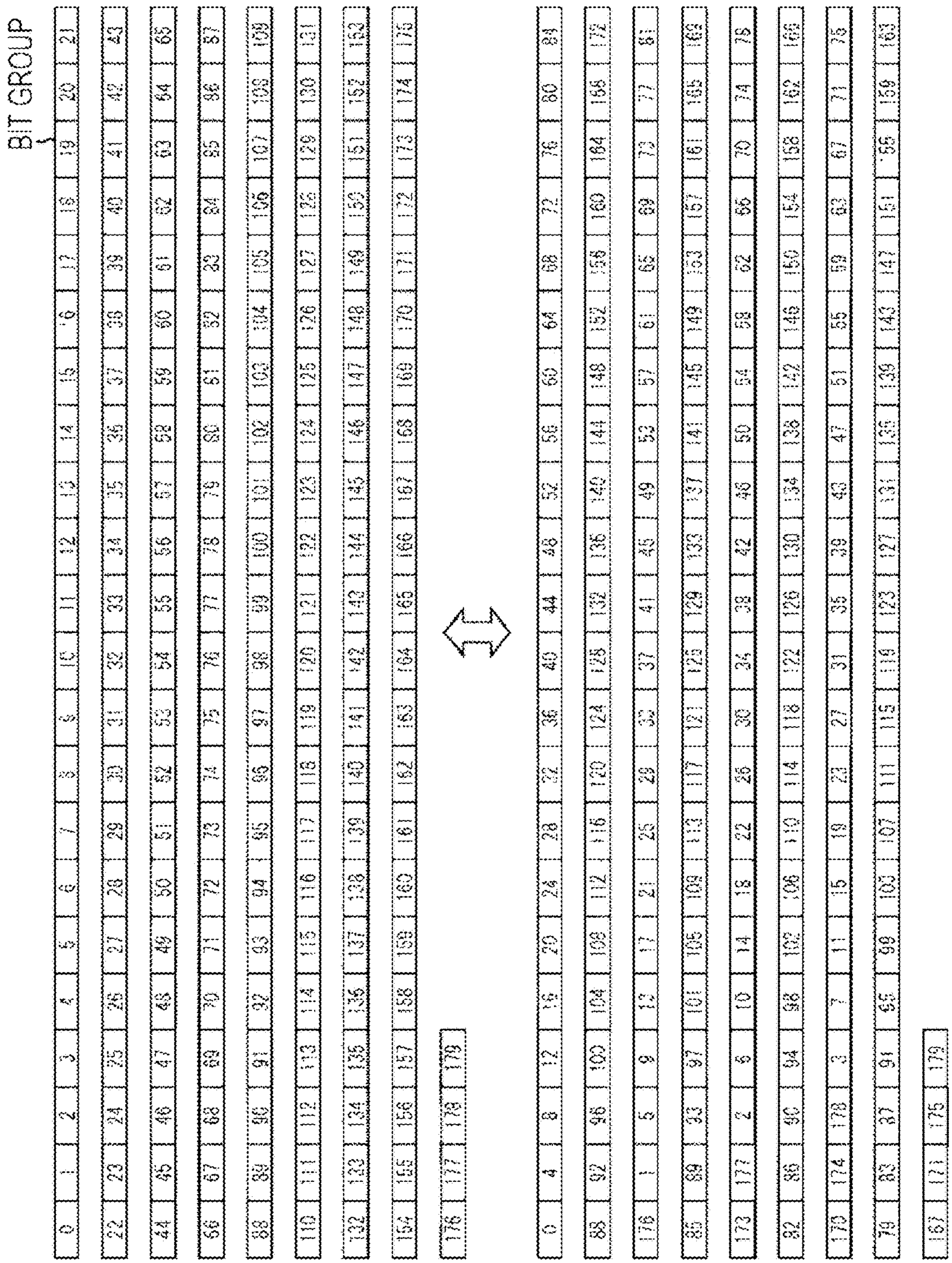
FIG. 111 is a diagram that illustrates a 14th example of a GW pattern for an LDPC code having a code length N of 64 k bits.

FIG. 111 is a diagram that illustrates a 14th example of the GW pattern for an LDPC code of which the code length N is 64 kbits.

According to the GW pattern illustrated in FIG. 111, a sequence of bit groups 0 to 179 of the LDPC code of 64 kbits is interleaved into a sequence of the following bit groups.

0, 4, 8, 12, 16, 20, 24, 28, 32, 36, 40, 44, 48, 52, 56, 60, 64, 68, 72, 76, 80, 84, 88, 92, 96, 100, 104, 108, 112, 116, 120, 124, 128, 132, 136, 140, 144, 148, 152, 156, 160, 164, 168, 172, 176, 1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145, 149, 153, 157, 161, 165, 169, 173, 177, 2, 6, 10, 14, 18, 22, 26, 30, 34, 38, 42, 46, 50, 54, 58, 62, 66, 70, 74, 78, 82, 86, 90, 94, 98, 102, 106, 110, 114, 118, 122, 126, 130, 134, 138, 142, 146, 150, 154, 158, 162, 166, 170, 174, 178, 3, 7, 11, 15, 19, 23, 27, 31, 35, 39, 43, 47, 51, 55, 59, 63, 67, 71, 75, 79, 83, 87, 91, 95, 99, 103, 107, 111, 115, 119, 123, 127, 131, 135, 139, 143, 147, 151, 155, 159, 163, 167, 171, 175, 179

Figure 112:
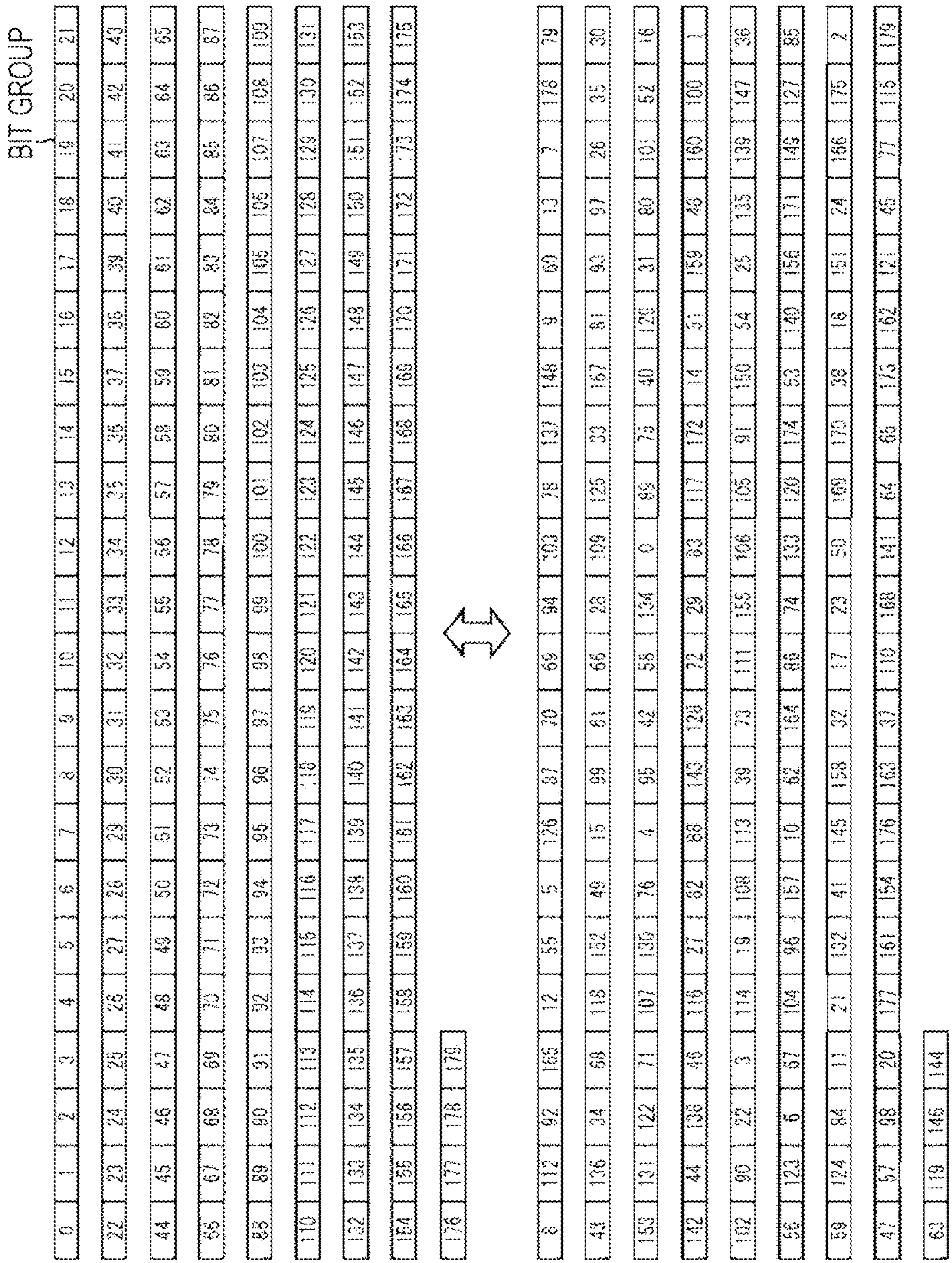
FIG. 112 is a diagram that illustrates a 15th example of a GW pattern for an LDPC code having a code length N of 64 k bits.

FIG. 112 is a diagram that illustrates a 15th example of the GW pattern for an LDPC code of which the code length N is 64 kbits.

According to the GW pattern illustrated in FIG. 112, a sequence of bit groups 0 to 179 of the LDPC code of 64 kbits is interleaved into a sequence of the following bit groups.

8, 112, 92, 165, 12, 55, 5, 126, 87, 70, 69, 94, 103, 78, 137, 148, 9, 60, 13, 7, 178, 79, 43, 136, 34, 68, 118, 152, 49, 15, 99, 61, 66, 28, 109, 125, 33, 167, 81, 93, 97, 26, 35, 30, 153, 131, 122, 71, 107, 130, 76, 4, 95, 42, 58, 134, 0, 89, 75, 40, 129, 31, 80, 101, 52, 16, 142, 44, 138, 46, 116, 27, 82, 88, 143, 128, 72, 29, 83, 117, 172, 14, 51, 159, 48, 160, 100, 1, 102, 90, 22, 3, 114, 19, 108, 113, 39, 73, 111, 155, 106, 105, 91, 150, 54, 25, 135, 139, 147, 36, 56, 123, 6, 67, 104, 96, 157, 10, 62, 164, 86, 74, 133, 120, 174, 53, 140, 156, 171, 149, 127, 85, 59, 124, 84, 11, 21, 132, 41, 145, 158, 32, 17, 23, 50, 169, 170, 38, 18, 151, 24, 166, 175, 2, 47, 57, 98, 20, 177, 161, 154, 176, 163, 37, 110, 168, 141, 64, 65, 173, 162, 121, 45, 77, 115, 179, 63, 119, 146, 144

Figure 113:
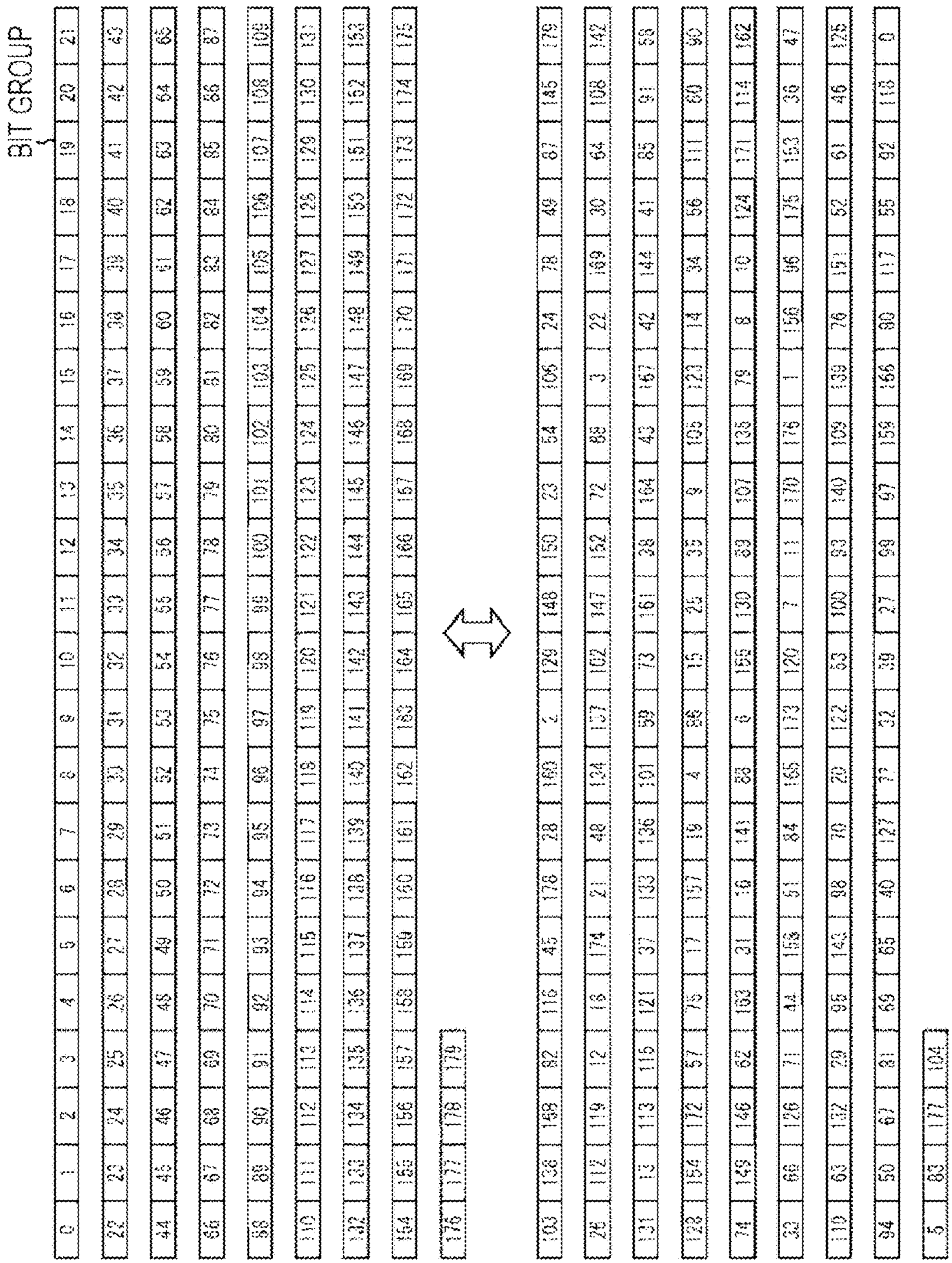
FIG. 113 is a diagram that illustrates a 16th example of a GW pattern for an LDPC code having a code length N of 64 k bits.

FIG. 113 is a diagram that illustrates a 16th example of the GW pattern for an LDPC code of which the code length N is 64 kbits.

According to the GW pattern illustrated in FIG. 113, a sequence of bit groups 0 to 179 of the LDPC code of 64 kbits is interleaved into a sequence of the following bit groups.

103, 138, 168, 82, 116, 45, 178, 28, 160, 2, 129, 148, 150, 23, 54, 106, 24, 78, 49, 87, 145, 179, 26, 112, 119, 12, 18, 174, 21, 48, 134, 137, 102, 147, 152, 72, 68, 3, 22, 169, 30, 64, 108, 142, 131, 13, 113, 115, 121, 37, 133, 136, 101, 59, 73, 161, 38, 164, 43, 167, 42, 144, 41, 85, 91, 58, 128, 154, 172, 57, 75, 17, 157, 19, 4, 86, 15, 25, 35, 9, 105, 123, 14, 34, 56, 111, 60, 90, 74, 149, 146, 62, 163, 31, 16, 141, 88, 6, 155, 130, 89, 107, 135, 79, 8, 10, 124, 171, 114, 162, 33, 66, 126, 71, 44, 158, 51, 84, 165, 173, 120, 7, 11, 170, 176, 1, 156, 96, 175, 153, 36, 47, 110, 63, 132, 29, 95, 143, 98, 70, 20, 122, 53, 100, 93, 140, 109, 139, 76, 151, 52, 61, 46, 125, 94, 50, 67, 81, 69, 65, 40, 127, 77, 32, 39, 27, 99, 97, 159, 166, 80, 117, 55, 92, 118, 0, 5, 83, 177, 104

FIG. 114 is a diagram that illustrates a 17th example of the GW pattern for an LDPC code of which the code length N is 64 kbits.

According to the GW pattern illustrated in FIG. 114, a sequence of bit groups 0 to 179 of the LDPC code of 64 kbits is interleaved into a sequence of the following bit groups.

Figure 115:
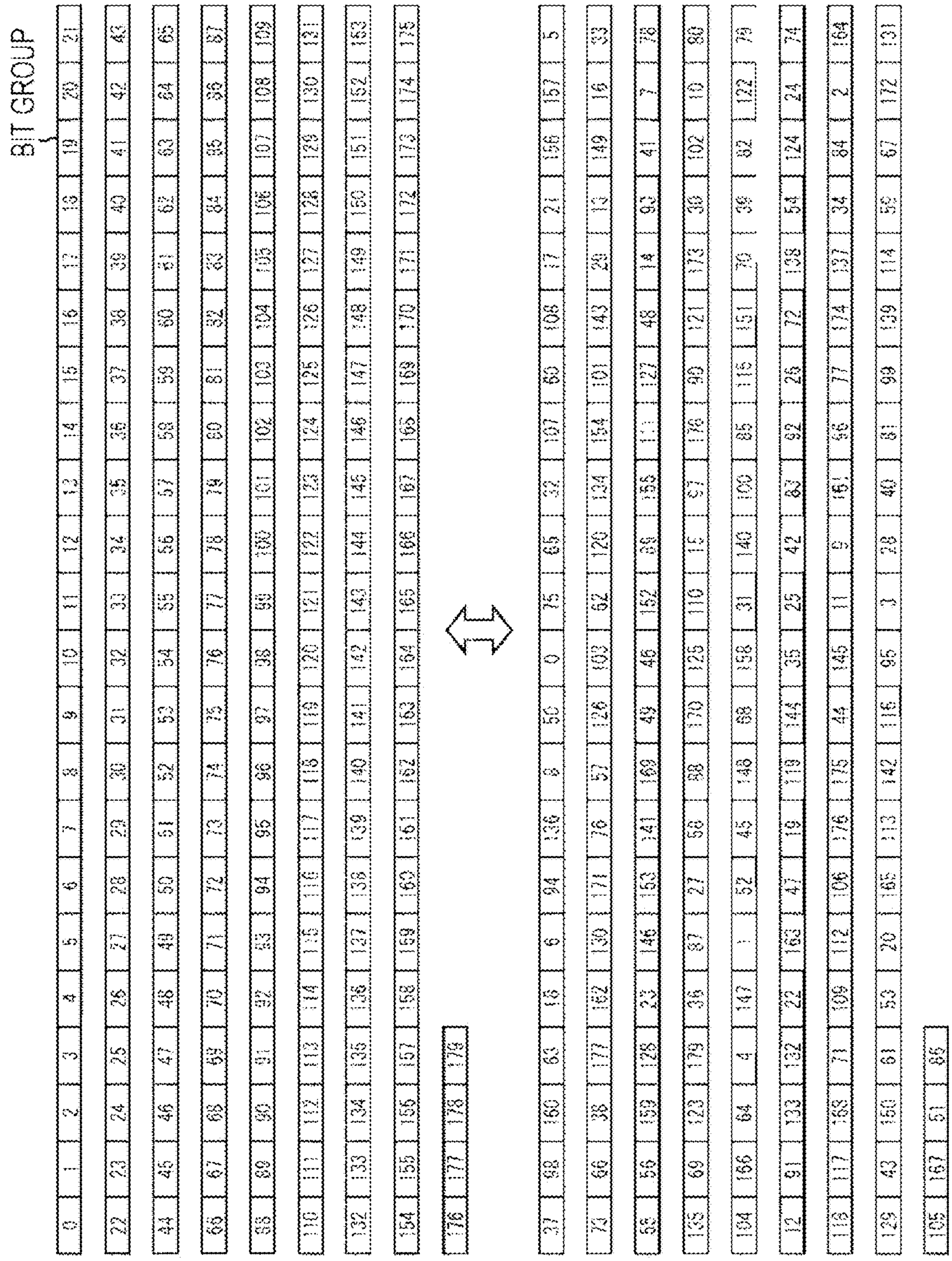
FIG. 115 is a diagram that illustrates an 18th example of a GW pattern for an LDPC code having a code length N of 64 k bits.

104, 120, 47, 136, 116, 109, 22, 20, 117, 61, 52, 108, 86, 99, 76, 90, 37, 58, 36, 138, 95, 130, 177, 93, 56, 33, 24, 82, 0, 67, 83, 46, 79, 70, 154, 18, 75, 43, 49, 63, 162, 16, 167, 80, 125, 1, 123, 107, 9, 45, 53, 15, 38, 23, 57, 141, 4, 178, 165, 113, 21, 105, 11, 124, 126, 77, 146, 29, 131, 27, 176, 40, 74, 91, 140, 64, 73, 44, 129, 157, 172, 51, 10, 128, 119, 163, 103, 28, 85, 156, 78, 6, 8, 173, 160, 106, 31, 54, 122, 25, 139, 68, 150, 164, 87, 135, 97, 166, 42, 169, 161, 137, 26, 39, 133, 5, 94, 69, 2, 30, 171, 149, 115, 96, 145, 101, 92, 143, 12, 88, 81, 71, 19, 147, 50, 152, 159, 155, 151, 174, 60, 32, 3, 142, 72, 14, 170, 112, 65, 89, 175, 158, 17, 114, 62, 144, 13, 98, 66, 59, 7, 118, 48, 153, 100, 134, 84, 111, 132, 127, 41, 168, 110, 102, 34, 121, 179, 148, 55,

FIG. 115 is a diagram that illustrates an 18th example of the GW pattern for an LDPC code of which the code length N is 64 kbits.

According to the GW pattern illustrated in FIG. 115, a sequence of bit groups 0 to 179 of the LDPC code of 64 kbits is interleaved into a sequence of the following bit groups.

37, 98, 160, 63, 18, 6, 94, 136, 8, 50, 0, 75, 65, 32, 107, 60, 108, 17, 21, 156, 157, 5, 73, 66, 38, 177, 162, 130, 171, 76, 57, 126, 103, 62, 120, 134, 154, 101, 143, 29, 13, 149, 16, 33, 55, 56, 159, 128, 23, 146, 153, 141, 169, 49, 46, 152, 89, 155, 111, 127, 48, 14, 93, 41, 7, 78, 135, 69, 123, 179, 36, 87, 27, 58, 88, 170, 125, 110, 15, 97, 178, 90, 121, 173, 30, 102, 10, 80, 104, 166, 64, 4, 147, 1, 52, 45, 148, 68, 158, 31, 140, 100, 85, 115, 151, 70, 39, 82, 122, 79, 12, 91, 133, 132, 22, 163, 47, 19, 119, 144, 35, 25, 42, 83, 92, 26, 72, 138, 54, 124, 24, 74, 118, 117, 168, 71, 109, 112, 106, 176, 175, 44, 145, 11, 9, 161, 96, 77, 174, 137, 34, 84, 2, 164, 129, 43, 150, 61, 53, 20, 165, 113, 142, 116, 95, 3, 28, 40, 81, 99, 139, 114, 59, 67, 172, 131, 105, 167, 51, 86

Figure 116:
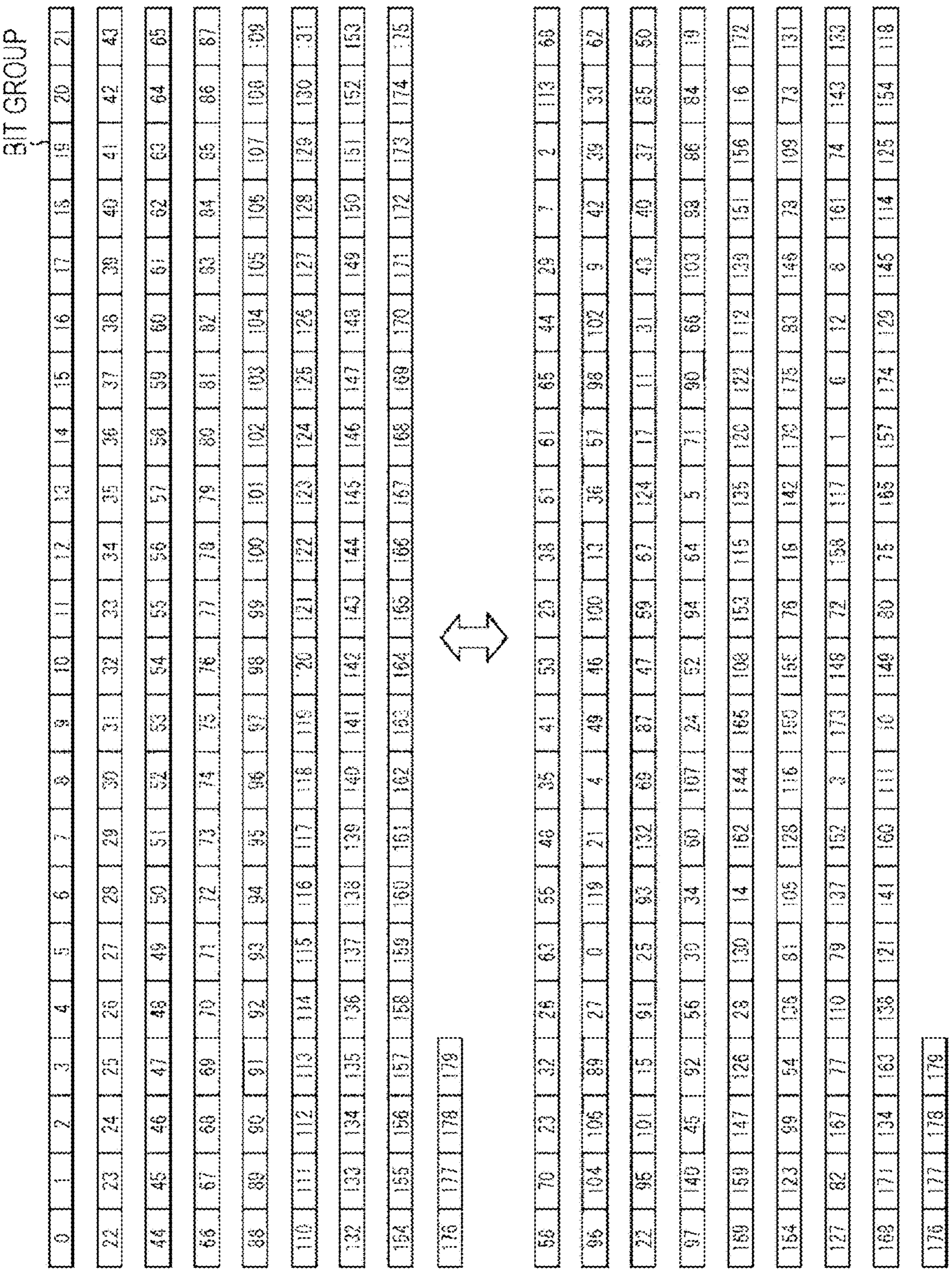
FIG. 116 is a diagram that illustrates a 19th example of a GW pattern for an LDPC code having a code length N of 64 k bits.

FIG. 116 is a diagram that illustrates a 19th example of the GW pattern for an LDPC code of which the code length N is 64 kbits.

According to the GW pattern illustrated in FIG. 116, a sequence of bit groups 0 to 179 of the LDPC code of 64 kbits is interleaved into a sequence of the following bit groups.

58, 70, 23, 32, 26, 63, 55, 48, 35, 41, 53, 20, 38, 51, 61, 65, 44, 29, 7, 2, 113, 68, 96, 104, 106, 89, 27, 0, 119, 21, 4, 49, 46, 100, 13, 36, 57, 98, 102, 9, 42, 39, 33, 62, 22, 95, 101, 15, 91, 25, 93, 132, 69, 87, 47, 59, 67, 124, 17, 11, 31, 43, 40, 37, 85, 50, 97, 140, 45, 92, 56, 30, 34, 60, 107, 24, 52, 94, 64, 5, 71, 90, 66, 103, 88, 86, 84, 19, 169, 159, 147, 126, 28, 130, 14, 162, 144, 166, 108, 153, 115, 135, 120, 122, 112, 139, 151, 156, 16, 172, 164, 123, 99, 54, 136, 81, 105, 128, 116, 150, 155, 76, 18, 142, 170, 175, 83, 146, 78, 109, 73, 131, 127, 82, 167, 77, 110, 79, 137, 152, 3, 173, 148, 72, 158, 117, 1, 6, 12, 8, 161, 74, 143, 133, 168, 171, 134, 163, 138, 121, 141, 160, 111, 10, 149, 80, 75, 165, 157, 174, 129, 145, 114, 125, 154, 118, 176, 177, 178, 179

FIG. 117 is a diagram that illustrates a 20th example of the GW pattern for an LDPC code of which the code length N is 64 kbits.

According to the GW pattern illustrated in FIG. 117, a sequence of bit groups 0 to 179 of the LDPC code of 64 kbits is interleaved into a sequence of the following bit groups.

40, 159, 100, 14, 88, 75, 53, 24, 157, 84, 23, 77, 140, 145, 32, 28, 112, 39, 76, 50, 93, 27, 107, 25, 152, 101, 127, 5, 129, 71, 9, 21, 96, 73, 35, 106, 158, 49, 136, 30, 137, 115, 139, 48, 167, 85, 74, 72, 7, 110, 161, 41, 170, 147, 82, 128, 149, 33, 8, 120, 47, 68, 58, 67, 87, 155, 11, 18, 103, 151, 29, 36, 83, 135, 79, 150, 97, 54, 70, 138, 156, 31, 121, 34, 20, 130, 61, 57, 2, 166, 117, 15, 6, 165, 118, 98, 116, 131, 109, 62, 126, 175, 22, 111, 164, 16, 133, 102, 55, 105, 64, 177, 78, 37, 162, 124, 119, 19, 4, 69, 132, 65, 123, 160, 17, 52, 38, 1, 80, 90, 42, 81, 104, 13, 144, 51, 114, 3, 43, 146, 163, 59, 45, 89, 122, 169, 44, 94, 86, 99, 66, 171, 173, 0, 141, 148, 176, 26, 143, 178, 60, 153, 142, 91, 179, 12, 168, 113, 95, 174, 56, 134, 92, 46, 108, 125, 10, 172, 154, 63

Figure 118:
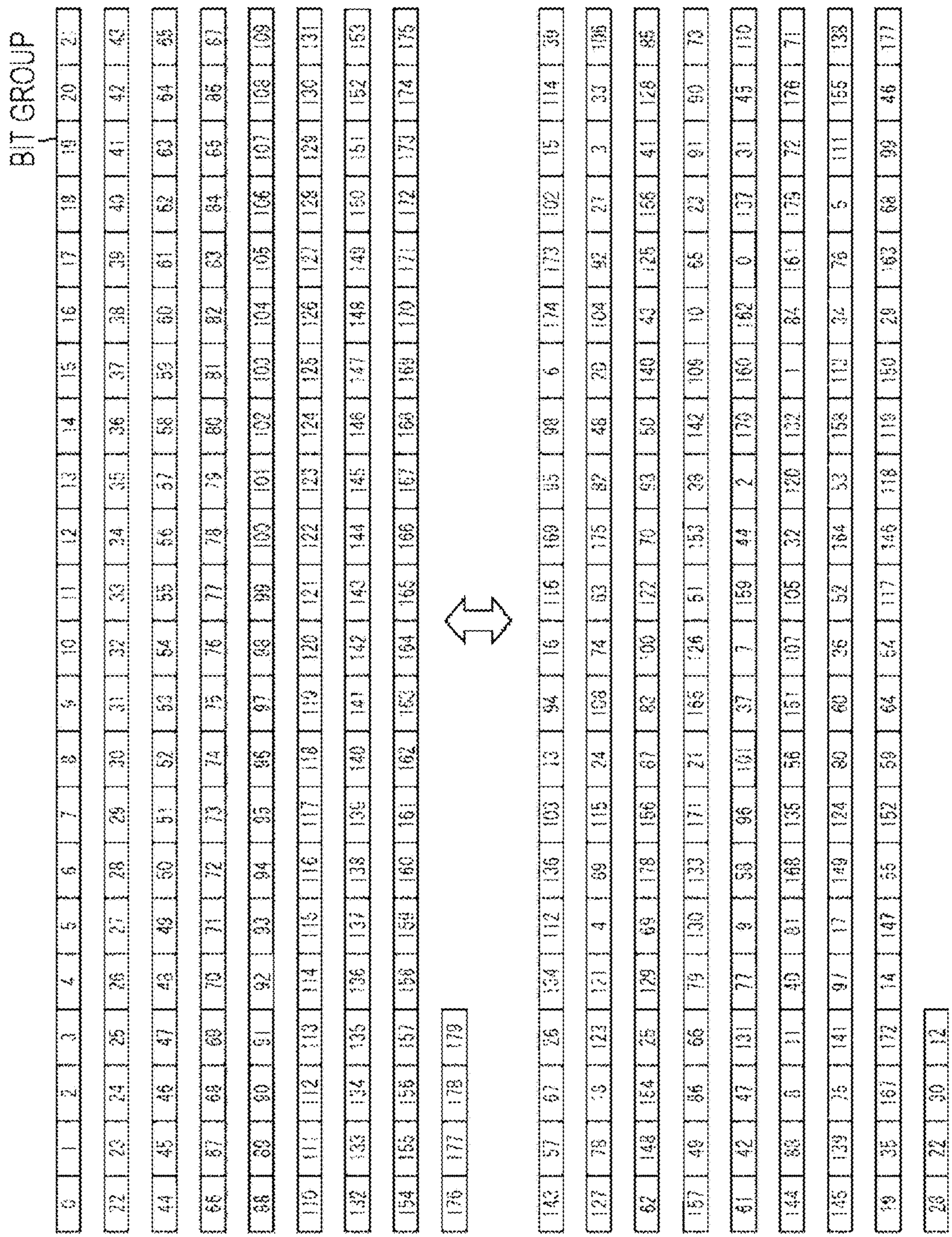
FIG. 118 is a diagram that illustrates a 21st example of a GW pattern for an LDPC code having a code length N of 64 k bits.

FIG. 118 is a diagram that illustrates a 21st example of the GW pattern for an LDPC code of which the code length N is 64 kbits.

According to the GW pattern illustrated in FIG. 118, a sequence of bit groups 0 to 179 of the LDPC code of 64 kbits is interleaved into a sequence of the following bit groups.

143, 57, 67, 26, 134, 112, 136, 103, 13, 94, 16, 116, 169, 95, 98, 6, 174, 173, 102, 15, 114, 39, 127, 78, 18, 123, 121, 4, 89, 115, 24, 108, 74, 63, 175, 82, 48, 20, 104, 92, 27, 3, 33, 106, 62, 148, 154, 25, 129, 69, 178, 156, 87, 83, 100, 122, 70, 93, 50, 140, 43, 125, 166, 41, 128, 85, 157, 49, 86, 66, 79, 130, 133, 171, 21, 165, 126, 51, 153, 38, 142, 109, 10, 65, 23, 91, 90, 73, 61, 42, 47, 131, 77, 9, 58, 96, 101, 37, 7, 159, 44, 2, 170, 160, 162, 0, 137, 31, 45, 110, 144, 88, 8, 11, 40, 81, 168, 135, 56, 151, 107, 105, 32, 120, 132, 1, 84, 161, 179, 72, 176, 71, 145, 139, 75, 141, 97, 17, 149, 124, 80, 60, 36, 52, 164, 53, 158, 113, 34, 76, 5, 111, 155, 138, 19, 35, 167, 172, 14, 147, 55, 152, 59, 64, 54, 117, 146, 118, 119, 150, 29, 163, 68, 99, 46, 177, 28, 22, 30, 12

Figure 119:
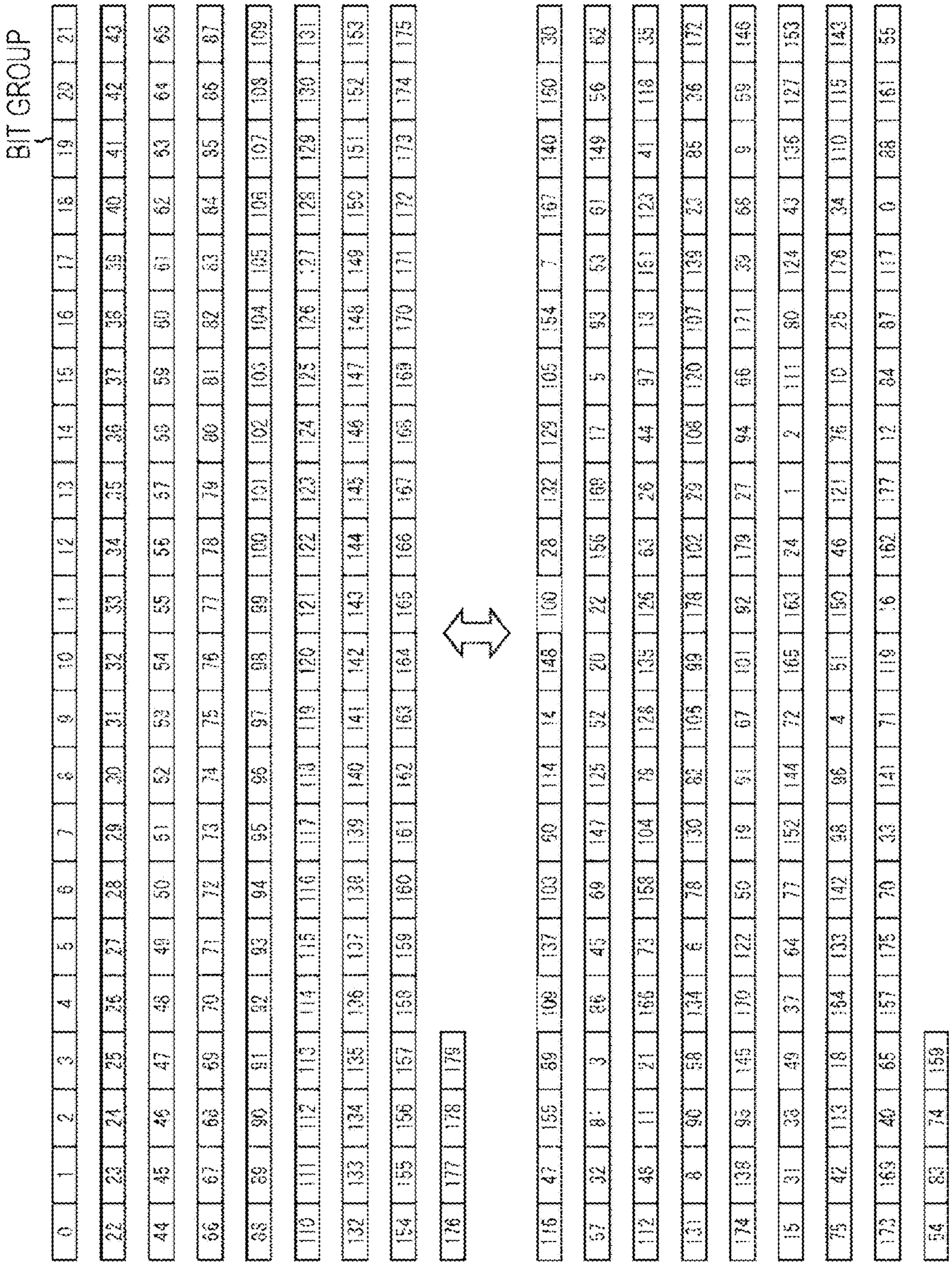
FIG. 119 is a diagram that illustrates a 22nd example of a GW pattern for an LDPC code having a code length N of 64 k bits.

FIG. 119 is a diagram that illustrates a 22nd example of the GW pattern for an LDPC code of which the code length N is 64 kbits.

According to the GW pattern illustrated in FIG. 119, a sequence of bit groups 0 to 179 of the LDPC code of 64 kbits is interleaved into a sequence of the following bit groups.

116, 47, 155, 89, 109, 137, 103, 60, 114, 14, 148, 100, 28, 132, 129, 105, 154, 7, 167, 140, 160, 30, 57, 32, 81, 3, 86, 45, 69, 147, 125, 52, 20, 22, 156, 168, 17, 5, 93, 53, 61, 149, 56, 62, 112, 48, 11, 21, 166, 73, 158, 104, 79, 128, 135, 126, 63, 26, 44, 97, 13, 151, 123, 41, 118, 35, 131, 8, 90, 58, 134, 6, 78, 130, 82, 106, 99, 178, 102, 29, 108, 120, 107, 139, 23, 85, 36, 172, 174, 138, 95, 145, 170, 122, 50, 19, 91, 67, 101, 92, 179, 27, 94, 66, 171, 39, 68, 9, 59, 146, 15, 31, 38, 49, 37, 64, 77, 152, 144, 72, 165, 163, 24, 1, 2, 111, 80, 124, 43, 136, 127, 153, 75, 42, 113, 18, 164, 133, 142, 98, 96, 4, 51, 150, 46, 121, 76, 10, 25, 176, 34, 110, 115, 143, 173, 169, 40, 65, 157, 175, 70, 33, 141, 71, 119, 16, 162, 177, 12, 84, 87, 117, 0, 88, 161, 55, 54, 83, 74, 159

FIG. 120 is a diagram that illustrates a 23rd example of the GW pattern for an LDPC code of which the code length N is 64 kbits.

According to the GW pattern illustrated in FIG. 120, a sequence of bit groups 0 to 179 of the LDPC code of 64 kbits is interleaved into a sequence of the following bit groups.

62, 17, 10, 25, 174, 13, 159, 14, 108, 0, 42, 57, 78, 67, 41, 132, 110, 87, 77, 27, 88, 56, 8, 161, 7, 164, 171, 44, 75, 176, 145, 165, 157, 34, 142, 98, 103, 52, 11, 82, 141, 116, 15, 158, 139, 120, 36, 61, 20, 112, 144, 53, 128, 24, 96, 122, 114, 104, 150, 50, 51, 80, 109, 33, 5, 95, 59, 16, 134, 105, 111, 21, 40, 146, 18, 133, 60, 23, 160, 106, 32, 79, 55, 6, 1, 154, 117, 19, 152, 167, 166, 30, 35, 100, 74, 131, 99, 156, 39, 76, 86, 43, 178, 155, 179, 177, 136, 175, 81, 64, 124, 153, 84, 163, 135, 115, 125, 47, 45, 143, 72, 48, 172, 97, 85, 107, 126, 91, 129, 137, 83, 118, 54, 2, 9, 58, 169, 73, 123, 4, 92, 168, 162, 94, 138, 119, 22, 31, 63, 89, 90, 69, 49, 173, 28, 127, 26, 29, 101, 170, 93, 140, 147, 149, 148, 66, 65, 121, 12, 71, 37, 70, 102, 46, 38, 68, 130, 3, 113, 151

FIG. 121 is a diagram that illustrates a 24th example of the GW pattern for an LDPC code of which the code length N is 64 kbits.

According to the GW pattern illustrated in FIG. 121, a sequence of bit groups 0 to 179 of the LDPC code of 64 kbits is interleaved into a sequence of the following bit groups.

168, 18, 46, 131, 88, 90, 11, 89, 111, 174, 172, 38, 78, 153, 9, 80, 53, 27, 44, 79, 35, 83, 171, 51, 37, 99, 95, 119, 117, 127, 112, 166, 28, 123, 33, 160, 29, 6, 135, 10, 66, 69, 74, 92, 15, 109, 106, 178, 65, 141, 0, 3, 154, 156, 164, 7, 45, 115, 122, 148, 110, 24, 121, 126, 23, 175, 21, 113, 58, 43, 26, 143, 56, 142, 39, 147, 30, 25, 101, 145, 136, 19, 4, 48, 158, 118, 133, 49, 20, 102, 14, 151, 5, 2, 72, 103, 75, 60, 84, 34, 157, 169, 31, 161, 81, 70, 85, 159, 132, 41, 152, 179, 98, 144, 36, 16, 87, 40, 91, 1, 130, 108, 139, 94, 97, 8, 104, 13, 150, 137, 47, 73, 62, 12, 50, 61, 105, 100, 86, 146, 165, 22, 17, 57, 167, 59, 96, 120, 155, 77, 162, 55, 68, 140, 134, 82, 76, 125, 32, 176, 138, 173, 177, 163, 107, 170, 71, 129, 63, 93, 42, 52, 116, 149, 54, 128, 124, 114, 67, 64

Figure 122:
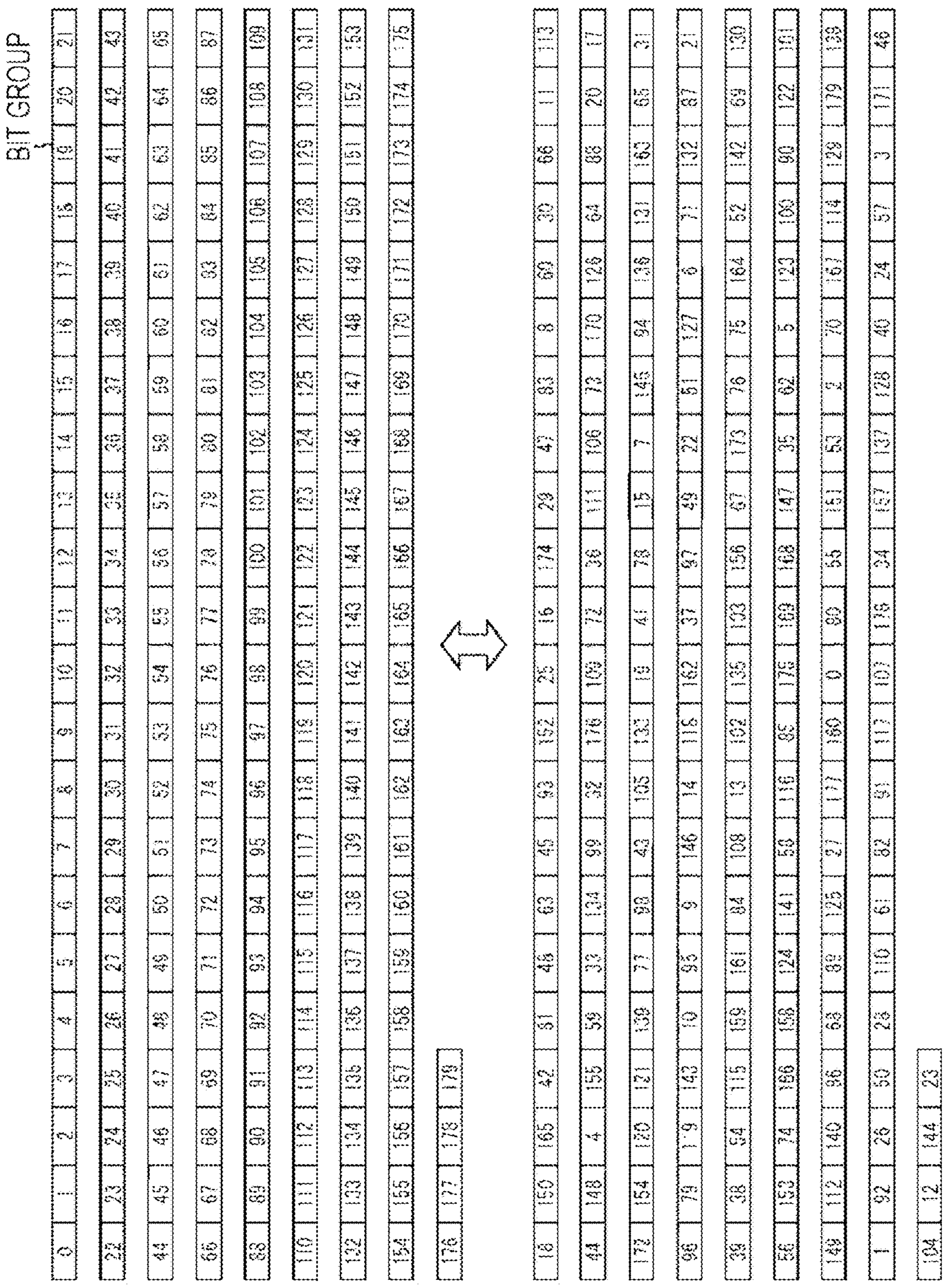

FIG. 122 is a diagram that illustrates a 25th example of the GW pattern for an LDPC code of which the code length N is 64 kbits.

According to the GW pattern illustrated in FIG. 122, a sequence of bit groups 0 to 179 of the LDPC code of 64 kbits is interleaved into a sequence of the following bit groups.

18, 150, 165, 42, 81, 48, 63, 45, 93, 152, 25, 16, 174, 29, 47, 83, 8, 60, 30, 66, 11, 113, 44, 148, 4, 155, 59, 33, 134, 99, 32, 176, 109, 72, 36, 111, 106, 73, 170, 126, 64, 88, 20, 17, 172, 154, 120, 121, 139, 77, 98, 43, 105, 133, 19, 41, 78, 15, 7, 145, 94, 136, 131, 163, 65, 31, 96, 79, 119, 143, 10, 95, 9, 146, 14, 118, 162, 37, 97, 49, 22, 51, 127, 6, 71, 132, 87, 21, 39, 38, 54, 115, 159, 161, 84, 108, 13, 102, 135, 103, 156, 67, 173, 76, 75, 164, 52, 142, 69, 130, 56, 153, 74, 166, 158, 124, 141, 58, 116, 85, 175, 169, 168, 147, 35, 62, 5, 123, 100, 90, 122, 101, 149, 112, 140, 86, 68, 89, 125, 27, 177, 160, 0, 80, 55, 151, 53, 2, 70, 167, 114, 129, 179, 138, 1, 92, 26, 50, 28, 110, 61, 82, 91, 117, 107, 178, 34, 157, 137, 128, 40, 24, 57, 3, 171, 46, 104, 12, 144, 23

Figure 123:

FIG. 123 is a diagram that illustrates a 26th example of the GW pattern for an LDPC code of which the code length N is 64 kbits.

According to the GW pattern illustrated in FIG. 123, a sequence of bit groups 0 to 179 of the LDPC code of 64 kbits is interleaved into a sequence of the following bit groups.

18, 8, 166, 117, 4, 111, 142, 148, 176, 91, 120, 144, 99, 124, 20, 25, 31, 78, 36, 72, 2, 98, 93, 74, 174, 52, 152, 62, 88, 75, 23, 97, 147, 15, 71, 1, 127, 138, 81, 83, 68, 94, 112, 119, 121, 89, 163, 85, 86, 28, 17, 64, 14, 44, 158, 159, 150, 32, 128, 70, 90, 29, 30, 63, 100, 65, 129, 140, 177, 46, 84, 92, 10, 33, 58, 7, 96, 151, 171, 40, 76, 6, 3, 37, 104, 57, 135, 103, 141, 107, 116, 160, 41, 153, 175, 55, 130, 118, 131, 42, 27, 133, 95, 179, 34, 21, 87, 106, 105, 108, 79, 134, 113, 26, 164, 114, 73, 102, 77, 22, 110, 161, 43, 122, 123, 82, 5, 48, 139, 60, 49, 154, 115, 146, 67, 69, 137, 109, 143, 24, 101, 45, 16, 12, 19, 178, 80, 51, 47, 149, 50, 172, 170, 169, 61, 9, 39, 136, 59, 38, 54, 156, 126, 125, 145, 0, 13, 155, 132, 162, 11, 157, 66, 165, 173, 56, 168, 167, 53, 35

FIG. 124 is a diagram that illustrates a 27th example of the GW pattern for an LDPC code of which the code length N is 64 kbits.

According to the GW pattern illustrated in FIG. 124, a sequence of bit groups 0 to 179 of the LDPC code of 64 kbits is interleaved into a sequence of the following bit groups.

77, 50, 109, 128, 153, 12, 48, 17, 147, 55, 173, 172, 135, 121, 99, 162, 52, 40, 129, 168, 103, 87, 134, 105, 179, 10, 131, 151, 3, 26, 100, 15, 123, 88, 18, 91, 54, 160, 49, 1, 76, 80, 74, 31, 47, 58, 161, 9, 16, 34, 41, 21, 177, 11, 63, 6, 39, 165, 169, 125, 114, 57, 37, 67, 93, 96, 73, 106, 83, 166, 24, 51, 142, 65, 43, 64, 53, 72, 156, 81, 4, 155, 33, 163, 56, 150, 70, 167, 107, 112, 144, 149, 36, 32, 35, 59, 101, 29, 127, 138, 176, 90, 141, 92, 170, 102, 119, 25, 75, 14, 0, 68, 20, 97, 110, 28, 89, 118, 154, 126, 2, 22, 124, 85, 175, 78, 46, 152, 23, 86, 27, 79, 130, 66, 45, 113, 111, 62, 61, 7, 30, 133, 108, 171, 143, 60, 178, 5, 122, 44, 38, 148, 157, 84, 42, 139, 145, 8, 104, 115, 71, 137, 132, 146, 164, 98, 13, 117, 174, 158, 95, 116, 140, 94, 136, 120, 82, 69, 159, 19

Figure 125:
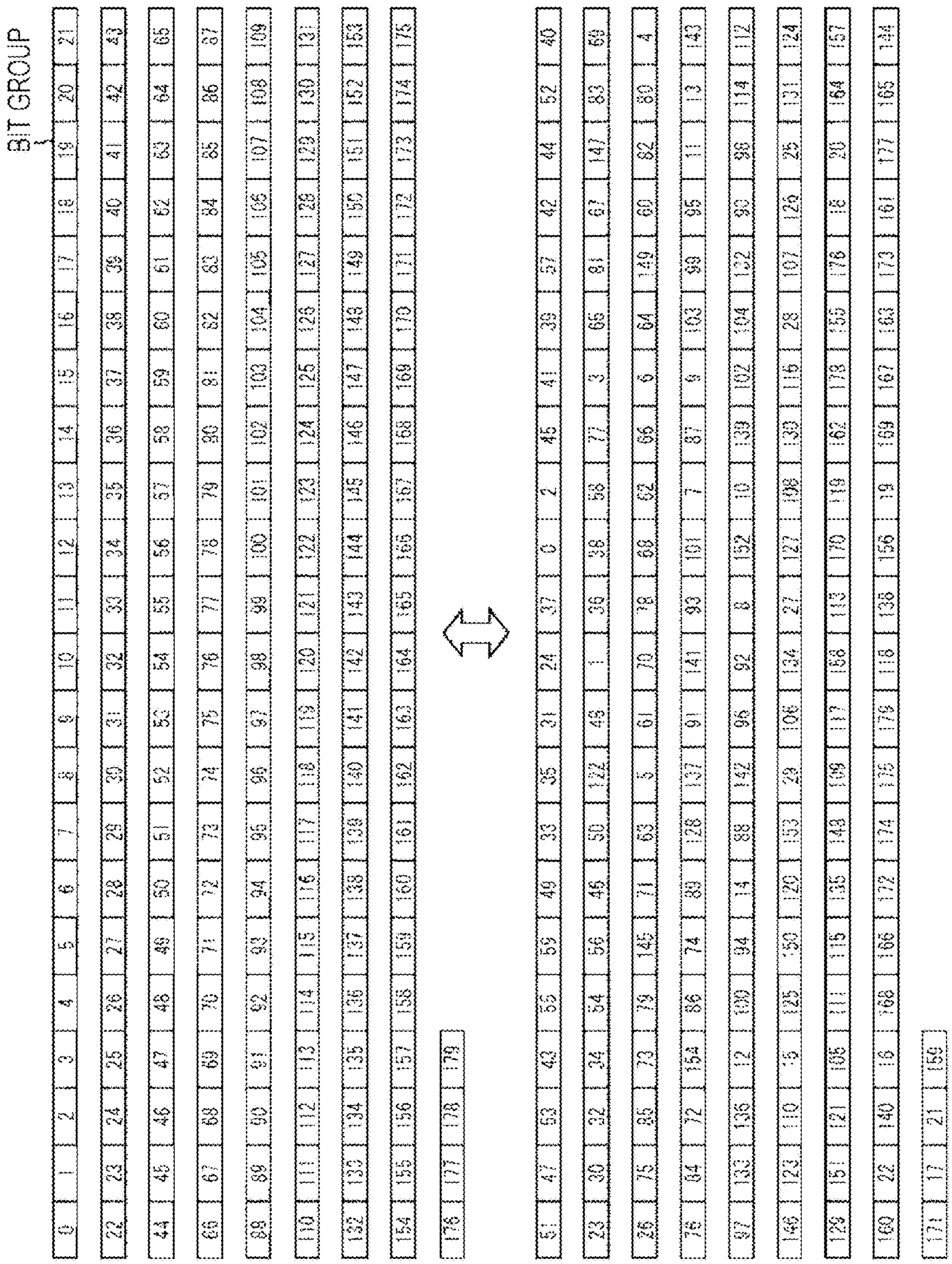

FIG. 125 is a diagram that illustrates a 28th example of the GW pattern for an LDPC code of which the code length N is 64 kbits.

According to the GW pattern illustrated in FIG. 125, a sequence of bit groups 0 to 179 of the LDPC code of 64 kbits is interleaved into a sequence of the following bit groups.

51, 47, 53, 43, 55, 59, 49, 33, 35, 31, 24, 37, 0, 2, 45, 41, 39, 57, 42, 44, 52, 40, 23, 30, 32, 34, 54, 56, 46, 50, 122, 48, 1, 36, 38, 58, 77, 3, 65, 81, 67, 147, 83, 69, 26, 75, 85, 73, 79, 145, 71, 63, 5, 61, 70, 78, 68, 62, 66, 6, 64, 149, 60, 82, 80, 4, 76, 84, 72, 154, 86, 74, 89, 128, 137, 91, 141, 93, 101, 7, 87, 9, 103, 99, 95, 11, 13, 143, 97, 133, 136, 12, 100, 94, 14, 88, 142, 96, 92, 8, 152, 10, 139, 102, 104, 132, 90, 98, 114, 112, 146, 123, 110, 15, 125, 150, 120, 153, 29, 106, 134, 27, 127, 108, 130, 116, 28, 107, 126, 25, 131, 124, 129, 151, 121, 105, 111, 115, 135, 148, 109, 117, 158, 113, 170, 119, 162, 178, 155, 176, 18, 20, 164, 157, 160, 22, 140, 16, 168, 166, 172, 174, 175, 179, 118, 138, 156, 19, 169, 167, 163, 173, 161, 177, 165, 144, 171, 17, 21, 159

Figure 126:
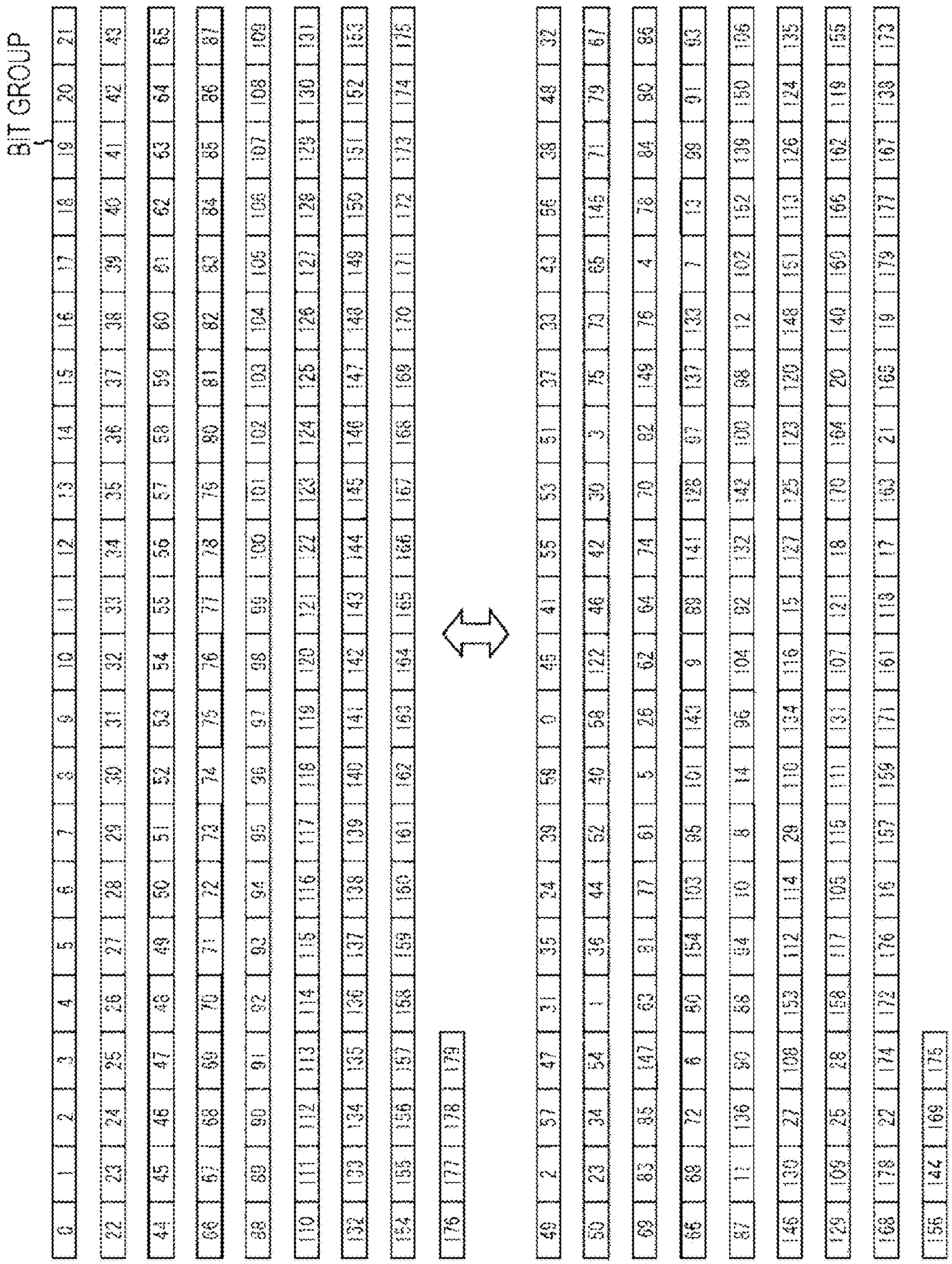

FIG. 126 is a diagram that illustrates a 29th example of the GW pattern for an LDPC code of which the code length N is 64 kbits.

According to the GW pattern illustrated in FIG. 126, a sequence of bit groups 0 to 179 of the LDPC code of 64 kbits is interleaved into a sequence of the following bit groups.

49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, 175

The first to 29th examples of the GW pattern for the LDPC code of which the code length N is 64 kbits can be applied to any combination of the LDPC code having a code length N of 64 kbits and an arbitrary coding rate r and an arbitrary modulation scheme (constellation).

However, in the group-wise interleave, by setting the GW pattern to be applied to each combination of the code length N of the LDPC code, the coding rate r of the LDPC code, and the modulation scheme (constellation), the error rate of each combination can be further improved.

By applying the GW pattern illustrated in FIG. 98, for example, to the combination of the ETRI code of (64 k, 5/15) and the QPSK, particularly, an excellent error rate can be achieved.

By applying the GW pattern illustrated in FIG. 99, for example, to the combination of the ETRI code of (64 k, 5/15) and the 16 QAM, particularly, an excellent error rate can be achieved.

By applying the GW pattern illustrated in FIG. 100, for example, to the combination of the ETRI code of (64 k, 5/15) and the 64 QAM, particularly, an excellent error rate can be achieved.

By applying the GW pattern illustrated in FIG. 101, for example, to the combination of the Sony code of (64 k, 7/15) and the QPSK, particularly, an excellent error rate can be achieved.

By applying the GW pattern illustrated in FIG. 102, for example, to the combination of the Sony code of (64 k, 7/15) and the 16 QAM, particularly, an excellent error rate can be achieved.

By applying the GW pattern illustrated in FIG. 103, for example, to the combination of the Sony code of (64 k, 7/15) and the 64 QAM, particularly, an excellent error rate can be achieved.

By applying the GW pattern illustrated in FIG. 104, for example, to the combination of the Sony code of (64 k, 9/15) and the QPSK, particularly, an excellent error rate can be achieved.

By applying the GW pattern illustrated in FIG. 105, for example, to the combination of the Sony code of (64 k, 9/15) and the 16 QAM, particularly, an excellent error rate can be achieved.

By applying the GW pattern illustrated in FIG. 106, for example, to the combination of the Sony code of (64 k, 9/15) and the 64 QAM, particularly, an excellent error rate can be achieved.

By applying the GW pattern illustrated in FIG. 107, for example, to the combination of the Sony code of (64 k, 11/15) and the QPSK, particularly, an excellent error rate can be achieved.

By applying the GW pattern illustrated in FIG. 108, for example, to the combination of the Sony code of (64 k, 11/15) and the 16 QAM, particularly, an excellent error rate can be achieved.

By applying the GW pattern illustrated in FIG. 109, for example, to the combination of the Sony code of (64 k, 11/15) and the 64 QAM, particularly, an excellent error rate can be achieved.

By applying the GW pattern illustrated in FIG. 110, for example, to the combination of the Sony code of (64 k, 13/15) and the QPSK, particularly, an excellent error rate can be achieved.

By applying the GW pattern illustrated in FIG. 111, for example, to the combination of the Sony code of (64 k, 13/15) and the 16 QAM, particularly, an excellent error rate can be achieved.

By applying the GW pattern illustrated in FIG. 112, for example, to the combination of the Sony code of (64 k, 13/15) and the 64 QAM, particularly, an excellent error rate can be achieved.

By applying the GW pattern illustrated in FIG. 113, for example, to the combination of the ETRI code of (64 k, 5/15) and the 256 QAM, particularly, an excellent error rate can be achieved.

By applying the GW pattern illustrated in FIG. 114, for example, to the combination of the ETRI code of (64 k, 7/15) and the 256 QAM, particularly, an excellent error rate can be achieved.

By applying the GW pattern illustrated in FIG. 115, for example, to the combination of the Sony code of (64 k, 7/15) and the 256 QAM, particularly, an excellent error rate can be achieved.

By applying the GW pattern illustrated in FIG. 116, for example, to the combination of the Sony code of (64 k, 9/15) and the 256 QAM, particularly, an excellent error rate can be achieved.

By applying the GW pattern illustrated in FIG. 117, for example, to the combination of the NERC code of (64 k, 9/15) and the 256 QAM, particularly, an excellent error rate can be achieved.

By applying the GW pattern illustrated in FIG. 118, for example, to the combination of the Sony code of (64 k, 11/15) and the 256 QAM, particularly, an excellent error rate can be achieved.

By applying the GW pattern illustrated in FIG. 119, for example, to the combination of the Sony code of (64 k, 13/15) and the 256 QAM, particularly, an excellent error rate can be achieved.

By applying the GW pattern illustrated in FIG. 120, for example, to the combination of the ETRI code of (64 k, 5/15) and the 1024 QAM, particularly, an excellent error rate can be achieved.

By applying the GW pattern illustrated in FIG. 121, for example, to the combination of the ETRI code of (64 k, 7/15) and the 1024 QAM, particularly, an excellent error rate can be achieved.

By applying the GW pattern illustrated in FIG. 122, for example, to the combination of the Sony code of (64 k, 7/15) and the 1024 QAM, particularly, an excellent error rate can be achieved.

By applying the GW pattern illustrated in FIG. 123, for example, to the combination of the Sony code of (64 k, 9/15) and the 1024 QAM, particularly, an excellent error rate can be achieved.

By applying the GW pattern illustrated in FIG. 124, for example, to the combination of the NERC code of (64 k, 9/15) and the 1024 QAM, particularly, an excellent error rate can be achieved.

By applying the GW pattern illustrated in FIG. 125, for example, to the combination of the Sony code of (64 k, 11/15) and the 1024 QAM, particularly, an excellent error rate can be achieved.

By applying the GW pattern illustrated in FIG. 126, for example, to the combination of the Sony code of (64 k, 13/15) and the 1024 QAM, particularly, an excellent error rate can be achieved.

Figure 127:
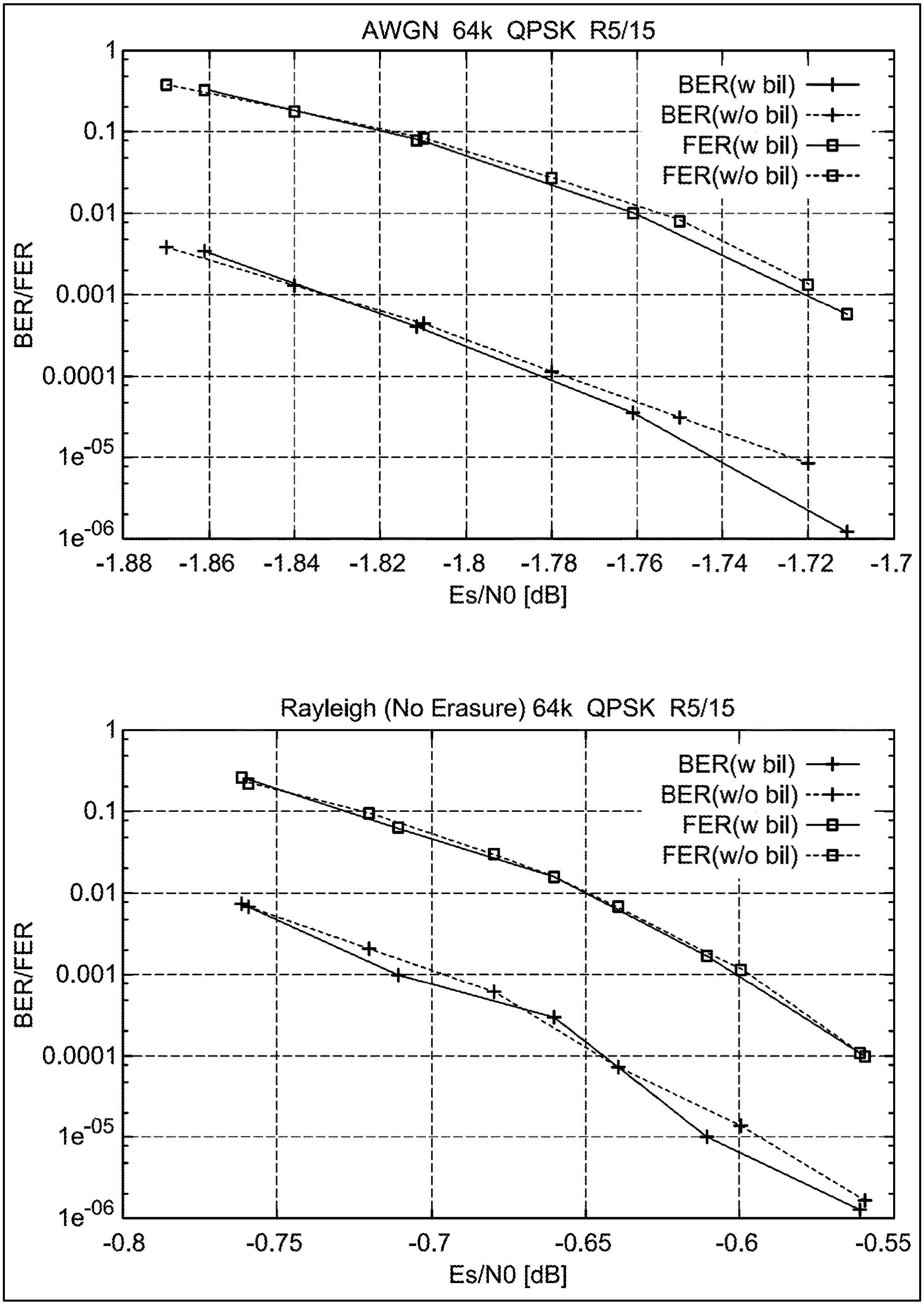

FIG. 127 is a diagram that illustrates a BER/FER curve as a simulation result of a simulation of measuring an error rate in a case where the GW pattern illustrated in FIG. 98 is applied to a combination of the ETRI code of (64 k, 5/15) and the QPSK.

FIG. 128 is a diagram that illustrates a BER/FER curve as a simulation result of a simulation of measuring an error rate in a case where the GW pattern illustrated in FIG. 99 is applied to a combination of the ETRI code of (64 k, 5/15) and the 16 QAM.

Figure 129:
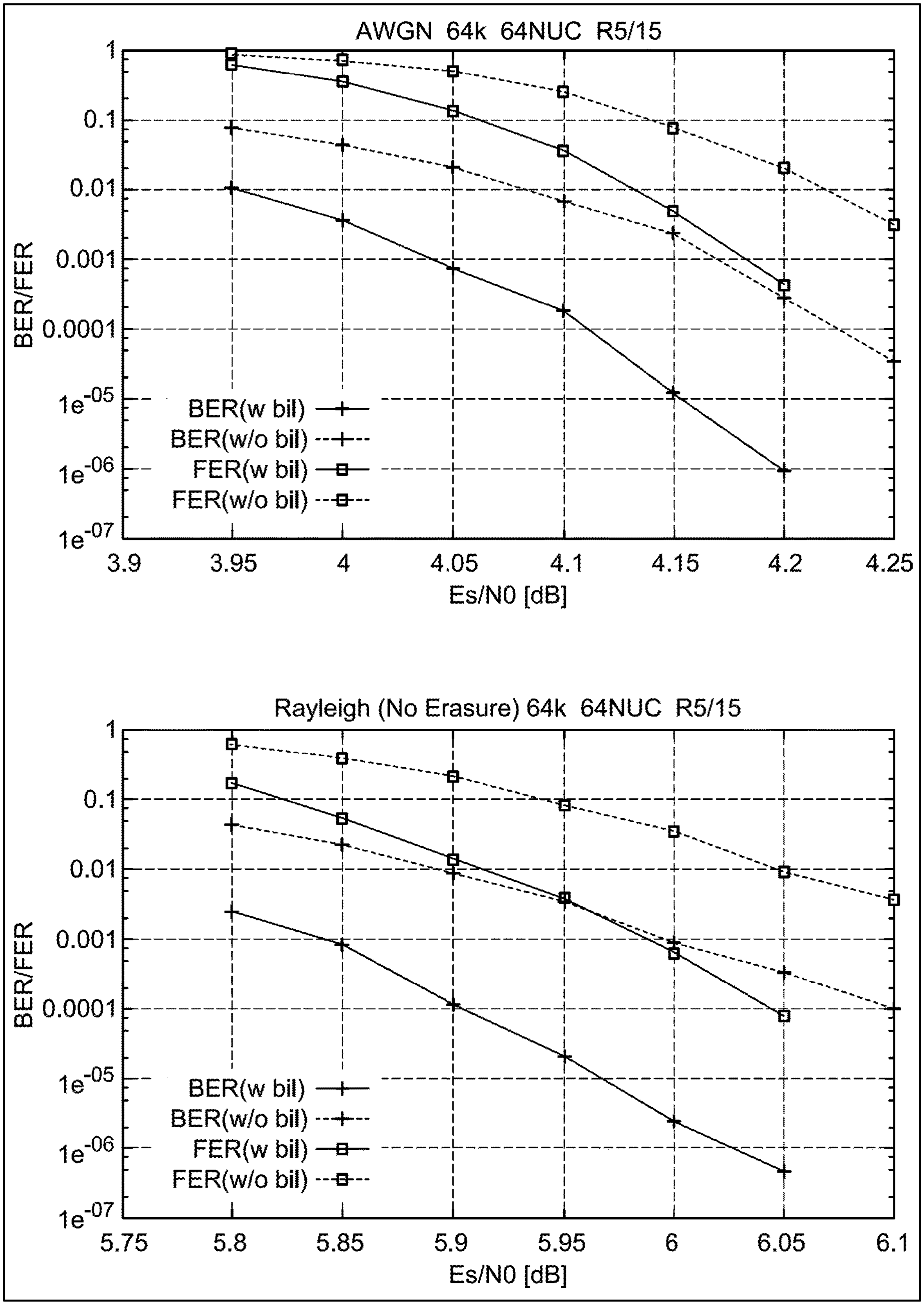

FIG. 129 is a diagram that illustrates a BER/FER curve as a simulation result of a simulation of measuring an error rate in a case where the GW pattern illustrated in FIG. 100 is applied to a combination of the ETRI code of (64 k, 5/15) and the 64 QAM.

Figure 130:
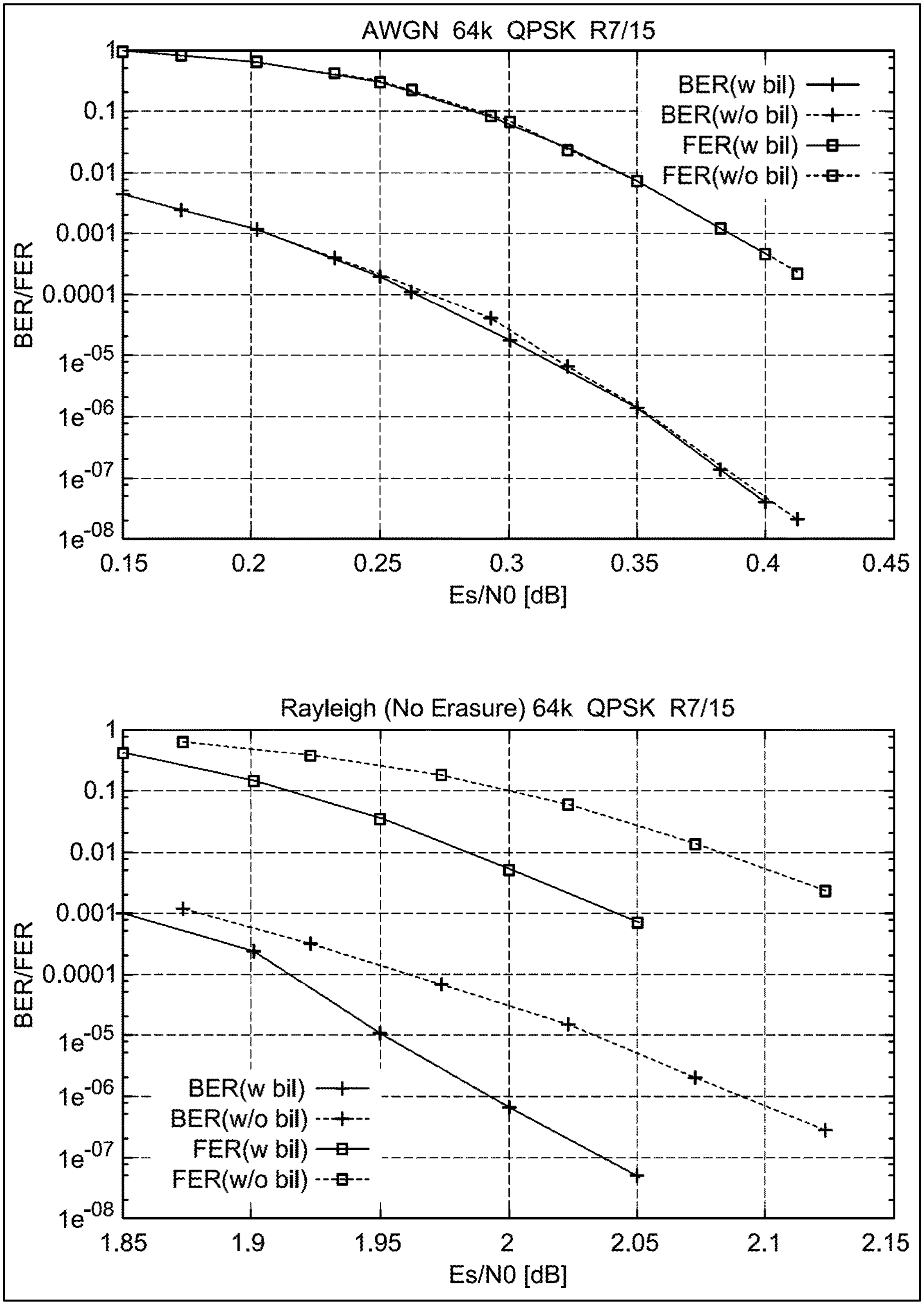

FIG. 130 is a diagram that illustrates a BER/FER curve as a simulation result of a simulation of measuring an error rate in a case where the GW pattern illustrated in FIG. 101 is applied to a combination of the Sony code of (64 k, 7/15) and the QPSK.

Figure 131:
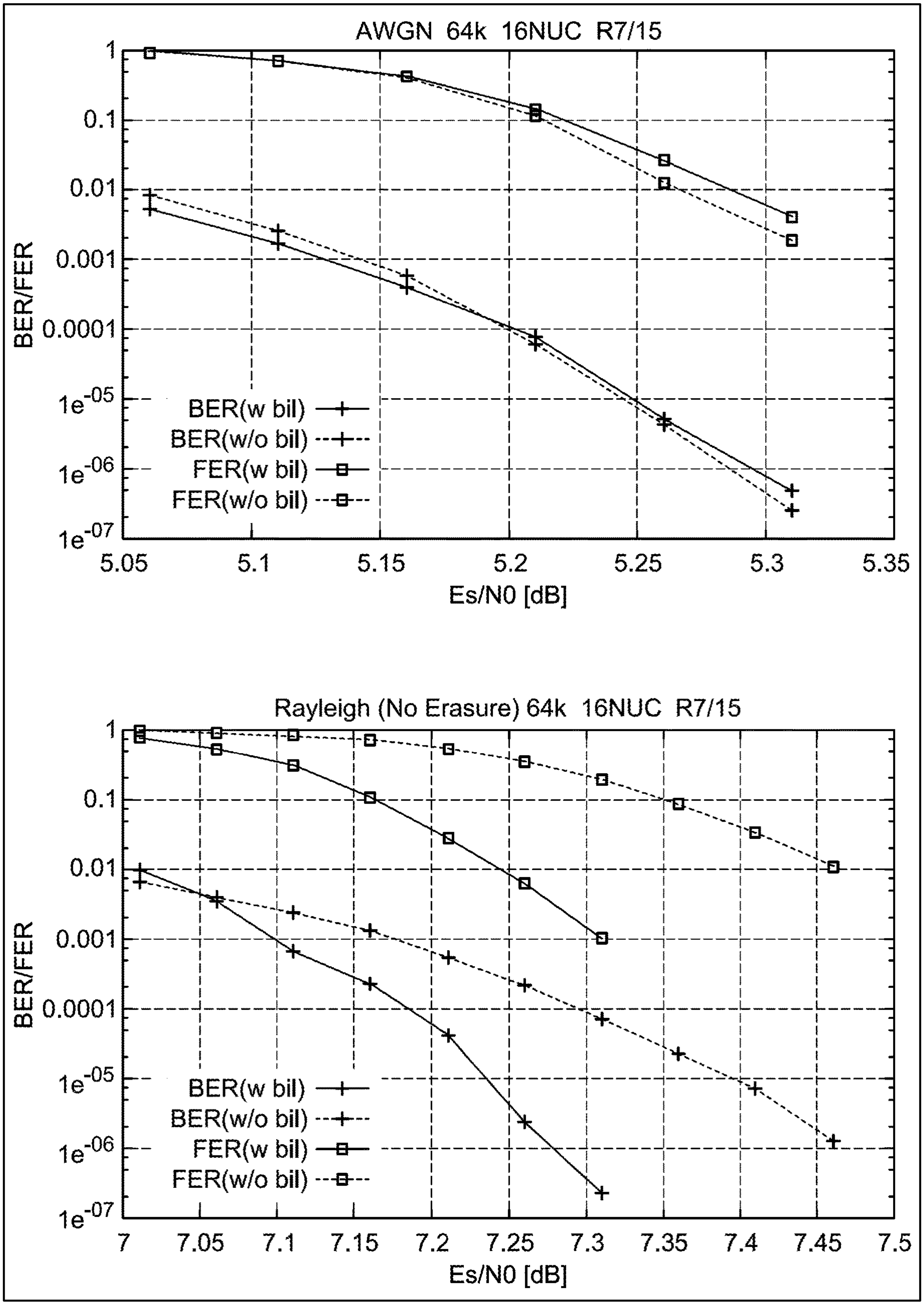

FIG. 131 is a diagram that illustrates a BER/FER curve as a simulation result of a simulation of measuring an error rate in a case where the GW pattern illustrated in FIG. 102 is applied to a combination of the Sony code of (64 k, 7/15) and the 16 QAM.

FIG. 132 is a diagram that illustrates a BER/FER curve as a simulation result of a simulation of measuring an error rate in a case where the GW pattern illustrated in FIG. 103 is applied to a combination of the Sony code of (64 k, 7/15) and the 64 QAM.

FIG. 133 is a diagram that illustrates a BER/FER curve as a simulation result of a simulation of measuring an error rate in a case where the GW pattern illustrated in FIG. 104 is applied to a combination of the Sony code of (64 k, 9/15) and the QPSK.

FIG. 134 is a diagram that illustrates a BER/FER curve as a simulation result of a simulation of measuring an error rate in a case where the GW pattern illustrated in FIG. 105 is applied to a combination of the Sony code of (64 k, 9/15) and the 16 QAM.

FIG. 135 is a diagram that illustrates a BER/FER curve as a simulation result of a simulation of measuring an error rate in a case where the GW pattern illustrated in FIG. 106 is applied to a combination of the Sony code of (64 k, 9/15) and the 64 QAM.

FIG. 136 is a diagram that illustrates a BER/FER curve as a simulation result of a simulation of measuring an error rate in a case where the GW pattern illustrated in FIG. 107 is applied to a combination of the Sony code of (64 k, 11/15) and the QPSK.

FIG. 137 is a diagram that illustrates a BER/FER curve as a simulation result of a simulation of measuring an error rate in a case where the GW pattern illustrated in FIG. 108 is applied to a combination of the Sony code of (64 k, 11/15) and the 16 QAM.

FIG. 138 is a diagram that illustrates a BER/FER curve as a simulation result of a simulation of measuring an error rate in a case where the GW pattern illustrated in FIG. 109 is applied to a combination of the Sony code of (64 k, 11/15) and the 64 QAM.

FIG. 139 is a diagram that illustrates a BER/FER curve as a simulation result of a simulation of measuring an error rate in a case where the GW pattern illustrated in FIG. 110 is applied to a combination of the Sony code of (64 k, 13/15) and the QPSK.

FIG. 140 is a diagram that illustrates a BER/FER curve as a simulation result of a simulation of measuring an error rate in a case where the GW pattern illustrated in FIG. 111 is applied to a combination of the Sony code of (64 k, 13/15) and the 16 QAM.

FIG. 141 is a diagram that illustrates a BER/FER curve as a simulation result of a simulation of measuring an error rate in a case where the GW pattern illustrated in FIG. 112 is applied to a combination of the Sony code of (64 k, 13/15) and the 64 QAM.

FIG. 142 is a diagram that illustrates a BER/FER curve as a simulation result of a simulation of measuring an error rate in a case where the GW pattern illustrated in FIG. 113 is applied to a combination of the ETRI code of (64 k, 5/15) and the 256 QAM.

FIG. 143 is a diagram that illustrates a BER/FER curve as a simulation result of a simulation of measuring an error rate in a case where the GW pattern illustrated in FIG. 114 is applied to a combination of the ETRI code of (64 k, 7/15) and the 256 QAM.

FIG. 144 is a diagram that illustrates a BER/FER curve as a simulation result of a simulation of measuring an error rate in a case where the GW pattern illustrated in FIG. 115 is applied to a combination of the Sony code of (64 k, 7/15) and the 256 QAM.

FIG. 145 is a diagram that illustrates a BER/FER curve as a simulation result of a simulation of measuring an error rate in a case where the GW pattern illustrated in FIG. 116 is applied to a combination of the Sony code of (64 k, 9/15) and the 256 QAM.

FIG. 146 is a diagram that illustrates a BER/FER curve as a simulation result of a simulation of measuring an error rate in a case where the GW pattern illustrated in FIG. 117 is applied to a combination of the NERC code of (64 k, 9/15) and the 256 QAM.

FIG. 147 is a diagram that illustrates a BER/FER curve as a simulation result of a simulation of measuring an error rate in a case where the GW pattern illustrated in FIG. 118 is applied to a combination of the Sony code of (64 k, 11/15) and the 256 QAM.

FIG. 148 is a diagram that illustrates a BER/FER curve as a simulation result of a simulation of measuring an error rate in a case where the GW pattern illustrated in FIG. 119 is applied to a combination of the Sony code of (64 k, 13/15) and the 256 QAM.

FIG. 149 is a diagram that illustrates a BER/FER curve as a simulation result of a simulation of measuring an error rate in a case where the GW pattern illustrated in FIG. 120 is applied to a combination of the ETRI code of (64 k, 5/15) and the 1024 QAM.

FIG. 150 is a diagram that illustrates a BER/FER curve as a simulation result of a simulation of measuring an error rate in a case where the GW pattern illustrated in FIG. 121 is applied to a combination of the ETRI code of (64 k, 7/15) and the 1024 QAM.

FIG. 151 is a diagram that illustrates a BER/FER curve as a simulation result of a simulation of measuring an error rate in a case where the GW pattern illustrated in FIG. 122 is applied to a combination of the Sony code of (64 k, 7/15) and the 1024 QAM.

FIG. 152 is a diagram that illustrates a BER/FER curve as a simulation result of a simulation of measuring an error rate in a case where the GW pattern illustrated in FIG. 123 is applied to a combination of the Sony code of (64 k, 9/15) and the 1024 QAM.

FIG. 153 is a diagram that illustrates a BER/FER curve as a simulation result of a simulation of measuring an error rate in a case where the GW pattern illustrated in FIG. 124 is applied to a combination of the NERC code of (64 k, 9/15) and the 1024 QAM.

FIG. 154 is a diagram that illustrates a BER/FER curve as a simulation result of a simulation of measuring an error rate in a case where the GW pattern illustrated in FIG. 125 is applied to a combination of the Sony code of (64 k, 11/15) and the 1024 QAM.

FIG. 155 is a diagram that illustrates a BER/FER curve as a simulation result of a simulation of measuring an error rate in a case where the GW pattern illustrated in FIG. 126 is applied to a combination of the Sony code of (64 k, 13/15) and the 1024 QAM.

Note that FIGS. 127 to 155 illustrate BER/FER curves in a case where an AWGN channel is employed as the communication line 13 (FIG. 7) (upper drawings) and BER/FER curves in a case where a Rayleigh (fading) channel is employed as the communication line 13 (FIG. 7) (lower drawings).

In addition, in FIGS. 127 to 155, each solid line (w bil) represents a BER/FER curve in a case where the parity interleave, the group-wise interleave, and the block-wise interleave are performed, and each dotted line (w/o bil) represents a BER/FER curve in a case where the parity interleave, the group-wise interleave, and the block-wise interleave are not performed.

As illustrated in FIGS. 127 to 155, in a case where the parity interleave, the group-wise interleave, and the block-wise interleave are performed, it can be checked that the BER/FER is improved, and an excellent error rate can be achieved, compared to a case where such interleave is not performed.

Note that the GW patterns illustrated in FIGS. 98 to 126 also can be applied to a constellation in which the signal point arrangements illustrated in FIGS. 87 to 93 are symmetrically moved with respect to the I axis or the Q axis, a constellation in which the signal point arrangements described above are symmetrically moved with respect to the origin, a constellation in which the signal point arrangements described above are rotated with the origin used at its center by an arbitrary angle, and the like in addition to the constellation of QPSK, 16 QAM, 64 QAM, 256 QAM, and 1024 QAM of the signal point arrangements illustrated in FIGS. 87 to 93 described above, and effects similar to those of case where the GW patterns illustrated in FIGS. 87 to 93 are applied to the constellation of QPSK, 16 QAM, 64 QAM, 256 QAM, and 1024 QAM of the signal point arrangements illustrated in FIGS. 87 to 93 can be acquired.

Furthermore, the GW pattern illustrated in FIGS. 98 to 126 also can be applied to a constellation in which the most significant bit (MSB) and the least significant bit (LSB) of the symbol to be associated with (allocated to) the signal point are interchanged in the signal point arrangements illustrated in FIGS. 87 to 93 in addition to the constellations of QPSK, 16 QAM, 64 QAM, 256 QAM, and 1024 QAM of the signal point arrangements illustrated in FIGS. 87 to 93, and effects similar to those of case where the GW patterns illustrated in FIGS. 87 to 93 are applied to the constellations of QPSK, 16 QAM, 64 QAM, 256 QAM, and 1024 QAM of the signal point arrangements illustrated in FIGS. 87 to 93 can be acquired.

<Configuration Example of Receiving Device 12>

FIG. 156 is a block diagram illustrating a configuration example of the receiving device 12 illustrated in FIG. 7.

An OFDM processing unit (OFDM operation) 151 receives an OFDM signal from the transmitting device 11 (FIG. 7) and performs signal processing of the OFDM signal. Data that is acquired by performing the signal processing performed by the OFDM processing unit 151 is supplied to a frame managing unit (Frame Management) 152.

The frame managing unit 152 performs processing (frame interpretation) of a frame configured by the data supplied from the OFDM processing unit 151 and respectively supplies a signal of target data acquired as a result thereof and a signal of control data to frequency deinterleavers 161 and 153.

The frequency deinterleaver 153 performs frequency deinterleave in units of symbols for the data supplied from the frame managing unit 152 and supplies resultant data to a demapper 154.

The demapper 154 performs demapping (signal point arrangement decoding) and quadrature demodulation for the data (the data on the constellation) supplied from the frequency deinterleaver 153 on the basis of the arrangement (constellation) of the signal points determined according to the quadrature modulation performed on the transmitting device 11 side and supplies the data ((the likelihood of) the LDPC code) acquired as a result thereof to the LDPC decoder 155.

The LDPC decoder 155 performs LDPC decoding of the LDPC code supplied from the demapper 154 and supplies LDPC target data (in this case, a BCH code) acquired as a result thereof to a BCH decoder 156.

The BCH decoder 156 performs BCH decoding of the LDPC target data supplied from the LDPC decoder 155 and outputs control data (signaling) acquired as a result thereof.

Meanwhile, the frequency deinterleaver 161 performs frequency deinterleave in units of symbols for the data supplied from the frame managing unit 152 and supplies resultant data to a SISO/MISO decoder 162.

The SISO/MISO decoder 162 performs time-space decoding of the data supplied from the frequency deinterleaver 161 and supplies resultant data to a time deinterleaver 163.

The time deinterleaver 163 performs time deinterleave in units of symbols for the data supplied from the SISO/MISO decoder 162 and supplies resultant data to a demapper 164.

The demapper 164 performs demapping (signal point arrangement decoding) and quadrature demodulation for the data (the data on the constellation) supplied from the time deinterleaver 163 on the basis of the arrangement (constellation) of the signal points determined according to the quadrature modulation performed on the transmitting device 11 side and supplies the data acquired as a result thereof to a bit deinterleaver 165.

The bit deinterleaver 165 performs the bit deinterleave for the data supplied from the demapper 164 and supplies (the likelihood of) the LDPC code that is data after the bit deinterleave to an LDPC decoder 166.

The LDPC decoder 166 performs LDPC decoding of the LDPC code supplied from the bit deinterleaver 165 and supplies LDPC target data (here, a BCH code) acquired as a result thereof to a BCH decoder 167.

The BCH decoder 167 performs BCH decoding of the LDPC target data supplied from the LDPC decoder 155 and supplies data acquired as a result thereof to a BB descrambler 168.

The BB descrambler 168 performs BB descramble for the data supplied from the BCH decoder 167 and supplies data acquired as a result thereof to a null deletion unit 169.

The null deletion unit 169 deletes null inserted by the padder 112 illustrated in FIG. 8 from the data supplied from the BB descrambler 168 and supplies resultant data to a demultiplexer 170.

The demultiplexer 170 separates one or more streams (target data) multiplexed in the data supplied from the null deletion unit 169, performs necessary processing for the streams, and outputs processed streams as output streams.

Note that the receiving device 12 may be configured without arranging some of the blocks illustrated in FIG. 156. In other words, for example, in a case where the transmitting device 11 (FIG. 8) is configured without arranging the time interleaver 118, the SISO/MISO encoder 119, the frequency interleaver 120 and the frequency interleaver 124, the receiving device 12 may be configured without arranging the time deinterleaver 163, the SISO/MISO decoder 162, the frequency deinterleaver 161, and the frequency deinterleaver 153 that are blocks respectively corresponding to the time interleaver 118, the SISO/MISO encoder 119, the frequency interleaver 120, and the frequency interleaver 124 of the transmitting device 11.

<Configuration Example of Bit Deinterleaver 165>

FIG. 157 is a block diagram that illustrates a configuration example of the bit deinterleaver 165 illustrated in FIG. 156.

The bit deinterleaver 165 is configured with a block deinterleaver 54 and a group-wise deinterleaver 55 and performs the (bit) deinterleave of the symbol bits of the symbol that is the data supplied from the demapper 164 (FIG. 156).

In other words, the block deinterleaver 54 performs block deinterleave (the inverse process of the block interleave) corresponding to the block interleave performed by the block interleaver 25 illustrated in FIG. 9, in other words, the block deinterleave restoring the positions of (the likelihood of) of the code bits of the LDPC code rearranged by the block interleave to the original positions for the symbol bits of the symbol supplied from the demapper 164 as a target and supplies the LDPC code acquired as a result thereof to the group-wise deinterleaver 55.

The group-wise deinterleaver 55 performs group-wise deinterleave (the inverse process of the group-wise interleave) corresponding to the group-wise interleave performed by the group-wise interleaver 24 illustrated in FIG. 9, in other words, group-wise deinterleave for restoring the original sequence by rearranging the code bits of the LDPC code of which the sequence has been changed in units of bit groups by the group-wise interleave described above, for example, with reference to FIG. 97 in units of bit groups for the LDPC code supplied from the block deinterleaver 54 as a target.

Here, in a case where the parity interleave, the group-wise interleave, and the block interleave are performed for the LDPC code supplied from the demapper 164 to the bit deinterleaver 165, the bit deinterleaver 165 can perform all of the parity deinterleave (the inverse process of the parity interleave, in other words, the parity deinterleave for restoring the code bits of the LDPC code of which the sequence has been changed by the parity interleave to the original sequence) corresponding to the parity interleave, the block deinterleave corresponding to the block interleave, and the group-wise deinterleave corresponding to the group-wise interleave.

However, in the bit deinterleaver 165 illustrated in FIG. 157, while the block deinterleaver 54 that performs the block deinterleave corresponding to the block interleave and the group-wise deinterleaver 55 that performs the group-wise deinterleave corresponding to the group-wise interleave are arranged, the block that performs the parity deinterleave corresponding to the parity interleave is not arranged, and the parity deinterleave is not performed.

Accordingly, the LDPC code for which the block deinterleave and the group-wise deinterleave have been performed, but the parity deinterleave has not been performed is supplied from the bit deinterleaver 165 (the group-wise deinterleaver 55 thereof) to the LDPC decoder 166.

The LDPC decoder 166 performs LDPC decoding of the LDPC code supplied from the bit deinterleaver 165 by using the transformed parity check matrix (or the transformed parity check matrix (FIG. 29) acquired by performing row permutation for the parity check matrix (FIG. 27) of the ETRI type) acquired by performing at least the column permutation corresponding to the parity interleave for the parity check matrix H of the DVB type used for the LDPC coding by the LDPC encoder 115 illustrated in FIG. 8 and outputs data acquired as a result thereof as a decoding result of the LDPC target data.

FIG. 158 is a flowchart that illustrates a process performed by the demapper 164, the bit deinterleaver 165, and the LDPC decoder 166 illustrated in FIG. 157.

In step S111, the demapper 164 performs demapping and quadrature demodulation for the data (the data on the constellation mapped into the signal points) supplied from the time deinterleaver 163, and supplies resultant data to the bit deinterleaver 165, and the process proceeds to step S112

In step S112, the bit deinterleaver 165 performs the deinterleave (the bit deinterleave) for the data supplied from the demapper 164, and the process proceeds to step S113.

In other words, in step S112, in the bit deinterleaver 165, the block deinterleaver 54 performs block deinterleave for the data (symbol) supplied from the demapper 164 as a target and supplies the code bits of the LDPC code acquired as a result thereof to the group-wise deinterleaver 55.

The group-wise deinterleaver 55 performs group-wise deinterleave for the LDPC code supplied from the block deinterleaver 54 as a target and supplies (the likelihood of) the LDPC code acquired as a result thereof to the LDPC decoder 166.

In step S113, the LDPC decoder 166 performs LDPC decoding of the LDPC code supplied from the group-wise deinterleaver 55 by using the parity check matrix H used for the LDPC coding by the LDPC encoder 115 illustrated in FIG. 8, in other words, for example, by using the transformed parity check matrix acquired from the parity check matrix H and outputs the data acquired as a result thereof to the BCH decoder 167 as a decoding result of the LDPC target data.

Note that, in FIG. 157, similarly to the case illustrated in FIG. 9, for the convenience of description, while the block deinterleaver 54 that performs the block deinterleave and the group-wise deinterleaver 55 that performs the group-wise deinterleave are separately configured, the block deinterleaver 54 and the group-wise deinterleaver 55 may be integrally configured.

<LDPC Decoding>

The LDPC decoding performed by the LDPC decoder 166 illustrated in FIG. 156 will be further described.

As described above, the LDPC decoder 166 illustrated in FIG. 156 performs the LDPC decoding of the LDPC code, for which the block deinterleave and the group-wise deinterleave have been performed, but the parity deinterleave has not been performed, supplied from the group-wise deinterleaver 55 by using the transformed parity check matrix acquired by performing at least the column permutation corresponding to the parity interleave (or the transformed parity check matrix (FIG. 29) acquired by performing the row permutation for the parity check matrix of the ETRI type (FIG. 27)) for the parity check matrix H of the DVB type used for the LDPC coding by the LDPC encoder 115 illustrated in FIG. 8.

Here, LDPC decoding that can suppress an operation frequency to be in a sufficiently realizable range while suppressing the circuit scale by performing the LDPC decoding using the transformed parity check matrix has been proposed in advance (for example, see U.S. Pat. No. 4,224,777).

Thus, first, the LDPC decoding, which has been proposed in advance, using the transformed parity check matrix will be described with reference to FIGS. 159 to 162.

FIG. 159 illustrates an example of a parity check matrix H of an LDPC code having a code length N of 90 and a coding rate of 2/3.

Note that, in FIG. 159 (and FIGS. 160 and 161 to be described later), 0 is represented by a period (.).

In the parity check matrix H illustrated in FIG. 159, the parity matrix has a staircase structure.

FIG. 160 illustrates a parity check matrix H' that is acquired by performing row permutation represented in Equation (11) and column permutation represented in Equation (12) for the parity check matrix H illustrated in FIG. 159.

$$\text{Row permutation: } (6s+t+1)\text{-th row} \rightarrow (5t+s+1)\text{-th row} \tag{11}$$

$$\text{Column permutation: } (6x+y+61)\text{-th column} \rightarrow (5y+x+61)\text{-th column} \tag{12}$$

In Equations (11) and (12), s, t, x, and y are integers respectively in the ranges of 0≤s<5, 0≤t<6, 0≤x<5, and 0≤t<6.

According to the row permutation represented in Equation (11), permutation is performed such that the 1st, 7th, 13th, 19th, and 25th rows having a remainder of 1 acquired when being divided by 6 are respectively replaced with the 1st, 2nd, 3rd, 4th, and 5th rows, and the 2nd, 8th, 14th, 20th, and 26th rows having a remainder of 2 acquired when being divided by 6 are respectively replaced with the 6th, 7th, 8th, 9th, and 10th rows.

In addition, according to the column permutation represented in Equation (12), permutation is performed such that the 61st, 67th, 73rd, 79th, and 85th columns having a remainder of 1 acquired when being divided by 6 are respectively replaced with the 61st, 62nd, 63rd, 64th, and 65th columns, and the 62nd, 68th, 74th, 80th, and 86th columns having a remainder of 2 acquired when being divided by 6 are respectively replaced with the 66th, 67th, 68th, 69th, and 70th columns for the 61st and following columns (parity matrix).

In this way, a matrix that is acquired by performing the permutation of the rows and the columns for the parity check matrix H illustrated in FIG. 159 is a parity check matrix H' illustrated in FIG. 160.

In this case, even when the row permutation of the parity check matrix H is performed, the sequence of the code bits of the LDPC code is not influenced.

In addition, the column permutation represented in Equation (12) corresponds to the above-described parity interleave for interleaving the (K+qx+y+1)-th code bit into the position of the (K+Py+x+1)-th code bit when the information length K is 60, the unit size P is 5, and the divisor q (=M/P) of the parity length M (here, 30) is 6.

Accordingly, the parity check matrix H' illustrated in FIG. 160 is a transformed parity check matrix acquired by performing at least column permutation replacing the (K+qx+y+1)-th column of the parity check matrix H illustrated in FIG. 159 (hereinafter, referred to as an original parity check matrix as is appropriate) with the (K+Py+x+1)-th column.

When the parity check matrix H' illustrated in FIG. 160 is multiplied by a result acquired by performing the same permutation as Equation (12) for the LDPC code of the parity check matrix H illustrated in FIG. 159, a zero vector is output. In other words, when a row vector acquired by performing the column permutation represented in Equation (12) for a row vector c as the LDPC code (one code word) of the original parity check matrix H is represented as c', $Hc^T$ becomes the zero vector on the basis of the property of the parity check matrix. Accordingly, it is apparent that $H'c'^T$ becomes the zero vector.

Accordingly, the transformed parity check matrix H' illustrated in FIG. 160 is a parity check matrix of the LDPC code c' that is acquired by performing the column permutation represented in Equation (12) for the LDPC code c of the original parity check matrix H.

Therefore, by performing the column permutation represented in Equation (12) for the LDPC code c of the original parity check matrix H, decoding the LDPC code c' after the column permutation (LDPC decoding) using the transformed parity check matrix H' illustrated in FIG. 160, and performing reverse permutation of the column permutation represented in Equation (12) for a result of the decoding, a decoding result similar to that in a case where the LDPC code of the original parity check matrix H is decoded using the parity check matrix H can be acquired.

FIG. 161 is a diagram that illustrates the transformed parity check matrix H' illustrated in FIG. 160 with being spaced in units of 5×5 matrixes.

In FIG. 161, the transformed parity check matrix H' is represented by a combination of a 5×5 (=P×P) unit matrix that has a unit size P, a matrix (hereinafter, appropriately referred to as a quasi unit matrix) acquired by setting one or more “1”s of the unit matrix to zero, a matrix (hereinafter, appropriately referred to as a shifted matrix) acquired by cyclically shifting the unit matrix or the quasi unit matrix, a sum (hereinafter, appropriately referred to as a sum matrix) of two or more matrixes of the unit matrix, the quasi unit matrix, and the shifted matrix, and a 5×5 zero matrix.

The transformed parity check matrix H' illustrated in FIG. 161 can be regarded as being configured using the 5×5 unit matrix, the quasi unit matrix, the shifted matrix, the sum matrix, and the zero matrix. Therefore, hereinafter, the 5×5 matrixes (the unit matrix, the quasi unit matrix, the shifted matrix, the sum matrix, and the zero matrix) that constitute the transformed parity check matrix H' will be appropriately referred to as constitutive matrixes.

For decoding the LDPC code of the parity check matrix represented by the P×P constitutive matrixes, an architecture in which P check node operations and variable node operations are simultaneously performed can be used.

FIG. 162 is a block diagram that illustrates a configuration example of a decoding device that performs such decoding.

In other words, FIG. 162 illustrates the configuration example of the decoding device that performs decoding of the LDPC code by using the transformed parity check matrix H' illustrated in FIG. 161 acquired by performing at least the column permutation represented in Equation (12) for the original parity check matrix H illustrated in FIG. 159.

The decoding device illustrated in FIG. 162 includes a branch data storing memory 300 that includes 6 FIFOs $\mathbf{300}_1$ to $\mathbf{300}_6$, a selector 301 that selects the FIFOs $\mathbf{300}_1$ to $\mathbf{300}_6$, a check node calculating unit 302, two cyclic shift circuits 303 and 308, a branch data storing memory 304 that includes 18 FIFOs $\mathbf{304}_1$ to $\mathbf{304}_{18}$, a selector 305 that selects the FIFOs $\mathbf{304}_1$ to $\mathbf{304}_{18}$, a reception data memory 306 that stores reception data, a variable node calculating unit 307, a decoding word calculating unit 309, a reception data rearranging unit 310, and a decoded data rearranging unit 311.

First, a method of storing data in the branch data storing memories 300 and 304 will be described.

The branch data storing memory 300 includes the 6 FIFOs $\mathbf{300}_1$ to $\mathbf{300}_6$ that correspond to a number acquired by dividing the number “30” of rows of the transformed parity check matrix H' illustrated in FIG. 161 by the number “5” of rows (the unit size P) of the constitutive matrix. The FIFO $\mathbf{300}_y$ (y=1, 2, . . . , 6) includes a plurality of stages of storage areas. For the storage area of each stage, messages corresponding to five branches that correspond to the number of rows and the number of columns (the unit size P) of the constitutive matrix can be simultaneously read or written. The number of stages of the storage areas of the FIFO $\mathbf{300}_y$ is 9 that is a maximum number of the number (Hamming weight) of “1” of the transformed parity check matrix illustrated in FIG. 161 in the row direction.

In the FIFO $\mathbf{300}_1$, data (messages $v_i$ from variable nodes) corresponding to positions of “1”s in the first to fifth rows of the transformed parity check matrix H' illustrated in FIG. 161 is stored in the form of filling each row in a horizontal direction (a form in which “0” is ignored). In other words, when a j-th row and an i-th column are represented as (j, i), data corresponding to positions of “1”s in a 5×5 unit matrix of (1, 1) to (5, 5) of the transformed parity check matrix H' is stored in the storage area of the first stage of the FIFO $\mathbf{300}_1$. In the storage area of the second stage, data corresponding to positions of “1” in a shifted matrix (shifted matrix acquired by cyclically shifting the 5×5 unit matrix to the right side by 3) of (1, 21) to (5, 25) of the transformed parity check matrix H' is stored. Similarly, in the storage areas of the third to eighth stages, data is stored in association with the transformed parity check matrix H'. In the storage area of the ninth stage, data corresponding to the positions of “1”s in a shifted matrix (a shifted matrix acquired by replacing “1” included in the first row of the 5×5 unit matrix with “0” and cyclically shifting the unit matrix to the left side by 1) of (1, 86) to (5, 90) of the transformed parity check matrix H' is stored.

In the FIFO $\mathbf{300}_2$, data corresponding to the positions of “1”s in the sixth to tenth rows of the transformed parity check matrix H' illustrated in FIG. 161 is stored. In other words, in the storage area of the first stage of the FIFO $\mathbf{300}_2$, data corresponding to the positions of “1”s in a first shifted matrix constituting a sum matrix (a sum matrix that is a sum of the first shifted matrix acquired by cyclically shifting the 5×5 unit matrix to the right side by one and a second shifted matrix acquired by cyclically shifting the 5×5 unit matrix to the right side by two) of (6, 1) to (10, 5) of the transformed parity check matrix H' is stored. In addition, in the storage area of the second stage, data corresponding to the positions of “1”s in the second shifted matrix constituting the sum matrix of (6, 1) to (10, 5) of the transformed parity check matrix H' is stored.

In other words, for a constitutive matrix of which the weight is two or more, when the constitutive matrix is represented by a sum of a plurality of a P×P unit matrix of which the weight is 1, a quasi unit matrix acquired by setting one or more elements of “1”s in the unit matrix to “0”, and a shifted matrix acquired by cyclically shifting the unit matrix or the quasi unit matrix, data (messages corresponding to branches belonging to the unit matrix, the quasi unit matrix, or the shifted matrix) corresponding to the positions of “1”s in the unit matrix of the weight of 1, the quasi unit matrix, or the shifted matrix is stored at the same address (the same FIFO among the FIFOs $\mathbf{300}_1$ to $\mathbf{300}_6$).

Subsequently, also in the storage areas of the third to ninth stages, data is stored in association with the transformed parity check matrix H'.

Also in the FIFOs $\mathbf{300}_3$ to $\mathbf{300}_6$, data is similarly stored in association with the transformed parity check matrix H'.

The branch data storing memory 304 includes 18 FIFOs $\mathbf{304}_1$ to $\mathbf{304}_{18}$ that correspond to a number acquired by dividing the number “90” of columns of the transformed parity check matrix H' by 5 that is the number of columns (the unit size P) of the constitutive matrix. The FIFO $\mathbf{304}_x$ (here, x=1, 2, . . . , 18) includes a plurality of stages of storage areas. For the storage area of each stage, messages corresponding to five branches corresponding to the number of rows and the number of columns (the unit size P) of the constitutive matrix can be simultaneously read or written.

In the FIFO $\mathbf{304}_1$, data (messages $u_j$ from check nodes) corresponding to the positions of “1”s in the first to fifth columns of the transformed parity check matrix H' illustrated in FIG. 161 is stored in the form of filling each column in the vertical direction (a form in which “0” is ignored). In other words, data corresponding to the positions of “1”s in the 5×5 unit matrix of (1, 1) to (5, 5) of the transformed parity check matrix H' is stored in the storage area of the first stage of the FIFO $\mathbf{304}_1$. In the storage area of the second stage, data corresponding to the positions of “1”s in the first shifted matrix constituting a sum matrix (a sum matrix that is a sum of the first shifted matrix acquired by cyclically shifting the 5×5 unit matrix to the right side by one and the second shifted matrix acquired by cyclically shifting the 5×5 unit matrix to the right side by two) of (6, 1) to (10, 5) of the transformed parity check matrix H' is stored. In addition, in the storage area of the third stage, data corresponding to the positions of "1" in the second shifted matrix constituting the sum matrix of (6, 1) to (10, 5) of the transformed parity check matrix H' is stored.

In other words, for a constitutive matrix of which the weight is two or more, when the constitutive matrix is represented by a sum of a plurality of a P×P unit matrix of which the weight is 1, a quasi unit matrix acquired by setting one or more elements of "1"s in the unit matrix to "0", and a shifted matrix acquired by cyclically shifting the unit matrix or the quasi unit matrix, data (messages corresponding to branches belonging to the unit matrix, the quasi unit matrix, or the shifted matrix) corresponding to the positions of "1"s in the unit matrix having a weight of 1, the quasi unit matrix, or the shifted matrix is stored at the same address (the same FIFO among the FIFOs $304_1$ to $304_{18}$).

Subsequently, also in the storage areas of the fourth and fifth stages, data is stored in association with the transformed parity check matrix H' The number of stages of the storage areas of the FIFO $304_1$ is 5 that is a maximum number of the number (Hamming weight) of "1"s in the row direction in the first to fifth columns of the transformed parity check matrix H'.

Similarly, in the FIFOs $304_2$ and $304_3$, data is stored in association with the transformed parity check matrix H', and each length (the number of stages) is 5. Similarly, in the FIFOs $304_4$ to $304_{12}$, data is stored in association with the transformed parity check matrix H', and each length is 3. Similarly, in the FIFOs $304_{13}$ to $304_{18}$, data is stored in association with the transformed parity check matrix H', and each length is 2.

Next, an operation of the decoding device illustrated in FIG. 162 will be described.

The branch data storing memory 300 includes the 6 FIFOs $300_1$ to $300_6$ and, according to information (matrix data) D312 representing rows of the transformed parity check matrix H' illustrated in FIG. 161 to which five messages D311 supplied from a cyclic shift circuit 308 of a previous stage belongs, selects a FIFO storing data from among the FIFOs $300_1$ to $300_6$ and sequentially stores the five messages D311 collectively in the selected FIFO. In order to read the data, the branch data storing memory 300 sequentially reads the five messages D$300_1$ from the FIFO $300_1$ and supplies the read messages to the selector 301 of a next stage. After reading of the messages from the FIFO $300_1$ ends, the branch data storing memory 300 sequentially reads messages also from the FIFOs $300_2$ to $300_6$ and supplies the read messages to the selector 301.

The selector 301 selects the five messages supplied from the FIFO from which data is currently read from among the FIFOs $300_1$ to $300_6$, according to a select signal D301, and supplies the selected messages as messages D302 to the check node calculating unit 302.

The check node calculating unit 302 includes five check node calculators $302_1$ to $302_5$, performs a check node operation according to Equation (7) by using the messages D302 (D$302_1$ to D$302_5$) (messages $v_1$ represented in Equation (7)) supplied through the selector 301, and supplies five messages D303 (D$303_1$ to D$303_5$) (messages $u_j$ of Equation (7)) acquired as a result of the check node operation to a cyclic shift circuit 303.

The cyclic shift circuit 303 cyclically shifts the five messages D$303_1$ to D$303_5$ acquired by the check node calculating unit 302 on the basis of information (matrix data) D305 representing the number of cyclic shifts of the unit matrix (or the quasi unit matrix) that is the origin in the transformed parity check matrix H' performed in a corresponding branch and supplies a result thereof as messages D304 to the branch data storing memory 304.

The branch data storing memory 304 includes eighteen FIFOs $304_1$ to $304_{18}$, according to information D305 representing rows of the transformed parity check matrix H' to which five messages D304 supplied from the cyclic shift circuit 303 of a previous stage belongs, selects a FIFO storing data from among the FIFOs $304_1$ to $304_{18}$, and sequentially stores the five messages D304 collectively in the selected FIFO. In order to read the data, the branch data storing memory 304 sequentially reads the five messages D$306_1$ from the FIFO $304_1$ and supplies the read messages to the selector 305 of a next stage. After reading of the data from the FIFO $304_1$ ends, the branch data storing memory 304 sequentially reads messages also from the FIFOs $304_2$ to $304_{18}$ and supplies the read messages to the selector 305.

The selector 305 selects the five messages supplied from the FIFO from which data is currently read from among the FIFOs $304_1$ to $304_{18}$ in accordance with a select signal D307 and supplies the selected messages as messages D308 to the variable node calculating unit 307 and the decoding word calculating unit 309.

Meanwhile, the reception data rearranging unit 310 rearranges the LDPC code D313, which corresponds to the parity check matrix H illustrated in FIG. 159, received through the communication line 13 by performing the column permutation represented in Equation (12) and supplies the rearranged LDPC code as reception data D314 to the reception data memory 306. The reception data memory 306 calculates a reception LLR (Log Likelihood Ratio) from the reception data D314 supplied from the reception data rearranging unit 310, stores the reception LLR, collects five reception LLRs, and supplies the reception LLRs as reception values D309 to the variable node calculating unit 307 and the decoding word calculating unit 309.

The variable node calculating unit 307 includes five variable node calculators $307_1$ to $307_5$, performs the variable node operation according to Equation (1) by using the messages D308 (D$308_1$ to D$308_5$) (messages $u_j$ represented in Equation (1)) supplied through the selector 305 and the five reception values D309 (reception values $u_{0i}$ represented in Equation (1)) supplied from the reception data memory 306, and supplies messages D310 (D$310_1$ to D$310_5$) (message $v_1$ represented in Equation (1)) acquired as an operation result to the cyclic shift circuit 308.

The cyclic shift circuit 308 cyclically shifts the messages D$310_1$ to D$310_5$ calculated by the variable node calculating unit 307 on the basis of information representing the number of cyclic shifts of the unit matrix (or the quasi unit matrix) that is the origin in the transformed parity check matrix H' performed in a corresponding branch, and supplies a result thereof as messages D311 to the branch data storing memory 300.

By circulating the above operation in one cycle, decoding (the variable node operation and the check node operation) of the LDPC code can be performed once. After decoding the LDPC code a predetermined number of times, the decoding device illustrated in FIG. 162 acquires a final decoding result in the decoding word calculating unit 309 and the decoded data rearranging unit 311 and outputs the final decoding result.

In other words, the decoding word calculating unit 309 includes five decoding word calculators $309_1$ to $309_5$. The decoding word calculating unit 309 calculates a decoding result (decoding word) on the basis of Equation (5) as a final stage of a plurality of number of times of decoding by using the five messages D308 (D$308_1$ to D$308_5$) (messages $u_j$ represented in Equation (5)) output by the selector 305 and the five reception values D309 (reception values $u_{0i}$ represented in Equation (5)) supplied from the reception data memory 306 and supplies decoded data D315 acquired as a result thereof to the decoded data rearranging unit 311.

The decoded data rearranging unit 311 rearranges the order by performing reverse permutation of the column permutation represented in Equation (12) for the decoded data D315 supplied from the decoding word calculating unit 309 as a target and outputs the rearranged decoded data as a final decoding result D316.

As above, by performing one or both of row permutation and column permutation for the parity check matrix (original parity check matrix) and converting the parity check matrix into a parity check matrix (transformed parity check matrix) that can be represented by a combination of a P×P unit matrix, a quasi unit matrix acquired by setting one or more elements of "1" to "0", a shifted matrix acquired by cyclically shifting the unit matrix or the quasi unit matrix, a sum matrix that is the sum of a plurality of unit matrixes, the quasi unit matrixes, and the shifted matrixes, and a P×P zero matrix, in other words, a parity check matrix (transformed parity check matrix) that can be represented by a combination of constitutive matrixes, as for LDPC code decoding, an architecture can be employed which simultaneously performs P check node operations and variable node operations, wherein P is smaller than the number of rows or the number of columns of the parity check matrix. In case of employing the architecture simultaneously performing P node operations (the (check node operations and the variable node operations) wherein P is a number less than the number of rows and the number of columns of the parity check matrix, compared to a case where the node operations corresponding to the same number as the number of rows and the number of columns of the parity check matrix are simultaneously performed, the operation frequency can be suppressed to be in a realizable range, and many repetitive decoding processes can be performed.

The LDPC decoder 166 that configures the receiving device 12 illustrated in FIG. 156, for example, performs the LDPC decoding by simultaneously performing P check node operations and variable node operations, similarly to the decoding device illustrated in FIG. 162.

In other words, for the simplification of description, in a case where the parity check matrix of the LDPC code output by the LDPC encoder 115 configuring the transmitting device 11 illustrated in FIG. 8 is the parity check matrix H illustrated in FIG. 159 in which the parity matrix has a staircase structure, in the parity interleaver 23 of the transmitting device 11, the parity interleave for interleaving the (K+qx+y+1)-th code bit into the position of the (K+Py+x+1)-th code bit is performed in a state in which the information length K is set to 60, the unit size P is set to 5, and the divisor q (=M/P) of the parity length M is set to 6.

Since the parity interleave, as described above, corresponds to the column permutation represented in Equation (12), the column permutation represented in Equation (12) does not need to be performed in the LDPC decoder 166.

For this reason, in the receiving device 12 illustrated in FIG. 156, as described above, the LDPC code for which the parity deinterleave has not been performed, in other words, the LDPC code in a state in which the column permutation represented in Equation (12) is performed is supplied from the group-wise deinterleaver 55 to the LDPC decoder 166. The LDPC decoder 166 performs a similar process as that of the decoding device illustrated in FIG. 162 except that the column permutation represented in Equation (12) is not performed.

In other words, FIG. 163 illustrates a configuration example of the LDPC decoder 166 illustrated in FIG. 156.

In FIG. 163, the LDPC decoder 166 has a similar configuration as the decoding device illustrated in FIG. 162 except that the reception data rearranging unit 310 illustrated in FIG. 162 is not arranged and performs a similar process as that of the decoding device illustrated in FIG. 162 except that the column permutation represented in Equation (12) is not performed, and thus, description thereof will not be presented.

As described above, since the LDPC decoder 166 can be configured without arranging the reception data rearranging unit 310, the scale thereof can be decreased to be less than that of the decoding device illustrated in FIG. 162.

Note that, in FIGS. 159 to 163, for the simplification of description, while the code length N of the LDPC code is set to 90, the information length K is set to 60, the unit size (the number of rows and the number of columns of the constitutive matrix) P is set to 5, and the divisor q (=M/P) of the parity length M is set to 6, the code length N, the information length K, the unit size P, and the divisor q (=M/P) are not limited to the values described above.

In other words, in the transmitting device 11 illustrated in FIG. 8, the LDPC encoder 115 outputs the LDPC code in which the code length N is set to 64800, 16200, or the like, the information length K is set to N−Pq (=N−M), the unit size P is set to 360, and the divisor q is set to M/P. However, the LDPC decoder 166 illustrated in FIG. 163 can be applied to a case where the LDPC decoding is performed by simultaneously performing P check node operations and variable node operations for the LDPC code as a target.

In addition, in a case where the parity portion of the decoding result is unnecessary, and only the information bits of the decoding result are output after the decoding of the LDPC code by the LDPC decoder 166, the LDPC decoder 166 may be configured without the decoded data rearranging unit 311.

<Configuration Example of Block Deinterleaver 54>

FIG. 164 is a block diagram that illustrates a configuration example of the block deinterleaver 54 illustrated in FIG. 157.

The block deinterleaver 54 has a configuration similar to the block interleaver 25 described above with reference to FIG. 94.

Thus, the block deinterleaver 54 includes the storage area called the part 1 and the storage area called the part 2, and each of the parts 1 and 2 is configured such that C columns as storage areas, which are equal in number to the number m of bits of the symbol, each storing one bit in the row direction and storing a predetermined number of bits in the column direction are arranged in the row direction.

The block deinterleaver 54 performs the block deinterleave by writing and reading the LDPC code for the parts 1 and 2.

However, in the block deinterleave, the writing of the LDPC code (forming the symbol) is performed in the order in which the LDPC code is read by the block interleaver 25 illustrated in FIG. 94.

In addition, in the block deinterleave, the reading of the LDPC code is performed in the order in which the LDPC code is written by the block interleaver 25 illustrated in FIG. 94.

In other words, in the block interleave performed by the block interleaver 25 illustrated in FIG. 94, while the LDPC code is written into the parts 1 and 2 in the column direction and is read from the parts 1 and 2 in the row direction, in the block deinterleave performed by the block deinterleaver 54 illustrated in FIG. 164, the LDPC code is written into the parts 1 and 2 in the row direction and is read from the parts 1 and 2 in the column direction.

<Another Configuration Example of Bit Deinterleaver 165>

FIG. 165 is a block diagram that illustrates another configuration example of the bit deinterleaver 165 illustrated in FIG. 156.

Note that, in the drawings, portions that correspond to the case illustrated in FIG. 157 are denoted using the same reference numerals, and, hereinafter, description thereof will not be presented as is appropriate.

In other words, the bit deinterleaver 165 illustrated in FIG. 165 has a similar configuration as that of the case illustrated in FIG. 157 except that a parity deinterleaver 1011 is newly arranged.

In the case illustrated in FIG. 165, the bit deinterleaver 165 is configured by a block deinterleaver 54, a group-wise deinterleaver 55, and a parity deinterleaver 1011 and performs bit deinterleave for the code bits of the LDPC code supplied from the demapper 164.

In other words, the block deinterleaver 54 performs block deinterleave (the inverse process of the block interleave) corresponding to the block interleave performed by the block interleaver 25 of the transmitting device 11, in other words, block deinterleave for restoring the positions of the code bits rearranged by the block interleave to the original positions for the LDPC code supplied from the demapper 164 as a target and supplies the LDPC code acquired as a result thereof to the group-wise deinterleaver 55.

The group-wise deinterleaver 55 performs group-wise deinterleave corresponding to the group-wise interleave as the rearrangement process performed by the group-wise interleaver 24 of the transmitting device 11 for the LDPC code supplied from the block deinterleaver 54 as a target.

The LDPC code that is acquired as a result of the group-wise deinterleave is supplied from the group-wise deinterleaver 55 to the parity deinterleaver 1011.

The parity deinterleaver 1011 performs the parity deinterleave (reverse processing of the parity interleave) corresponding to the parity interleave performed by the parity interleaver 23 of the transmitting device 11, in other words, the parity deinterleave for restoring the sequence of the code bits of the LDPC code of which the sequence has been changed by the parity interleave to the original sequence for the code bits after the group-wise deinterleave performed by the group-wise deinterleaver 55 as a target.

The LDPC code that is acquired as a result of the parity deinterleave is supplied from the parity deinterleaver 1011 to the LDPC decoder 166.

Therefore, in the bit deinterleaver 165 illustrated in FIG. 165, the LDPC code for which the block deinterleave, the group-wise deinterleave, and the parity deinterleave are performed, in other words, the LDPC code that is acquired by the LDPC coding according to the parity check matrix H is supplied to the LDPC decoder 166.

The LDPC decoder 166 performs LDPC decoding of the LDPC code supplied from the bit deinterleaver 165 by using the parity check matrix H used for the LDPC coding by the LDPC encoder 115 of the transmitting device 11. In other words, the LDPC decoder 166 performs the LDPC decoding of the LDPC code supplied from the bit deinterleaver 165 using the parity check matrix H (of the DVB type) used for the LDPC coding by the LDPC encoder 115 of the transmitting device 11 or the transformed parity check matrix acquired by performing at least the column permutation corresponding to the parity interleave for the parity check matrix H (for the ETRI type, the parity check matrix (FIG. 28) acquired by performing the column permutation for the parity check matrix (FIG. 27) used for the LDPC coding or the transformed parity check matrix (FIG. 29) acquired by performing the row permutation for the parity check matrix (FIG. 27) used for the LDPC coding).

In the case illustrated in FIG. 165, since the LDPC code that is acquired by the LDPC coding according to the parity check matrix H is supplied from the bit deinterleaver 165 (the parity deinterleaver 1011 thereof) to the LDPC decoder 166, in a case where the LDPC decoding of the LDPC code is performed using the parity check matrix H (of the DVB type) used by the LDPC encoder 115 of the transmitting device 11 for performing the LDPC coding (for the ETRI type, the parity check matrix (FIG. 28) acquired by performing the column permutation for the parity check matrix (FIG. 27) used for the LDPC coding), the LDPC decoder 166, for example, can be configured by a decoding device performing the LDPC decoding according to a full serial decoding scheme for sequentially performing operations of messages (a check node message and a variable node message) for each node or a decoding device performing the LDPC decoding according to a full parallel decoding scheme for simultaneously (in parallel) performing operations of messages for all the nodes.

In addition, in the LDPC decoder 166, in a case where the LDPC decoding of the LDPC code is performed using the transformed parity check matrix acquired by performing at least the column permutation corresponding to the parity interleave for the parity check matrix H (of the DVB type) used by the LDPC encoder 115 of the transmitting device 11 for performing the LDPC coding (for the ETRI type, the transformed parity check matrix (FIG. 29) acquired by performing the row permutation for the parity check matrix (FIG. 27) used for the LDPC coding), the LDPC decoder 166 can be configured by a decoding device that is a decoding device having an architecture simultaneously performing P (or a divisor of P other than 1) check node operations and variable node operations and the decoding device (FIG. 162) including the reception data rearranging unit 310 that rearranges the code bits of the LDPC code by performing a similar column permutation as the column permutation (parity interleave) for acquiring the transformed parity check matrix for the LDPC code.

Note that, in the case illustrated in FIG. 165, for the convenience of description, while the block deinterleaver 54 that performs the block deinterleave, the group-wise deinterleaver 55 that performs the group-wise deinterleave, and the parity deinterleaver 1011 that performs the parity deinterleave are separately configured, two or more of the block deinterleaver 54, the group-wise deinterleaver 55, and the parity deinterleaver 1011 may be configured integrally, similarly to the parity interleaver 23, the group-wise interleaver 24, and the block interleaver 25 of the transmitting device 11.

<Configuration Example of Reception System>

FIG. 166 is a block diagram illustrating a first configuration example of a reception system that can be applied to the receiving device 12.

In FIG. 166, the reception system includes an acquiring unit 1101, a transmission line decoding processing unit 1102, and an information source decoding processing unit 1103.

The acquiring unit 1101 acquires a signal including an LDPC code acquired by performing at least LDPC coding for LDPC target data such as video data or audio data of a program, for example, through a transmission line (communication line) not illustrated in the drawings such as terrestrial digital broadcasting, satellite digital broadcasting, a CATV network, the Internet, or other networks and supplies the acquired signal to the transmission line decoding processing unit 1102.

Here, in a case where the signal acquired by the acquiring unit 1101, for example, is broadcasted from a broadcasting station through a ground wave, a satellite wave, a Cable Television (CATV) network, or the like, the acquiring unit 1101 is configured by a tuner, a Set Top Box (STB), and the like. On the other hand, in a case where the signal acquired by the acquiring unit 1101, for example, is transmitted from a web server through multicasting like an Internet Protocol Television (IPTV), the acquiring unit 1101, for example, is configured by a network Interface (I/F) such as a Network Interface Card (NIC).

The transmission line decoding processing unit 1102 corresponds to the receiving device 12. The transmission line decoding processing unit 1102 performs transmission line decoding processing including at least processing for correcting an error generated in a transmission line for the signal acquired by the acquiring unit 1101 through the transmission line and supplies a signal acquired as a result thereof to the information source decoding processing unit 1103.

In other words, the signal that is acquired by the acquiring unit 1101 through the transmission line is a signal that is acquired by performing at least error correction coding for correcting an error generated in the transmission line. The transmission line decoding processing unit 1102 performs transmission line decoding processing such as error correction processing for such a signal.

Here, examples of the error correction coding include LDPC coding and BCH coding. Here, as the error correction coding, at least the LDPC coding is performed.

In addition, the transmission line decoding processing may include demodulation of a modulation signal or the like.

The information source decoding processing unit 1103 performs information source decoding processing including at least processing for extending compressed information to original information for the signal for which the transmission line decoding processing has been performed.

In other words, compression coding that compresses information may be performed for the signal acquired by the acquiring unit 1101 through the transmission line so as to decrease a data amount of a video or an audio as information. In such a case, the information source decoding processing unit 1103 performs the information source decoding processing such as the processing (extension processing) for extending the compressed information to the original information for the signal for which the transmission line decoding processing has been performed.

Note that, in a case where the compression coding has not been performed for the signal acquired by the acquiring unit 1101 through the transmission line, the processing for extending the compressed information to the original information is not performed by the information source decoding processing unit 1103.

In this case, as the extension processing, for example, there is MPEG decoding. In the transmission line decoding processing, in addition to the extension processing, descramble or the like may be included.

In the reception system configured as described above, in the acquiring unit 1101, for example, a signal for which the compression coding such as the MPEG coding and the error correction coding such as the LDPC coding have been performed for data such as a video or an audio is acquired through the transmission line and is supplied to the transmission line decoding processing unit 1102.

In the transmission line decoding processing unit 1102, for example, a similar processing as is performed by the receiving device 12 and the like are performed as the transmission line decoding processing for the signal supplied from the acquiring unit 1101, and a signal acquired as a result thereof is supplied to the information source decoding processing unit 1103.

In the information source decoding processing unit 1103, the information source decoding processing such as the MPEG decoding is performed for the signal supplied from the transmission line decoding processing unit 1102, and a video or an audio acquired as a result thereof is output.

The reception system illustrated in FIG. 166 as above can be applied to a television tuner that receives television broadcasting as digital broadcasting.

Note that each of the acquiring unit 1101, the transmission line decoding processing unit 1102, and the information source decoding processing unit 1103 can be configured as one independent device (hardware (Integrated Circuit (IC) or the like) or software module).

In addition, regarding the acquiring unit 1101, the transmission line decoding processing unit 1102, and the information source decoding processing unit 1103, a set of the acquiring unit 1101 and the transmission line decoding processing unit 1102, a set of the transmission line decoding processing unit 1102 and the information source decoding processing unit 1103, or a set of the acquiring unit 1101, the transmission line decoding processing unit 1102, and the information source decoding processing unit 1103 may be configured as one independent device.

FIG. 167 is a block diagram that illustrates a second configuration example of the reception system to which the receiving device 12 can be applied.

Note that, in the drawings, portions that correspond to those of the case illustrated in FIG. 166 are denoted using the same reference numerals, and hereinafter, description thereof will not be presented as is appropriate.

The reception system illustrated in FIG. 167 is common to the case illustrated in FIG. 166 in that the acquiring unit 1101, the transmission line decoding processing unit 1102, and the information source decoding processing unit 1103 are included but is different from the case illustrated in FIG. 166 in that an output unit 1111 is newly arranged.

The output unit 1111 is a display device displaying a video or a speaker outputting an audio and outputs a video or an audio as a signal output from the information source decoding processing unit 1103. In other words, the output unit 1111 displays the video or outputs the audio.

The reception system illustrated in FIG. 167 described above, for example, can be applied to a TV (television receiver) receiving television broadcasting as digital broadcasting, a radio receiver receiving radio broadcasting, or the like.

Note that, in a case where the compression coding is not performed for the signal acquired in the acquiring unit 1101, the signal that is output by the transmission line decoding processing unit 1102 is supplied to the output unit 1111.

FIG. 168 is a block diagram that illustrates a third configuration example of the reception system to which the receiving device 12 can be applied.

Note that, in the drawings, portions that correspond to those of the case illustrated in FIG. 166 are denoted using the same reference numerals, and, hereinafter, description thereof will not be presented as is appropriate.

The reception system illustrated in FIG. 168 is common to the case illustrated in FIG. 166 in that the acquiring unit 1101 and the transmission line decoding processing unit 1102 are arranged.

However, the reception system illustrated in FIG. 168 is different from the case illustrated in FIG. 166 in that the information source decoding processing unit 1103 is not arranged, but a recording unit 1121 is newly arranged.

The recording unit 1121 records (stores) a signal (for example, TS packets of TS of MPEG) output by the transmission line decoding processing unit 1102 on recording (storage) media such as an optical disk, a hard disk (magnetic disk), and a flash memory.

The reception system illustrated in FIG. 168 described above can be applied to a recorder that records television broadcasting and the like.

Note that, in FIG. 168, the reception system is configured by providing the information source decoding processing unit 1103 and can record the signal acquired by performing the information source decoding processing by the information source decoding processing unit 1103, in other words, the image or the sound acquired by decoding, by the recording unit 1121.

<Computer According to Embodiment>

A series of the processes described above can be performed either by hardware or by software. In a case where the series of the processes is performed by software, a program configuring the software is installed to a general-purpose computer or the like.

FIG. 169 is a diagram that illustrates an example of the configuration of a computer according to an embodiment to which the program executing the series of processes described above is installed.

The program may be recorded in a hard disk 705 or a ROM 703 as a recording medium built in the computer in advance.

Alternatively or additionally, the program may be stored (recorded) temporarily or perpetually on a removable recording medium 711 such as a flexible disk, a Compact Disc Read Only Memory (CD-ROM), a Magneto Optical (MO) disk, a Digital Versatile Disc (DVD), a magnetic disk, or a semiconductor memory. Such a removable recording medium 711 may be provided as so-called package software.

Note that, instead of installing the program to the computer from the removable recording medium 711 as described above, it may be configured such that the program is transmitted in a wireless manner from a download site to the computer through a digital broadcasting satellite or is transmitted to the computer in a wired manner through a network such as a local area network (LAN) or the Internet, and the computer receives the transmitted program using a communication unit 708 and installs the program to a built-in hard disk 705.

The computer has a central processing unit (CPU) 702 built therein, and an input/output interface 710 is connected to the CPU 702 through a bus 701. When an instruction is input from a user through the input/output interface 710 by operating an input unit 707 configured by a keyboard, a mouse, a microphone, and the like, the CPU 702 executes a program that is stored in a Read Only Memory (ROM) 703 in accordance with the instruction. Alternatively, the CPU 702 loads a program that is stored in the hard disk 705, a program that is transmitted from a satellite or a network, is received by the communication unit 708, and is installed to the hard disk 705, or a program that is read from the removable recording medium 711 loaded into a drive 709 and is installed to the hard disk 705 into a Random Access Memory (RAM) 704 and executes the program. Accordingly, the CPU 702 performs the process according to the flowchart described above or the process performed using the configuration illustrated in the block diagram described above. Then, the CPU 702, for example, outputs a result of the process from an output unit 706 configured by a Liquid Crystal Display (LCD), a speaker, and the like through the input/output interface 710, transmits the result from the communication unit 708, or records the result on the hard disk 705 as is necessary.

Here, in this specification, the processing step describing a program causing a computer to perform various processes does not need to be performed necessarily in a time series in accordance with the sequence described in the flowchart but also includes a process (for example, a parallel process or a process using an object) that is performed in a parallel manner or in an individual manner.

In addition, the program may be processed by one computer or may be processed by a plurality of computers in a distributed manner. Furthermore, the program may be transmitted to a remote computer and be executed.

Note that embodiments of the present technology are not limited to the embodiments described above, but various changes can be made therein in a range not departing from the concept of the present technology.

In other words, for example, the new LDPC code (the parity check matrix initial value table thereof) described above may be used when the communication line 13 (FIG. 7) is a satellite channel, a terrestrial wave, a cable (wired line) or any other communication channel. Furthermore, the new LDPC code can be used also for data transmission other than digital broadcasting.

In addition, the GW pattern described above can be applied to a code other than the new LDPC code. Furthermore, the modulation scheme to which the GW pattern described above is applied is not limited to the QPSK, the 16 QAM, the 64 QAM, the 256 QAM, and the 1024 QAM.

Note that the effects described in this specification are merely examples but are not for the purposes of limitation, and any additional effect may be present.

REFERENCE SIGNS LIST

11 Transmitting device
12 Receiving device
23 Parity interleaver
24 Group-wise interleaver
Block interleaver
54 Block deinterleaver
55 Group-wise deinterleaver
111 Mode adaptation/multiplexer
112 Padder
113 BB scrambler
114 BCH encoder
115 LDPC encoder
116 Bit interleaver
117 Mapper
118 Time interleaver
119 SISO/MISO encoder
120 Frequency interleaver
121 BCH encoder
122 LDPC encoder
123 Mapper
124 Frequency interleaver
131 Frame builder/resource allocation unit

132 OFDM generating unit
151 OFDM processing unit
152 Frame managing unit
153 Frequency deinterleaver
154 Demapper
155 LDPC decoder
156 BCH decoder
161 Frequency deinterleaver
162 SISO/MISO decoder
163 Time deinterleaver
164 Demapper
165 Bit deinterleaver
166 LDPC decoder
167 BCH decoder
168 BB descrambler
169 Null deletion unit
170 Demultiplexer
300 Branch data storing memory
301 Selector
302 Check node calculating unit
303 Cyclic shift circuit
304 Branch data storing memory
305 Selector
306 Reception data memory
307 Variable node calculating unit
308 Cyclic shift circuit
309 Decoding word calculating unit
310 Reception data rearranging unit
311 Decoded data rearranging unit
601 Coding processing unit
602 Storage unit
611 Coding rate setting unit
612 Initial value table reading unit
613 Parity check matrix generating unit
614 Information bit reading unit
615 Coding parity calculating unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Reverse permutation unit
1002 Memory
1011 Parity deinterleaver
1101 Acquiring unit
1101 Transmission line decoding processing unit
1103 Information source decoding processing unit
1111 Output unit
1121 Recording unit

The invention claimed is:

1. A receiving device for receiving digital television signals, the receiving device comprising:

a receiver configured to receive encoded data, each ten bits of which mapped to one of 1024 signal points of a modulation method; and processing circuitry configured to process the encoded data to produce a group-wise interleaved low density parity check (LDPC) codeword;

process the group-wise interleaved LDPC codeword in a unit of a bit group of 360 bits to produce an LDPC codeword of an LDPC code; wherein an (i+1)-th bit group from a head of the LDPC codeword of the LDPC code is indicated by a bit group i, the LDPC codeword of the LDPC codeword has a sequence of bit groups 0 to 179, and the group-wise interleaved LDPC codeword has a following sequence of bit groups, 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175, decode the LDPC codeword of the LDPC code to produce decoded data; and process the decoded data for presentation;

wherein the LDPC code has a length N of 64800 bits and a coding rate r of 13/15 and corresponds to a parity check matrix initial value table including the following, 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598

105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373

364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054

1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

2. The receiving device according to claim 1, wherein the LDPC code uses a parity check matrix, which includes an information matrix part and a parity matrix part.

3. The receiving device according to claim 2, wherein
the LDPC codeword includes information bits and parity bits; and
the information matrix part corresponds to the information bits and the parity matrix part corresponds to the parity bits.

4. The receiving device according to claim 3, wherein
the parity matrix part is a lower bidiagonal matrix, in which elements of "1" are arranged in a step-wise fashion.

5. The receiving device according to claim 3, wherein
the information matrix part is represented by the parity check matrix initial value table, and
the parity check matrix initial value table is a table showing in an i-th row, i>0, positions of elements "1" in (1+360×(i−1))-th column of the information matrix part.

6. The receiving device according to claim 5, wherein
if a length of the parity bit of the LDPC codeword is represented by M, the z+360×(i−1)-th column of the parity check matrix, z>1, is obtained by the cyclic shift of the (z−1)+360×(i−1)-th column of the parity check matrix indicating a position of an element "1" in the parity check matrix initial value table downward by q=M/360.

7. The receiving device according to claim 6, wherein
as for each column from the 2+360×(i−1)-th column to a 360×i-th column being the column other than the 1+360×(i−1)-th column of the parity check matrix,
if an i-th row j-th column value of the parity check matrix initial value table is represented as hi, j and the row number of a j-th element "1" of a w-th column of the parity check matrix is represented as Hw-j,
a row number Hw-j of the j-th element "1" of the w-th column being the column other than the 1+360×(i−1)-th column of the parity check matrix is represented by the equation $$Hw\text{-}j=\mathrm{mod}(hi,j+\mathrm{mod}((w-1),360)\times M/360,M).$$

8. The receiving device according to claim 2, wherein
the parity check matrix has no cycle-4.

9. The receiving device according to claim 1, wherein
the input is a tuner.

10. The receiving device according to claim 1, wherein
the modulation scheme employs non-uniform constellations (NUCs).

11. A method performed by a receiving device receiving digital television signals, the method comprising:
receiving encoded data, each 10 bits of which mapped to one of 1024 signal points of a modulation method;
processing the encoded data to produce a group-wise interleaved low density parity check (LDPC) codeword;
processing the group-wise interleaved LDPC codeword in a unit of a bit group of 360 bits to produce an LDPC codeword of an LDPC code; wherein an (i+1)-th bit group from a head of the LDPC codeword of the LDPC code is indicated by a bit group i, the LDPC codeword of the LDPC code has a sequence of bit groups 0 to 179, and the group-wise interleaved LDPC codeword has a following sequence of bit groups,
49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175,
decoding the LDPC codeword of the LDPC code to produce decoded data; and
processing the decoded data for presentation;
wherein the LDPC code has a length N of 64800 bits and a coding rate r of 13/15 and corresponds to a parity check matrix initial value table including the following,
142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636

3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470

2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

12. The method according to claim 11, wherein the LDPC code uses a parity check matrix, which includes an information matrix part and a parity matrix part.

13. The method according to claim 12, wherein the LDPC codeword includes information bits and parity bits; and the information matrix part corresponds to the information bits and the parity matrix part corresponds to the parity bits.

14. The method according to claim 13, wherein the parity matrix part is a lower bidiagonal matrix, in which elements of "1" are arranged in a step-wise fashion.

15. The method according to claim 13, wherein the information matrix part is represented by the parity check matrix initial value table, and the parity check matrix initial value table is a table showing in an i-th row, i>0, positions of elements "1" in (1+360×(i−1))-th column of the information matrix part.

16. The method according to claim 15, wherein if a length of the parity bit of the LDPC codeword is represented by M, the z+360×(i−1)-th column of the parity check matrix, z>1, is obtained by the cyclic shift of the (z−1)+360×(i−1)-th column of the parity check matrix indicating a position of an element "1" in the parity check matrix initial value table downward by q=M/360.

17. The method according to claim 16, wherein as for each column from the 2+360×(i−1)-th column to a 360×i-th column being the column other than the 1+360×(i−1)-th column of the parity check matrix, if an i-th row j-th column value of the parity check matrix initial value table is represented as hi, j and the row number of a j-th element "1" of a w-th column of the parity check matrix is represented as Hw-j, a row number Hw-j of the j-th element "1" of the w-th column being the column other than the 1+360×(i−1)-th column of the parity check matrix is represented by the equation $$Hw\text{-}j=\mathrm{mod}(hi,j+\mathrm{mod}((w-1),360)\times M/360,M).$$

18. The method according to claim 12, wherein the parity check matrix has no cycle-4.

19. The method according to claim 11, wherein receiving the encoded data further comprises receiving the encoded data by means of a tuner.

20. A non-transitory computer readable medium including computer executable instructions which, when executed by a computer, cause the computer to perform a method comprising:

receiving encoded data, each 10 bits of which mapped to one of 1024 signal points of a modulation method;

processing the encoded data to produce a group-wise interleaved low density parity check (LDPC) codeword;

processing the group-wise interleaved LDPC codeword in a unit of a bit group of 360 bits to produce an LDPC codeword of an LDPC code; wherein an (i+1)-th bit group from a head of the LDPC codeword of the LDPC code is indicated by a bit group i, the LDPC codeword of the LDPC code has a sequence of bit groups 0 to 179, and the group-wise interleaved LDPC codeword has a following sequence of bit groups, 49, 2, 57, 47, 31, 35, 24, 39, 59, 0, 45, 41, 55, 53, 51, 37, 33, 43, 56, 38, 48, 32, 50, 23, 34, 54, 1, 36, 44, 52, 40, 58, 122, 46, 42, 30, 3, 75, 73, 65, 145, 71, 79, 67, 69, 83, 85, 147, 63, 81, 77, 61, 5, 26, 62, 64, 74, 70, 82, 149, 76, 4, 78, 84, 80, 86, 66, 68, 72, 6, 60, 154, 103, 95, 101, 143, 9, 89, 141, 128, 97, 137, 133, 7, 13, 99, 91, 93, 87, 11, 136, 90, 88, 94, 10, 8, 14, 96, 104, 92, 132, 142, 100, 98, 12, 102, 152, 139, 150, 106, 146, 130, 27, 108, 153, 112, 114, 29, 110, 134, 116, 15, 127, 125, 123, 120, 148, 151, 113, 126, 124, 135, 129, 109, 25, 28, 158, 117, 105, 115, 111, 131, 107, 121, 18, 170, 164, 20, 140, 160, 166, 162, 119, 155, 168, 178, 22, 174, 172, 176, 16, 157, 159, 171, 161, 118, 17, 163, 21, 165, 19, 179, 177, 167, 138, 173, 156, 144, 169, and 175, decoding the LDPC codeword of the LDPC code to produce decoded data; and processing the decoded data for presentation;

wherein the LDPC code has a length N of 64800 bits and a coding rate r of 13/15 and corresponds to a parity check matrix initial value table including the following, 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636

3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470

2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 367 04979.

* * * * *